US012660399B2

(12) United States Patent
Hashimoto et al.

(10) Patent No.: US 12,660,399 B2
(45) Date of Patent: *Jun. 16, 2026

(54) DISPLAY DEVICE AND METHOD FOR MANUFACTURING DISPLAY DEVICE

(71) Applicant: TORAY INDUSTRIES, INC., Tokyo (JP)

(72) Inventors: Keika Hashimoto, Otsu (JP); Yuki Masuda, Otsu (JP); Takuma Nishimura, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 571 days.

This patent is subject to a terminal disclaimer.

(21) Appl. No.: 18/028,664

(22) PCT Filed: Oct. 5, 2021

(86) PCT No.: PCT/JP2021/036774

§ 371 (c)(1),
(2) Date: Mar. 27, 2023

(87) PCT Pub. No.: WO2022/085430

PCT Pub. Date: Apr. 28, 2022

(65) Prior Publication Data

US 2024/0038819 A1 Feb. 1, 2024

(30) Foreign Application Priority Data

Oct. 23, 2020 (JP) ................................ 2020-177904
Oct. 23, 2020 (JP) ................................ 2020-177906

(51) Int. Cl.
*H10H 29/14* (2025.01)
*H10H 20/854* (2025.01)
(Continued)

(52) U.S. Cl.
CPC ........ *H10H 29/142* (2025.01); *H10H 20/854* (2025.01); *H10H 20/856* (2025.01);
(Continued)

(58) Field of Classification Search
CPC .. H10H 29/142; H10H 20/854; H10H 20/856; H10H 20/857; H10H 20/0362; H10H 20/0364
See application file for complete search history.

(56) References Cited

U.S. PATENT DOCUMENTS

2011/0303941 A1 12/2011 Lee
2014/0153238 A1* 6/2014 Nishimura ......... H10H 20/8583 362/293
(Continued)

FOREIGN PATENT DOCUMENTS

CN 102376854 A 3/2012
JP 2003-309293 A 10/2003
(Continued)

OTHER PUBLICATIONS

International Search Report, issued in PCT/JP2021/036774, PCT/ISA/210, dated Dec. 28, 2021.
(Continued)

*Primary Examiner* — Samuel A Gebremariam
(74) *Attorney, Agent, or Firm* — Birch, Stewart, Kolasch & Birch, LLP

(57) ABSTRACT

Problems have been presented in terms of the step flatness of cured films used, inter alia, as wiring-insulating insulation films or protective films formed so as to cover metal wirings or light-emitting elements such as LEDs. The present invention overcomes problems relating to the incidence of wiring defects such as short-circuiting and defects associated with light-emitting element connection, and problems relating to
(Continued)

the light-emission fault rate when this display device has been produced. The present invention is a display device having at least a metal wiring, a cured film, and a plurality of light-emitting elements, wherein a pair of electrode terminals are provided on one surface of each of the light-emitting elements. The pair of electrode terminals are connected to a plurality of the metal wirings extending in the cured film. The metal wirings are configured so that electrical insulation properties are maintained by the cured film. The metal wirings have a plurality of metal wirings (K1) extending in the thickness direction of the cured film, and a plurality of metal wirings (K2) that are connected to the metal wiring (K1) and that extend in a planar direction perpendicular to the thickness direction of the cured film. The cured film is obtained by curing a resin composition containing resin (A) and has a cured film that is in contact with some of the surfaces of the metal wirings (K2). The display device has at least a region (G) in which the line spacing H1 between two of the metal wirings (K2) that are adjacent to one another is 1-20 μm. In the region (G), the ratio H3/H2 is 1.4-4.0, and the step flattening rate P (%) expressed by (Formula 1) is 70-99%, where H2 (μm) is the thickness of the metal wirings (K2), H3 (μm) is the thickness of the cured film, and H4 (μm) is the depth of a step in the cured film that was formed in the region (G). (Formula 1) P (%)=(1−(H4/H2))×100.

29 Claims, 34 Drawing Sheets

(51) Int. Cl.
*H10H 20/856* (2025.01)
*H10H 20/857* (2025.01)
*H10H 20/01* (2025.01)

(52) U.S. Cl.
CPC ....... *H10H 20/857* (2025.01); *H10H 20/0362* (2025.01); *H10H 20/0364* (2025.01)

(56) References Cited

U.S. PATENT DOCUMENTS

| | | | |
|---|---|---|---|
| 2014/0367633 A1 | 12/2014 | Bibl et al. | |
| 2017/0301724 A1 | 10/2017 | Lee | |
| 2019/0165035 A1 | 5/2019 | Fu | |
| 2021/0296293 A1 | 9/2021 | Kanaya et al. | |
| 2024/0297157 A1* | 9/2024 | Kaneki | G09F 9/30 |

FOREIGN PATENT DOCUMENTS

| | | | |
|---|---|---|---|
| JP | 2011-53247 A | 3/2011 |
| JP | 2011-148971 A | 8/2011 |
| JP | 2013-37139 A | 2/2013 |
| JP | 2016-523450 A | 8/2016 |
| WO | WO 2016/043203 A1 | 3/2016 |
| WO | WO 2020/110715 A1 | 6/2020 |

OTHER PUBLICATIONS

Written Opinion of the International Searching Authority, issued in PCT/JP2021/036774, PCT/ISA/237, dated Dec. 28, 2021.

* cited by examiner h a

DISPLAY DEVICE AND METHOD FOR MANUFACTURING DISPLAY DEVICE

TECHNICAL FIELD

The present invention relates to displays such as LED display and a method for production thereof.

BACKGROUND ART

From the viewpoint of providing displays with highly improved performances, LED displays in which the same number of light emitting diodes (hereinafter occasionally referred to as LEDs) as required pixels are arranged are attracting attention in recent years as a new display technology to replace the liquid crystal displays, plasma displays, and organic EL displays. In particular, currently in the spotlight are mini-LED displays that have LED light sources with sizes ranging from 1 mm, i.e. about the size of conventional ones, to 100 to 700 μm and micro-LED displays that are as small as less than 100 μm, and research and development efforts are being actively made for them. The main features of these mini-LED displays and micro-LED displays include high contrast, high speed response, low power consumption, and wide viewing angles. It is expected that they will be applied not only to conventional devices such as TVs, smart phones, and wearable displays such as smart watches, but also to a wide range of new products with high future potential such as those for signage, AR, VR, and transparent displaying to display spatial images.

Various structures of LED displays that serve for practical and high performance applications have been proposed, including a structure that includes a multilayer flexible circuit board and micro LEDs arranged thereon (see Patent document 1) and a structure produced by forming a bank layer and trace lines on a display substrate and arranging micro-LEDs and micro-driver chips thereon (see Patent document 2). In addition, also proposed is a structure produced by forming main light emitting element bodies having electrode pads in an integral manner on a growth substrate, forming a planarization layer thereon, removing the planarization layer located on the electrode pads to expose the electrode pads, forming outer side electrode pads connected to the electrode pads on the aforementioned planarization layer, and mounting them on a circuit board with the circuit side electrodes located thereon in such a manner that the outer side electrode pads are opposed to the circuit side electrodes, followed by electrically connecting the front external electrode pads to the circuit side electrodes (see Patent document 3).

PRIOR ART DOCUMENTS

Patent Documents

Patent document 1: Japanese Unexamined Patent Publication (Kokai) No. 2019-153812
Patent document 2: Japanese Unexamined Patent Publication (Kokai) No. 2020-52404
Patent document 3: Japanese Unexamined Patent Publication (Kokai) No. 2020-68313

SUMMARY OF INVENTION

Problems to be Solved by the Invention

However, the LED displays described in the above document had the problem of high light emission failure rates.

In addition, the LED display devices described in the above documents require the application of high voltages to fine metal wiring when smaller products are to be developed. Accordingly, degradation of metal wiring and leakage current occur frequently, leading to the problem of high defective rates in reliability test performed under accelerated test conditions that simulate practical uses.

Means of Solving the Problems

To solve the above problems, the first embodiment of the present invention is configured as described below.

[1] A display comprising at least metal wires, a cured film, and a plurality of light emitting elements, each of the light emitting elements having a pair of electrode terminals on one face thereof, the pair of electrode terminals being connected to the plurality of metal wires extending in the cured film, the plurality of metal wires being electrically insulated by the cured film, the metal wires having a plurality of metal wires (K1) extending in the cured film in the thickness direction and also having a plurality of metal wires (K2) extending in the cured film in the planar direction perpendicular to the thickness direction and connected to the metal wires (K1), the cured film being a film formed by curing a resin composition containing a resin (A), the cured film being in contact with part of the surface of the metal wires (K2), at least a region (G) in which the conductor spacing H1 between mutually adjacent metal wires (K2) is 1 to 20 μm being present in the display, and the relations H3/H2=1.4 to 4.0 and P (%)=70% to 99% holding wherein H2 (μm) is the thickness of the metal wires (K2) in the region (G), H3 (μm) the thickness of the cured film, H4 (μm) the depth of the depression formed in the region (G) of the cured film, and P (%) the depressed surface planarization rate represented by the formula (1):

$$P\ (\%)=(1-(H4/H2))\times 100 \qquad \text{formula (1)}$$

To solve the above problems, the second embodiment of the present invention is configured as described below.

[1] A display including at least metal wires, a cured film, and a plurality of light emitting elements, each of the light emitting elements having a pair of electrode terminals on one face thereof, the pair of electrode terminals being connected to the plurality of metal wires extending in the cured film, the plurality of metal wires being electrically insulated by the cured film, the cured film being a film formed by curing a resin composition containing a resin (A), and the cured film having a dielectric breakdown voltage of 360 kV/mm or more and 600 kV/mm or less.

[2] A production method for a display having at least metal wires, a cured film, and a plurality of light emitting elements including a step (D1) for arranging the light emitting elements on a support substrate, a step (D2) for forming a resin film from a resin composition containing a resin (A) on the support substrate and on the light emitting elements, a step (D3) for irradiating and developing the resin film to form a plurality of through-hole patterns in the resin film, a step (D4) for curing the resin film to form a cured film having a dielectric breakdown voltage of 360 kV/mm or more and 600 kV/mm or less, and a step (D5) for forming the metal wires on at least part of the surface of the cured film and in the hole patterns in the cured film.

[3] A production method for a display having at least metal wires, a cured film, and a plurality of light emitting elements including a step (E1) for disposing a metal pad on a support substrate, a step (E2) for forming a resin film from a resin composition containing a resin (A) on the support substrate and on the metal pad, a step (E3) for irradiating and developing the resin film to form a plurality of through-hole patterns in the resin film, a step (E4) for curing the resin film to form the cured film having a dielectric breakdown voltage of 360 kV/mm or more and 600 kV/mm or less, a step (E5) for forming the metal wires on at least part of the surface of the cured film and in the hole patterns in the cured film, and a step (E6) for arranging the light emitting elements on the cured film while maintaining electric connection to the metal wires.

Advantageous Effects of the Invention

The first embodiment of the present invention provides a display in which the cured film is designed to ensure a high flatness of the depressed surface so as to reduce wiring defects such as short circuits in wires and defective connections of light emitting elements, thus serving to produce a display with a decreased light emission failure rate.

The second embodiment of the present invention provides a display with a low defective rate found in reliability test performed under accelerated test conditions that simulate practical uses.

BRIEF DESCRIPTION OF THE DRAWINGS

The first embodiment of the present invention is as follows.

The second embodiment of the present invention is as follows.

Figure 20:
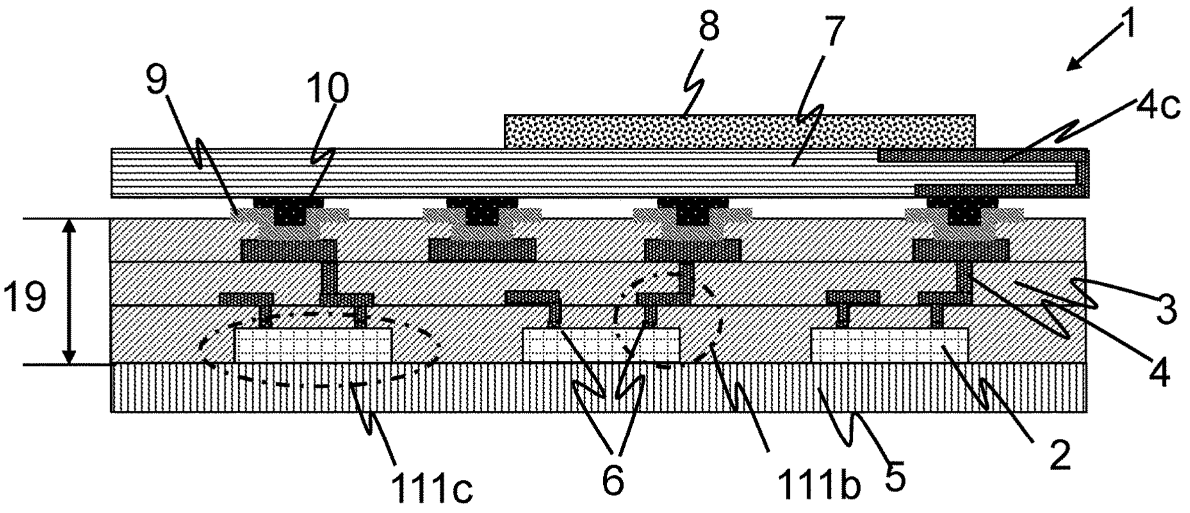

FIG. 20 This gives a frontal sectional view of an embodiment of the display according to the present invention.

Figure 21:
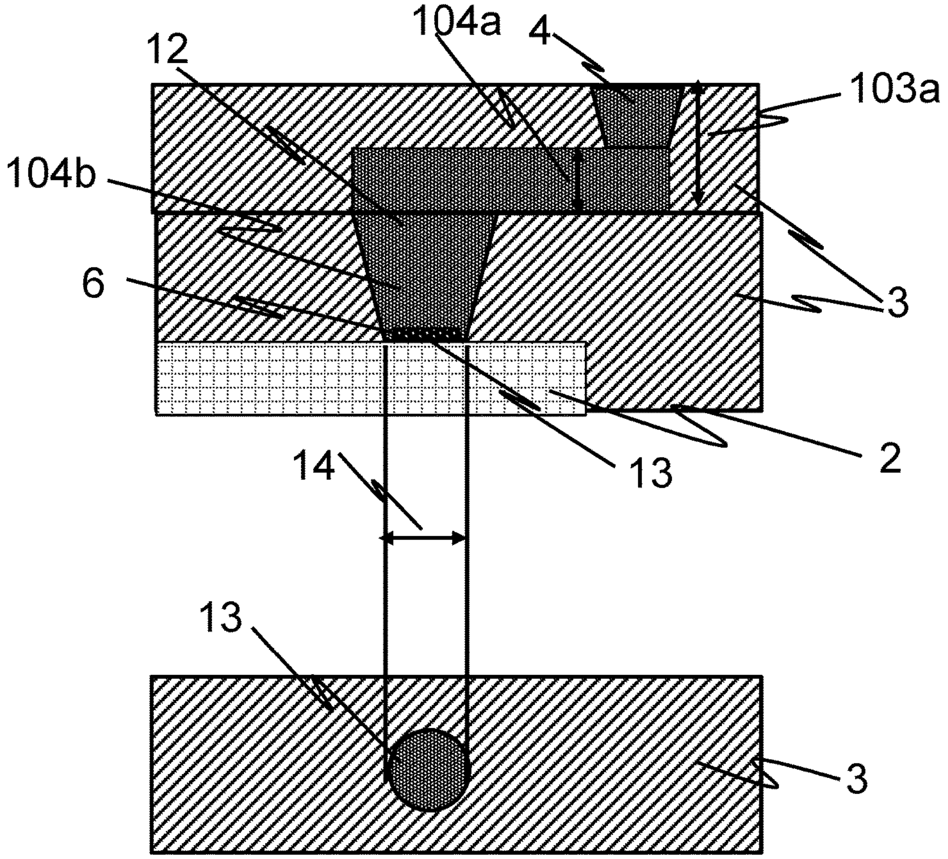

FIG. 21 This gives an enlarged frontal sectional view (upper part) of the designated region B and a bottom face view (lower part) of the designated region B excluding the light emitting elements.

Figure 22:
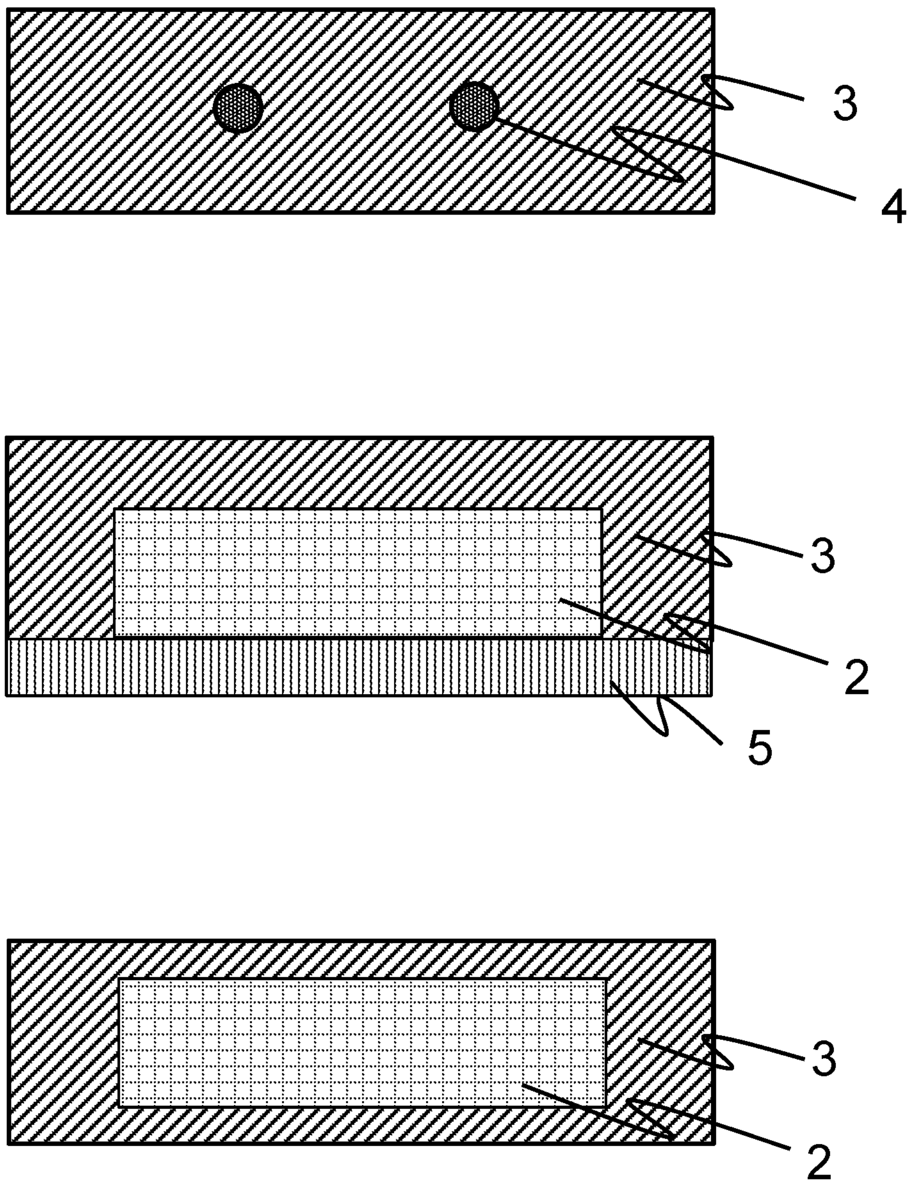

FIG. 22 This gives an enlarged top sectional view (upper part) of the designated region C, a cross-sectional view (middle part) along a plane perpendicular to the front face of the designated region C excluding the wires, and a bottom face view (lower part) of the designated region C excluding the opposite substrate.

Figure 23:
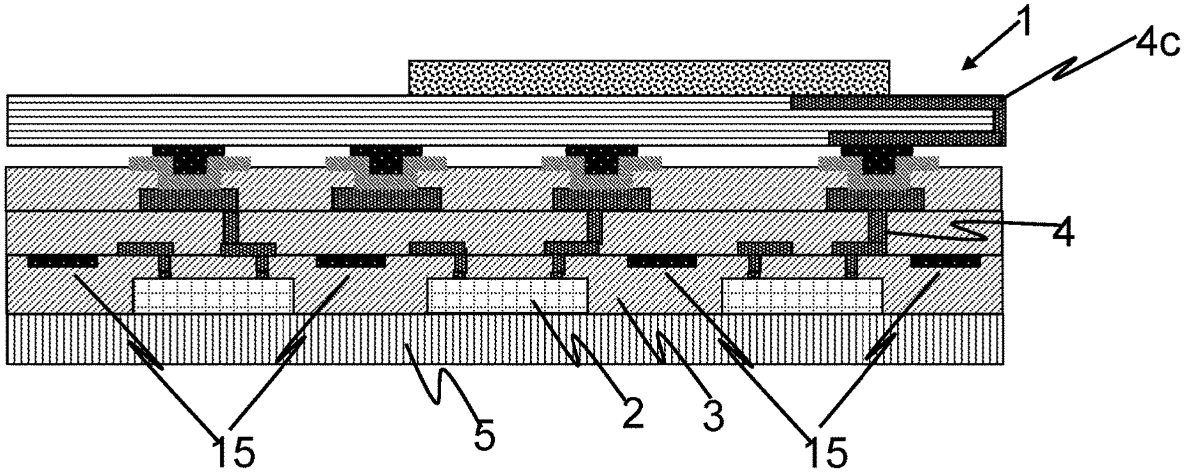

FIG. 23 This gives a frontal sectional view of an embodiment of the display according to the present invention that has reflecting films.

Figure 24:
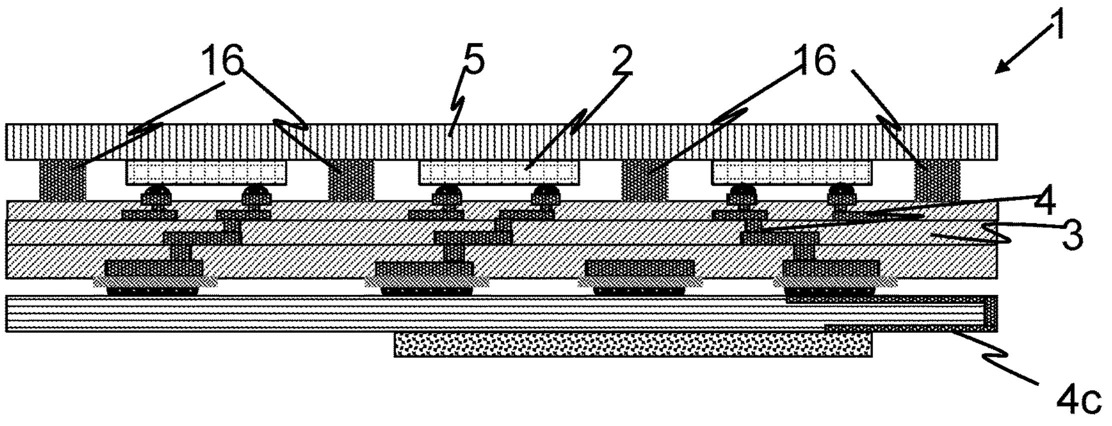

FIG. 24 This gives a frontal sectional view of another embodiment of the display according to the present invention that has partition walls.

Figure 25:
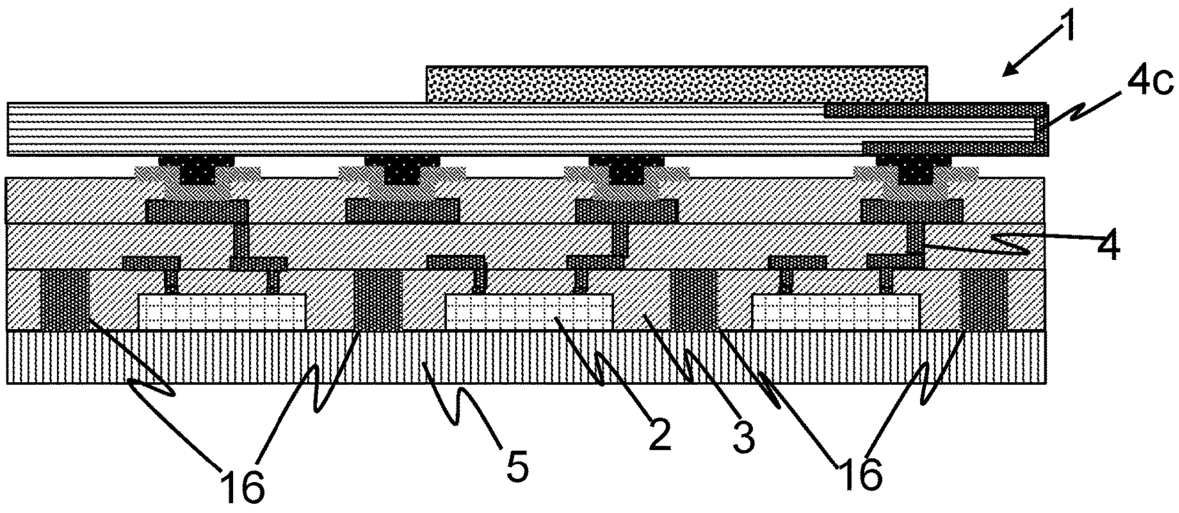

FIG. 25 This gives a frontal sectional view of an embodiment of the display according to the present invention that has partition walls in the cured film.

Figure 26:
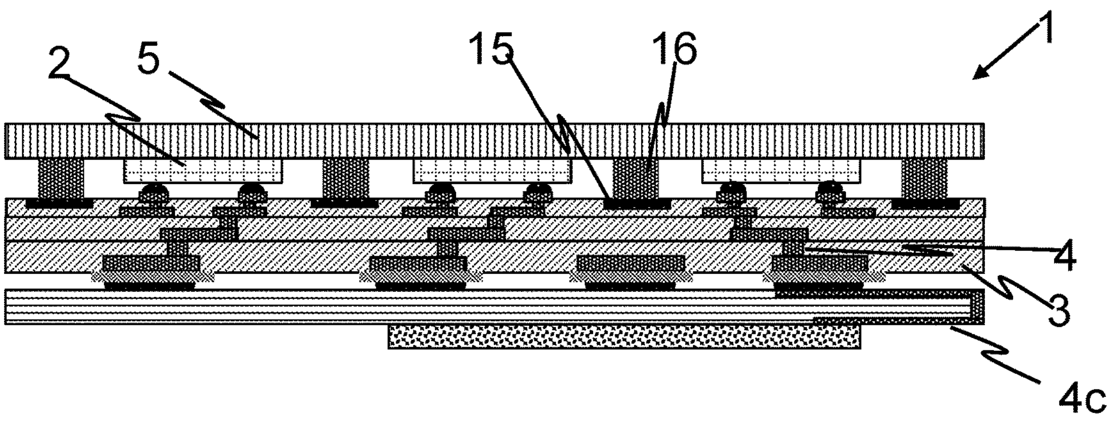

FIG. 26 This gives a frontal sectional view of another embodiment of the display according to the present invention that has reflecting films and partition walls.

Figure 27:
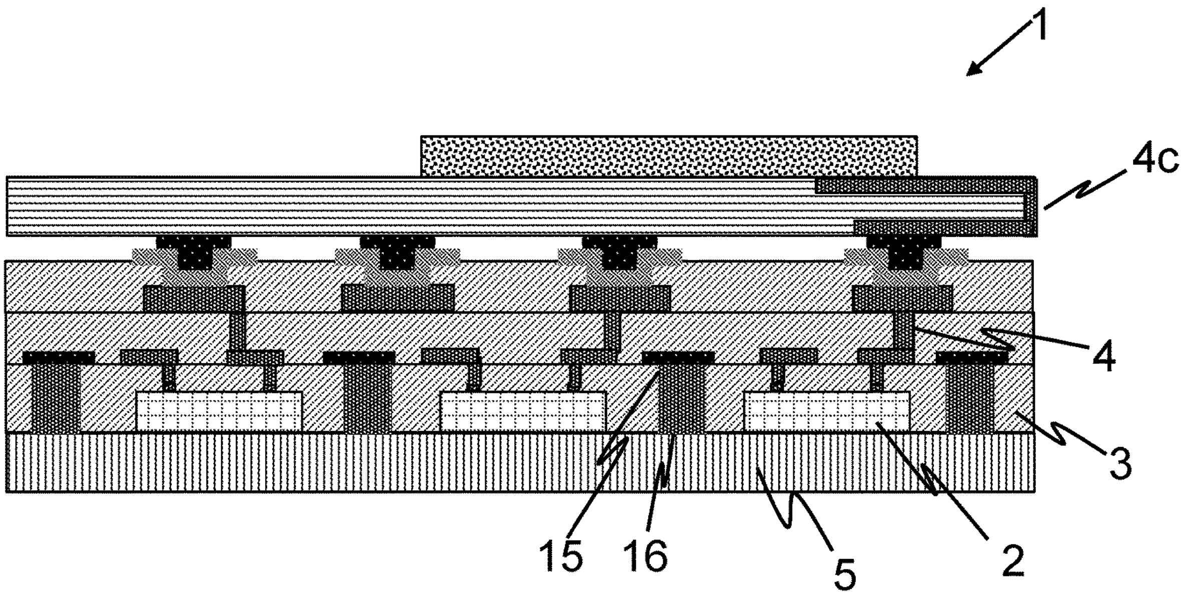

FIG. 27 This gives a frontal sectional view of an embodiment of the display according to the present invention that has partition walls in the cured film and also has reflecting films formed thereon.

Figure 28:
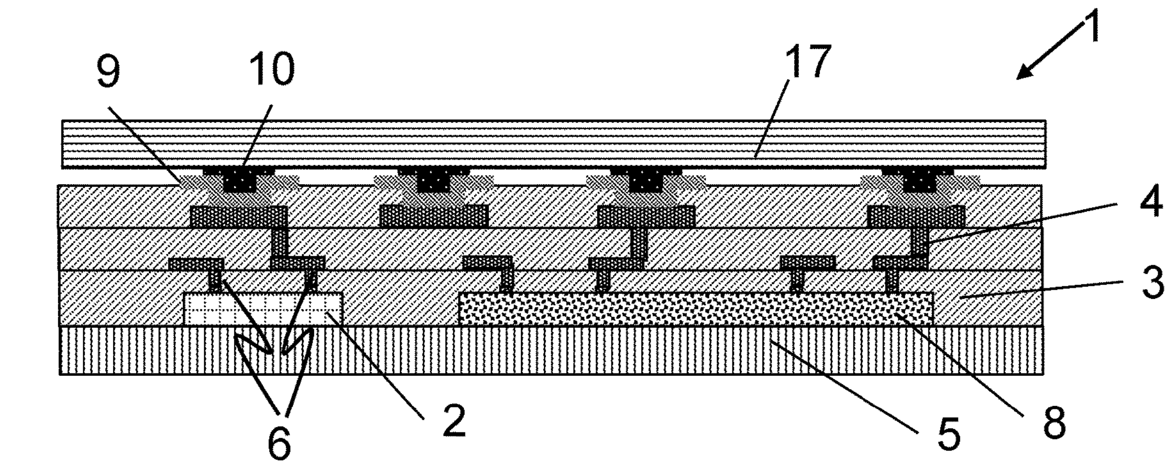

FIG. 28 This gives a frontal sectional view of an embodiment of the display according to the present invention that has a structure in which a drive element exists in the cured film.

Figure 29:
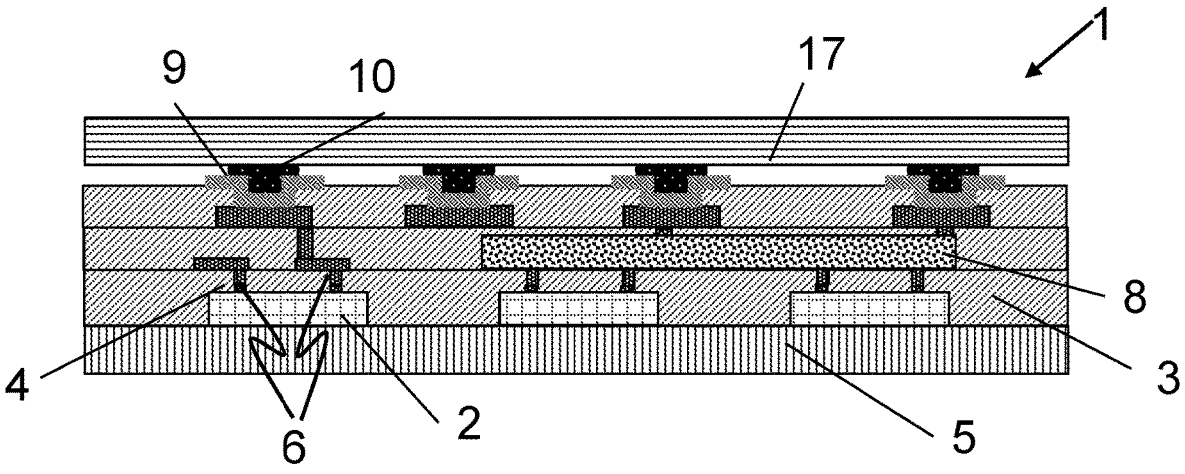

FIG. 29 This gives a frontal sectional view of an embodiment of the display according to the present invention that has another structure in which a drive element exists in the cured film.

Figure 30:
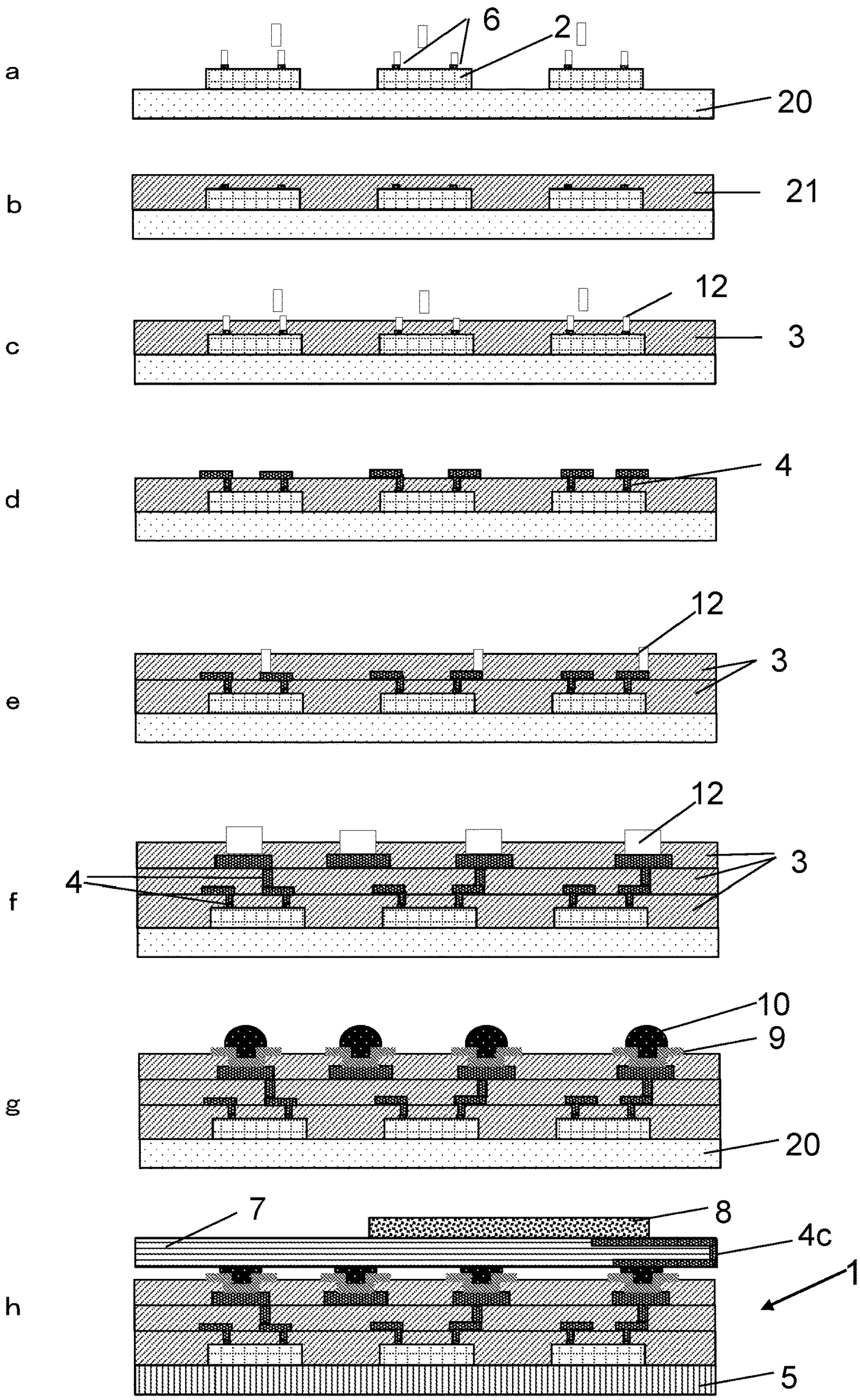

FIG. 30 This gives a cross-sectional view of a production process for an embodiment of the display according to the present invention.

Figure 31:
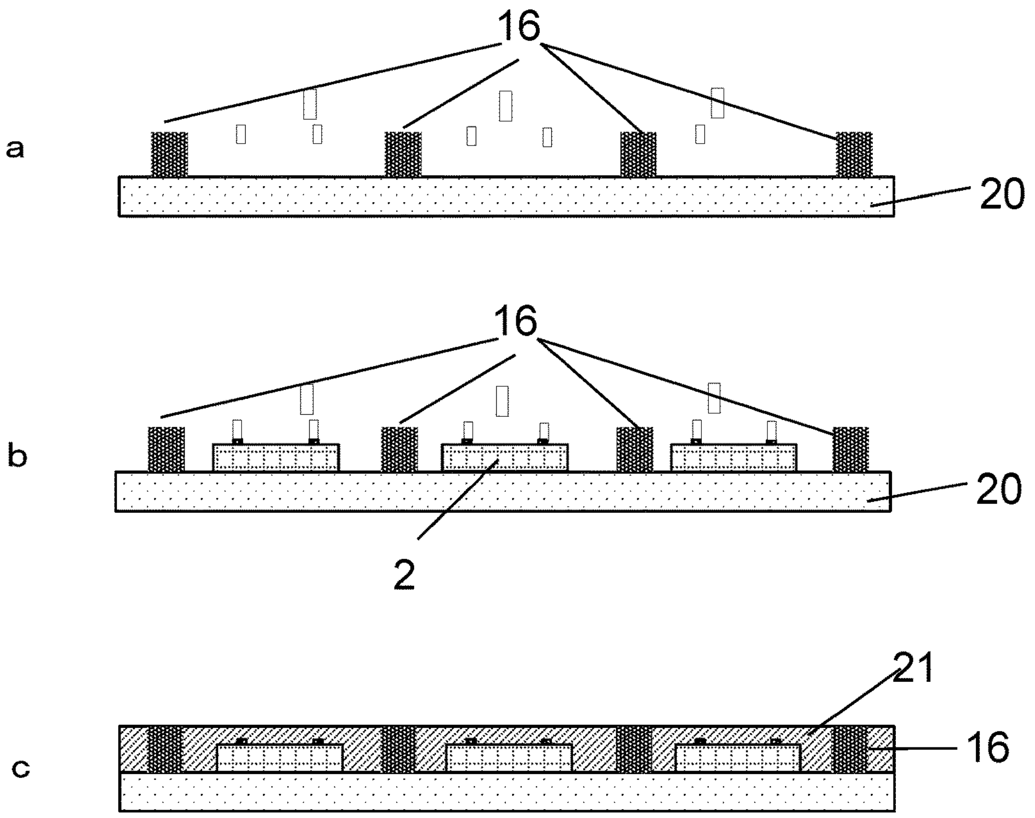

FIG. 31 This gives a cross-sectional view of a production process for an embodiment of the display according to the present invention that has partition walls.

Figure 32:
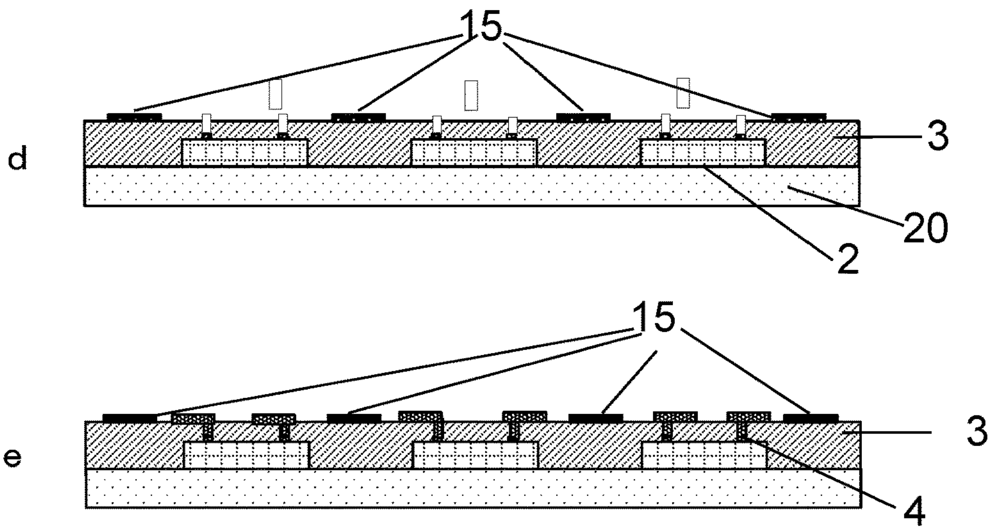

FIG. 32 This gives a cross-sectional view of a production process for an embodiment of the display according to the present invention that has reflecting films.

Figure 33:
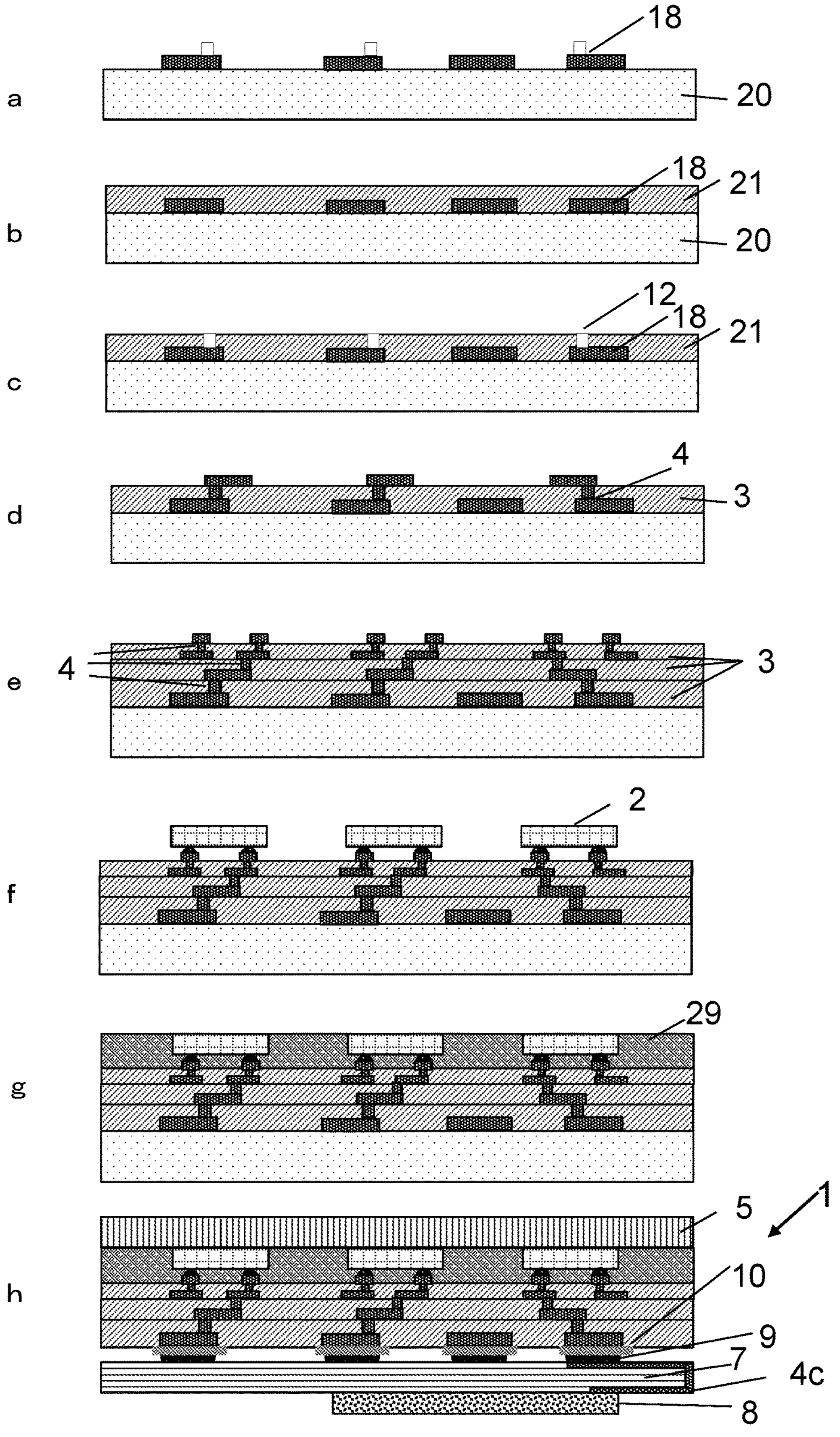

FIG. 33 This gives a cross-sectional view of a production process for another aspect of the display according to the present invention.

Figure 34:
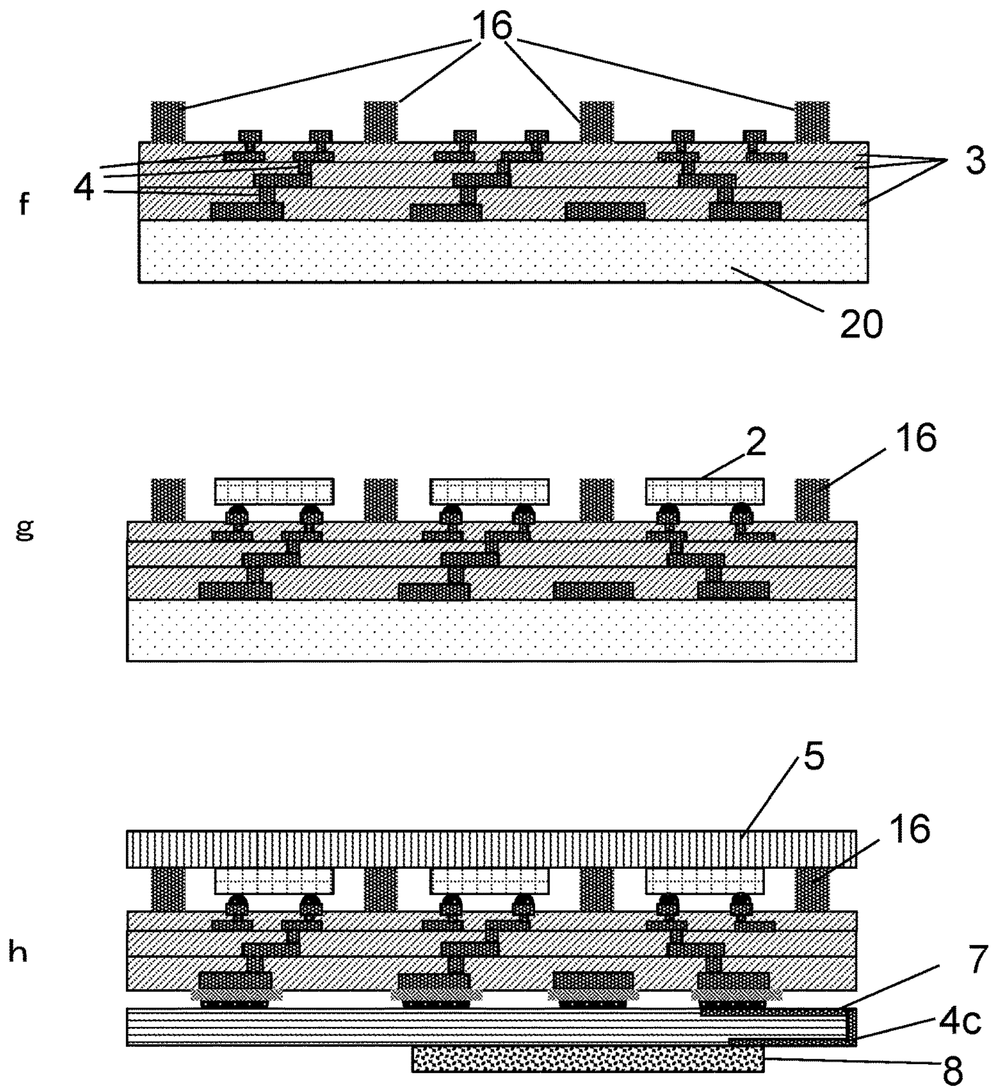

FIG. 34 This gives a cross-sectional view of a production process for another aspect of the display according to the present invention that has partition walls.

Figure 35:
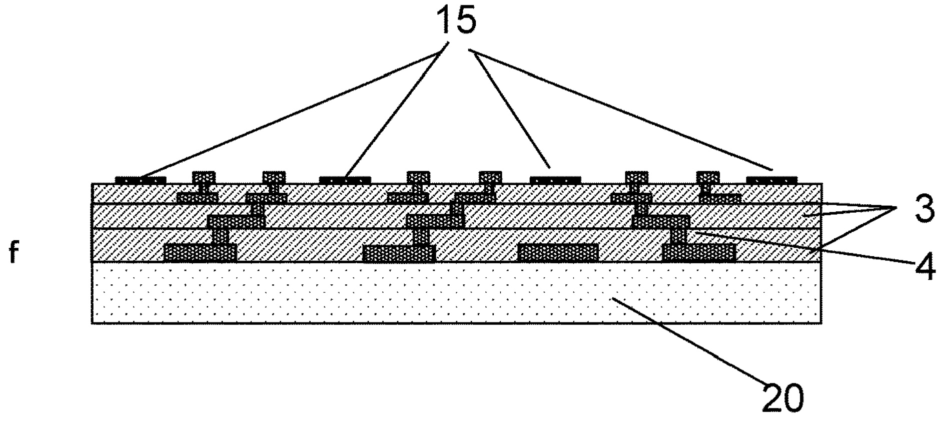

FIG. 35 This gives a cross-sectional view of a production process for another aspect of the display according to the present invention that has reflecting films.

Figure 36:
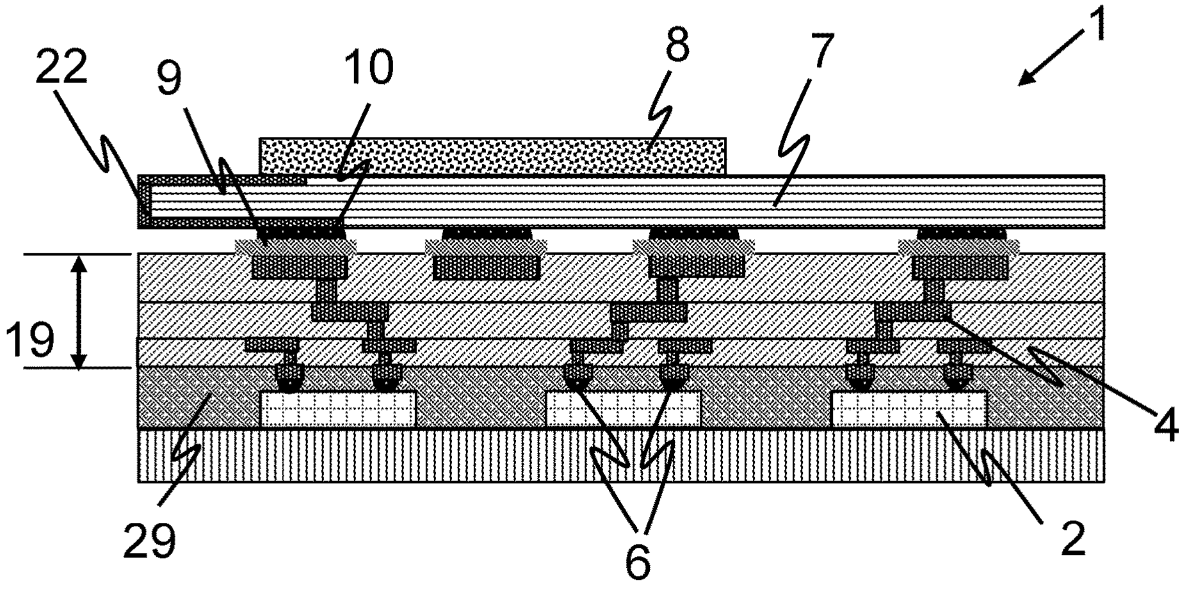

FIG. 36 This gives a frontal sectional view of an embodiment of the display according to the present invention that has a cured film. The first and second embodiments of the present invention are as follows.

Figure 37:
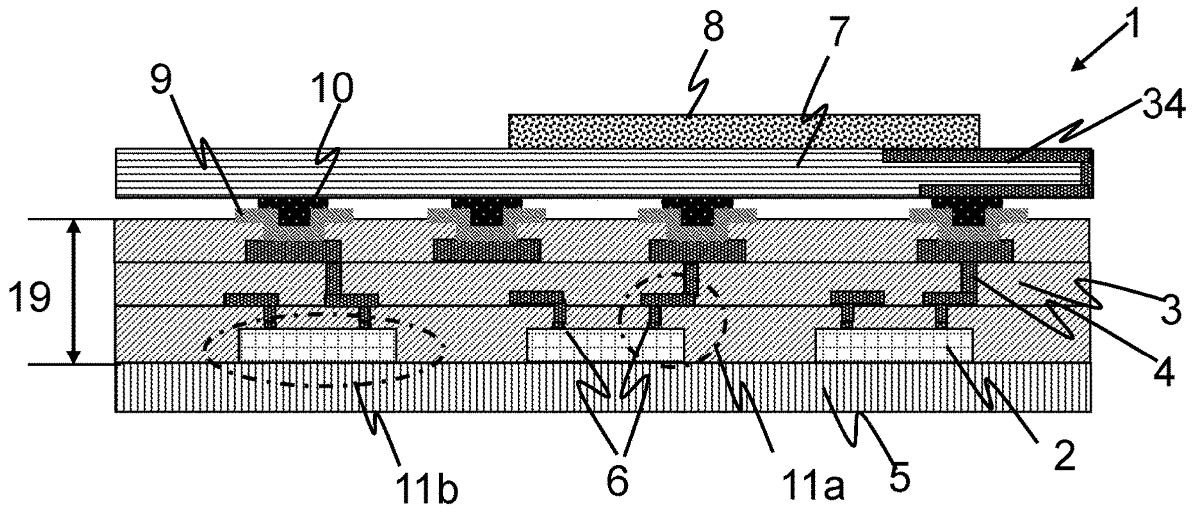

FIG. 37 This gives a frontal sectional view of an embodiment of the display according to the present invention that has an electrically conductive film.

Figure 38:
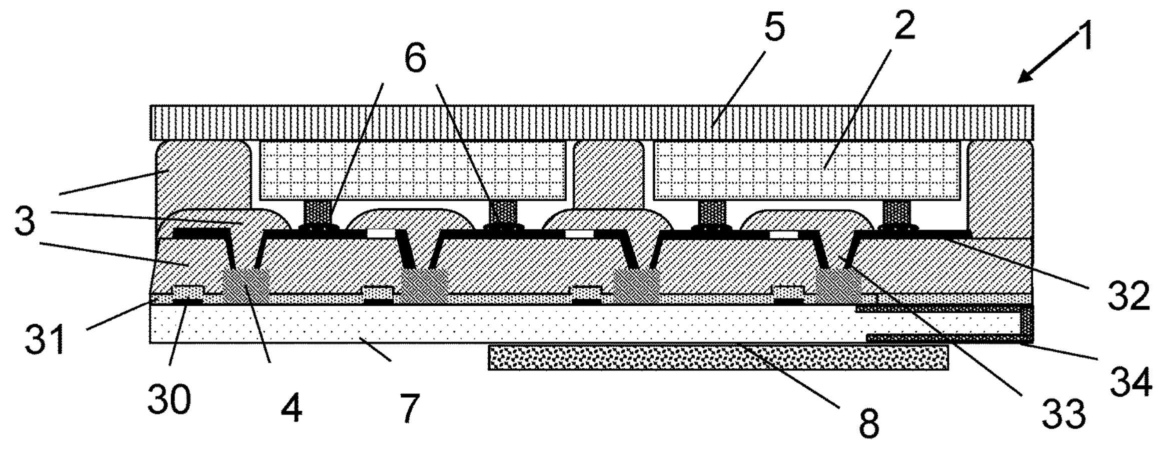

FIG. 38 This gives a frontal sectional view of another embodiment of the display according to the present invention that has an electrically conductive film.

Figure 39:
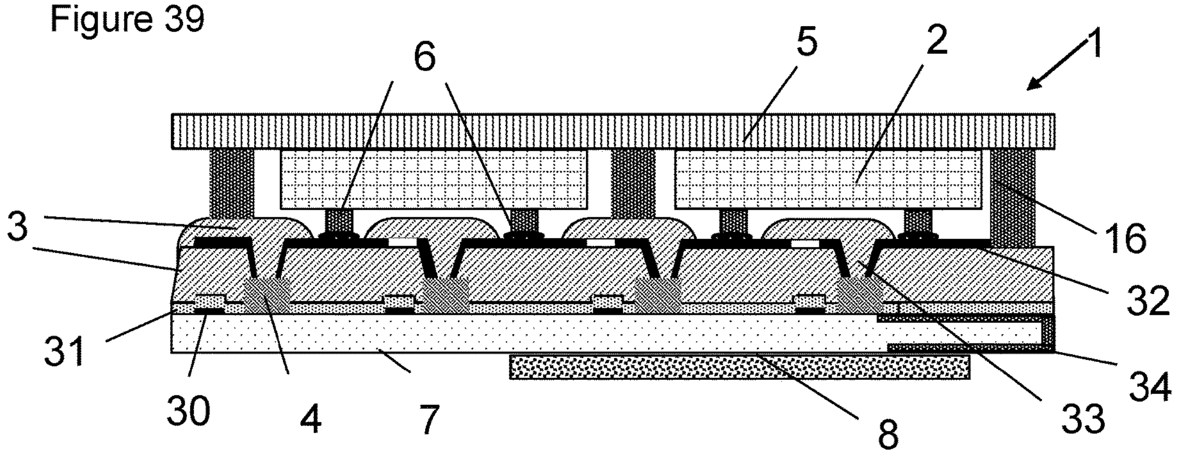

FIG. 39 This gives a frontal sectional view of another embodiment of the display according to the present invention that has an electrically conductive film.

Figure 40:
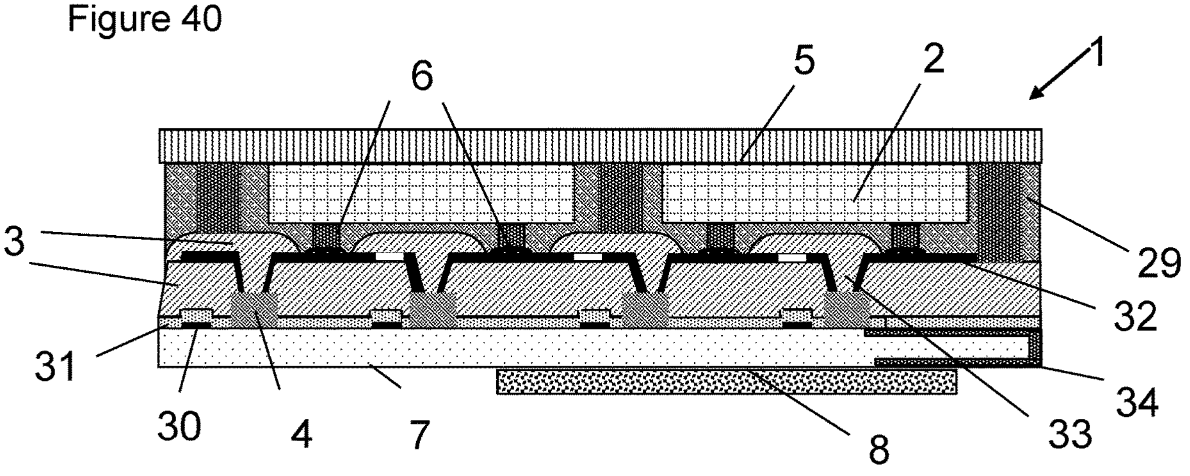

FIG. 40 This gives a frontal sectional view of another embodiment of the display according to the present invention that has an electrically conductive film.

Figure 41:
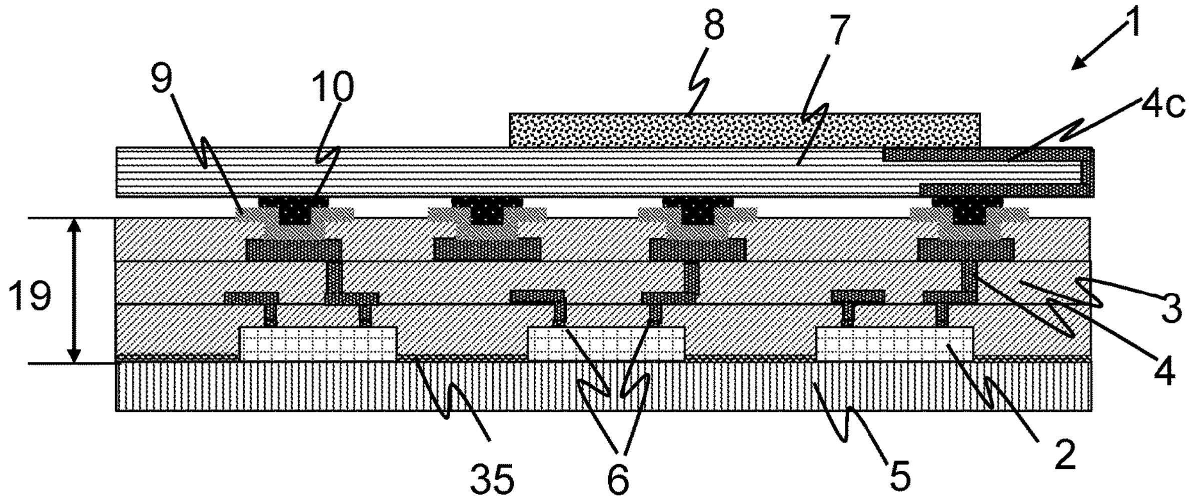

FIG. 41 This gives a frontal sectional view of an embodiment of the display according to the present invention that has shading layers.

Figure 42:
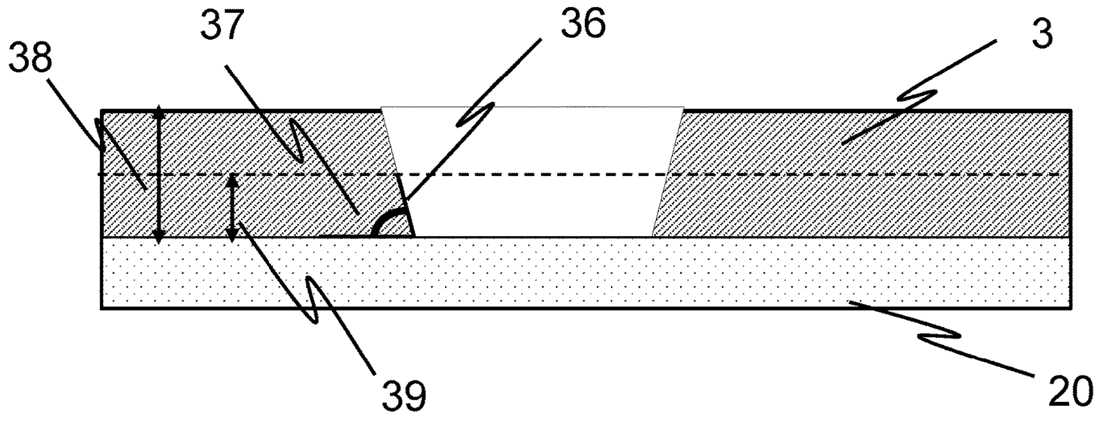

FIG. 42 This gives a frontal sectional view of a hole pattern in the cured film.

Figure 43:
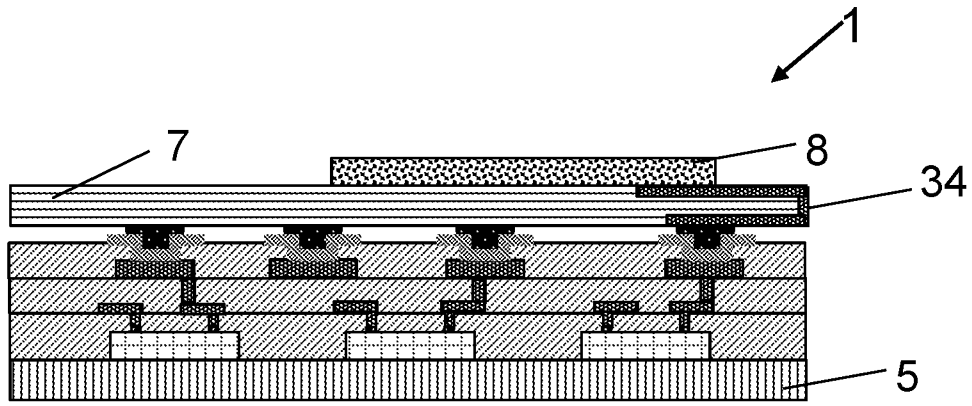

FIG. 43 This gives a cross-sectional view of a production process for an embodiment of the display according to the present invention that has an electrically conductive film.

Figure 44:
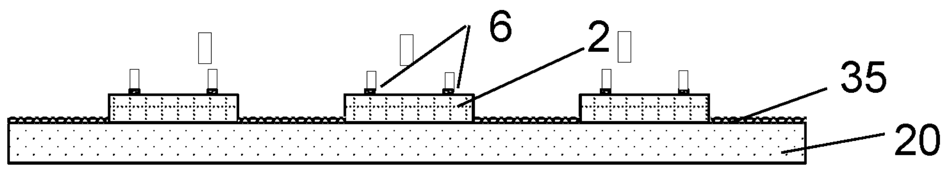

FIG. 44 This gives a cross-sectional view of a production process for an embodiment of the display according to the present invention that has shading layers.

Figure 45:
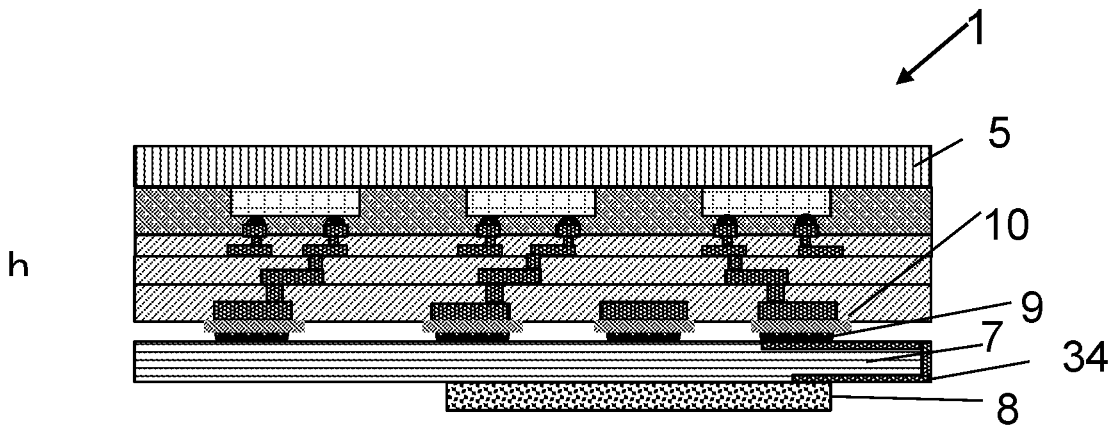

FIG. 45 This gives a cross-sectional view of a production process for another example of the display according to the present invention that has an electrically conduction film.

Figure 46:
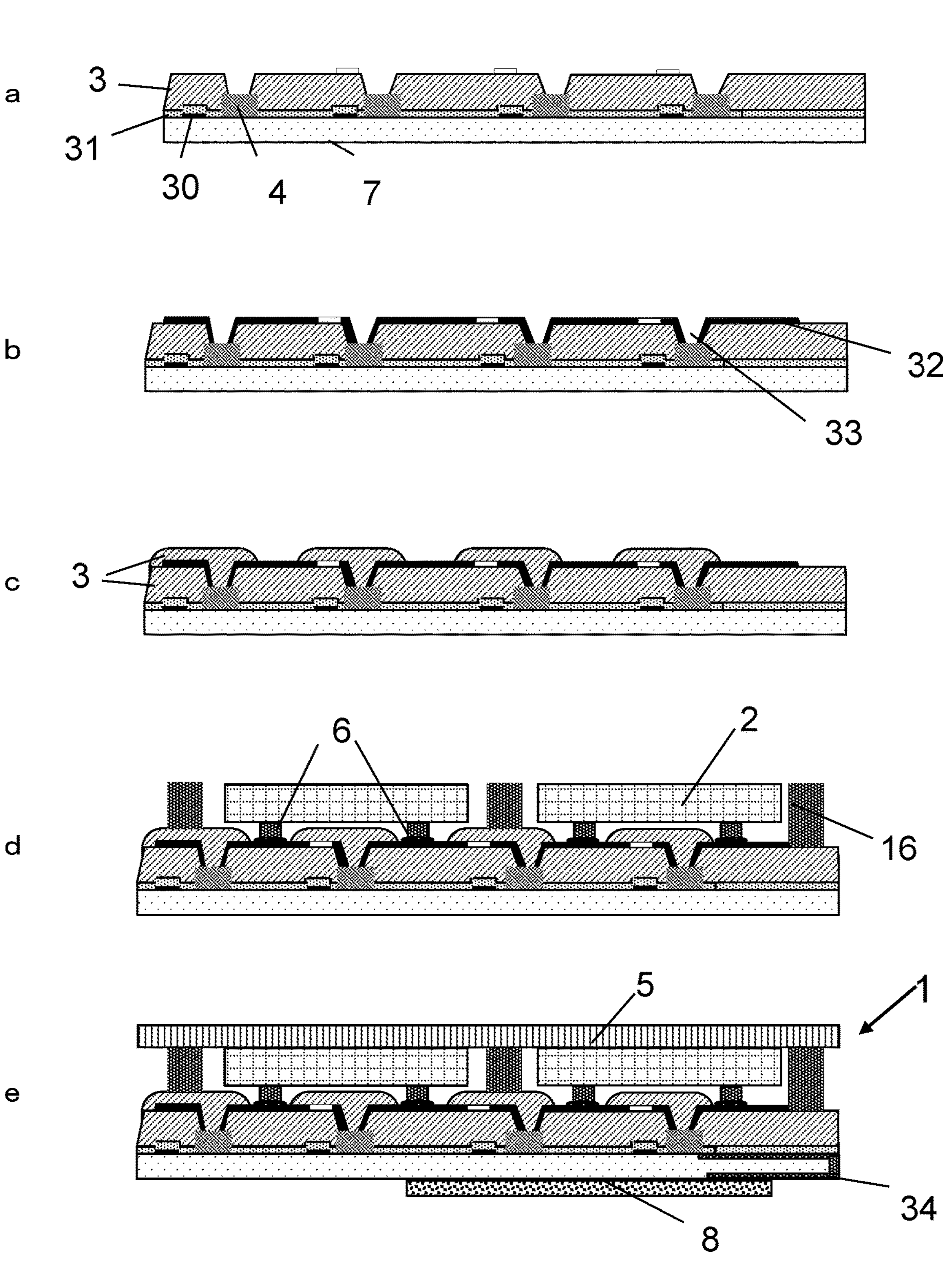

FIG. 46 This gives a cross-sectional view of a production process for another example of the display according to the present invention.

Figure 47:
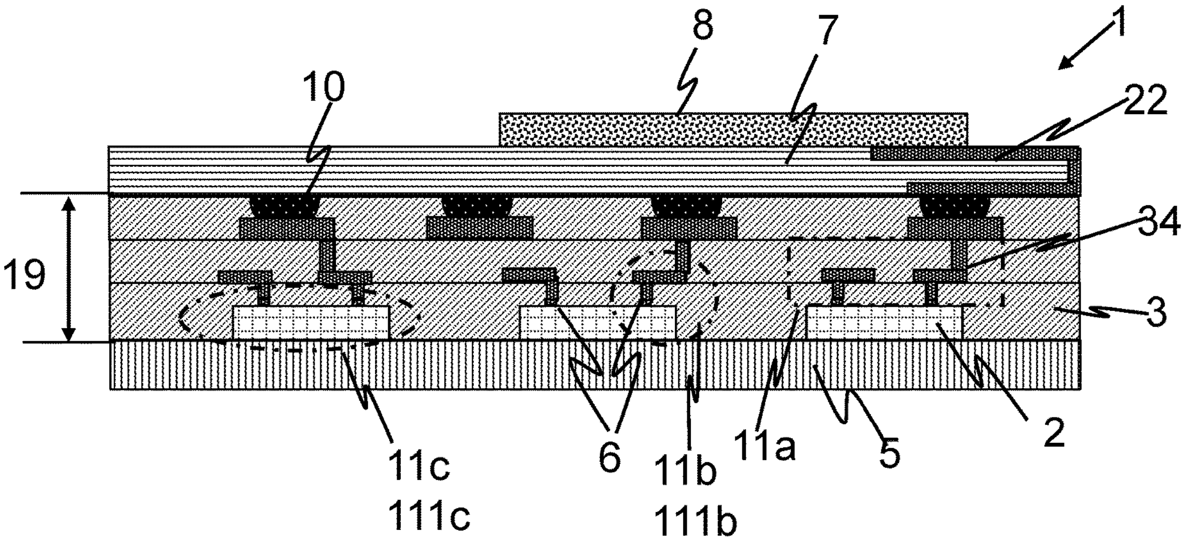

FIG. 47 This gives a frontal sectional view of another embodiment of the display according to the present invention that has an electrically conductive film.

Figure 48:
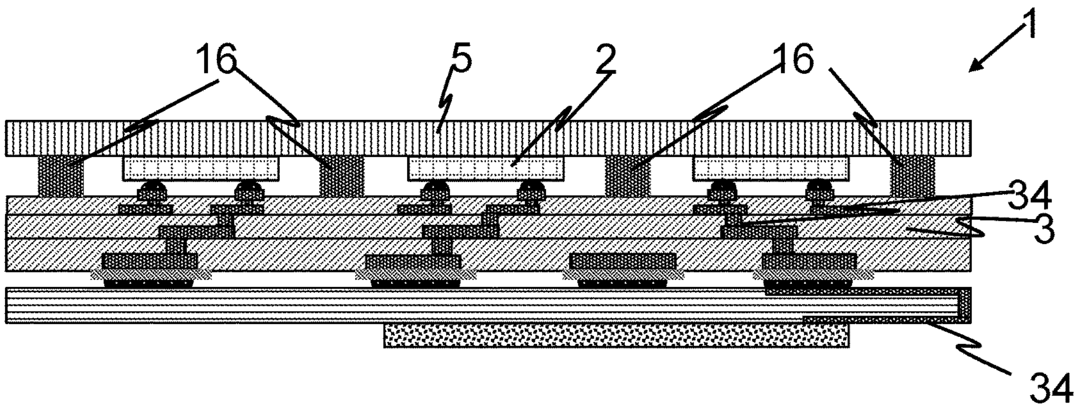

FIG. 48 This gives a frontal sectional view of another embodiment of the display according to the present invention that has an electrically conductive film.

Figure 49:
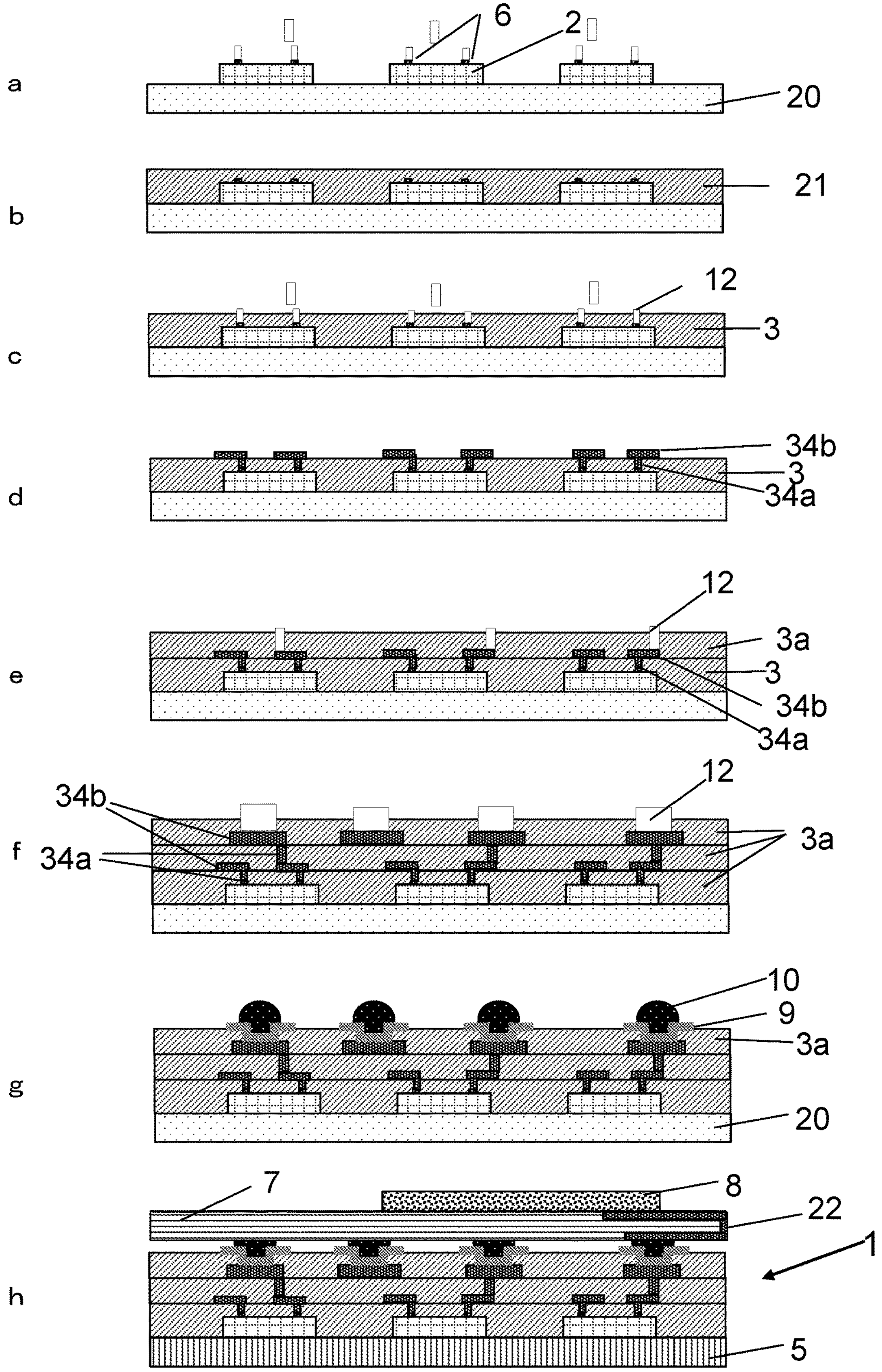

FIG. 49 This gives a cross-sectional view of another example of the production process for the display according to the present invention that has an electrically conductive film.

Figure 50:
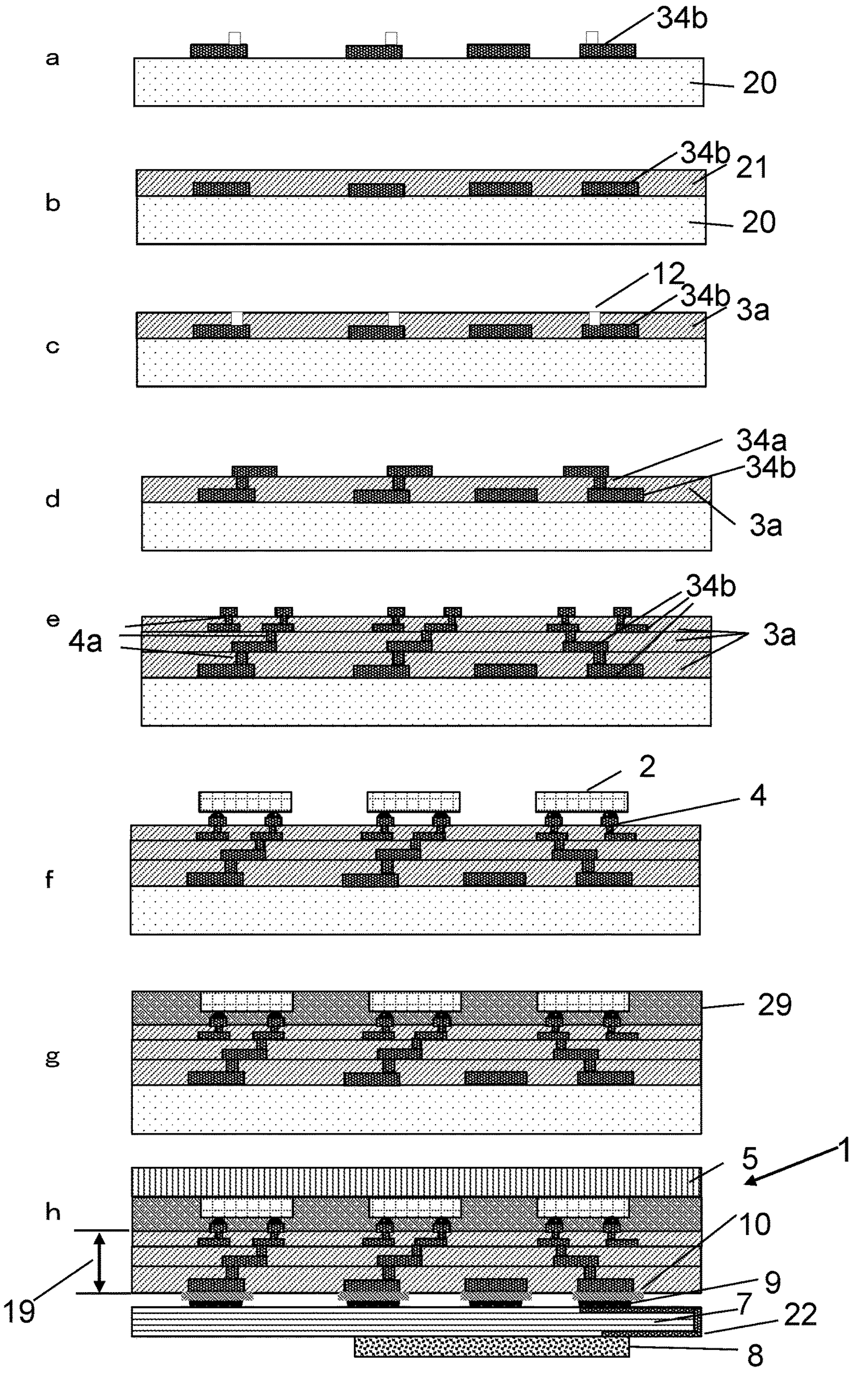

FIG. 50 This gives a cross-sectional view of another example of the production process for the display according to the present invention that has an electrically conductive film.

Figure 51:
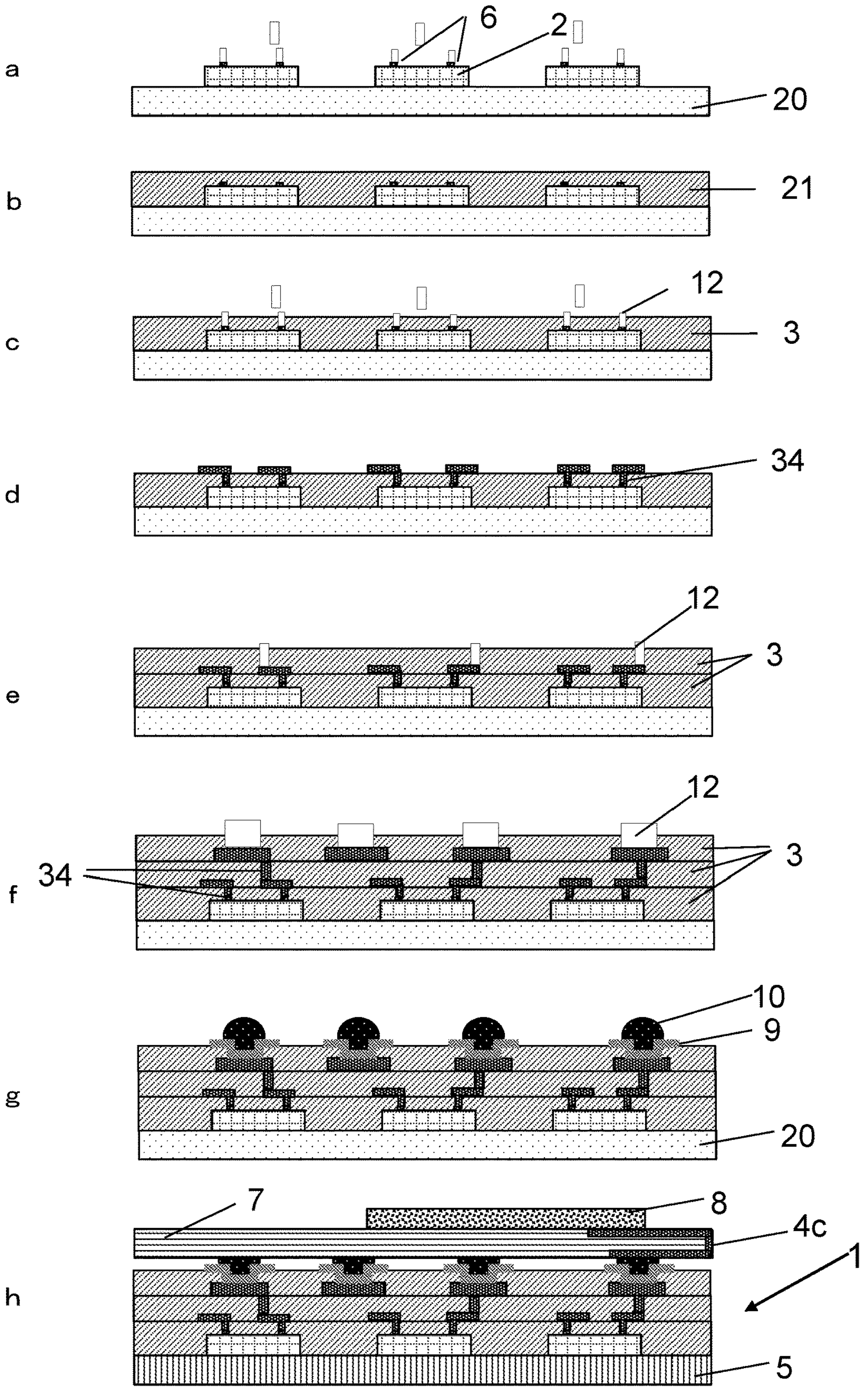

FIG. 51 This gives a cross-sectional view of another example of the production process for the display according to the present invention that has an electrically conductive film.

Figure 52:
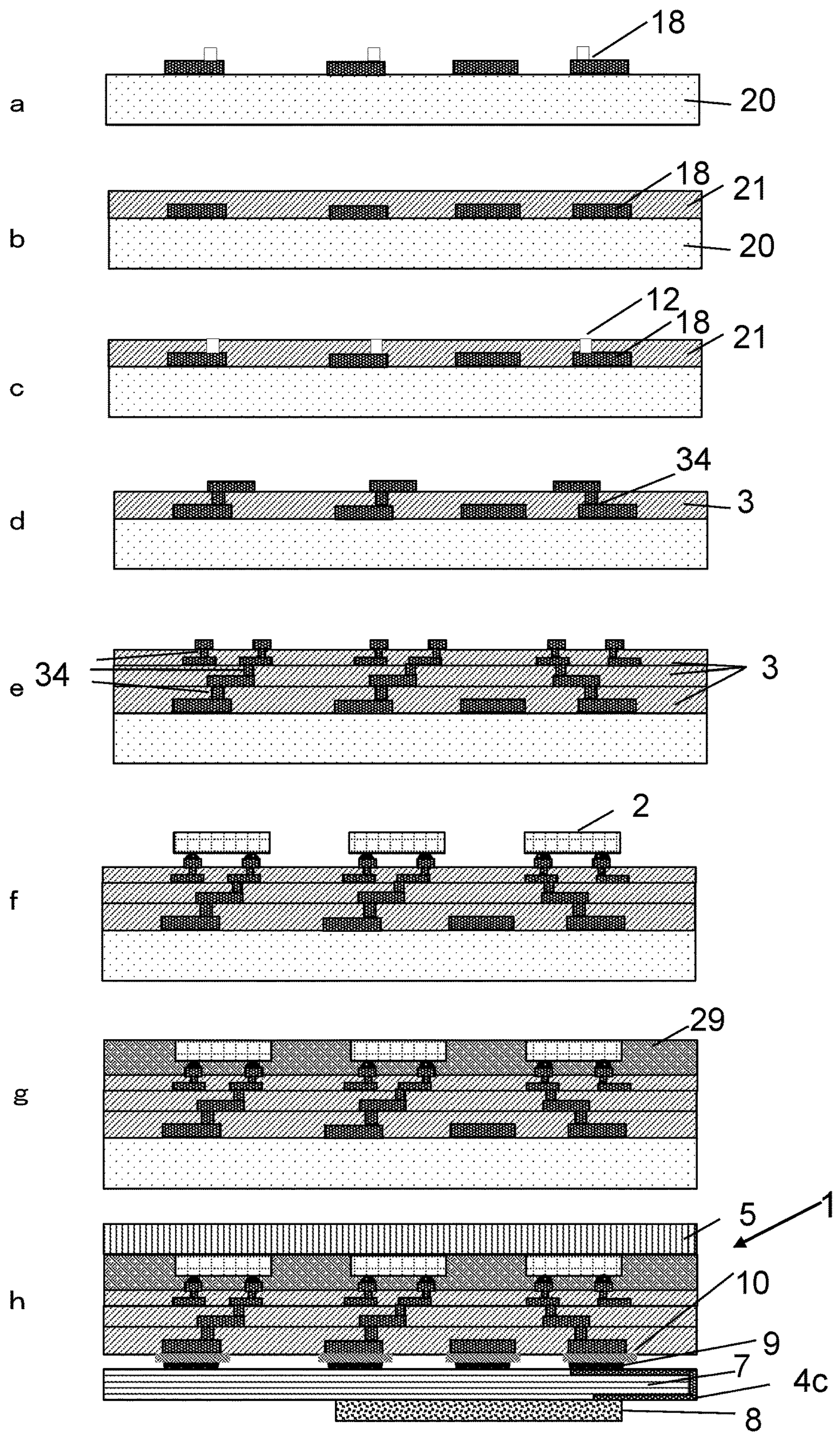

FIG. 52 This gives a cross-sectional view of another example of the production process for the display according to the present invention that has an electrically conductive film.

DESCRIPTION OF PREFERRED EMBODIMENTS

Favorable embodiments of the display according to the present invention will be described in more detail below, but it should be noted that the present invention is not limited to the embodiments described below and may be modified appropriately to suit particular objectives and purposes.

There are two major embodiments of the present invention.

The first embodiment of the display according to the present invention includes at least metal wires, a cured film, and a plurality of light emitting elements, each of the light emitting elements having a pair of electrode terminals on one face thereof, the pair of electrode terminals being connected to the plurality of metal wires extending in the cured film, the plurality of metal wires being electrically insulated by the cured film, the metal wires having a plurality of metal wires (K1) extending in the cured film in the thickness direction and also having a plurality of metal wires (K2) extending in the cured film in the planar direction perpendicular to the thickness direction and connected to the metal wires (K1), the cured film being a film formed by curing a resin composition containing a resin (A), the cured film being in contact with part of the surface of the metal wires (K2), at least a region (G) in which the conductor spacing H1 (in the unit of μm, hereinafter omitted occasionally) between mutually adjacent metal wires (K2) is 1 to 20 μm being present in the display, and the relations H3/H2=1.4 to 4.0 and P (%)=70% to 99% holding wherein H2 (in the unit of μm, hereinafter omitted occasionally) is the thickness of the metal wires (K2) in the region (G), H3 (in the unit of μm, hereinafter omitted occasionally) the thickness of the cured film (F1), H4 (in the unit of μm, hereinafter omitted occasionally) the depth of the depression formed in the region (G) of the cured film (F1), and P (%) the depressed surface planarization rate represented by the formula (1):

$$P\ (\%)=(1-(H4/H2))\times 100 \qquad \text{formula (1)}$$

The display according to the first embodiment of the present invention is described below with reference to FIG. 1 that illustrates an example of the embodiment.

Here, in order to clearly define relevant members, the metal wires 4 extending in the cured film 3 in the thickness direction will be referred to as the metal wires (K1)4*a*, and the metal wires 4 connected to the metal wires (K1) and extending in the cured film 3 in the planar direction perpendicular to the thickness direction will be referred to as the metal wires (K2)4*b*. In the cured film 3, furthermore, the cured film 3 that contains the metal wires (K2)4*b* will be referred to as the cured film (F1)3*a*.

Figure 1:
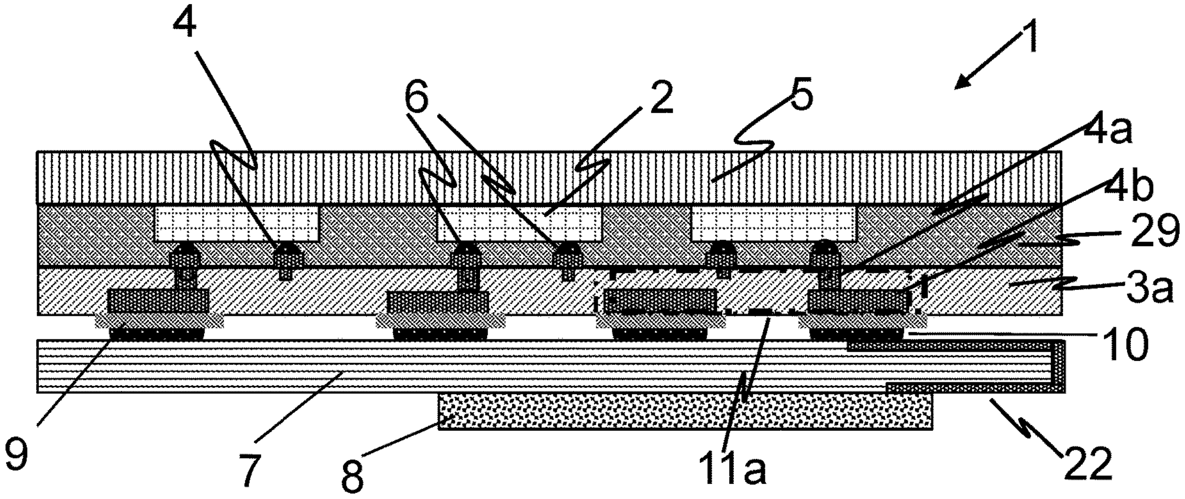
FIG. 1 This gives a frontal sectional view of an embodiment of the display according to the present invention.

In FIG. 1, the display 1 has a cured film (F1)3*a* that contains metal wires (K2)4*b*. Each of the light emitting elements 2 has a pair of electrode terminals 6 on the face opposed to the other face that is in contact with an opposite substrate 5, and each of the electrode terminals 6 is connected with a metal wire 4. The metal wires 4 are electrically connected to the metal wires (K1)4*a* extending in the thickness direction of the cured film (F1)3*a* and the metal wires (K2)4*b*. The plurality of metal wires (K1)4*a* and (K2)4*b* that extend in the cured film (F1)3*a* is surrounded by the cured film (F1)3*a* and the cured film (F1)3*a* is acting as an insulation film so that the metal wires (K1)4*a* and (K2)4*b* are electrically insulated from each other by the cured film (F1)3*a*. Thus electrical insulation of metal wires is maintained in this structure, and it means that those portions of the metal wires which require electrical insulation are covered by the cured film, which is formed by curing a resin composition containing the resin (A).

A cured film 29 is disposed so that it is in contact with at least part of the light emitting elements 2 and an opposite substrate 5 is disposed so that it is in contact with the light emitting elements 2 and the cured film 29. The cured film (F1)3*a* in the embodiment shown in FIG. 1 has a monolayer structure, but it may contain a plurality of stacked cured film layers (F1)3*a* each containing metal wires (K2)4*b*. In the embodiment shown in FIG. 1, furthermore, the light emitting elements 2 are electrically connected through the metal wires (K1)4*a*, metal wires (K2)4*b*, and metal wires 22 to the drive element 8 that is added to the light emitting element driving substrate 7 located at an opposed position to the opposite substrate 5, thereby serving to control the light emission from the light emitting elements 2. In addition, the light emitting element driving substrate 7 is electrically connected to the metal wires (K1)4*a* and the metal wires (K2)4*b* through, for example, solder bumps 10. Barrier metal 9 may be provided additionally in order to prevent the diffusion of metal from the metal wires 4, metal wires (K2)4*b*, etc. It should be noted that in all diagrams given here and hereafter, the metal wires 22 may permeate the light emitting element driving substrate 7 to achieve connection to the drive element 8. After the formation of the metal wires 4*b* and the cured film 3*a* on the support substrate, the support substrate may be removed, followed by attaching solder bumps 10 and a light emitting element driving substrate 7. These steps will be described later.

Figure 2:
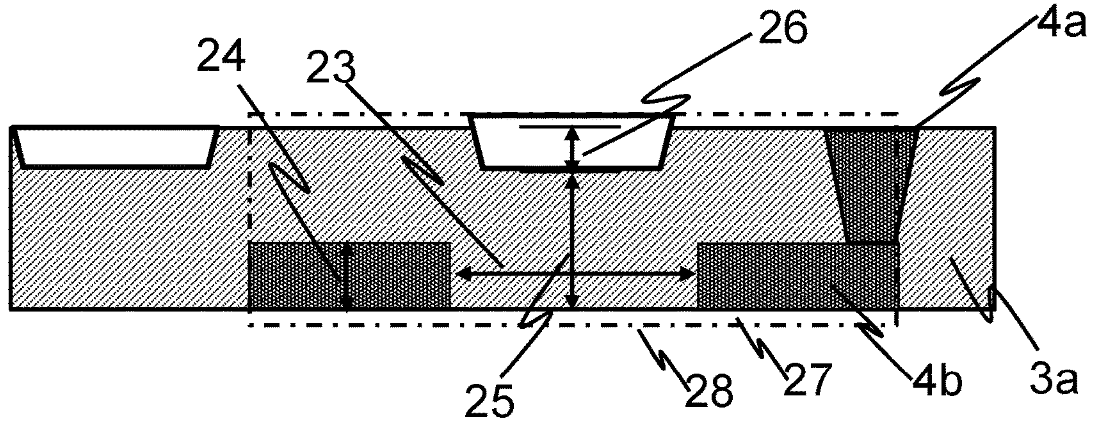
FIG. 2 This gives an enlarged frontal sectional view of the designated region A defined in FIG. 1.

Described next is the depressed surface planarization rate for the first embodiment of the present invention. FIG. 2 gives an enlarged frontal sectional view showing a designated region A11*a* defined in FIG. 1. In this structure, the cured film (F1)3*a* is disposed so that it contains the metal wires (K2)4*b*, and the metal wires 4 has the metal wires (K1)4*a* that extend in the cured film (F1)3*a* in the thickness direction of the cured film (F1)3*a* and the metal wires (K2)4*b* that extend in the planar direction perpendicular to the thickness direction of the cured film (F1)3*a* and is connected to the metal wires (K1).

The display according to the first embodiment of the present invention at least has a region (G) 28 (hereinafter occasionally referred to as the region (G)) in which the conductor spacing H1 between mutually adjacent metal wires (K2)4*b* is 1 to 20 μm. The region (G) 28, which is defined by dashed-dotted lines in FIG. 2, is a region of the cured film (F1)3*a* that exists above and between the metal wires (K2)4*b*, which are mutually spaced at intervals of the conductor spacing H1, when looked at in such a manner that the metal wires (K2)4*b* are disposed below the metal wires (K1)4*a* in the cured film (F1)3*a* that contains the metal wires (K2)4*b*.

When the cured film (F1)3*a* is disposed so that it contains the metal wires (K2)4*b*, a depression can be formed in some cases in the surface of the cured film (F1)3*a*. As the depth H4 of this depression increases, problems may occur more frequently during the steps for forming the wires and light emitting elements that are performed subsequently to cause wiring defects such as short circuits in wires and defective connections of light emitting elements, leading to a display that can suffer light emission failures. Therefore, if the thickness H2 of the metal wires (K2)4*b* and the depth H4 of the depression formed in the cured film (F1)3*a* are so small that the depressed surface planarization rate P represented by the formula 1 is in the range of 70% to 99%, it serves to reduce wiring defects such as short circuits in wires and defective connections of light emitting elements, thus leading to a display with a decreased light emission failure rate. If the depressed surface planarization rate P is less than 70%, the depressed surface will not have a sufficiently high flatness and it is likely to cause wiring defects such as short circuits in wires and defective connections of light emitting elements, leading to frequent occurrence of light emission failures. The depressed surface planarization rate P is preferably 75% to 99%, more preferably 80% to 99%, and still more preferably 90% to 97%.

Here, in the depressed surface planarization rate P, the depth H4 of the depression is defined as the maximum depth that is located between mutually adjacent metal wires (K2) spaced at intervals of the conductor spacing H1 in the upper part of the cured film (F1). The depression depth H4 is illustrated in FIG. 2.

To determine the depth H4 of the depression in the cured film (F1), it may be good to examine the cross section of the relevant region G of the display. In the case where a plurality of cured film layers (F1) is formed, it may be good to examine the relevant region G of any cured film layer (F1) when it is formed.

For the thickness H2 of the metal wires (K2) and the thickness H3 of the cured film (F1), the H3/H2 ratio is in the range of 1.4 to 4.0.

The thickness H2 of the metal wires (K2) means the thickness measured at the width center of the metal wire (K2) in an appropriately selected region (G).

The thickness H3 of the cured film (F1) means the thickness of the cured film (F1) at the position where the depth of the depression is H4.

To determine the thickness H2 of the metal wires (K2)4*b* and the thickness H3 of the cured film (F1), it may be good to examine the cross section at the relevant position in the display. In the case where a plurality of cured film layers (F1) is formed, it may be good to examine the cross section at the relevant position in any cured film layer (F1) when it is formed.

Thus, it can work also as an insulation film or protective film for appropriate metal wires to prevent a significant depression from occurring when forming a layered structure involving the cured film, metal wires, and light emitting elements, which helps to reduce wiring defects such as short circuits in wires and defective connections of light emitting elements, thus serving to produce a display with a decreased light emission failure rate. If the H3/H2 ratio is less than 1.4, it may be too small in some cases to decrease the depression sufficiently, whereas if the H3/H2 ratio is more than 4.0, it leads in some cases to a failure in realizing a decrease in the height of the display itself, shortening of the wire length that can serve for preventing wiring defects such as short circuits in wires, suppression of loss reduction, and improvement in high speed response. The H3/H2 ratio is preferably 1.6 to 3.5, and more preferably 1.8 to 3.0.

The cured film 3 is a film formed by curing a resin composition containing the resin (A).

There are no specific limitations on the material used in the metal wires 4, and a generally known material may be adopted. Examples thereof include gold, silver, copper, aluminum, nickel, titanium, molybdenum, and alloys containing them, of which copper is preferable. Here, the metal wires 4 may include the electrodes therein.

The cured film 29 may be a cured film formed by curing a resin composition or a resin sheet containing the resin (A) or may be of a material other than a cured film formed by curing a resin composition or a resin sheet containing the resin (A), and as that material, a generally known one such as epoxy resin, silicone resin, and fluorine resin may be used.

Figure 3:
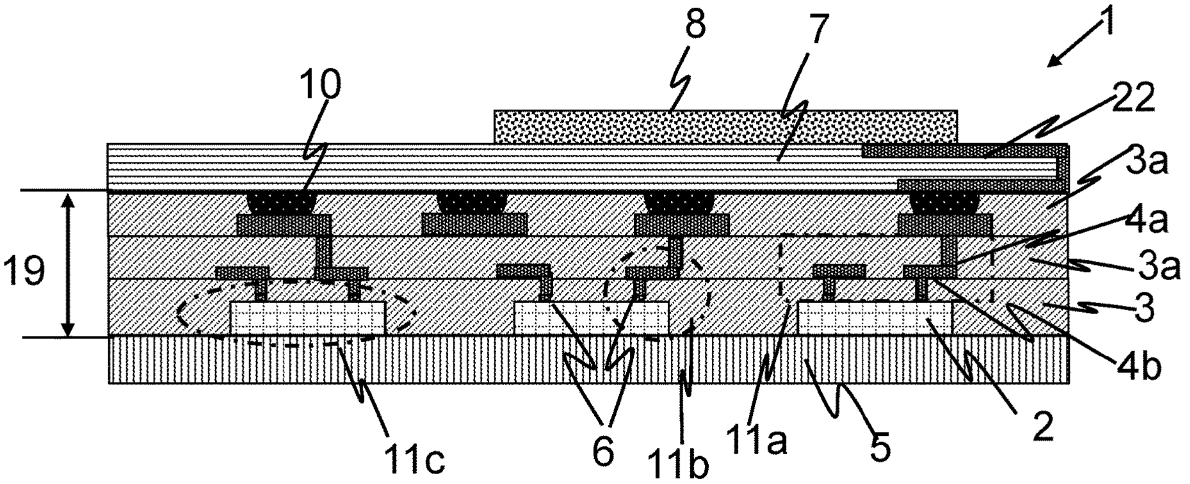
FIG. 3 This gives a frontal sectional view of another embodiment of the display according to the present invention.

Another embodiment is given in FIG. 3. FIG. 3 shows a display 1 that has a plurality of light emitting elements 2 arranged on an opposite substrate 5 and a cured film 3 formed on the light emitting elements 2. The term "formed on the light emitting elements" means that the film exists at least either on the surface of the light emitting elements or above the support substrate or the light emitting elements. In the embodiment illustrated in FIG. 3, a cured film 3 is disposed in such a manner that it is in contact with at least part of the light emitting elements 2, and a plurality of additional cured film layers (F1)3*a* is formed on top of it to form a structure containing a total of three layers, although the embodiment is not limited thereto. Each of the light emitting elements 2 has a pair of electrode terminals 6 on the face opposed to the other face that is in contact with the opposite substrate 5, and each of the electrode terminals 6 is connected with the metal wires (K1)4*a* and the metal wires (K2)4*b* that extend in the cured film (F1)3*a*. Here, the plurality of metal wires (K1)4*a* and metal wires (K2)4*b* that extend in the cured film (F1)3*a* are surrounded by the cured film (F1)3*a* and the cured film (F1)3*a* is also acting as an insulation film to maintain electrical insulation. As compared with the embodiment illustrated in FIG. 1, the positional arrangement of the light emitting elements is reversed in the vertical direction.

Figure 4:
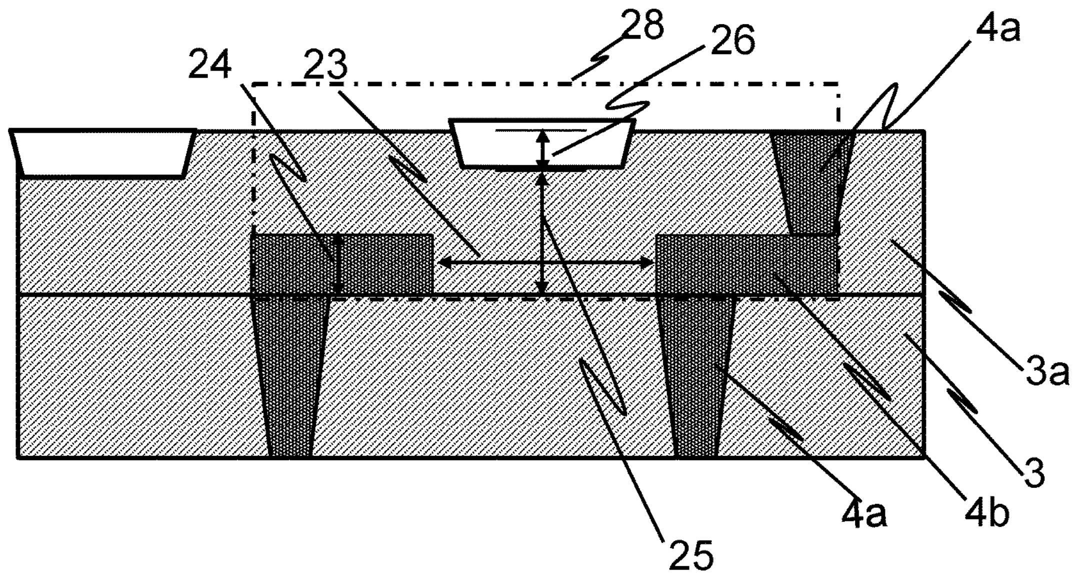
FIG. 4 This gives an enlarged frontal sectional view of the designated region A defined in FIG. 3.

FIG. 4 gives an enlarged frontal sectional view of the designated region A defined in FIG. 3. The constituent members are the same as in FIG. 2.

For the present invention, it is preferable for the metal wires (K2) to have a thickness H2 of 1.5 to 10 μm.

This serves to decrease the wiring resistance and ensures a decrease in wiring delay. Since the H3/H2 ratio is 1.4 to 4.0, furthermore, a cured film having a sufficient thickness can be formed to prevent a significant depression from occurring when forming a layered structure involving the cured film, metal wires, and light emitting elements, which helps to reduce wiring defects such as short circuits in wires and defective connections of light emitting elements, thus serving to produce a display with a decreased light emission failure rate. If the thickness H2 of the metal wires (K2) is less than 1.5 μm, it is likely to cause an increased wiring resistance and frequent delays, whereas if the thickness H2 of the metal wires (K2) is more than 10 μm, it is likely to make it difficult to decrease the height of the display itself. The thickness H2 of the metal wires (K2) is preferably 2 to 9 μm, and the thickness H2 of the metal wires (K2) is more preferably 3 to 8 μm.

The thicknesses of the metal wires in different layers may be identical to or different from each other. If they differ in thickness in FIG. 3, for example, it is preferable for the thickness of the metal wires disposed near the bump 10 to be larger than that of the metal wires disposed near the light emitting elements 2. This serves to prevent the occurrence of wiring defects when connecting a light emitting element driving substrate 7 having bumps 10 and produce a display with high reliability.

The display according to the second embodiment of the present invention includes at least metal wires, a cured film, and a plurality of light emitting elements, each of the light emitting elements having a pair of electrode terminals on one face thereof, the pair of electrode terminals being connected to the plurality of metal wires extending in the cured film, the plurality of metal wires being electrically insulated by the cured film, the cured film being a film formed by curing a resin composition containing a resin (A), and the cured film having a dielectric breakdown voltage of 360 kV/mm or more and 600 kV/mm or less.

The display according to the second embodiment of the present invention is described below with reference to FIG. 20 that illustrates an example of the embodiment.

FIG. 20 shows a display 1 that has a plurality of light emitting elements 2 arranged on an opposite substrate 5 and a cured film 3 formed on the light emitting elements 2. The term "formed on the light emitting elements" means that the film exists at least either on the surface of the light emitting elements or above the support substrate or the light emitting elements. In the embodiment illustrated in FIG. 20, a cured film 3 is disposed in such a manner that it is in contact with at least part of the light emitting elements 2 and a plurality of additional cured film layers 3 are formed on top of it to form a structure containing a total of three layers. However, it may be a monolayer structure containing only one cured film layer 3. Each of the light emitting elements 2 has a pair of electrode terminals 6 on the face opposed to the other face that is in contact with the opposite substrate 5, and each of the electrode terminals 6 is connected with a metal wire 4 extending in the cured film 3. Here, if the plurality of metal wires 4 extending in the cured film 3 is covered completely by the cured film 3, the cured film 3, which can act as an insulation film, serves to construct a structure in which electrical insulation is maintained. Thus, electrical insulation of metal wires is maintained in this structure, and it means that those portions of the metal wires which require electrical insulation are covered by the cured film, which is formed by curing a resin composition containing the resin (A). Furthermore, the light emitting elements 2 will be electrically connected through metal wires 4 and 4*c* to the drive element 8 that is added to the light emitting element driving substrate 7 located at an opposed position to the opposite substrate 5, thereby serving to control the light emission from the light emitting elements 2. In addition, the light emitting element driving substrate 7 is electrically connected to the metal wires 4 through, for example, a solder bump 10. Barrier metal 9 may be provided additionally in order to prevent diffusion of metal from the metal wires 4 etc. It should be noted that in all diagrams given here and hereafter, the metal wires 4*c* may permeate the light emitting element driving substrate 7 to achieve connection to the drive element 8.

The cured film 3 is a film formed by curing a resin composition containing the resin (A) that will be described later, and it is essential for the cured film 3 to have a dielectric breakdown voltage of 360 kV/mm or more and 600 kV/mm or less. Accordingly, degradation of metal wires and leakage current can be prevented, leading to low defective rates in reliability test performed under accelerated test conditions that simulate practical uses. It is preferable for the dielectric breakdown voltage to be 450 kV/mm or more and 600 kV/mm or less, more preferably 500 kV/mm or more and 600 kV/mm or less. If the dielectric breakdown voltage is less than 360 kV/mm, degradation of metal wiring and leakage current will occur frequently to cause high defective rates, whereas if the dielectric breakdown voltage is more than 600 kV/mm, electric charges will be accumulated and electrostatic breakdown of wires and drive elements will occur to cause high defective rates. Useful reliability tests include impact test, high temperature storage test, constant-temperature high-humidity test, and heat cycle test.

To determine the dielectric breakdown voltage, measurements may be taken after removing the cured film from the display, but a cured film to use for dielectric breakdown voltage determination may be prepared under the conditions for the evaluation method for tensile strength of a cured film that will be described later. In the case where a plurality of stacked cured film layers is formed, any of the cured film layers may be used for measurement.

There are no specific limitations on the material used in the metal wires 4, and a generally known material may be adopted. Examples thereof include gold, silver, copper, aluminum, nickel, titanium, molybdenum, and alloys containing them, of which copper is preferable. Here, the metal wires 4 may include the electrodes therein.

Another illustrative embodiment of the display according to the first embodiment and the second embodiment of the present invention is given in FIG. 36, which shows a structure that, unlike the displays illustrated in FIG. 3 and FIG. 20, has a cured film 29 disposed so as to be in contact with at least part of the light emitting elements 2. The cured film 29 that is disposed so as to be in contact with at least part of the light emitting elements 2 may be a cured film formed by curing a resin composition or a resin sheet containing the resin (A) or may be of a material other than a cured film formed by curing a resin composition or a resin sheet containing the resin (A), and as that material, a generally known one such as epoxy resin, silicone resin, and fluorine resin may be used.

For the first embodiment and the second embodiment of the present invention, the light emitting element driving substrate 7 is, for example, a substrate having an element with a driving function, and it is preferably connected to the drive element 8.

There are no specific limitations on the material used for the light emitting element driving substrate 7, and a generally known material may be adopted. Examples thereof include glass substrate, sapphire substrate, printed circuit board, TFT array substrate, and ceramic substrate.

For the display according to the first embodiment and the second embodiment of the present invention, the metal wires may be in the form of electrically conductive films.

There are no specific limitations on the materials to use for such electrically conductive films, and examples thereof include compounds containing, as primary component, an oxide of at least one substance selected from indium, gallium, zinc, tin, titanium, niobium, or the like, and photosensitive electrically conductive pastes containing organic substances and electrically conductive particles. Other generally known materials may also be used. Specific examples of such compounds containing, as primary component, an oxide of at least one substance selected from indium, gallium, zinc, tin, titanium, niobium, or the like include indium tin zinc oxide (ITZO), indium gallium zinc oxide (IGZO; InGaZnO), zinc oxide (ZnO), indium zinc oxide (IZO), indium gallium oxide (IGO), indium tin oxide (ITO), and indium oxide (InO).

These electrically conductive films can be produced by, for example, wet plating techniques such as electroless plating and electrolytic plating, CVD (chemical vapor deposition) techniques (CVD) such as thermal CVD, plasma CVD, and laser CVD, dry plating techniques such as vacuum deposition, sputtering, and ion plating, and others such as bonding of metal foil to a substrate and subsequent etching.

In regard to the photosensitive electrically conductive pastes containing organic substances and electrically conductive particles, examples of useful organic substances include epoxy resin, phenoxy resin, acrylic copolymers, and epoxy carboxylate compounds. Two or more of these may be contained together. An organic substance having a urethane bond may also be contained. The inclusion of a substance having an urethane bond can serve to ensure improved flexibility of the wires. Furthermore, it is preferable for the organic substance in use to show photosensitivity because it serves to form a fine wire pattern easily by photolithography. Photosensitivity can be developed by, for example, adding a photo initiator or a component having an unsaturated double bond.

For the present invention, the electrically conductive particles are particles that contain a substance having an electric resistivity of $10^{-5}$ Ω·m or less. Useful materials for the electrically conductive particles include, for example, silver, gold, copper, platinum, lead, tin, nickel, aluminum, tungsten, molybdenum, chromium, titanium, indium, and alloys of these metals, as well as carbon particles. It should be noted that the electrically conductive film contains electrodes as well. Typical displays that adopt electrically conductive films are shown in FIG. 47 and FIG. 48.

For the first embodiment of the present invention, the cured film preferably contains 2 to 10 layers.

From the viewpoint of arranging a plurality of light emitting elements, it is preferable to adopt one or more cured film layers. It is more preferable to adopt two or more cured film layers because it prevents a significant depression from occurring when forming a layered structure involving the cured film, metal wires, and light emitting elements, which helps to reduce wiring defects such as short circuits in wires and defective connections of light emitting elements, thus serving to produce a display with a decreased light emission failure rate and also because it serves to increase the number of metal wires that can be connected to the light emitting elements, thus allowing a plurality of light emitting elements to be arranged. On the other hand, the number of layers is preferably 10 or less from the viewpoint of decreasing the package height and shortening the wire length, which serves for prevention of wiring defects such as short circuits in wires, reduction in loss, and improvement in high speed response. If the number of layers is less than 2, the number of light emitting elements that can be arranged will be limited in some cases, whereas if the number of layers is more than 10, it leads in some cases to a failure in realizing a decrease in the height of the display itself, shortening of the wire length that can serve for preventing wiring defects such as short circuits in wires, suppression of loss reduction, and improvement in high speed response. The number of layers is preferably 2 to 8, and more preferably 2 to 5.

If a stack of a plurality of cured film layers is used in the second embodiment of the present invention, it is preferable for the number of cured film layers to be 2 or more and 10 or less.

From the viewpoint of arranging a plurality of light emitting elements, it is preferable to adopt one or more cured film layers. It is more preferable to adopt two or more cured film layers because it serves to increase the number of metal wires that can be connected to the light emitting elements, thus allowing a plurality of light emitting elements to be arranged. On the other hand, the number is preferably 10 or less from the viewpoint of decreasing the package height and shortening the wire length, which serves for prevention of wiring defects such as short circuits in wires, reduction in loss, and improvement in high speed response.

For the first embodiment and the second embodiment of the present invention, the total cured film thickness is preferably 5 to 100 μm.

For the first embodiment of the present invention, if the total cured film thickness is 5 to 100 μm, it prevents a significant depression from occurring when forming a layered structure involving the cured film, metal wires, and light emitting elements, which helps to reduce wiring defects such as short circuits in wires and defective connections of light emitting elements, thus serving to produce a display with a decreased light emission failure rate. In addition, it also serves to decrease the height of the display itself that includes light emitting elements and shorten the wire length, thereby realizing the prevention of wiring defects such as short circuits in wires, suppression of loss reduction, and improvement in high speed response.

For the second embodiment of the present invention, if the total cured film thickness is 5 to 100 μm, it is preferable because it serves to prevent the light beams emitted in all directions from the light emitting elements 2 from being absorbed in the cured film 3 to ensure increased light extraction efficiency and realize increased brightness. It is preferable also because it helps to reduce the degradation of metal wires and leakage current and realize low defective rates in reliability test performed under accelerated test conditions that simulate practical uses. In addition, it also serves to decrease the height of the display itself that includes light emitting elements and shorten the wire length, thereby realizing the prevention of wiring defects such as short circuits in wires, suppression of loss reduction, and improvement in high speed response.

The total cured film thickness means the total thickness of a stack of continuously disposed cured film layers in which at least part of each cured film layer is in contact with another cured film layer. For example, in the case where a plurality of cured film layers 3 are stacked as in FIG. 3 and FIG. 20 described above, the distance denoted by 19 in FIG. 3 and FIG. 20 shows the total cured film thickness. The total cured film thickness is preferably 7 to 70 μm, and more preferably 8 to 60 μm. If it is less than 5 μm, the metal wires will not be protected adequately and wiring defects such as short circuits may occur in the wires, whereas if it is more than 100 μm, problems may likely to occur in some cases such as insufficient light extraction efficiency as well as hindrance to a decrease in the height of the display itself and shortening of the wire length that can serve for the prevention of wiring defects such as short circuits in wires, suppression of loss reduction, and improvement in high speed response.

For the first embodiment and the second embodiment of the present invention, it is preferable that the cured film have a hole pattern that penetrates it in the thickness direction, with metal wires extending at least in the hole pattern, and that the bottom face portion of each metal wire, which is formed at a position where it is in contact with a light emitting element, has a maximum size of 2 to 20 μm.

Figure 5:
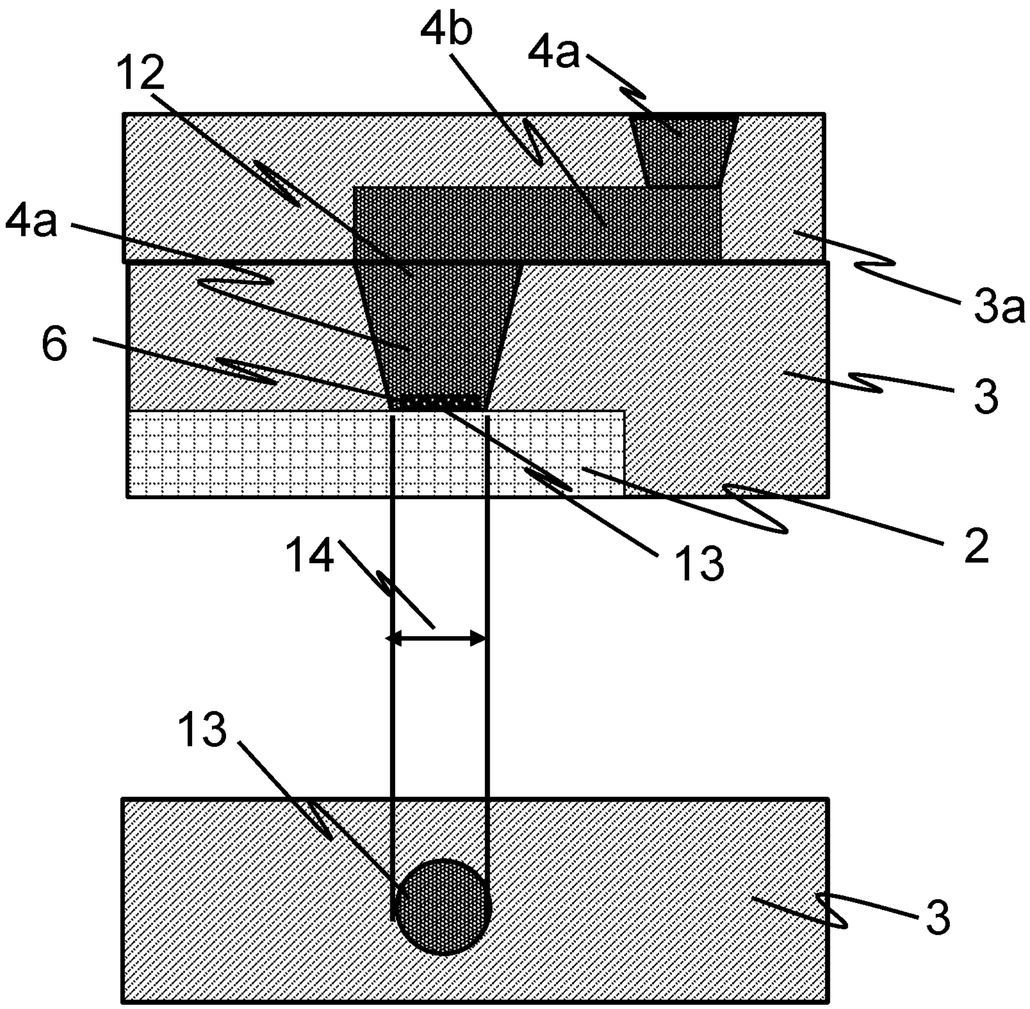
FIG. 5 This gives an enlarged frontal sectional view (upper part) of the designated region B defined in FIG. 3 and a bottom face view (lower part) of the designated region B excluding the light emitting elements.

For the first embodiment of the present invention, FIG. 5 gives an enlarged frontal sectional view (upper part) of the designated region B defined in FIG. 3 and a bottom face view (lower part) of the designated region B excluding the light emitting elements. In the enlarged frontal sectional view (upper part) of the designated region B shown in FIG. 5, cured film layers 3 are disposed on a light emitting element 2. In the diagram, a hole pattern 12 is provided in the cured film layers 3, and a metal wire (K1)**4*a* is provided in the hole pattern 12. The metal wire (K1)4*a* extends in the cured film 3 to the light emitting element 2 and reaches the position where it comes in contact with the electrode terminal 6 of the light emitting element 2, and the bottom face portion 13 of the metal wire (K1)4*a* represents the shape of the metal wire (K1)4*a*** at the contact point.

The bottom face portion 13 is shown in the bottom face view (lower part) of the designated region B, which is defined in FIG. 5, excluding the light emitting elements. In this view, the light emitting elements 2 are excluded and the bottom face portion 13 of the metal wire (K1)**4*a* that extends in the cured film 3 is seen from below. The shape of the bottom face portion 13 may depends on the features of a particular product or the form of its light emitting elements. When it is a circle, the diameter is defined as the maximum size 14; when it is an ellipse, the major axis is defined as the maximum size 14; and when it is a polygon such as rectangle, the longest of the diagonals that connect the apexes in the corners is defined as the maximum size 14. Here, FIG. 5 illustrates an example in which the bottom face portion 13** in the bottom face view (lower part) of the designated region B excluding the light emitting element has a circular shape.

For the second embodiment of the present invention, FIG. 21 gives an enlarged frontal sectional view (upper part) of the designated region B defined in FIG. 20 and a bottom face view (lower part) of the designated region B excluding the light emitting elements. In the enlarged frontal sectional view (upper part) of the designated region B shown in FIG. 21, cured film layers 3 are disposed on a light emitting element 2. In the diagram, a hole pattern 12 is provided in the cured film layers 3, and a metal wire 4 is provided in the hole pattern 12. The metal wire 4 extends in the cured film 3 to the light emitting element 2 and reaches the position where it comes in contact with the electrode terminal 6 of the light emitting element 2, and the bottom face portion 13 of the metal wire 4 represents the shape of the metal wire 4 at the contact point.

The bottom face portion 13 is shown in the bottom face view (lower part) of the designated region B, which is defined in FIG. 21, excluding the light emitting elements. In this view, the light emitting elements 2 are excluded and the bottom face portion 13 of the metal wire 4 that extends in the cured film 3 is seen from below. The shape of the bottom face portion 13 may depends on the features of a particular product or the form of its light emitting elements. When it is a circle, the diameter is defined as the maximum size 14; when it is an ellipse, the major axis is defined as the maximum size 14; and when it is a polygon such as rectangle, the longest of the diagonals that connect the apexes in the corners is defined as the maximum size 14. Here, FIG. 21 illustrates an example in which the bottom face portion 13 in the bottom face view (lower part) of the designated region B excluding the light emitting element has a circular shape.

This constitution serves to apply minute light emitting elements and achieve high density mounting of a plurality of light emitting elements to make it possible to develop a wide range of displays with different sizes that have high resolution light emitting elements. It also allows fine metal wires to be laid, thereby increasing the number of wires included in a unit area and decreasing the total cured film thickness. This prevents a significant depression from occurring when forming a layered structure involving the cured film, metal wires, and light emitting elements, which helps to reduce wiring defects such as short circuits in wires and defective connections of light emitting elements, thus serving to produce a display with a decreased light emission failure rate. In addition, it also serves to decrease the height of the display itself that includes light emitting elements and shorten the wire length, thereby realizing the prevention of wiring defects such as short circuits in wires, suppression of loss reduction, and improvement in high speed response.

From the viewpoint of the application of minute light emitting elements and high density mounting of light emitting elements, it is preferable for the bottom face portion of a metal wire to have a maximum size of 2 to 15 μm, more preferably 2 to 10 μm, and still more preferably 2 to 5 μm. If it is less than 2 μm, its connection to the light emitting elements 2 may not be achieved appropriately, whereas if it is more than 20 μm, it may hinder the application of minute light emitting elements and high density mounting thereof.

For the first embodiment and the second embodiment of the present invention, the bottom face portion of a metal wire that is formed at a position in the vicinity of a light emitting element may have a maximum size of 2 to 20 μm.

This constitution serves to apply minute light emitting elements and achieve high-density mounting of a plurality of light emitting elements to make it possible to develop a wide range of displays with different sizes that have high resolution light emitting elements. It also allows fine metal wires to be laid, thereby increasing the number of wires included in a unit area and decreasing the total cured film thickness. This serves to realize a smaller depression when forming a cured film with metal wires and light emitting elements thereon, which helps to reduce wiring defects such as short circuits in wires and defective connections of light emitting elements, thus serving to produce a display with a decreased light emission failure rate. In addition, it also serves to decrease the height of the display itself that includes light emitting elements and shorten the wire length, thereby realizing the prevention of wiring defects such as short circuits in wires, suppression of loss reduction, and improvement in high speed response.

From the viewpoint of the application of minute light emitting elements and high density mounting of light emitting elements, it is preferable for the bottom face portion of a metal wire to have a maximum size of 2 to 15 μm, more preferably 2 to 10 μm, and still more preferably 2 to 5 μm. If it is less than 2 μm, its connection to the light emitting elements 2 may not be achieved appropriately, whereas if it is more than 20 μm, it may hinder the application of minute light emitting elements and high density mounting thereof.

For the second embodiment of the present invention, it is preferable for the thickness of the cured film to be 1.1 times or more and 4.0 times or less as large as the thickness of each metal wire.

To explain on the basis of the enlarged frontal sectional view (upper part) of the designated region B defined in FIG. 21, the thickness of a metal wire refers to the thickness of the metal wire 104*a* disposed on the surface of the cured film 3 and it does not include the thickness of the metal wire 104*b* extending in the hole pattern that penetrates the cured film 3 in the thickness direction. The metal wire preferably has a thickness of 0.1 to 10 μm, more preferably 3 to 10 μm. If the metal wire has a thickness of 0.1 to 10 μm, it serves to decrease the height of the display itself that includes light emitting elements and shorten the wire length, thereby realizing the prevention of wiring defects such as short circuits in wires, suppression of loss reduction, and improvement in high speed response. If it is 3 to 10 μm, furthermore, it serves to reduce the wiring resistance and contribute to decreasing the electric power consumption and increasing the brightness.

To explain on the basis of the enlarged frontal sectional view (upper part) of the designated region B defined in FIG. 21, the thickness of the cured film means the thickness of the cured film 103*a* that covers the metal wire 104*a*.

As a result, it becomes possible to produce a cured film with high reliability that can work as an appropriate protective film for metal wires and prevent wiring defects such as short circuits in the wires.

The thicknesses of the metal wires in different layers may be identical to or different from each other. If they differ in thickness in FIG. 20, for example, it is preferable for the thickness of the metal wires disposed near the bump 10 to be larger than that of the metal wires disposed near the light emitting elements 2. This serves to prevent the occurrence of wiring defects when connecting a light emitting element driving substrate 7 having bumps 10 and produce a display with high reliability.

For the first embodiment and the second embodiment of the present invention, it is preferable for the cured film to cover the faces of each light emitting element other than the light extraction face.

Figure 6:
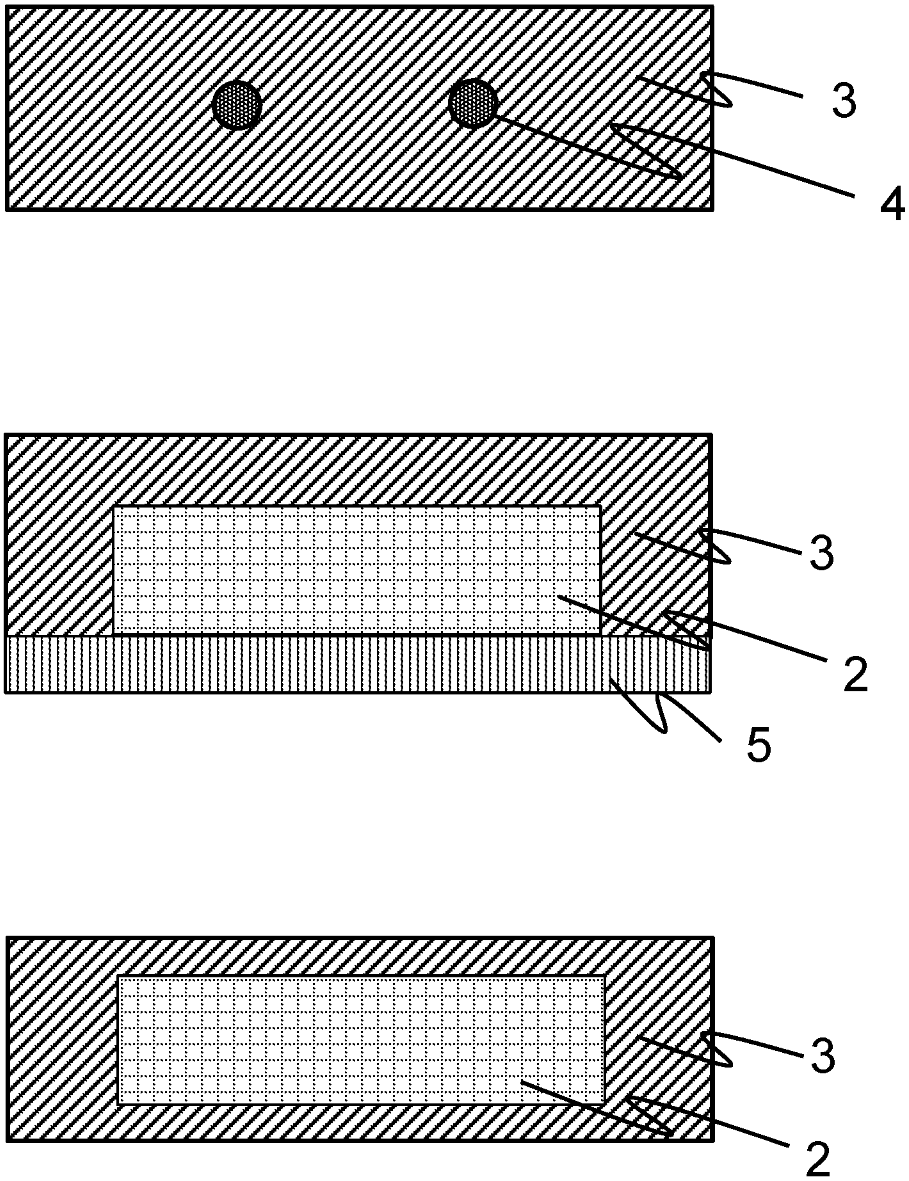
FIG. 6 This gives an enlarged top sectional view (upper part) of the designated region C defined in FIG. 3, a cross-sectional view (middle part) along a plane perpendicular to the front face of the designated region C excluding the wires, and a bottom face view (lower part) of the designated region C excluding the opposite substrate.

As an example of the first embodiment of the present invention, FIG. 6 gives an enlarged top cross-sectional view (upper part) of the designated region C defined in FIG. 3, a sectional view (middle part) along a plane perpendicular to the front face of the designated region C excluding the wires, and a bottom face view (lower part) showing the designated region C excluding the opposite substrate.

In the enlarged top sectional view (upper part) of the designated region C defined in FIG. 6, the light emitting element 2 is covered by the cured film 3, and the metal wires 4, seen through the top face, are connected to the electrode terminals 6 of the light emitting element and extend in the cured film 3.

In the sectional view (middle part) along a plane perpendicular to the front face excluding the wires in FIG. 6, it is shown that the light emitting element 2 is surrounded and covered by the cured film 3.

In the bottom face view (lower part) of the designated region C excluding the opposite substrate in FIG. 6, it is shown that the light emitting element 2 is surrounded by the cured film 3, but one face of the light emitting element 2 is left uncovered by the cured film 3.

As an example of the second embodiment of the present invention, FIG. 22 gives an enlarged top sectional view (upper part) of the designated region C defined in FIG. 20, a cross-sectional view (middle part) along a plane perpendicular to the front face of the designated region C excluding the wires, and a bottom face view (lower part) showing the designated region C excluding the opposite substrate.

In the enlarged top sectional view (upper part) of the designated region C given in FIG. 22, the light emitting element 2 is covered by the cured film 3, and the metal wires 4 that are connected to the electrode terminals 6 of the light emitting element and extend in the cured film 3 are seen from above.

In the sectional view (middle part) along a plane perpendicular to the front face excluding the wires given in FIG. 22, it is shown that the light emitting element 2 is surrounded and covered by the cured film 3.

In the bottom face view (lower part) of the designated region C excluding the opposite substrate in FIG. 22, it is shown that the light emitting element 2 is surrounded by the cured film 3, but one face of the light emitting element 2 is left uncovered by the cured film 3.

In FIG. 3, FIG. 6, FIG. 20, and FIG. 22, all side faces and the top face of the light emitting element 2 are covered by the cured film 3, and this allows the light emitting element 2 to be protected against external impact. This is preferable also because it serves to planarize the depressed surface that results from the formation of the light emitting elements 2 and also serves to allow an opposite substrate 5 to be attached easily.

For the first embodiment of the present invention, the cured film 3 that covers all faces of the light emitting element 2 excluding the light extraction face has a depressed surface with high flatness as described above, and accordingly, it prevents a significant depression from occurring when forming a layered structure involving the cured film, metal wires, and light emitting elements, which helps to reduce wiring defects such as short circuits in wires and defective connections of light emitting elements, thus serving to produce a display with a decreased light emission failure rate.

For the second embodiment of the present invention, the cured film 3 that covers all faces of the light emitting element 2 excluding the light extraction face has a dielectric breakdown voltage as described above and accordingly serves to prevent the degradation of metal wires and leakage current, leading to low defective rates in reliability test performed under accelerated test conditions that simulate practical uses.

For the first embodiment and the second embodiment of the present invention, it is preferable to provide reflecting films on the cured film.

Figure 7:
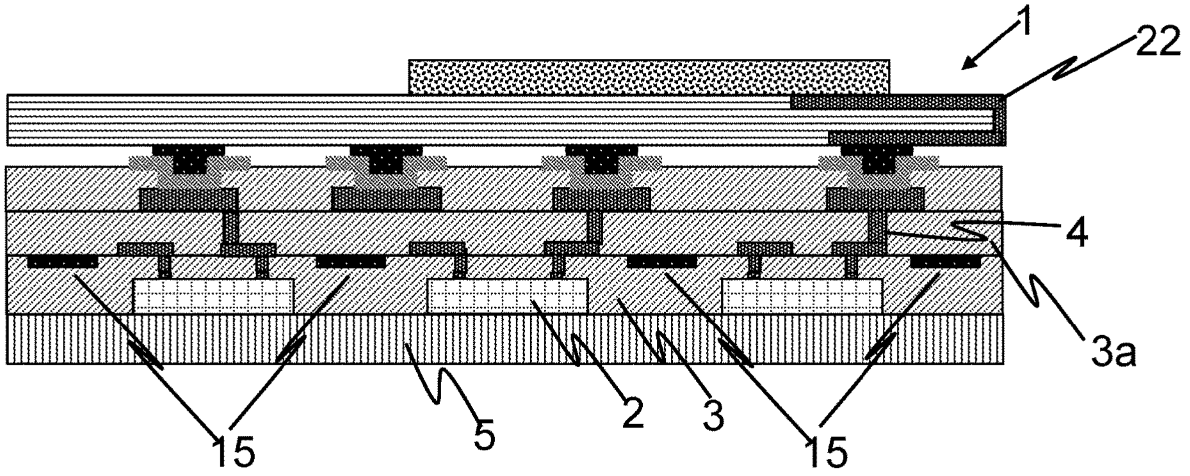
FIG. 7 This gives a frontal sectional view of another embodiment of the display according to the present invention that has reflecting films.

For the first embodiment of the present invention, as illustrated in FIG. 7, reflecting films 15 are provided on the cured film 3 that surrounds the light emitting elements 2. If reflecting films 15 are provided on the cured film 3 as described above, light beams coming through the cured film 3 are reflected by the reflecting films 15 to increase the light extraction efficiency and improve the brightness.

For the second embodiment of the present invention, as illustrated in FIG. 23, reflecting films 15 are provided on the cured film 3 that surrounds the light emitting elements 2. If reflecting films 15 are provided on the cured film 3, it is preferable because light beams coming through the cured film 3 are reflected by the reflecting films 15 and serve not only to further increase the light extraction efficiency and improve the brightness, but also prevent the metal wires and cured film from being degraded by absorbed water and light, thereby decreasing the defective rates in reliability test.

These reflecting films can be provided at any appropriate positions in the cured film, and specifically, they may be disposed to surround the four faces of each light emitting element except the light extraction face, disposed diagonally to the light emitting element, or disposed along a curved line. The reflecting films may be of any material as long as they can reflect light, and good materials include, but not limited to, aluminum, silver, copper, titanium, and alloys containing them.

Furthermore, for the first embodiment and the second embodiment of the present invention, it is preferable that partition walls having a thickness equal to or larger than the thickness of the light emitting elements be disposed between the two or more light emitting elements.

Figure 8:
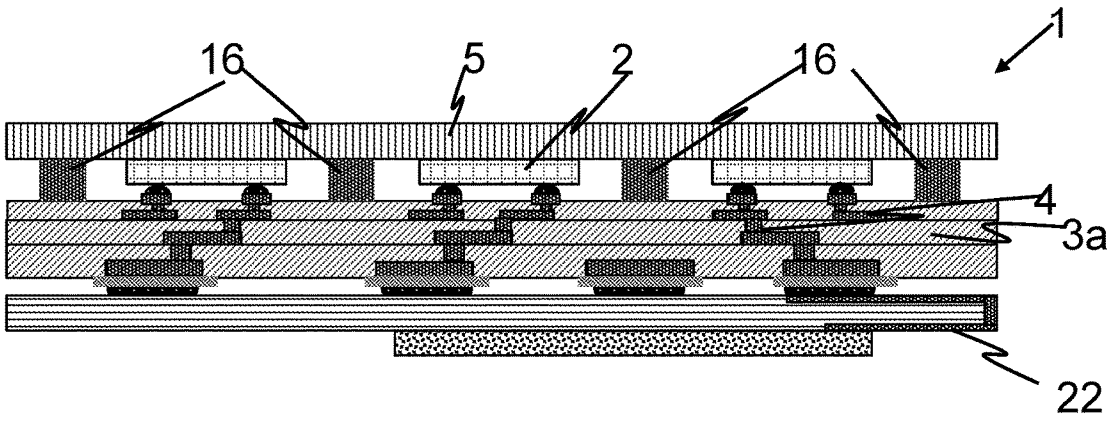
FIG. 8 This gives a frontal sectional view of another embodiment of the display according to the present invention that has partition walls.

For the first embodiment of the present invention, as shown in FIG. 8, it is preferable to dispose these partition walls 16 in an appropriate repeating pattern depending on the number of pixels present in the display 1 that has the light emitting elements 2, and more specifically, they are preferably disposed between the light emitting elements 2 or around each of them. This constitution is preferable because it can serve, in combination with the high depressed surface planarization rate, to allow the opposite substrate 5 to be attached easily.

For the second embodiment of the present invention, as shown in FIG. 24, it is preferable to dispose these partition walls 16 in an appropriate repeating pattern depending on the number of pixels present in the display 2 that has the light emitting elements 2, and more specifically, they are preferably disposed between the light emitting elements 2 or around each of them. This constitution is preferable because it allows the opposite substrate 5 to be attached easily.

It is preferable for the thickness of each partition wall to be larger than the thickness of the light emitting elements, and more specifically, it is preferably 5 to 120 μm.

The partition wall may be constructed mainly of a cured film formed by curing a resin composition containing the resin (A) or may be of a material other than a resin composition containing the resin (A), and good materials include generally known ones such as epoxy resin, (meth) acrylic polymers, polyurethane, polyester, polyolefin, and polysiloxane. The use of these materials serves to form a partition wall having good adhesion property.

The partition wall may have a shading portion on a side face of or inside the partition wall itself in order to suppress light leakage from the light emitting elements and mixing of colors between pixels, thereby realizing improved contrast. The shading portion is a portion that contains a black pigment etc.

In addition, a reflecting portion may also be provided on a side face of each partition wall in order to reflect light emitted from a light emitting element toward the partition wall, thereby ensuring increased light extraction efficiency and realizing increased brightness. The reflecting portion is a portion that contains a white pigment etc.

For the first embodiment and the second embodiment of the present invention, it is preferable that partition walls having a thickness equal to or larger than the thickness of the light emitting elements be disposed between the two or more light emitting elements in the cured film that covers the light emitting elements.

Figure 9:
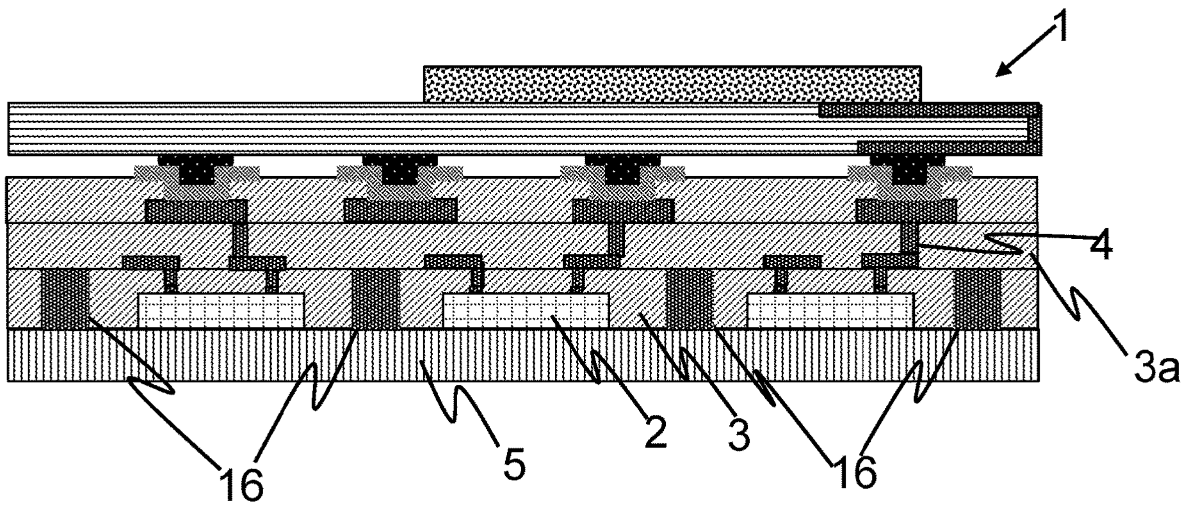
FIG. 9 This gives a frontal sectional view of another embodiment of the display according to the present invention that has partition walls in the cured film.

For the first embodiment of the present invention, FIG. 9, which gives another illustrative embodiment that use partition walls, shows a structure in which partition walls 16 are disposed between or around the light emitting elements 2 in the cured film 3 that covers the light emitting elements 2.

For the second embodiment of the present invention, FIG. 25, which gives another illustrative embodiment that use partition walls, shows a structure in which partition walls 16 are disposed between or around the light emitting elements 2 in the cured film 3 that covers the light emitting elements 2.

The partition wall shown in FIG. 9 and FIG. 25 may be of a material other than a resin composition containing the resin (A), and good materials include generally known ones such as epoxy resin, (meth)acrylic polymers, polyurethane, polyester, polyolefin, and polysiloxane. The use of these materials serves to form a partition wall having good adhesion property.

The disposition of such partition walls is preferable because they serve as marks when transferring the light emitting elements in a subsequent step and also because they can work as photospacers to allow the light emitting elements to be transferred more efficiently.

It is also preferable that not only partition walls having a thickness equal to or larger than the thickness of the light emitting elements be disposed between the two or more light emitting elements, but also reflecting films be provided around the partition walls.

Figure 10:
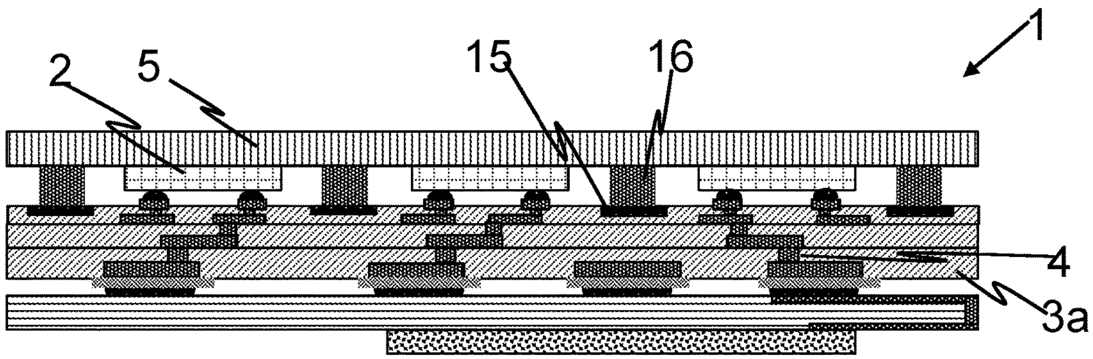
FIG. 10 This gives a frontal sectional view of another embodiment of the display according to the present invention that has reflecting films and partition walls.
Figure 11:
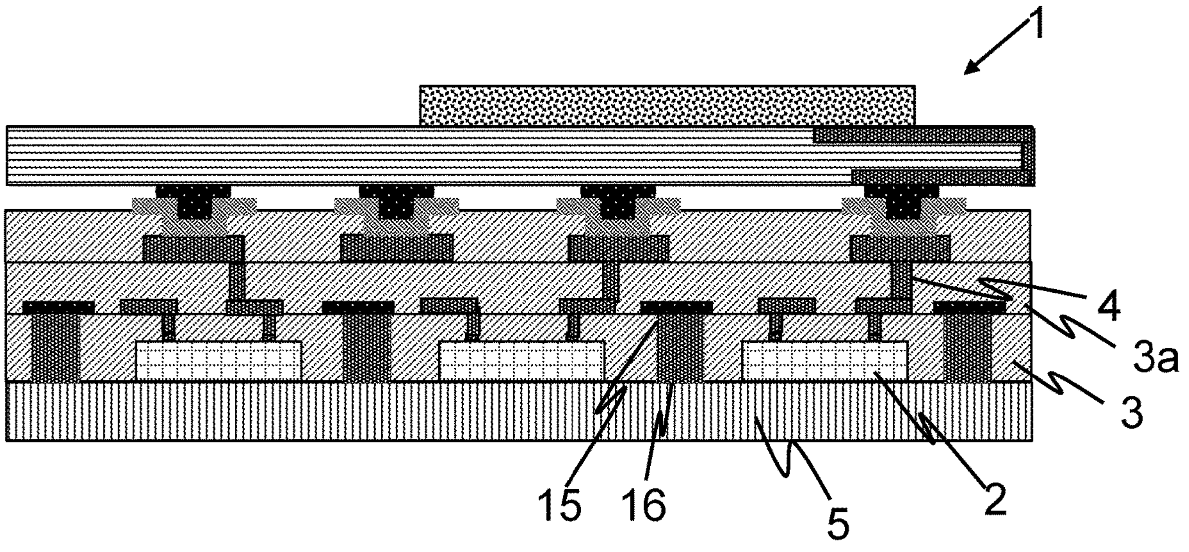
FIG. 11 This gives a frontal sectional view of another embodiment of the display according to the present invention that has partition walls in the cured film and also has reflecting films formed thereon.

For the first embodiment of the present invention, typical structures of the display 1 are shown in FIG. 10 and FIG. 11, wherein not only partition walls 16 having a thickness equal to or larger than the thickness of the light emitting elements 2 are disposed between the two or more light emitting elements 2, but also reflecting films 15 are provided around the partition walls. The adoption of such a structure in which reflecting films are provided around the partition walls allows the light beams emitted from the light emitting elements to be reflected by the reflecting films disposed around the partition walls, thereby realizing increased light extraction efficiency and increased brightness.

For the first embodiment of the present invention, typical structures of the display 1 are shown in FIG. 26 and FIG. 27, wherein not only partition walls 16 having a thickness equal to or larger than the thickness of the light emitting elements 2 are disposed between the two or more light emitting elements 2, but also reflecting films 15 are provided around the partition walls.

A structure having reflecting films around the partition walls is preferable because light beams emitted from the light emitting elements are reflected by the reflecting films disposed around the partition walls to prevent the metal wires and cured film from being degraded by absorbed water and light, thereby decreasing the defective rates in reliability test.

The partition wall may have a shading portion on a side face of or inside the partition wall itself in order to suppress light leakage from the light emitting elements and mixing of colors between pixels, thereby realizing improved contrast. The shading portion is a portion that contains a black pigment etc.

In addition, a reflecting portion may also be provided on a side face of each partition wall in order to reflect light emitted from a light emitting element toward the partition wall, thereby ensuring increased light extraction efficiency and realizing increased brightness. The reflecting portion is a portion that contains a white pigment etc.

For the first embodiment and the second embodiment of the present invention, light diffusion layers may be provided around the light emitting elements, the cured film, or the metal wires.

For the first embodiment and the second embodiment of the present invention, the light emitting element is preferably an LED with a side length of 5 μm or more and 700 μm or less, and the light emitting element is more preferably an LED with a side length of 5 μm or more and 100 μm or less.

An LED consists mainly of a p-type semiconductor and an n-type semiconductor joined through a p-n junction. When a voltage is applied in the normal direction to the LED, electrons and positive holes will move through the chip to cause electric current. In this process, electrons and positive holes are recombined to cause an energy difference, and the surplus energy is converted into light energy to cause light emission. The wavelength of light emitted from an LED depends on the compounds, such as GaN, GaAs, InGaAlP, or GaP, that constitute the semiconductors, and the difference in wavelength defines the color of the light to be emitted. In general, a white color is created by mixing two or more light beams of different colors, and in the case of an LED, largely improved color reproducibility is realized by mixing the three primary colors of red, green, and blue, thereby creating a more natural white color.

In regard to the shape, there are bullet-like, chip-like, and polyhedral LEDs, of which chip-like and polyhedral ones are preferable from the viewpoint of the production of minute LEDs. In addition, it is preferable to use LEDs with a side length of 5 μm or more and 700 μm or less because it allows a plurality of chips to be arranged, and it is more preferable to adopt LEDs with a side length of 5 μm or more and 100 μm or less.

To mount LEDs on a substrate, such as light emitting element driving substrate 7, that carries a cured film 3, there are some methods proposed so far including, but not limited to, the pick-and-place method and mass transfer method.

Available techniques for mounting LEDs on a substrate include, for example, a technique in which LEDs that emit red, green, and blue light beams are disposed at appropriate positions in a matrix-like array on a substrate and a technique in which single color LEDs that emit beams of red, blue, etc., or ultraviolet LEDs that emit ultraviolet ray are mounted in an array on a substrate. The former technique may use LEDs each emitting a red, green, or blue light beam or may use LEDs emitting red, green, and blue light beams that are stacked in the vertical direction. The latter technique serves for easy mounting of LEDs in an array. In this case, full color display can be realized by forming red, green, or blue sub-pixels using wavelength conversion material such as quantum dots.

A generally known substance may be used as wavelength conversion material.

In the case of using LEDs that emit blue light, for example, it is preferable that only an array of LEDs that emit blue light beams be mounted first to prepare an LED array substrate, then followed by forming wavelength conversion layers in which excitation by blue light is caused and wavelength is converted to emit red and green light beams at the positions corresponding to red and green sub-pixels. This makes it possible to form red, green, and blue sub-pixels by using only LEDs that emit blue light beams.

On the other hand, in the case of using ultraviolet LEDs that emit ultraviolet light, it is preferable that an array of ultraviolet LEDs alone be mounted first to prepare an LED array substrate, followed by forming wavelength conversion layers in which excitation by ultraviolet light is caused and wavelength is converted to emit red, green, and blue light beams at the positions corresponding to red, green, and blue sub-pixels. This serves to reduce the difference in light emission angle among different sub-pixel colors that were described above. As the wavelength conversion layer, generally known ones may be used and color filters etc. may also be used as required.

As the opposite substrate used for the present invention, a glass plate, resin plate, resin film, or the like may be applied. When using a glass plate, it is preferable to adopt a plate of non-alkali glass. Preferable materials for such a resin plate or resin film include polyester, (meth)acrylic polymers, transparent polyimide, and polyether sulfone. It is preferable for such a glass plate and resin plate to have a thickness of 1 mm or less, more preferably 0.8 mm or less. The thickness of the resin film is preferably 100 μm or less.

For the first embodiment and the second embodiment of the present invention, it is preferable that the display have a drive element and that the light emitting elements be electrically connected to the drive element by metal wires extending in the cured film. If the display has a drive element and the light emitting elements are electrically connected to the drive element by metal wires extending in the cured film, it serves to perform switching-driving of a plurality of light emitting elements separately. Useful drive elements include driver ICs. A plurality of driver ICs with different functions may be applied to one LED or one group of red, blue, and green LEDs.

Figure 12:
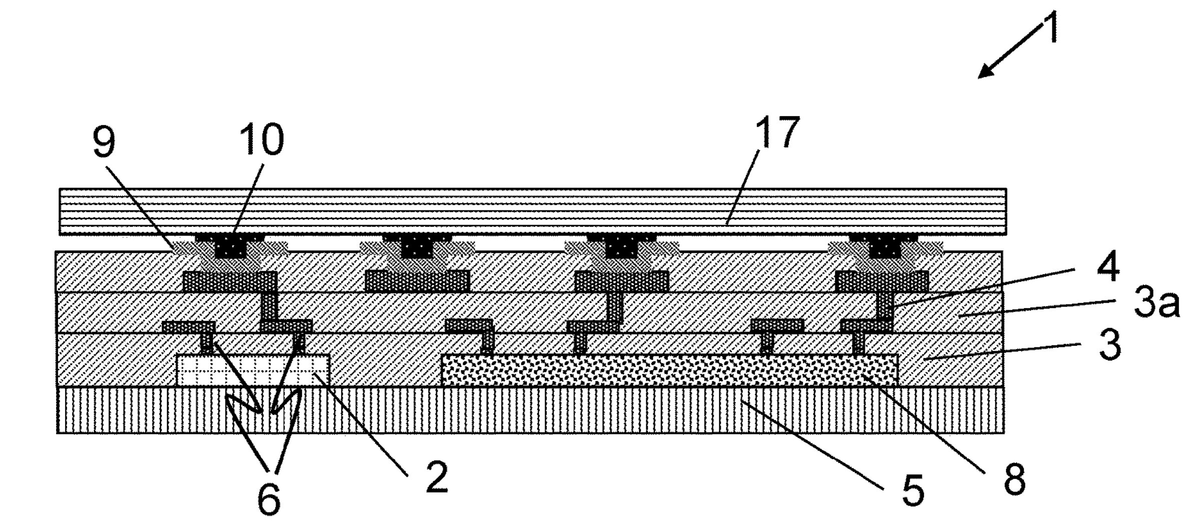
FIG. 12 This gives a frontal sectional view of another embodiment of the display according to the present invention that has a structure in which a drive element exists in the cured film.
Figure 13:
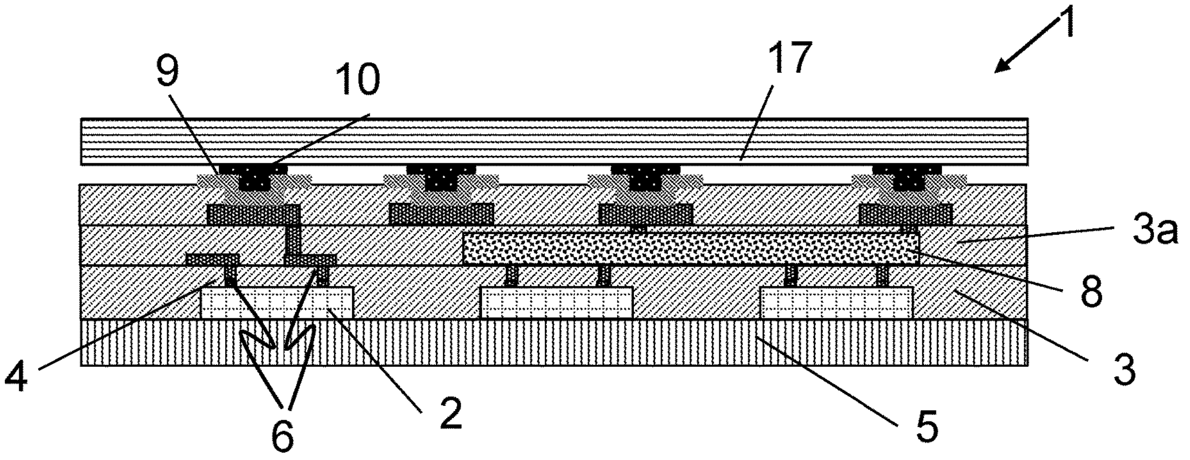
FIG. 13 This gives a frontal sectional view of another embodiment of the display according to the present invention that has another structure in which a drive element exists in the cured film.

In regard to the structure of arranged drive elements in the first embodiment of the present invention, it is preferable to adopt a structure in which the drive element 8 is contained in the cured film 3 in such a manner that it is disposed on the opposite substrate 5 and near the light emitting element 2 as illustrated in FIG. 12. It is also preferable to adopt a structure in which the drive element 8 is contained in the cured film (F1)3*a* and disposed above the light emitting element 2 as illustrated in FIG. 13.

In regard to the structure of arranged drive elements in the second embodiment of the present invention, it is preferable to adopt a structure in which the drive element 8 is contained in the cured film 3 in such a manner that it is disposed on the opposite substrate 5 and near the light emitting element 2 as illustrated in FIG. 28. It is preferable to adopt a structure in which the drive element 8 is contained in the cured film and disposed above the light emitting element 2 as illustrated in FIG. 29.

This serves to shorten the wire length, thereby realizing the prevention of wiring defects such as short circuits in wires, suppression of loss reduction, and improvement in high speed response.

For the first embodiment and the second embodiment of the present invention, it is preferable that a drive element and a substrate be included in such a manner that the drive element is connected to the light emitting elements by metal wires and that at least part of the metal wires extends along a side face of the substrate. If a drive element and a substrate are included in such a manner that the drive element is connected to the light emitting elements by metal wires and that at least part of the metal wires extends along a side face of the substrate, it serves not only to allow switching-driving of a plurality of light emitting elements separately, but also decrease the height of the display itself and enhance the high speed response, thereby realizing the production of a smaller display with a smaller frame.

As in the case of the light emitting element driving substrate 7, there are no specific limitations on the substrate and a generally known one may be adopted. Examples thereof include glass substrate, sapphire substrate, printed circuit board, TFT array substrate, and ceramic substrate. The metal wires at least part of which extends along a side face of the substrate may be of, for example, gold, silver, copper, aluminum, nickel, titanium, tungsten, aluminum, tin, chromium, or an alloy containing them. Furthermore, useful techniques that can be used to form the metal wires extending along a side face of the substrate include, for example, wet plating techniques such as electroless plating and electrolytic plating, CVD (chemical vapor deposition) techniques (CVD) such as thermal CVD, plasma CVD, and laser CVD, dry plating techniques such as vacuum deposition, sputtering, and ion plating, and others such as bonding of metal foil to a substrate and subsequent etching. It is also good to provide a groove along a side face of the substrate In this case, the groove works to separate mutually adjacent metal wires completely, thereby preventing short circuits from occurring between metal wires. A groove to accommodate such a side face conductor wire can be produced by such a technique as cutting, etching, and laser processing.

It is preferable for such metal wires to be laid, for example, as denoted by 22 in FIG. 1 and FIGS. 3 and 4*c* in FIG. 20.

For the first embodiment and the second embodiment of the present invention, the metal wires may be in the form of electrically conductive films. Useful materials for such electrically conductive films include, for example, compounds containing, as primary component, an oxide of at least one substance selected from indium, gallium, zinc, tin, titanium, niobium, or the like, and photosensitive electrically conductive pastes containing organic substances and electrically conductive particles, and other generally known ones may be used.

Specific examples of such compounds containing, as primary component, an oxide of at least one substance selected from indium, gallium, zinc, tin, titanium, niobium, or the like include indium tin zinc oxide (ITZO), indium gallium zinc oxide (IGZO; InGaZnO), zinc oxide (ZnO), indium zinc oxide (IZO), indium gallium oxide (IGO), indium tin oxide (ITO), and indium oxide (InO).

These electrically conductive films can be produced by, for example, wet plating techniques such as electroless plating and electrolytic plating, CVD (chemical vapor deposition) techniques (CVD) such as thermal CVD, plasma CVD, and laser CVD, dry plating techniques such as vacuum deposition, sputtering, and ion plating, and others such as bonding of metal foil to a substrate and subsequent etching.

In the photosensitive electrically conductive pastes containing organic substances and electrically conductive particles, it is preferable for the electrically conductive pastes to account for 60 to 90 mass %. If an electrically conductive layer contains an organic substance, it serves to prevent disconnection in curved faces, bendable portions, etc., to ensure a higher electric conductivity. If the content of electrically conductive particles is less than 60 mass %, the probability of contact between electrically conductive particles decreases, leading to a lower electric conductivity. In addition, electrically conductive particles may be separated easily in bendable portions of the wires. The content of electrically conductive particles is preferably 70 mass % or more. On the other hand, if the content of electrically conductive particles is more than 90 mass %, it will be difficult to form a good wiring pattern and disconnection will occur easily in bendable portions. The content of electrically conductive particles is preferably 80 mass % or less.

Examples of useful organic substances include epoxy resin, phenoxy resin, acrylic copolymers, and epoxy carboxylate compounds. Two or more of these may be contained together. An organic substance having a urethane bond may also be contained. The inclusion of a substance having an urethane bond can serve to ensure improved flexibility of the wires. Furthermore, it is preferable for the organic substance in use to show photosensitivity because it serves to form a fine wire pattern easily by photolithography. Photosensitivity can be developed by, for example, adding a photo initiator or a component having an unsaturated double bond.

For the present invention, the electrically conductive particles are particles that contain a substance having an electric resistivity of $10^{-5}$ Ω·m or less. Useful materials for the electrically conductive particles include, for example, silver, gold, copper, platinum, lead, tin, nickel, aluminum, tungsten, molybdenum, chromium, titanium, indium, and alloys of these metals, as well as carbon particles. Furthermore, it is preferable that two or more types of electrically conductive particles be contained. If two or more types of electrically conductive particles are contained, it serves, in the heat treatment step described later, to prevent the sintering of electrically conductive particles of the same type that can cause volume shrinkage, and as a result, reduce the overall volume shrinkage of the electrically conductive film, leading to a higher bendability.

It is preferable for the electrically conductive particles to have an average particle diameter of 0.005 to 2 μm. In the case where two or more types of electrically conductive particles are contained, the average particle diameter referred to above means the average particle diameter of the particles with larger diameter. If the electrically conductive particles have an average particle diameter of 0.005 μm or more, it serves to maintain moderate interaction between electrically conductive particles, thereby allowing the electrically conductive particles to be in a more stable dispersed state. It is more preferable for the electrically conductive particles to have an average particle diameter of 0.01 μm or more. On the other hand, if the electrically conductive particles have an average particle diameter of 2 μm or less, it serves to produce a desired wiring pattern more easily. It is more preferable for the electrically conductive particles to have an average particle diameter of 1.5 μm or less.

It is preferable for the electrically conductive film to have a thickness of 2 to 10 μm. If the electrically conductive film has a thickness of 2 μm or more, it serves to prevent disconnection in bendable portions to ensure a higher electric conductivity. It is more preferable for the electrically conductive film to have a thickness of 4 μm or more. On the other hand, if the electrically conductive film has a thickness of 10 μm or less, it serves to produce a wiring pattern more easily in the manufacturing process. It is more preferable for the electrically conductive film to have a thickness of 8 μm or less.

In regard to the constitution of the electrically conductive film, it is preferable, for example, to adopt structures as shown in FIG. 37 to FIG. 40 where it is denoted by 34.

For the first embodiment and the second embodiment of the present invention, it is preferable to further provide shading layers between the two or more light emitting elements. If shading layers are provided between the two or more light emitting elements, they serve to suppress light leakage from the light emitting elements and mixing of colors between pixels and realize improved contrast without suffering a significant decrease in light extraction efficiency.

These shading layers may be constructed mainly of a cured film formed by curing a resin composition containing the resin (A) and a coloring material (E) or may be of a material other than a resin composition containing the resin (A), and good materials include generally known ones such as epoxy resin, (meth)acrylic polymers, polyurethane, polyester, polyolefin, and polysiloxane. A black pigment may be used as the coloring material (E), and good materials include, for example, black organic pigments such as carbon black, perylene black, and aniline black, and inorganic pigments including graphite and fine particles of metal such as titanium, copper, iron, manganese, cobalt, chromium, nickel, zinc, calcium, and silver, as well as metal oxides, composite oxides, metal sulfides, metal nitrides, and metal oxynitrides thereof. Furthermore, a red pigment and a blue pigment may be combined, along with a yellow pigment and other pigments as required, to provide a black mixture. Dyes may also be used. Two or more coloring materials may be contained together.

The resin composition containing a resin (A) and a coloring material (E) may be made photosensitive, and a photosensitizing agent (B) as described later may be used.

For example, a preferable method to produce a resin composition containing a resin (A) and a coloring material (E) is to disperse a resin solution containing a resin (A) and a coloring material (E), along with a dispersant and an organic solvent as required, using a disperser to prepare a coloring material dispersion liquid with a high coloring material concentration, followed by further adding the resin (A) and other components such as photosensitizing agent as required and stirring the liquid. Filtration may be performed as required.

Examples of the disperser include ball mill, bead mill, sand grinder, triple roll mill, and high-speed impact mill. In particular, from the viewpoint of realizing a higher dispersion efficiency and finer dispersion, the use of a bead mill is preferable. Examples of the bead mill include CoBall Mill, basket mill, pin mill, and dyno mill. Examples of beads to use in bead mills include titania beads, zirconia beads, and zircon beads. For these bead mills, it is preferable to use beads with diameters of 0.03 to 1.0 mm. If the diameter of primary particles and the diameter of secondary particles formed of aggregated primary particles are small in the coloring material (E), it is preferable to use fine beads with diameters of 0.03 to 0.10 mm. In this case, it is preferable to adopt a bead mill equipped with a centrifugal separation type separator that can separate the fine beads from the dispersion liquid. On the other hand, to disperse a coloring material containing bulky particles of a submicronic size, the use of beads with diameters of 0.10 mm or more is preferable because large crushing force can be realized.

A resin composition containing a resin (A) and a coloring material (E) may be spread over a substrate, which can be selected from various appropriate ones, dried, and then heat-treated to form a shading layer. When it has photosensitivity, light irradiation is performed by applying actinic ray as described later, followed by development and heat treatment steps as described later to form a patterned shading layer.

It is preferable for the shading layer to have a thickness of 0.1 to 5 μm. If the shading layer has a thickness of 0.1 μm or more, it serves to suppress light leakage from the light emitting elements and mixing of colors between pixels and realize increased contrast. It is more preferable for the shading layer to have a thickness of 0.5 μm or more. On the other hand, if the wires have a thickness of 5 μm or less, they serve to suppress light leakage from the light emitting elements and mixing of colors between pixels and realize increased contrast without suffering a significant decrease in light extraction efficiency. It is more preferable for the shading layer to have a thickness of 4 μm or less.

The shading layer is produced preferably by forming a colored film with a film thickness of 1.0 μm on a non-alkali glass plate with a thickness of 0.7 mm in such a manner that the reflection chromaticity value (a*, b*), which is the chromaticity measured from the glass surface, is in the range of $-0.5 \leq a^* \leq 1.0$ and $-1.0 \leq b^* \leq 0.5$, more preferably $-0.5 \leq a^* \leq 0.5$ and $-1.0 \leq b^* \leq 0.4$. Reflection chromaticity represents the color tone of an image reflected in the colored film and the reflection color tone can be said to become more achromatic as the (a*, b*) values come closer to (0.0, 0.0). Compared to this, the reflection color tone in a black portion of a liquid crystal display or an organic EL display generally has a negative b* value and is bluish, and accordingly, it is preferable for a decorating film used in a display to have a negative b* value.

To determine the reflection chromaticity (L*,a*,b*) of a colored film, a spectrophotometer (CM-2600d, manufactured by Konica Minolta, Inc.) calibrated with a white calibration plate (CM-A145, manufactured by Konica Minolta, Inc.) is used, and the total reflection chromaticity (SCI) of light coming through the transparent base is measured under the measuring conditions of the use of a standard light source D65 (color temperature 6504 K), view angle of 2° (CIE1976), atmospheric pressure, and 20° C. In regard to the constitution of the shading layer, it is preferable, for example, to adopt a structure as shown in FIG. 41 where it is denoted by 35. The shading layer 35 may be either in contact with the light emitting elements 2 or separated from them.

For the first embodiment of the present invention, in order to allow the cured film formed by curing a resin composition containing a resin (A) to have a depressed surface planarization rate as described above, it is preferable for the resin (A) to have a high heat resistance, which more specifically means that the resin preferably suffers little degradation or decomposition when exposed to heat at a high temperature of 160° C. or more during heat treatment or after heat treatment. Furthermore, such a cured film is preferable because it is low in outgassing rate, which is a good characteristic for a cured film to be used as, for example, insulation film, protective film, or partition wall in a display.

For the second embodiment of the present invention, the cured film formed by curing a resin composition containing a resin (A) has a dielectric breakdown voltage of 360 kV/mm or more and 600 kV/mm or less. This serves to prevent the degradation of metal wires and leakage current, leading to low defective rates in reliability test.

To realize such characteristics, it is preferable for the resin (A) to have a high heat resistance. Specifically, it preferably suffers little resin degradation when exposed to heat at a high temperature of 160° C. or more during heat treatment or after heat treatment and undergoes little formation of a quinone structure, which is a coloring structure, or the like as a result of resin degradation, resin decomposition etc. Furthermore, such a cured film is preferable because it is low in outgassing rate, which is a good characteristic for a cured film to be used as, for example, insulation film, protective film, or partition wall in a display.

From the viewpoint of the formation of an intended hole pattern by light irradiation and development, it is preferable that before the curing step, the resin (A) have a high light transmittance at the exposure wavelength.

To realize such characteristics, good methods include, for example, shortening the conjugated chains derived from aromatic rings in the resin and reducing the movement of electric charges in a molecule or between molecules.

For protection of the metal wires, it is preferably high in processability even when having a large thickness of 10 μm or more.

There are no specific limitations on the resin (A), but it is preferably an alkali-soluble resin from the viewpoint of environmental load reduction. To determine the alkali-solubility, a solution prepared by dissolving the resin in γ-butyrolactone is spread over a silicon wafer and prebaked at 120° C. for 4 minutes to form a prebaked film having a film thickness of 10±0.5 μm. Then, the prebaked film is immersed in a 2.38 mass % aqueous solution of tetramethyl ammonium hydroxide at 23±1° C. for 1 minute and then rinsed with pure water, followed by measuring the decrease in film thickness. If the prebaked film is dissolved at a dissolution rate of 50 nm/min or more, then the resin is defined as alkali-soluble.

For the first embodiment and the second embodiment of the present invention, the resin (A) preferably contains one or more resins selected from the group consisting of polyimide, polyimide precursor, polybenzoxazole, polybenzoxazole precursor, and copolymers thereof. The resin (A) may contain only one of these resins or may contain a combination of two or more of these resins.

Described below are the polyimide, polyimide precursor, polybenzoxazole, and polybenzoxazole precursor.

There are no specific limitations on the polyimide as long as it has an imide ring. There are no specific limitations on the polyimide precursor as long as it has a structure that can form an imide ring-containing polyimide when undergoing dehydration-cyclization, and it may contain polyamic acid, polyamic acid ester, etc. There are no specific limitations on the polybenzoxazole as long as it has an oxazole ring. There are no specific limitations on the polybenzoxazole precursor as long as it has a structure that can form a benzoxazole ring-containing polybenzoxazole when undergoing dehydration-cyclization, and it may contain polyhydroxyamide, etc.

The polyimide has a structural unit as represented by the general formula (1); the polyimide precursor and polybenzoxazole precursor have structural units as represented by the general formula (2) given below; and the polybenzoxazole has a structural unit as represented by the general formula (3). Two or more of these may be contained and a resin formed by copolymerizing a structural unit as represented by the general formula (1), a structural unit as represented by the general formula (2), a structural unit as represented by the general formula (3), and a structural unit as represented by the general formula (7) may be contained.

[Chemical compound 1]

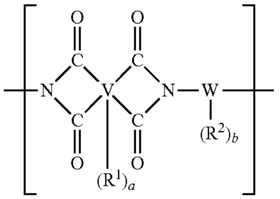

(1)

In the general formula (1), V is a tetravalent to decavalent organic group having 4 to 40 carbon atoms and W is a divalent to octavalent organic group having 4 to 40 carbon atoms; a and b each denote an integer of 0 to 6; $R^1$ and $R^2$ each denote one selected from the group consisting of a hydroxyl group, carboxyl group, sulfonic group, and thiol group, and the plurality of $R^1$'s and $R^2$'s may be identical to or different from each other.

[Chemical compound 2]

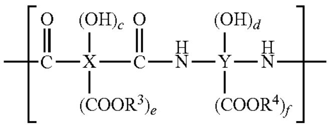

(2)

In the general formula (2), X and Y each independently denote a divalent to octavalent organic group having 4 to 40 carbon atoms; $R^3$ and $R^4$ each independently represent a hydrogen atom or a monovalent organic group containing 1 to 20 carbon atoms; c and d each denote an integer of 0 to 4; and e and f each denote an integer of 0 to 2.

[Chemical compound 3]

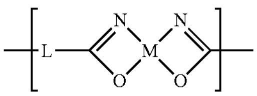

(3)

In the general formula (3), L and M each independently denote a divalent to octavalent organic group having 4 to 40 carbon atoms.

[Chemical formula 3-1]

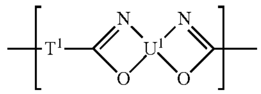

(7)

In the general formula (7), $T^1$ and $U^1$ each independently denote a divalent to octavalent organic group having 4 to 40 carbon atoms.

In the general formula (1), it is preferable that a+b>0 in order to allow the resin (A) to be alkali-soluble. In the general formula (2), furthermore, it is preferable that c+d+e+f>0. In the case where the general formula (2) represents a polyimide precursor, it is preferable that X and Y in the general formula (2) each have an aromatic group. Furthermore, the general formula (2) has an aromatic group in X, meets the relation e>2, and has a carboxyl group or a carboxy ester group at the ortho position of the aromatic amide group. The structure forms an imide ring through dehydration-cyclization.

In the case where the general formula (2) represents a polybenzoxazole precursor, the general formula (2) has an aromatic group in X, meets the relation d>0, and has a hydroxyl group at the ortho position of the aromatic amide group. The structure forms a benzoxazole ring through dehydration-cyclization.

For the resin (A), the number of repetitions n of a structural unit as represented by the general formula (1), general formula (2), general formula (3), or general formula (7) is preferably 5 to 100,000, more preferably 10 to 100,000.

Another structural unit may be contained in addition to a structural unit as represented by the general formula (1), general formula (2), general formula (3), or general formula (7). Examples of such another structural unit include, but not limited to, cardo structure and siloxane structure. In this case, it is preferable that a structural unit as represented by the general formula (1), general formula (2), general formula (3), or general formula (7) be included as main constituent unit. Here, the main constituent unit is the unit that is represented by the general formula (1), general formula (2), general formula (3), or general formula (7) and accounts for 50 mol % or more, preferably 70 mol % or more, of all structural units.

$V—(R^1)_a$ in the general formula (1), $(OH)_c—X—(COOR^3)_e$ in the general formula (2), L in the general formula (3), and $T^1$ in the general formula (7) each denote an acid residue. V is a tetravalent to decavalent organic group having 4 to 40 carbon atoms and in particular, it is preferably an organic group having 4 to 40 carbon atoms and having an aromatic ring or a cycloaliphatic group. X, L, and $T^1$ are each a divalent to octavalent organic group having 4 to 40 carbon atoms and in particular, they are each preferably an organic group containing 4 to 40 carbon atoms and having an aromatic ring or an aliphatic group.

For the first embodiment of the present invention, the use of a polyimide, polyimide precursor, polybenzoxazole, or polybenzoxazole precursor having a structural unit as represented by any of the general formulae (1) to (3) is preferable because they contain no or few components that can be eliminated during heat treatment so that the rate of thickness change caused by heat treatment is as small as 25% or less, thus serving to prevent a significant depression from occurring when forming a layered structure involving the cured film, metal wires, and light emitting elements, which helps to ensure a depressed surface with high flatness and reduce wiring defects such as short circuits in wires and defective connections of light emitting elements. Accordingly, this serves to produce a display with a decreased light emission failure rate.

Examples of the acid component present in the acid residue include, but not limited to, dicarboxylic acids such as terephthalic acid, isophthalic acid, diphenyl ether dicarboxylic acid, bis(carboxyphenyl)hexafluoropropane, biphenyldicarboxylic acid, benzophenone dicarboxylic acid, triphenyldicarboxylic acid, suberic acid, dodecafluorosuberic acid, azelaic acid, sebacic acid, hexadecafluorosebacic acid, 1,9-nonanedioic acid, dodecanedioic acid, tridecanedioic acid, tetradecanedioic acid, pentadecanedioic acid, hexadecanedioic acid, heptadecanedioic acid, octadecanedioic acid, nonadecanedioic acid, eicosane diacid, henicosane diacid, docosane diacid, tricosane diacid, tetracosane diacid, pentacosane diacid, hexacosane diacid, heptacosane diacid, octacosane diacid, nonacosane diacid, and triacontane diacid; tricarboxylic acids such as trimellitic acid, trimesic acid, diphenyl ether tricarboxylic acid, and biphenyl tricarboxylic acid; and tetracarboxylic acids such as pyromellitic acid, 3,3',4,4'-biphenyltetracarboxylic acid, 2,3,3',4'-biphenyltetracarboxylic acid, 2,2',3,3'-biphenyltetracarboxylic acid, 3,3',4,4'-diphenyl ether tetracarboxylic acid 3,3',4,4'-benzophenone tetracarboxylic acid, 2,2',3,3'-benzophenone tetracarboxylic acid, 2,2-bis(3,4-dicarboxyphenyl) propane, 2,2-bis(2,3-dicarboxyphenyl) propane, 1,1-bis(3,4-dicarboxyphenyl) ethane, 1,1-bis(2,3-dicarboxyphenyl) ethane, bis(3,4-dicarboxyphenyl) methane, bis(2,3-dicarboxyphenyl) methane, bis(3,4-dicarboxyphenyl) ether, 1,2,5,6-naphthalene tetracarboxylic acid, 9,9-bis(3,4-dicarboxyphenyl) fluorene, 9,9-bis{4-(3,4-dicarboxyphenoxy)phenyl} fluorene, 2,3,6,7-naphthalene tetracarboxylic acid, 2,3,6,7-naphthalene tetracarboxylic acid, 2,3,5,6-pyridine tetracarboxylic acid, 3,4,9,10-perylene tetracarboxylic acid, 2,2-bis(3,4-dicarboxyphenyl)hexafluoropropane, aromatic tetracarboxylic acids having structures as shown below, butane tetracarboxylic acid, cyclobutane tetracarboxylic acid, and 1,2,3,4-cyclopentane tetracarboxylic acid. Two or more of these may be used in combination.

[Chemical compound 4]

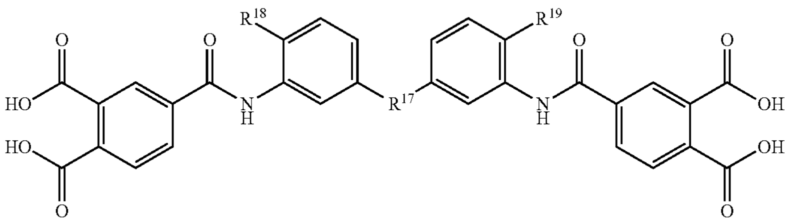

-continued

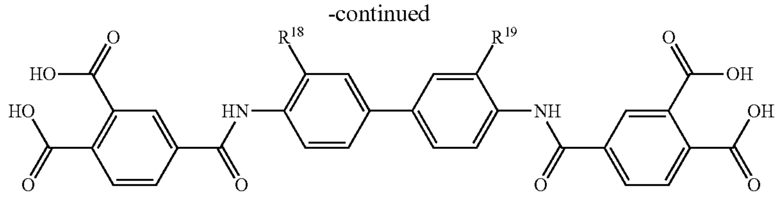

In the formulae, $R^{17}$ denotes an oxygen atom, $C(CF_3)_2$, or $C(CH_3)_2$. $R^{18}$ and $R^{19}$ are each a hydrogen atom or a hydroxyl group.

These acids may be used in their original form or in the form of anhydrides, halides, or active esters.

$W—(R^2)_b$ in the general formula (1), $(OH)_d—Y—(COOR^4)_f$ in the general formula (2), M in the general formula (3), and $U^1$ in the general formula (7) each denote an diamine residue. W, Y, M, and $U^1$ are each a divalent to octavalent organic group having 4 to 40 carbon atoms and in particular, they are each preferably an organic group containing 4 to 40 carbon atoms and having an aromatic ring or a cycloaliphatic group.

Specific examples of the diamine present in the diamine residue include hydroxyl group-containing diamines such as bis(3-amino-4-hydroxyphenyl) hexafluoropropane, bis(3-amino-4-hydroxyphenyl) sulfone, bis(3-amino-4-hydroxyphenyl) propane, bis(3-amino-4-hydroxyphenyl) methylene, bis(3-amino-4-hydroxyphenyl) ether, bis(3-amino-4-hydroxy) biphenyl, and bis(3-amino-4-hydroxyphenyl) fluorene; sulfonic acid-containing diamines such as 3-sulfonic acid-4,4'-diaminodiphenyl ether; thiol group-containing diamines such as dimercaptophenylene diamine; aromatic diamines such as 3,4'-diaminodiphenyl ether, 4,4'-diaminodiphenyl ether, 3,4'-diaminodiphenyl methane, 4,4'-diaminodiphenyl methane, 3,4'-diaminodiphenyl sulfone, 4,4'-diaminodiphenyl sulfone, 3,4'-diaminodiphenyl sulfide, 4,4'-diaminodiphenyl sulfide, 1,4-bis(4-aminophenoxy)benzene, benzine, m-phenylene diamine, p-phenylene diamine, 1,5-naphthalene diamine, 2,6-naphthalene diamine, bis(4-aminophenoxy phenyl) sulfone, bis(3-aminophenoxy phenyl) sulfone, bis(4-aminophenoxy)biphenyl, bis{4-(4-aminophenoxy)phenyl} ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, and 2,2'-bis(trifluoromethyl)-4,4'-diaminobiphenyl; compounds formed by substituting part of the hydrogen atoms in the aromatic rings in these aromatic substances by an alkyl group or fluoroalkyl group having 1 to 10 carbon atoms, or a halogen atom; diamines having nitrogen-containing aromatic heterocyclic groups such as 2,4-diamino-1,3,5-triazine (guanamine), 2,4-diamino-6-methyl-1,3,5-triazine (acetoguanamine), and 2,4-diamino-6-phenyl-1,3,5-triazine (benzoguanamine); silicone diamines such as 1,3-bis(3-aminopropyl)-1,1,3,3-tetramethyl disiloxane, 1,3-bis(p-aminophenyl)-1,1,3,3-tetramethyl disiloxane, 1,3-bis(p-aminophenethyl)-1,1,3,3-tetramethyl disiloxane, and 1,7-bis(p-aminophenyl)-1,1,3,3,5,5,7,7-octamethyl tetrasiloxane; alicyclic diamines such as cyclohexyl diamine and methylene biscyclohexyl amine; and diamines having structures as shown below. Two or more of these may be used in combination.

[Chemical compund 5]

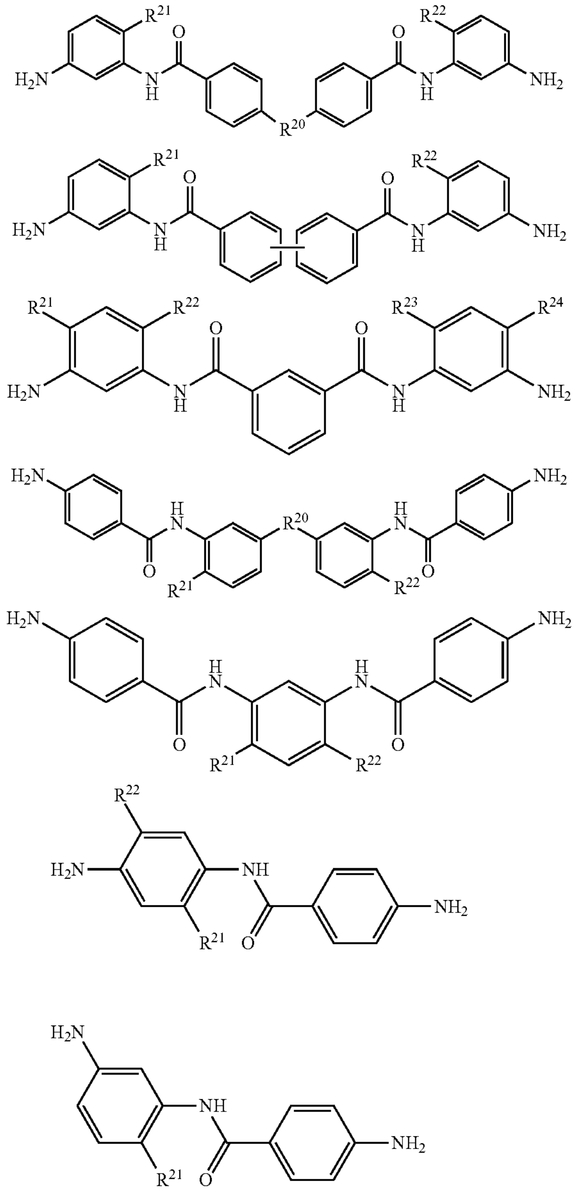

In the formulae, $R^{20}$ denotes an oxygen atom, $C(CF_3)_2$, or $C(CH_3)_2$. $R^{21}$ to $R^{24}$ are each independently a hydrogen atom or a hydroxyl group.

In particular, the inclusion of at least one diamine having a structure as shown below is preferable from the viewpoint of ensuring a higher alkali developability and providing a resin (A) and its cured film with a higher transmittance.

[Chemical compund 6]

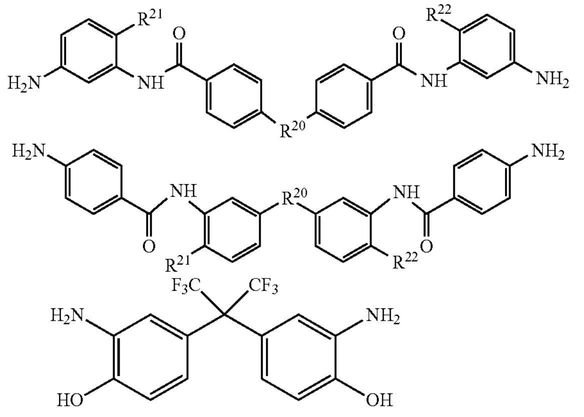

In the formulae, $R^{20}$ denotes an oxygen atom, $C(CF_3)_2$, or $C(CH_3)_2$. $R^{21}$ and $R^{22}$ are each independently a hydrogen atom or a hydroxyl group.

These diamines can be used in the form of the original diamines, diisocyanate compounds produced through reaction between diamine and phosgene, or trimethylsilylated diamines.

It is preferable for the resin (A) to contain a group selected from alkylene groups and alkylene ether groups. These groups may contain aliphatic rings. It is particularly preferable for the group selected from alkylene groups and alkylene ether groups to be a group as represented by the general formula (4).

[Chemical compound 7]

(4)

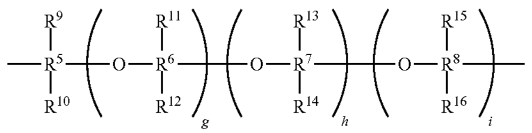

In the general formula (4), $R^5$ to $R^8$ each independently denote an alkylene group having 1 to 6 carbon atoms. $R^9$ to $R^{16}$ each independently denote a hydrogen atom, fluorine atom, or an alkyl group having 1 to 6 carbon atoms. However, the structures in parentheses are different from each other. Furthermore, g, h, and i each independently denote an integer of 0 to 35 and meet the relation $g+h+i>0$.

Groups as represented by the general formula (4) include, for example, ethylene oxide group, propylene oxide group, and butylene oxide group, which may be linear, branched, or cyclic.

For the first embodiment of the present invention, if the resin (A) has a group selected from alkylene groups and alkylene ether groups, it serves to allow the resin (A) and its cured film to have better mechanical characteristics, a higher elongation percentage in particular, and also achieve an increase in light transmittance at 450 nm between before and after curing. Since the group selected from alkylene groups and alkylene ether groups works to moderately lower the glass transition temperature of the resin (A) and increase its flowability, at least part of the resin film prepared from a resin composition containing the resin (A) will flow while forming a cured film by heat treatment, thereby increasing the flatness of the depressed surface. This prevents a significant depression from occurring when forming a layered structure involving the cured film, metal wires, and light emitting elements, which helps to reduce wiring defects such as short circuits in wires and defective connections of light emitting elements, thus serving to produce a display with a decreased light emission failure rate.

For the second embodiment of the present invention, if the resin (A) has a group selected from alkylene groups and alkylene ether groups, it serves to allow the resin (A) and its cured film to have better mechanical characteristics, a higher elongation percentage in particular, thereby further increasing its dielectric breakdown voltage.

In regard to the resin (A), it is preferable for W in the general formula (1) or Y in the general formula (2) to contain a group selected from alkylene groups and alkylene ether groups as described above. For the first embodiment of the present invention, this serves to allow the resin (A) and its cured film to have better mechanical characteristics, a higher elongation percentage in particular, and also achieve an increase in light transmittance at 450 nm between before and after curing. Furthermore, when the cured film of the resin composition is heat-treated at a low temperature to promote cyclization, it works to achieve an increased chemical resistance, stronger adhesion to the metal substrate, and durability in constant-temperature, constant-humidity test (HAST). For the second embodiment of the present invention, as well, this serves to allow the resin (A) and its cured film to have a higher elongation percentage and a higher dielectric breakdown voltage. Furthermore, when the cured film of a resin composition is heat-treated at a low temperature to promote cyclization, it works to achieve an increased chemical resistance, stronger adhesion to the metal substrate, and durability in constant-temperature, constant-humidity test (HAST).

Specific examples of such a diamine containing a group selected from alkylene groups and alkylene ether groups include ethylene diamine, 1,3-diaminopropane, 2-methyl-1,3-propane diamine, 1,4-diaminobutane, 1,5-diaminopentane, 2-methyl-1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, 1,2-cyclohexane diamine, 1,3-cyclohexane diamine, 1,4-cyclohexane diamine, 1,2-bis(aminomethyl) cyclohexane, 1,3-bis(aminomethyl) cyclohexane, 1,4-bis(aminomethyl) cyclohexane, 4,4'-methylene bis(cyclohexylamine), 4,4'-methylene bis(2-methylcyclohexylamine), KH-511, ED-600, ED-900, ED-2003, EDR-148, EDR-176, D-200, D-400, D-2000, THF-100, THF-140, THF-170, RE-600, RE-900, RE-2000, RP-405, RP-409, RP-2005, RP-2009, RT-1000, HE-1000, HT-1100, and HT-1700 (all trade names, manufactured by HUNTSMAN).

Here, these diamines may contain bonds such as —S—, —SO—, $—SO_2—$, —NH—, $—NCH_3—$, $—N(CH_2CH)—$, $—N(CH_2CH_2CH_3)—$, $—N(CH(CH_3)_2)—$, —COO—, —CONH—, —OCONH—, and —NHCONH—.

It is preferable for such a diamine residue containing a group selected from alkylene groups and alkylene ether groups to account for 5 mol % or more, more preferably 10 mol % or more, of all diamine residues. On the other hand, it preferably accounts for 40 mol % or less, more preferably 30 mol % or less, of all diamine residues. For the first embodiment of the present invention, if the content is in the above range, it serves not only to realize a higher developability with an alkaline developer, but also to allow the resin (A) and its cured film to have better mechanical characteristics, a higher elongation percentage in particular, and also achieve a higher light transmittance at 450 nm after curing. Furthermore, when the cured film of a resin composition is heat-treated at a low temperature to promote cyclization, it works to achieve an increased chemical resistance, stronger adhesion to the metal surface, and durability in constant-temperature, constant-humidity test (HAST). For the second embodiment of the present invention, as well, this serves to increase the developability with an alkaline developer and allow the resin (A) and its cured film to have a higher elongation percentage and a higher dielectric breakdown voltage. Furthermore, when the cured film of a resin composition is heat-treated at a low temperature to promote cyclization, it works to achieve an increased chemical resistance, stronger adhesion to the metal substrate, and durability in constant-temperature, constant-humidity test (HAST).

It may be copolymerized with a diamine residue having an aliphatic polysiloxane structure unless it suffers a decrease in heat resistance. Copolymerization with a diamine residue having an aliphatic polysiloxane structure can serve to improve the adhesion to the substrate. Specific examples of diamine components include bis(3-aminopropyl)tetramethyl disiloxane and bis(p-aminophenyl)octamethyl pentasiloxane copolymerized with 1 to 15 mol % of all diamine residues. Copolymerization in this range is preferable in terms of improvement in the adhesion to the substrate such as silicon wafer and prevention of a decrease in solubility in alkali solutions.

Chain ends of the resin (A) may be capped with a monoamine, anhydride, acid chloride, or monocarboxylic acid having an acidic group to provide a resin having acidic groups at backbone chain ends. As the monoamine, anhydride, acid chloride, or monocarboxylic acid having an acidic group, generally known ones may be adopted and a plurality thereof may be used in combination.

The end-capping agents such as monoamine, anhydride, acid chloride, and monocarboxylic acid preferably account for 2 to 25 mol % of the total quantity of the acid and amine components present in the resin (A), which accounts for 100 mol %.

The resin (A) preferably has a weight average molecular weight of 10,000 or more and 100,000 or less. A weight average molecular weight of 10,000 or more enables the production of a cured film having improved mechanical properties after curing. The weight average molecular weight is more preferably 20,000 or more. On the other hand, a weight average molecular weight of 100,000 or less is preferable because it serves to improve the developability with various developers, and a weight average molecular weight of 50,000 or less is preferable because it serves to improve the developability with alkali solutions.

The weight average molecular weight (Mw) can be determined by GPC (gel permeation chromatography). For example, N-methyl-2-pyrrolidone (hereinafter occasionally abbreviated as NMP) can be used as eluent to take measurements to determine the polystyrene based value.

It is preferable for the content of the resin (A) to be 3 to 55 mass %, more preferably 5 to 40 mass %, relative to the total quantity of all components including the solvent, which account for 100 mass %. A content in the above range makes it possible to adjust the viscosity appropriately for the implementation of spin coating or slit coating.

For the second embodiment of the present invention, other substances may also be used, including phenol resin, polymers containing, as a monomer unit, a radical polymerizable monomer having an alkali-soluble group such as polyhydroxystyrene and acrylic resin, siloxane polymers, cyclic olefin polymers, and cardo resin. Generally known resins may be employed, and these resins may be used singly or a plurality of resins may be used in combination.

For the first embodiment of the present invention, it is preferable for the resin (A) to further contain a phenol resin having a biphenyl structure.

It is preferable for the phenol resin having a biphenyl structure to have a structure as represented by the general formula (5).

[Chemical compound 8]

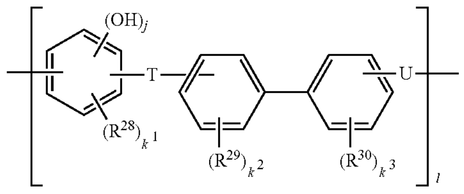

(5)

In the general formula (5), $R^{28}$, $R^{29}$, and $R^{30}$ each denote a monovalent organic group containing 1 to 20 carbon atoms; T and U each independently denote an alkylene group or alkylene oxide group containing 1 to 20 carbon atoms; j denotes an integer of 1 to 3; $k^1$, $k^2$, and $k^3$ each denote an integer of 0 to 2; and l denotes an integer of 3 to 100.

Examples of $R^{28}$, $R^{29}$, and $R^{30}$ include, but not limited to, a group selected from hydroxyl group, carboxyl group, sulfonic group, and thiol group, and a group selected from an aliphatic group containing 1 to 20 carbon atoms that may have an unsaturated bond, an alicyclic group containing 3 to 20 carbon atoms, and an aromatic group containing 6 to 20 carbon atoms.

Although j denotes an integer of 1 to 3, it is preferable for j to be an integer of 1 or 2, and it is more preferable for j to be the integer of 1, in order to develop a moderate alkali solubility.

Since the resin (A) contains a phenol resin having a biphenyl structure, there are no or few components that can be eliminated during heat treatment so that the rate of thickness change caused by heat treatment is small, thus preventing the formation of a significant depression. In addition, this works to moderately lower the glass transition temperature of the resin (A) and increase its flowability, and accordingly, at least part of the resin film prepared from a resin composition containing the resin (A) will flow while forming a cured film by heat treatment, thereby increasing the flatness of the depressed surface. This prevents a significant depression from occurring when forming a layered structure involving the cured film, metal wires, and light emitting elements, which helps to reduce wiring defects such as short circuits in wires and defective connections of light emitting elements, thus serving to produce a display with a decreased light emission failure rate.

It is preferable for the phenol resin having a biphenyl structure to be a resin containing a structure described below, though it is not limited to the undermentioned structure.

[Chemical compound 9]

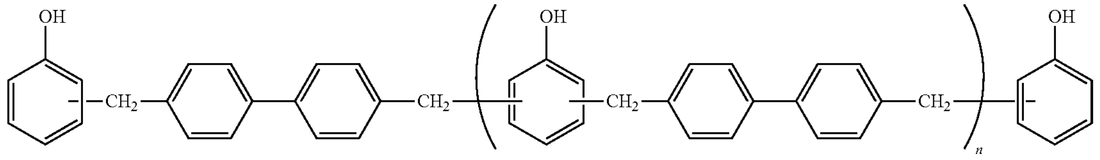

In the above formula, n denotes an integer of 2 to 99.

Specific examples of substances as represented by the general formula (5) or the formula given above include, but not limited to, the MEHC-7851 series phenol resins manufactured by Meiwa Plastic Industries, Ltd.

The phenol resin having a biphenyl structure preferably has a weight average molecular weight of 700 or more and 50,000 or less. If the weight average molecular weight is 700 or more, it serves to ensure a depressed surface with high flatness and prevent a significant depression from occurring when forming a layered structure involving the cured film, metal wires, and light emitting elements, which helps to reduce wiring defects such as short circuits in wires and defective connections of light emitting elements, thus serving to produce a display with a decreased light emission failure rate. On the other hand, if the weight average molecular weight is 50,000 or less, it serves to increase the compatibility with the one or more resins selected from the group consisting of polyimide, polyimide precursor, polybenzoxazole, polybenzoxazole precursor, and copolymers thereof and enhance the developability with various developers. If it is 9,000 or less, furthermore, it is more preferable because it serves to further increase the compatibility with the one or more resins selected from the group consisting of polyimide, polyimide precursor, polybenzoxazole, polybenzoxazole precursor, and copolymers thereof.

It is preferable for the phenol resin having a biphenyl structure to account for 5 parts by mass or more from the viewpoint of improving the flatness of the depressed surface, and more preferably 10 parts by mass or more from the viewpoint of improving the flatness of the depressed surface, relative to 100 parts by mass of the one or more resins selected from the group consisting of polyimide, polyimide precursor, polybenzoxazole, polybenzoxazole precursor, and copolymers thereof. On the other hand, from the viewpoint of the compatibility with the one or more resins selected from the group consisting of polyimide, polyimide precursor, polybenzoxazole, polybenzoxazole precursor, and copolymers thereof, it preferably accounts for 49 parts by mass or less, more preferably 19 parts by mass or less, relative to 100 parts by mass of the one or more resins selected from the group consisting of polyimide, polyimide precursor, polybenzoxazole, polybenzoxazole precursor, and copolymers thereof.

For the first embodiment of the present invention, other substances may also be used, including phenol resin, polymers containing, as a monomer unit, a radical polymerizable monomer having an alkali-soluble group such as polyhydroxystyrene and acrylic resin, siloxane polymers, cyclic olefin polymers, and cardo resin. These generally known resins may be employed, and they may be used singly or as a combination of plurality of these resins.

In the first embodiment and the second embodiment of the present invention, it is preferable for the resin composition containing the resin (A) to further include a photosensitizing agent (B) (hereinafter occasionally referred as the component (B)).

The inclusion of the component (B) serves to make the resin composition photosensitive and form a fine hole pattern.

The component (B) is a compound that undergoes changes in chemical structure when exposed to ultraviolet ray. Examples thereof include photo acid generator, photo base generator, and photo initiator. If a photo acid generator is used as the component (B), it works to produce an acid in the irradiated portion of the photosensitive resin composition so that the irradiated portion increases in solubility in alkaline developers, thus forming a positive type pattern in which the irradiated portion will be dissolvable.

If a photo base generator is used as the component (B), it works to produce a base in the irradiated portion of the resin composition so that the irradiated portion decreases in solubility in alkaline developers, thus forming a negative type pattern in which the irradiated portion will be insoluble.

If a photo initiator is used as the component (B), it works to produce radicals to cause radical polymerization in the irradiated portion of the resin composition so that the portion becomes insoluble in alkaline developers, thus forming a negative type pattern. Furthermore, UV curing is accelerated by the light irradiation, ensuring an increase in sensitivity.

For the first embodiment of the present invention, in order to allow the cured formed by curing a resin composition containing the resin (A) and the component (B) to have a depressed surface planarization rate as described above, it is preferable for the component (B) to be so high in heat resistance that it can avoid structural changes or elimination of groups that may be caused by heat treatment.

For the second embodiment of the present invention, the cured film formed by curing a resin composition containing the resin (A) and the component (B) preferably has a dielectric breakdown voltage of 360 kv/mm or more and 600 kv/mm or less. This serves to prevent the degradation of metal wires and leakage current, leading to low defective rates in reliability test.

To realize such characteristics, it is preferable that the component (B) can promote the reaction with the resin (A), the thermal crosslinking agent (C), or the like, that the decomposition product itself of the component (B) can react with the resin (A), the thermal crosslinking agent (C), or the like, or that it leaves little amount of organic acids after heat treatment. In order to decrease the amount of organic acids remaining after heat treatment, it is preferable for the resin composition containing the component (B) to be irradiated with light before being cured. The thermal crosslinking agent (C) will be occasionally referred to as the component (C).

From the viewpoint of fine processability, it is preferable for the resin composition containing the resin (A) to have positive photosensitivity.

Of the above substances that can work as the component (B), the use of a photo acid generator is preferable from the viewpoint of high sensitivity and fine processability. Examples of the photo acid generator include quinonediazide compounds, sulfonium salts, phosphonium salts, diazonium salts, and iodonium salts. In addition, a sensitizing agent etc. may also be included as required.

It is preferable for such a quinonediazide compound to have a structure in which a sulfonic acid of naphthoquinonediazide is connected through an ester bond to a compound having a phenolic hydroxyl group. Useful examples of the compound having a phenolic hydroxyl group include generally known ones, which preferably contain 4-naphthoquinonediazide sulfonic acid or 5-naphthoquinonediazide sulfonic acid that is introduced through an ester bond, though compounds other than these may also be used.

It is preferable that 50 mol % or more of the functional groups in these compounds having phenolic hydroxyl groups be substituted by quinonediazide. If using a quinonediazide compound that is substituted by 50 mol % or more, the quinonediazide compound is lower in the affinity with aqueous alkali solutions. As a result, the resin composition in the unirradiated portion will be much lower in solubility in the aqueous alkali solution in use. Furthermore, light irradiation works to convert the quinonediazide sulfonyl group into an indenecarboxylic acid, and accordingly, the photosensitive resin composition in the irradiated portion will become very high in the rate of dissolution in the aqueous alkali solution. Thus, this results in a large ratio in dissolution rate between the irradiated portion and the unirradiated portion of the composition, thereby making it possible to form a pattern with high resolution.

The inclusion of such a quinonediazide compound enables the production of a positive type photosensitive resin composition that is photosensitive not only to the i-line (365 nm), h-line (405 nm), or g-line (436 nm) of a common mercury lamp, but also to broad band light that contains them. Furthermore, the aforementioned compounds useful for the component (B) may be contained singly or two or more of them may be contained in combination to provide a highly photosensitive resin composition.

Useful quinonediazide compounds include not only those containing either a 5-naphthoquinonediazide sulfonyl group or a 4-naphthoquinonediazide sulfonyl group but also those containing both a 5-naphthoquinonediazide sulfonyl group and a 4-naphthoquinonediazide sulfonyl group in one molecule.

Useful naphthoquinonediazide sulfonyl ester compounds include 5-naphthoquinonediazide sulfonyl ester compounds (B-1) and 4-naphthoquinonediazide sulfonyl ester compounds (B-2), but for the first embodiment and the second embodiment of the present invention, it is preferable that a compound (B-1) be included. The compounds (B-1) absorb light over a wide range including the g-line of a mercury lamp, and therefore, they are suitable not only for g-line irradiation or also for full wavelength range irradiation. In addition, for the first embodiment of the present invention, they react with the resin (A) etc. in the curing step to form a crosslinked structure and accordingly serve to ensure increased chemical resistance. Furthermore, as compared to the compounds (B-2), they can avoid significant elimination of components in the heat treatment step and cause little stress or shrinkage left after heat treatment, and therefore, their use is also preferable from the viewpoint of the flatness of the depressed surface. In regard to the content of the compounds (B-1), they preferably account for 50 mass % or more and 100 mass % or less relative to the total quantity of all photosensitizing agents, that is, the total quantity of the compounds (B-1) and the compounds (B-2). If their content is in this range, it serves to produce a cured film with a high depressed surface planarization rate. In addition, for the second embodiment of the present invention, they react with the resin (A), the thermal crosslinking agent (C), etc. in the curing step to form a crosslinked structure, thereby providing a cured film with an increased tensile strength and an increased chemical resistance. Furthermore, as compared to the compounds (B-2), their use is preferable because they can prevent organic acid components from being left after the heat treatment step, thereby leading to an increased dielectric breakdown voltage. In regard to the content of the compounds (B-1), they preferably account for 55 mass % or more and 100 mass % or less relative to the total quantity of all photosensitizing agents, that is, the total quantity of the compounds (B-1) and the compounds (B-2). If their content is in this range, it serves to produce a cured film with a high dielectric breakdown voltage.

A quinonediazide compound can be synthesized by a generally known method through an esterification reaction between a compound containing a phenolic hydroxyl group and a quinonediazide sulfonic acid compound. The use of a quinonediazide compound serves to further increase the resolution, sensitivity, and residual film rate.

The molecular weight of the component (B) is preferably 300 or more, more preferably 350 or more, and preferably 3,000 or less, more preferably 1,500 or less, from the viewpoint of the heat resistance, mechanical properties, and adhesiveness of the film that can be produced by heat treatment.

Of the useful substances for the component (B), sulfonium salts, phosphonium salts, and diazonium salts are preferable because they can stabilize moderately the acid component generated by light irradiation. In particular, the use of a sulfonium salt is preferable.

It is preferable for the component (B) to account for 0.1 part by mass or more and 100 parts by mass or less relative to 100 parts by mass of the resin (A). When accounting for 0.1 part by mass or more and 100 parts by mass or less, the component (B) can work to develop photosensitivity while serving to produce a heat-treated film with high heat resistance, chemical resistance, and mechanical properties.

In the case where the component (B) contains a quinonediazide compound, it is more preferable for the component (B) to account for 1 part by mass or more, still more preferably 3 parts by mass or more, relative to 100 parts by mass of the component (A). On the other hand, its content is more preferably 100 parts by mass or less, still more preferably 80 parts by mass or less. When accounting for 1 part by mass or more and 100 parts by mass or less, it can work to develop photosensitivity while serving to produce a heat-treated film with high heat resistance, chemical resistance, and mechanical characteristics.

In the case where the component (B) contains a sulfonium salt, phosphonium salt, or diazonium salt, it is more preferable for the component (B) to account for 0.1 part by mass or more, still more preferably 1 part by mass or more, and particularly preferably 3 parts by mass or more, relative to 100 parts by mass of the resin (A). On the other hand, its content is more preferably 100 parts by mass or less, still more preferably 80 parts by mass or less, and particularly preferably 50 parts by mass or less. When accounting for 0.1 part by mass or more and 100 parts by mass or less, it can work to develop photosensitivity while serving to produce a heat-treated film with high heat resistance, chemical resistance, and mechanical characteristics.

In the case where it contains a photo base generator as the component (B), specific examples of good photo base generators include amide compounds and ammonium salts.

Such amide compounds include, for example, 2-nitrophenylmethyl-4-methacryloyloxypipeidine-1-carboxylate, 9-anthrylmethyl-N,N-dimethyl carbamate, 1-(anthraquinone-2-yl) ethylimidazole carboxylate, and (E)-1-[3-(2-hydroxyphenyl)-2-propenoyl] piperidine.

Such ammonium salts include, for example, 1,2-diisopropyl-3-(bisdimethylamino)methylene) guanidium 2-(3-benzoylphenyl) propionate, (Z)-{[bis(dimethylamino)methylidene]amino}-N-cyclohexylamino)methaniumtetrakis(3-fluorophenyl) borate, and 1,2-dicyclohexyl-4,4,5,5-tetramethylbiguanidium n-butyltriphenyl borate.

In the case where it contains a photo base generator as the component (B), it is preferable for the component (B) in the resin component to account for 0.1 part by mass or more, more preferably 0.5 part by mass or more, still more preferably 0.7 part by mass or more, and particularly preferably 1 part by mass or more, relative to 100 parts by mass of the resin (A). A content in the above range allows it to have an increased sensitivity in the light irradiation step. On the other hand, the content is preferably 25 parts by mass or less, more preferably 20 parts by mass or less, still more preferably 17 parts by mass or less, and particularly preferably 15 parts by mass or less. A content in the above range allows it to have an increased resolution after the development step.

When a photo initiator is to be added as the component (B), examples of preferable photo initiators include benzylketal based photo initiators, α-hydroxyketone based photo initiators, α-aminoketone based photo initiators, acylphosphine oxide based photo initiators, oxime ester based photo initiators, acridine based photo initiators, benzophenone based photo initiators, acetophenone based photo initiators, aromatic keto ester based photo initiators, benzoic ester based photo initiators, and titanocene based photo initiators. For all these photo initiators, generally known substances may be adopted, and two or more thereof may be used together. For the second embodiment of the present invention, their use is preferable because they can accelerate the reaction with the resin (A), the thermal crosslinking agent (C), or the like. Of these, from the viewpoint of ensuring improved sensitivity in the light irradiation step, more preferable ones include α-hydroxyketone based photo initiators, α-aminoketone based photo initiators, acylphosphine oxide based photo initiators, oxime ester based photo initiators, acridine based photo initiators, and benzophenone based photo initiators, of which α-aminoketone based photo initiators, acylphosphine oxide based photo initiators, and oxime ester based photo initiators are still more preferable.

In the case where a photo initiator is to be added as the component (B), it is preferable for the component (B) in the resin component to account for 0.1 part by mass or more, more preferably 0.5 part by mass or more, still more preferably 0.7 part by mass or more, and particularly preferably 1 part by mass or more, relative to 100 parts by mass of the resin (A). A content in the above range allows it to have an increased sensitivity in the light irradiation step. On the other hand, the content is preferably 25 parts by mass or less, more preferably 20 parts by mass or less, still more preferably 17 parts by mass or less, and particularly preferably 15 parts by mass or less. A content in the above range allows it to have an increased resolution after the development step.

In the first embodiment and the second embodiment of the present invention, it is preferable for the resin composition containing the resin (A) to further include a heat crosslinking agent (C). For the second embodiment of the present invention, the inclusion of the component (C) is preferable because it serves to produce a cured film with an increased dielectric breakdown voltage and chemical resistance.

A thermal crosslinking agent is a resin or a compound that contains at least two thermally reactive functional groups in one molecule. Examples of the thermally reactive functional groups include alkoxymethyl groups, methylol groups, and cyclic ether groups.

One or more compounds selected from alkoxymethyl compounds and methylol compounds (hereinafter occasionally referred to as the component (C-1)) may be used as the thermal crosslinking agent. The inclusion of the component (C-1) serves to further strengthen the crosslinks and allows the cured film to have increased chemical resistance to flux liquids and the like. Specific examples of the component (C-1) include methylol compounds having structures as given below and alkoxymethyl compounds with a hydrogen atom in the methylol group substituted by a methyl group or an alkyl group having 2 to 10 carbon atoms, though they are not limited to the structures shown below.

[Chemical formula 9-1]

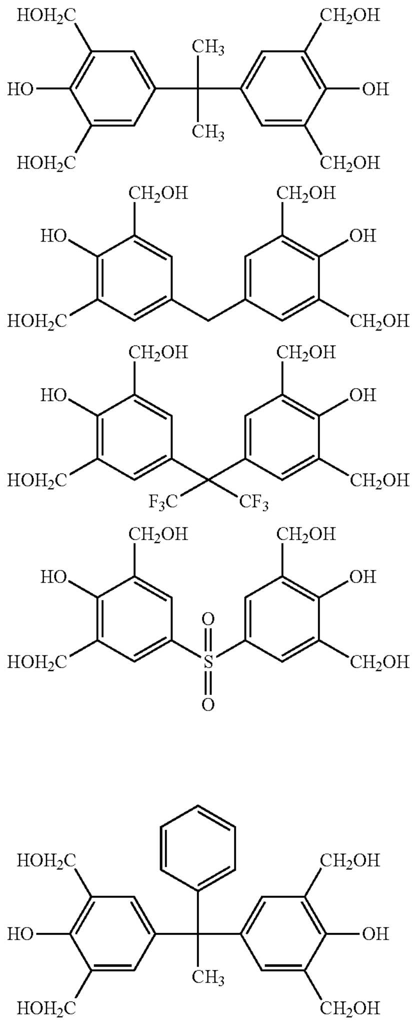

-continued
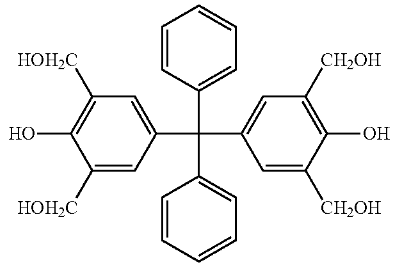
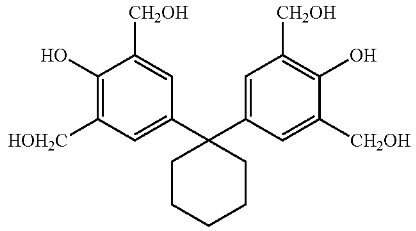
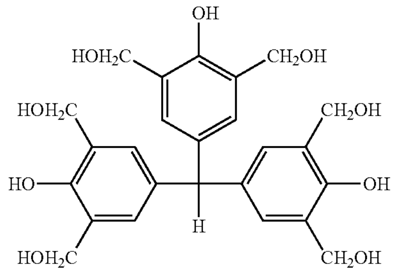
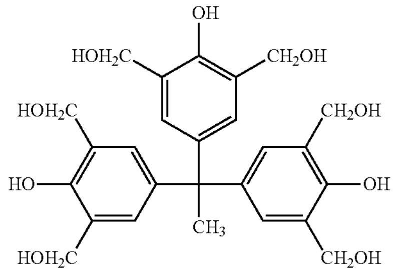
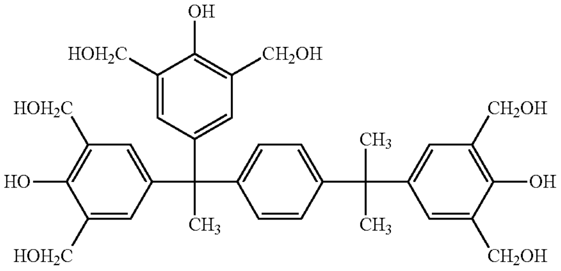
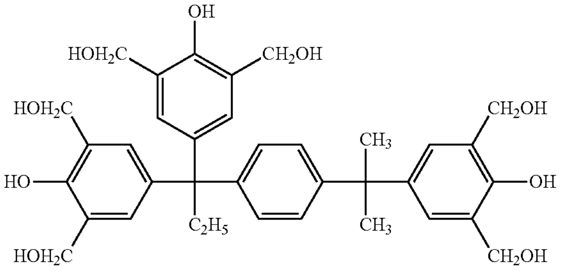
-continued
[Chemical formula 9-2]
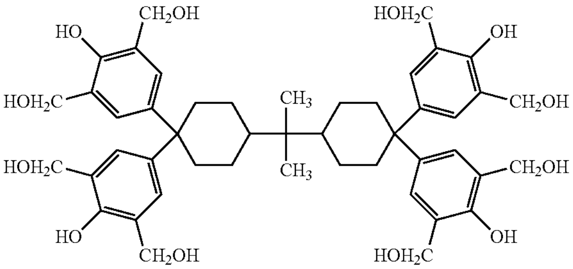
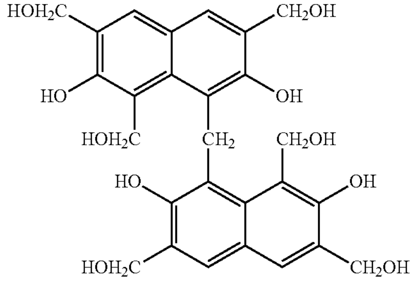
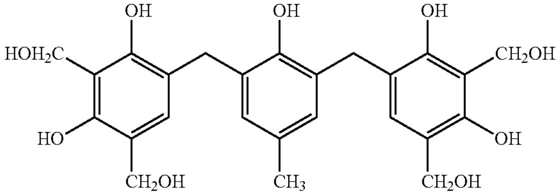
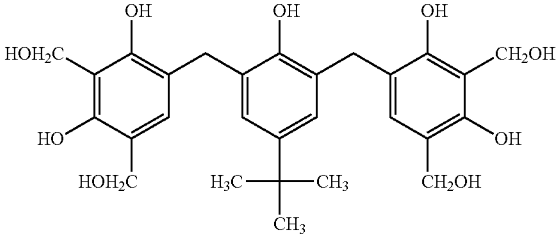
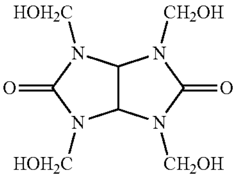
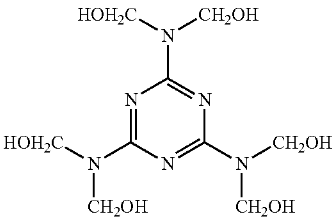
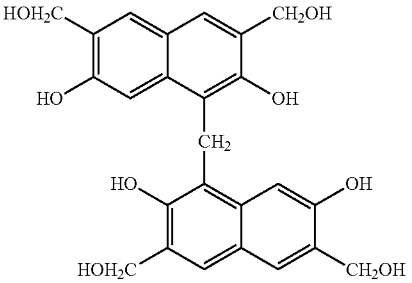

-continued

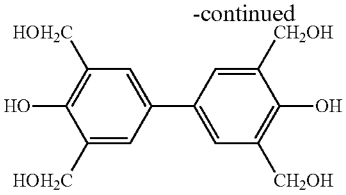

As the component (C), one or more cyclic ether group-containing compounds (hereinafter occasionally referred to as the component (C-2)) may be contained. The inclusion of the component (C-2) serves to allow the reaction to proceed at a low temperature of 160° C. or less, further strengthen the crosslinks, increase the dielectric breakdown voltage, and further increase the chemical resistance of the cured film.

Specific examples of the component (C-2) include Denacol (registered trademark) EX-212L, Denacol EX-214L, Denacol EX-216L, Denacol EX-850L, Denacol EX-321L (all manufactured by Nagase ChemteX Corporation), GAN, GOT (both manufactured by Nippon Kayaku Co., Ltd.), Epikote (registered trademark) 828, Epikote 1002, Epikote 1750, Epikote 1007, YX4000, YX4000H, YX8100-BH30, E1256, E4250, E4275 (all manufactured by Mitsubishi Chemical Corporation), Epicron (registered trademark) 850-S, Epicron HP-4032, Epicron HP-7200, Epicron HP-820, Epicron HP-4700, Epicron HP-4770, Epicron HP4032 (all manufactured by DIC Corporation), TECHMORE VG3101L (manufactured by Printec, Inc.), Tepic (registered trademark) S, Tepic G, Tepic P (all manufactured by Nissan Chemical Industries, Ltd.), Epotohto YH-434L (manufactured by Tohto Kasei Co., Ltd.), EPPN502H, NC-3000, NC-6000, XD-1000 (manufactured by Nippon Kayaku Co., Ltd.), Epicron N695, HP7200 (both manufactured by DIC Corporation), Etemacoll (registered trademark) EHO, Etemacoll OXBP, Etemacoll OXTP, Etemacoll OXMA (all manufactured by Ube Industries, Ltd.), and oxetanized phenol novolac.

Of these, substances having a triaryl methane structure or a biphenyl structure are preferable. Specific examples include YX4000 and YX4000H (both manufactured by Mitsubishi Chemical Corporation), TECHMORE VG3101L (manufactured by Printec, Inc.), and NC-3000.

Furthermore, for the first embodiment and the second embodiment of the present invention, it is preferable for the thermal crosslinking agent (C) to contain a thermal crosslinking agent having a biphenyl structure.

A thermal crosslinking agent is a resin or a compound that contains at least two thermally reactive functional groups in one molecule. Examples of the thermally reactive functional groups include alkoxymethyl groups, methylol groups, and cyclic ether groups.

For the present invention, the inclusion of the component (C) is preferable because it serves to realize increased chemical resistance.

Since a thermal crosslinking agent having a biphenyl structure works to moderately lower the glass transition temperature of a resin containing the resin (A), the component (B), and a thermal crosslinking agent having a biphenyl structure and increase their flowability, the resin film prepared from a resin composition containing the resin (A), the component (B), and a thermal crosslinking agent having a biphenyl structure suffers no or little elimination of components during heat treatment so that the rate of thickness change caused by heat treatment is small, thus preventing the formation of a significant depression. In addition, at least part thereof flows while forming a cured film by heat treatment, thereby increasing the flatness of the depressed surface. This prevents a significant depression from occurring when forming a layered structure involving the cured film, metal wires, and light emitting elements, which helps to reduce wiring defects such as short circuits in wires and defective connections of light emitting elements, thus serving to produce a display with a decreased light emission failure rate.

Specific examples of the thermal crosslinking agent having a biphenyl structure include, but not limited to, cyclic ether group-containing compounds as shown below, methylol compounds, and alkoxymethyl compounds with a hydrogen atom in the methylol group substituted by a methyl group or an alkyl group having 2 to 10 carbon atoms. It may be a copolymer and the biphenyl structure may have a substituent group.

[Chemical compound 10]

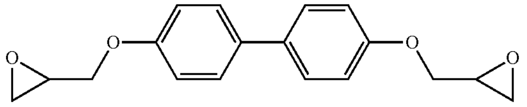

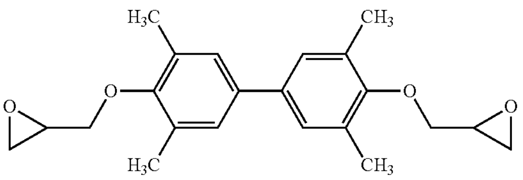

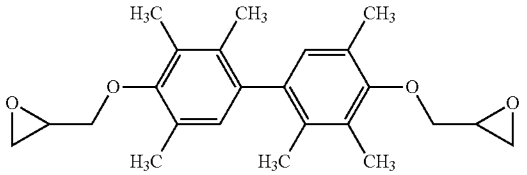

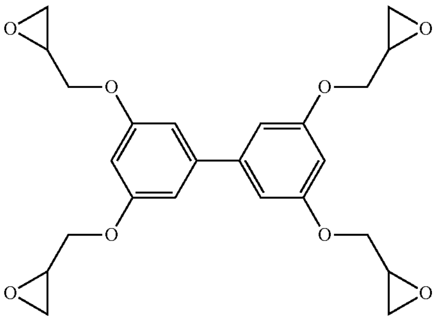

-continued
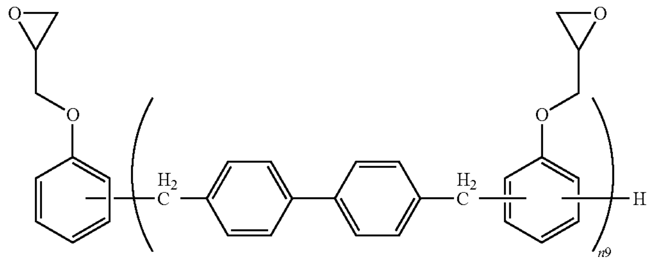
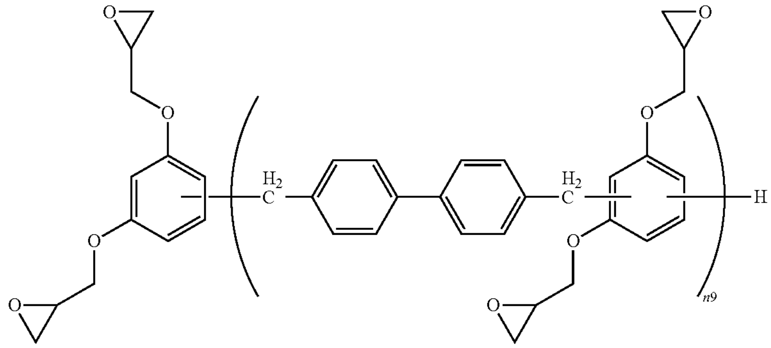
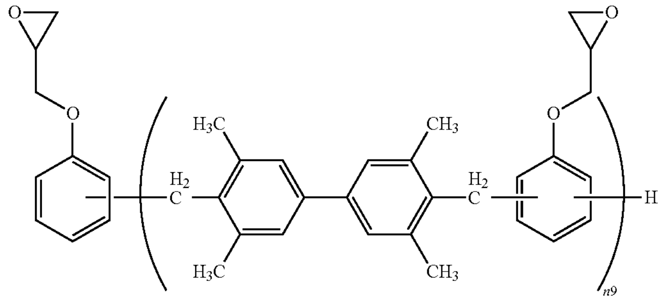
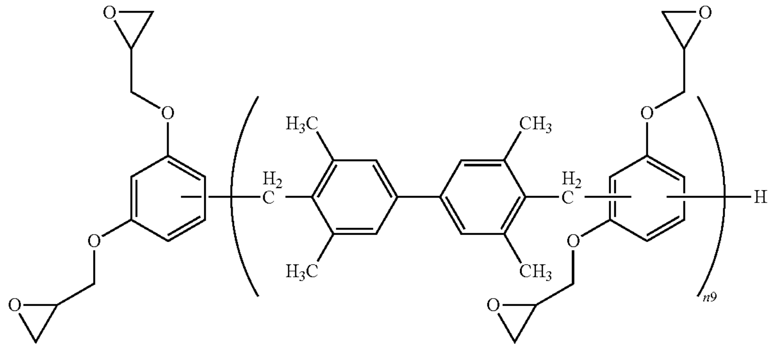
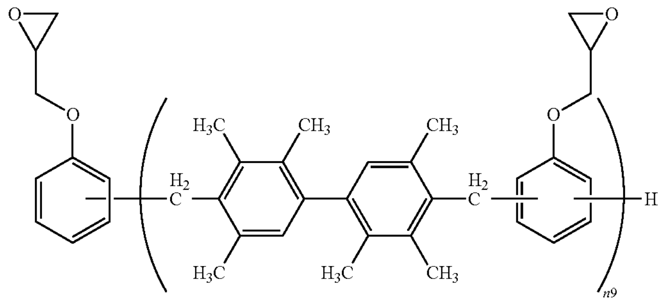

-continued
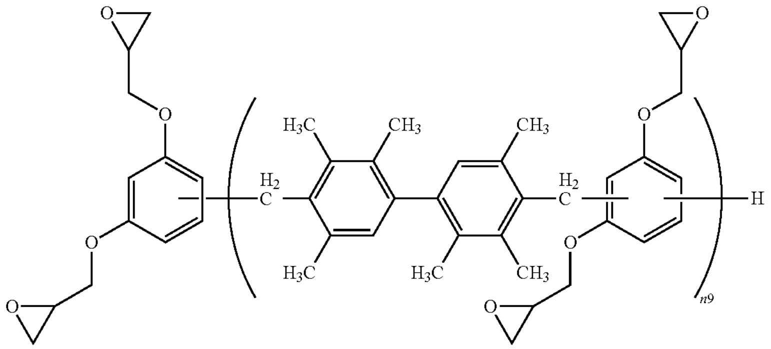
[Chemical compound 11]
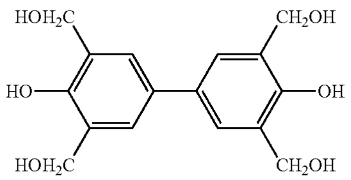
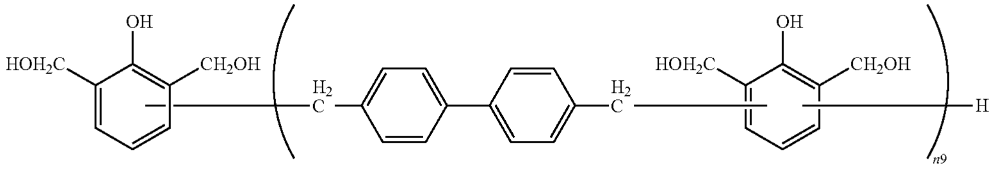
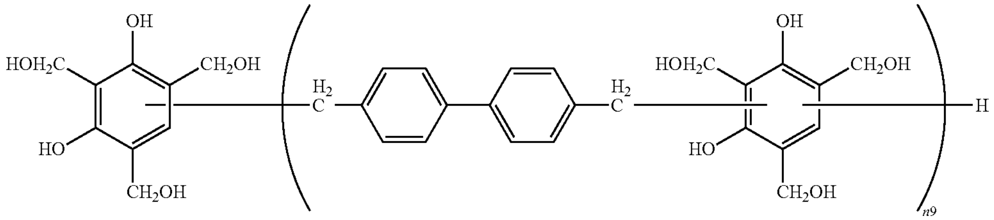
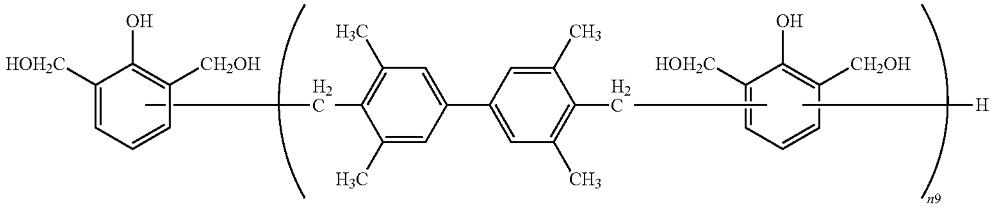
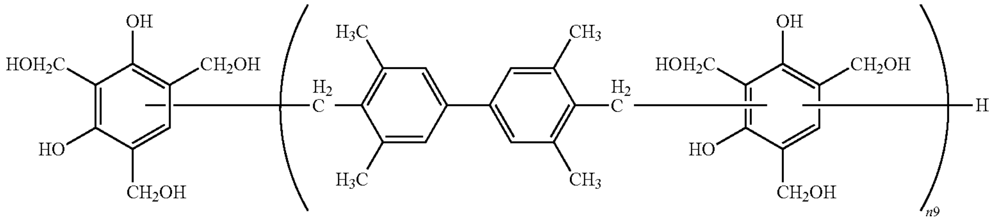
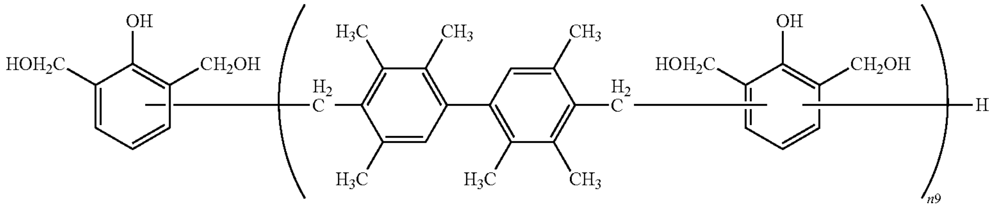

-continued

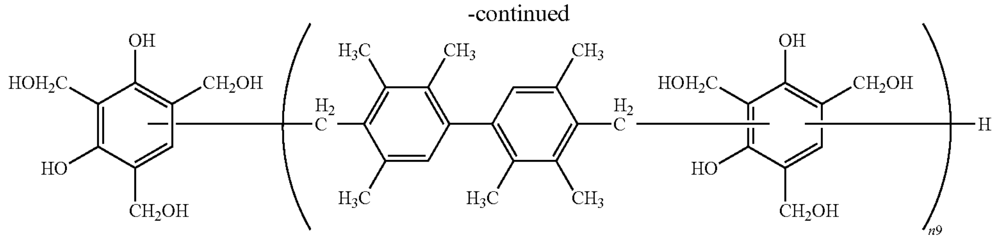

Here, n9 shows the number of repetitions and is an integer of 1 to 10.

For the first embodiment and the second embodiment of the present invention, one or more compounds each having a structural unit as represented by the general formula (6) given below (hereinafter occasionally referred to as the component (C-3)) may be contained as the component (C).

[Chemical compound 12]

(6)

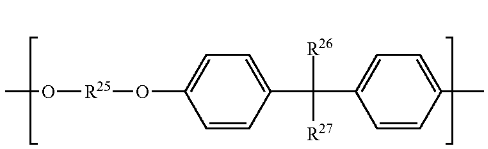

In the general formula (6), $R^{25}$ denotes a divalent organic group having an alkylene group or an alkylene ether group having 1 or more and 15 or less carbon atoms, and examples of such a group include methylene group, ethylene group, propylene group, butylene group, ethylene oxide group, propylene oxide group, and butylene oxide group, which may be linear, branched, or cyclic. Furthermore, some of the substituent groups in the divalent organic group having an alkylene group or an alkylene ether group containing 1 or more and 15 or less carbon atoms may have one or a combination of the following: cyclic ether groups, alkylsilyl groups, alkoxysilyl groups, aryl groups, aryl ether groups, carboxyl groups, carbonyl groups, allyl groups, vinyl groups, heterocyclic groups, and other substituent groups. $R^{25}$ and $R^{27}$ each independently denote a hydrogen atom or a methyl group.

A compound containing a structural unit as represented by the general formula (6) itself has both a flexible alkylene group and a rigid aromatic group. For the first embodiment of the present invention, therefore, the compound containing a structural unit as represented by the general formula (6) works to moderately lower the glass transition temperature of a resin containing the resin (A), the component (B), and a compound having a structural unit as represented by the general formula (6) and develop flowability. In the case of a resin film prepared from a resin composition containing the resin (A), the component (B), and a compound having a structural unit as represented by the general formula (6), therefore, at least part of it flows while forming a cured film by heat treatment, thereby increasing the flatness of the depressed surface. This prevents a significant depression from occurring when forming a layered structure involving the cured film, metal wires, and light emitting elements, which helps to reduce wiring defects such as short circuits in wires and defective connections of light emitting elements, thus serving to produce a display with a decreased light emission failure rate. For the second embodiment of the present invention, furthermore, the resulting cured film can be higher in elongation percentage and lower in stress while maintaining heat resistance. Examples of the crosslink group contained in the compound having a structural unit as represented by the component (6) include, but not limited to, acrylic groups, methylol groups, alkoxymethyl groups, and cyclic ether groups. Of these, cyclic ether groups are preferable because they can react with hydroxyl groups in the resin (A) to provide a cured film with an improved heat resistance and also because they can react without undergoing dehydration.

Specific examples of the compound that contains a structural unit as represented by the general formula (6) include, but not limited to, those having structures as described below.

[Chemical compound 13]

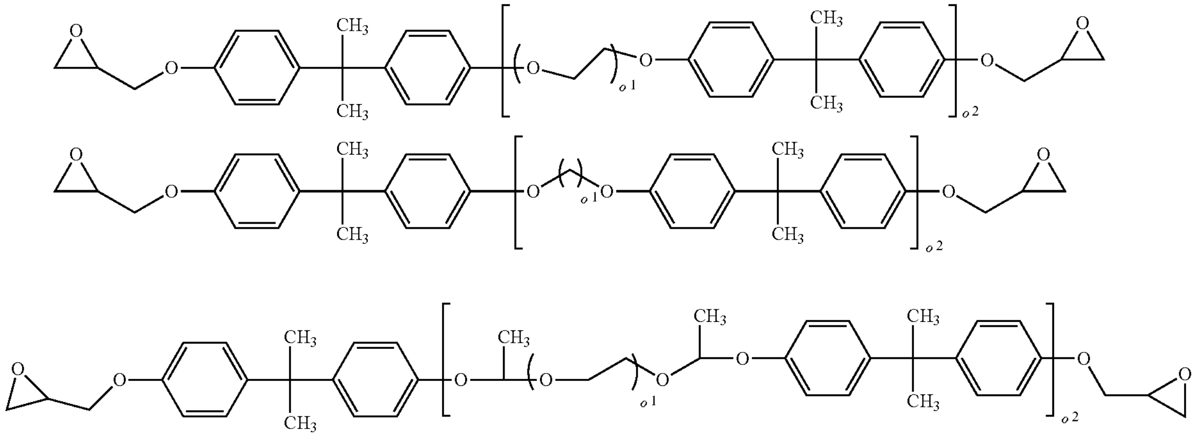

-continued

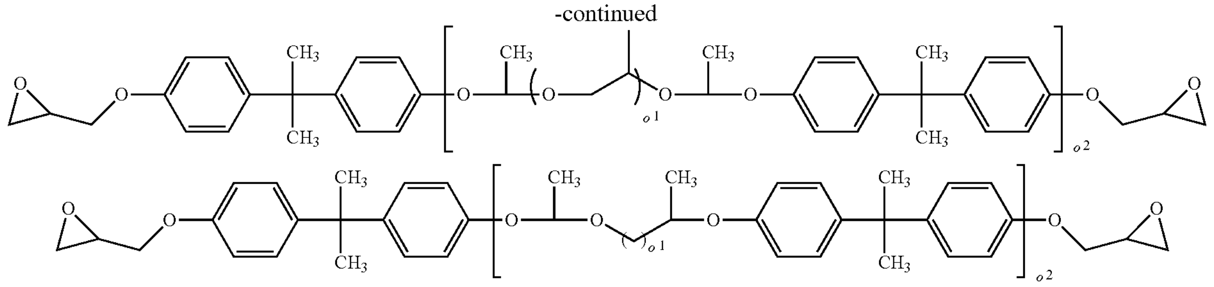

In the formulae, $o^1$ denotes an integer of 1 to 20 and $o^2$ denotes an integer of 1 to 5. In order to ensure both improved heat resistance and elongation percent, it is preferable that $o^1$ be an integer of 3 to 7 and $o^2$ be an integer of 1 or 2.

For the first embodiment of the present invention, furthermore, a generally known cyclic ether group-containing compound, alkoxymethyl compound, or methylol compound may be contained as a thermal crosslinking agent other than the aforementioned thermal crosslinking agents.

For the component (C), a combination of two or more of the aforementioned substances may be contained.

For the first embodiment and the second embodiment of the present invention, the component (C) preferably accounts for 5 parts by mass or more, more preferably 10 parts by mass or more, relative to 100 parts by mass of the resin (A), from the viewpoint of producing a cured film having high chemical resistance to flux liquids and the like. It preferably accounts for 100 parts by mass or less, more preferably 90 parts by mass or less, and still more preferably 80 parts by mass or less, relative to 100 parts by mass of the resin (A) because a cured film having high chemical resistance to flux liquids and the like can be produced while allowing the resin composition to maintain a high storage stability and also because it serves to prevent the separation of metal wires and cracks in the cured film after reliability test of the wires to which the cured film is applied.

For the first embodiment of the present invention, the thermal crosslinking agent having a biphenyl structure that may have a substituent group and the thermal crosslinking agent having a structural unit as represented by the general formula (14) preferably account for 15 parts by mass or more and 80 parts by mass or less relative to the total amount of the thermal crosslinking agent (C), which accounts for 100 parts by mass. This serves to increase the flatness of the depressed surface and prevent a significant depression from occurring when forming a layered structure involving the cured film, metal wires, and light emitting elements, which helps to reduce wiring defects such as short circuits in wires and defective connections of light emitting elements, thus serving to produce a display with a decreased light emission failure rate.

For the first embodiment and the second embodiment of the present invention, the resin composition containing the resin (A) may also include other components such as a radical polymerizable compound, antioxidant, solvent, compound having a phenolic hydroxyl group, adhesion promoter, adhesion promoter, and surfactant, as required.

Next, described below is the production method for the resin composition according to the first embodiment and the second embodiment of the present invention. For example, a resin composition can be prepared by mixing and dissolving the resin (A) along with the component (B), component (C), and various others such as radical polymerizable compound, antioxidant, solvent, compound with a phenolic hydroxyl group, adhesion promoter, adhesion promoter, and surfactant, as required.

For their dissolution, generally known methods such as heating and stirring can be used.

The resin composition preferably has a viscosity of 2 to 5,000 mPa·s. A desired film thickness can be realized easily by controlling the solid content so as to adjust the viscosity to 2 mPa·s or more. On the other hand, a highly uniform resin film can be obtained easily if the viscosity is 5,000 mPa·s or less. A resin composition having such a viscosity can be prepared easily by, for example, adjusting the solid content to 5 to 60 mass %. Here, the solid content means the content of the components other than the solvents.

The resulting resin composition is preferably filtrated through a filter to remove dust and particles. The filter to be used for filtration may be of such a material as polypropylene (PP), polyethylene (PE), nylon (NY), and polytetrafluoroethylene (PTFE), of which polyethylene and nylon are preferable.

To form a cured film by curing a resin composition containing the resin (A), a good method is to form a resin sheet first from the resin composition containing the resin (A) and then cure the resin sheet to produce a film.

A resin sheet as referred to above means a sheet of the resin composition formed on a base. Specifically, such a resin sheet is prepared by spreading the resin composition over a base and then dry it.

A film of polyethylene terephthalate (PET) or the like may be used as the base over which the resin composition is to be spread. In the case where a resin sheet is to be used after attaching it to a base such as silicon wafer, it may be necessary to remove the base by peeling. In such a case, it is preferable to adopt a base having a surface coated with a mold releasing agent such as silicone resin to allow the resin sheet and the base to be separated easily.

Described next is the production method for a display according to the present invention.

First, the production method for a display according to the first embodiment of the present invention is described.

Figure 14:
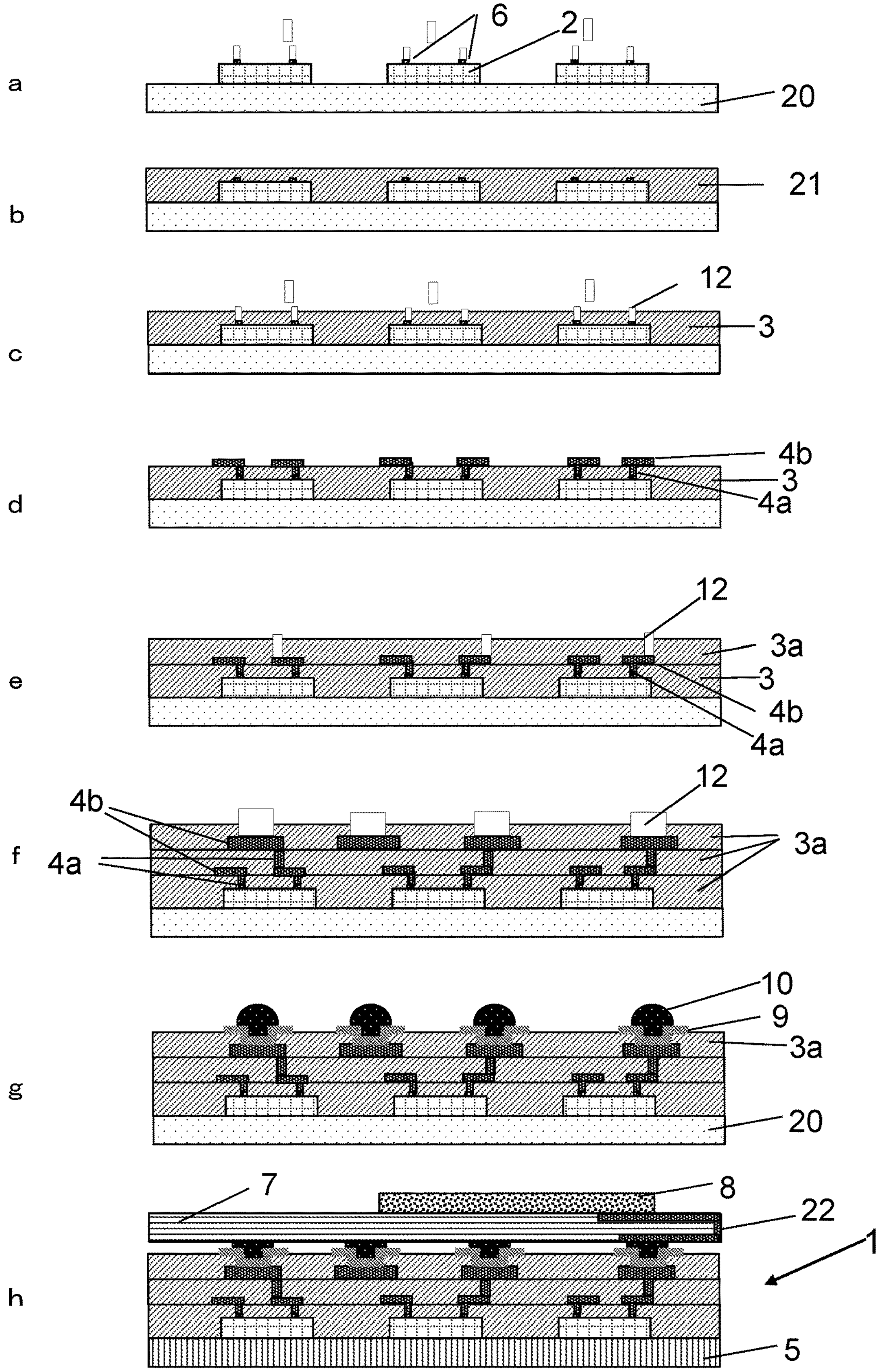
FIG. 14 This gives a cross-sectional view of a production process for an embodiment of the display according to the present invention.

FIG. 14 gives a sectional view of a production process for an example of the display having a plurality of light emitting elements according to the first embodiment of the present invention.

Hereinafter, a resin film refers to a film prepared by coating a substrate with a resin composition containing the resin (A) or by laminating it with a resin sheet, followed by drying it. In addition, a cured film refers to a film prepared by curing such a resin film or a resin sheet.

FIG. 14*a* illustrates a step in which light emitting elements 2 each having a pair of electrode terminals 6 are arranged on a support substrate 20. Useful examples of the support substrate include, but not limited to, glass substrate, silicon substrate, various ceramic substrates, gallium arsenide substrate, organic circuit board, and inorganic circuit board. These substrates may be provided with circuit components disposed thereon. Such a glass substrate and silicon substrate may have materials temporarily attached thereon. It may also be good to use a TFT array substrate. The support substrate may be removed in an appropriate step in the process, and another substrate may be added as opposite substrate after its removal.

Next, FIG. 14*b* shows a step in which a resin composition containing the resin (A) or a resin sheet prepared from a resin composition containing the resin (A) is laid by coating or laminating on the support substrate 20 and on the light emitting elements 2 to produce a resin film 21.

Here, the expression "on the support substrate 20 and on the light emitting elements" means that the composition or sheet is required only to be present at least either on the surface of the support substrate and on the surfaces of the light emitting elements or above the support substrate and above the light emitting elements, and the resin film may be formed by coating or laminating the cured film, metal wires, reflecting film, partition walls, etc., with a resin composition containing the resin (A) or a resin sheet prepared from a resin composition containing the resin (A).

Available coating methods include the spin coating method, slit coating method, dip coating method, spray coating method, and printing method. The required coating thickness depends on the coating method used, solid content in the composition, its viscosity, and the like, but commonly, coating is performed in such a manner that the film thickness will be 0.1 to 150 μm after drying.

Before the coating step, the support substrate to be coated with a resin composition containing the resin (A) may be pre-treated in advance with an adhesion promoter as described above. For example, an adhesion promoter is dissolved in a solvent such as isopropanol, ethanol, methanol, water, tetrahydrofuran, propylene glycol monomethyl ether acetate, propylene glycol monomethyl ether, ethyl lactate, and diethyl adipate to prepare a 0.5 to 20 mass % solution, which is then used to treat the surface of a substrate by an appropriate technique such as spin coating, slit die coating, bar coating, dip coating, spray coating, and steam treatment. After treating the substrate surface, reduced pressure drying may be performed as required. In addition, heat treatment at 50° C. to 280° C. may be performed to accelerate the reaction between the substrate and the adhesion promoter.

Then, the coating film of a resin composition containing the resin (A) is dried to form a resin film 21. Drying is preferably performed in the temperature range of 50° C. to 140° C. for one minute to several hours, using an oven, a hot plate, infrared rays, and the like.

On the other hand, in the case of using the aforementioned resin sheet, the protective film, if any, is removed from the resin sheet, and the resin sheet and the support substrate are held so that they are opposed to each other, followed by combining them by thermocompression bonding (such an operation of holding a resin sheet and a support substrate so that they are opposed to each other and combining them by thermocompression bonding will be occasionally expressed as laminating a support substrate with a resin sheet). Then, the resin sheet on the laminated support substrate is dried as in the case of the aforementioned resin film preparation to form a resin film 21. Such a resin sheet can be produced by spreading a resin composition containing a resin (A) on a support film of a strippable substrate material such as polyethylene terephthalate, followed by drying.

Thermocompression bonding can be carried out by hot pressing treatment, thermal lamination treatment, thermal vacuum lamination treatment, or the like. The combining temperature is preferably 40° C. or more from the viewpoint of the adhesion property to the substrate and embedding property. When the resin sheet is photosensitive, furthermore, the combining temperature is preferably 140° C. or less in order to prevent the resin sheet from being cured during the combining step to cause a decrease in resolution when forming a pattern in the light irradiation and development steps.

Next, FIG. 14*c* shows a step in which the resin film 21 is processed by photolithography to form through-hole patterns 12 having shapes that correspond to the metal wires 4.

High density arrangement of light emitting elements can be realized because fine processing techniques can be applied to the resin composition containing the resin (A) or to the resin sheet An actinic ray is applied to the surface of the photosensitive resin film through a mask having a desired pattern. Examples of actinic ray to be used for light irradiation include ultraviolet ray, visible light, electron beam, and X-ray. For the present invention, it is preferable to use the g-line (436 nm), h-line (405 nm), or i-line (365 nm). Beams of these wavelengths are generally used for light irradiation. In the case of a resin film that is not photosensitive, a photoresist is formed after preparing a resin film, and then an actinic ray such as described above is applied.

The irradiated photosensitive resin film 21 is then developed. Preferable developers include aqueous solutions of alkaline compounds such as tetramethyl ammonium, diethanolamine, diethyl aminoethanol, sodium hydroxide, potassium hydroxide, sodium carbonate, potassium carbonate, triethyl amine, diethyl amine, methyl amine, dimethyl amine, dimethylaminoethyl acetate, dimethylaminoethanol, dimethylaminoethyl methacrylate, cyclohexyl amine, ethylene diamine, and hexamethylene diamine. In some cases, these aqueous alkali solutions may also contain polar solvents such as N-methyl-2-pyrolidone, N,N-dimethyl formamide, N,N-dimethyl acetamide, dimethyl sulfoxide, γ-butyrolactone, and dimethyl acrylamide; alcohols such as methanol, ethanol, and isopropanol; esters such as ethyl lactate and propylene glycol monomethyl ether acetate; and ketones such as cyclopentanone, cyclohexanone, isobutyl ketone, and methyl isobutyl ketone; which may be added singly or as a combination of two or more thereof. Commonly, rinsing with water is performed after the development step. Here again, rinsing may be performed with a solution prepared by adding to water an alcohol such as ethanol and isopropyl alcohol or an ester such as ethyl lactate and propylene glycol monomethyl ether acetate.

Next, FIG. 14*c* shows a step in which the resin film 21 is cured to form a cured film 3.

The resin film 21 is heated to undergo a cyclization reaction or a thermal crosslinking reaction, thereby forming the cured film 3. The cured film 3 has an increased heat resistance and chemical resistance as a result of crosslinking of molecules of the component (A) with other molecules of the component (A) or with molecules of the component (B) or those of the component (C). This heat treatment may be carried out by raising the temperature stepwise or by raising it continuously. It is preferable for the heat treatment to be performed for 5 minutes to 5 hours. For example, heat treatment is performed first at 110° C. for 30 minutes and additional heat treatment is performed at 230° C. for 60 minutes. Preferable heat treatment conditions include a temperature range of 140° C. or more and 400° C. or less.

The heat treatment temperature is preferably 140° C. or more, more preferably 160° C. or more, in order to accelerate the thermal crosslinking reaction. On the other hand, the heat treatment temperature is preferably 300° C. or less, more preferably 250° C. or less, in order to form a good cured film, produce a display with improved reliability, and provide a heat-treated film with a depressed surface with higher flatness.

It is preferable for the heat treatment to be performed in an atmosphere with a low oxygen concentration in order to form a cured film with a high reliability. The oxygen concentration is preferably 1,000 ppm or less, more preferably 300 ppm or less, and still more preferably 50 ppm or less.

The cured film thus formed preferably has a hole pattern, and the hole pattern preferably has a cross section with an inclined side with an angle of 40° or more and 85° or less. If the cross section of the hole portion has an angle of 40° or more, it allows a plurality of light emitting elements to be arranged efficiently to ensure a high definition. It is more preferable for the hole portion to have a cross section with an angle of 50° C. or more. On the other hand, if the angle of the cross section of the hole portion is 85° or less, it serves to suppress the occurring of wiring defects such as short circuits in wires. The angle of the cross section of the hole portion is more preferably 80° or less.

FIG. 42 gives a frontal sectional view of a hole pattern in a cured film. In FIG. 42, the hole pattern formed in the cured film 3 has an inclined side 36 with an angle 37. Here, the inclined side is defined as the straight line connecting between the hole pattern at the position 39 that is located at ½ of the thickness of the cured film 3 and the hole pattern at the bottom.

Following this, in order to improve the adhesion between the cured film 3 and the metal wires (K1)4*a* or metal wires (K2)4*b* in FIG. 14*c*, barrier metal such as titanium is sputtered on the cured film 3 and in addition, a copper seed (seed layer) is formed on top of it by sputtering.

Next, FIG. 14*d* shows a step in which a photoresist layer (not shown in the figures) is formed, and then metal wires (K1)4*a* of copper or the like for electric connection to the pair of electrode terminals 6 on each light emitting element 2 are formed by the plating technique or the like in the hole pattern 12 in the cured film 3, followed by forming metal wires (K2)4*b* on part of the surface of the cured film 3. Subsequently, no longer necessary components such as photoresist, seed layer, and barrier metal are removed.

As a result of this, the cured film can act to maintain electric insulation of the metal wires, and the existence of the metal wires extending in the cured film serves to provide electric connection between the pair of electrode terminals on the light emitting element and the drive element, thereby serving for control of the light emission mechanism. In addition, because the cured film that is in contact with part of the surface of the metal wires has a depressed surface with high flatness, the cured film can work also as an insulation film or protective film for appropriate metal wires to prevent a significant depression from occurring when forming a layered structure involving the cured film, metal wires, and light emitting elements in a display, which helps to reduce wiring defects such as short circuits in wires and defective connections of light emitting elements, thus serving to produce a display with a decreased light emission failure rate.

The production method for a display according to the present invention may also have a step for forming a plurality of cured film layers in which each cured film layer contains metal wires as described above.

As illustrated in FIG. 14*e* to 14*f*, a cured film 3*a* having two or more layers can be produced by repeatedly carrying out the same procedure as for forming the cured film (F1)3*a*, metal wires (K1)4*a*, and metal wires (K2)4*b*.

This prevents a significant depression from occurring when forming a layered structure involving the cured film, metal wires, and light emitting elements, which helps to reduce wiring defects such as short circuits in wires and defective connections of light emitting elements, thus serving to produce a display with a decreased light emission failure rate. Furthermore, the existence of a plurality of cured film layers in which each cured film layer contains metal wires serves to arrange a plurality of light emitting elements and also serves to lower the height of the package and shorten the wire length, thereby realizing the prevention of wiring defects such as short circuits in wires, reduction of loss, and improvement in high speed response.

Subsequently, as illustrated in FIG. 14*g*, barrier metal 9 is formed by sputtering in the hole pattern 12 in the cured film (F1)3*a*, followed by forming solder bumps 10. Here, the barrier metal 9 may or may not be formed. Each solder bump 10 is electrically connected to, for example, a light emitting element driving substrate 7 that has a drive element such as driver IC.

It may be good to apply a plurality of drive elements 8 with different functions to a single light emitting element 2 or to one group of red, blue, and green light emitting elements 2. For example, a plurality of drive elements may be laid in the neighborhood of light emitting elements in carrying out the steps in FIG. 14. In that case, the drive elements are electrically connected b to the light emitting elements 2 by the metal wires (K1)4*a* and metal wires (K2)4*b* extending in the cured film 3 or the cured film (F1)3*a*.

Subsequently, as illustrated in FIG. 14*h*, they are electrically connected through the solder bump 10 to the light emitting element driving substrate 7 that has a drive element 8 such as driver IC. Then, the support substrate 20 is removed and an opposite substrate 5 is attached using an adhesive or the like, thus producing a display 1 that has a plurality of light emitting elements 2. Here, the metal wires 4 may include the electrodes therein.

As a result of this, the cured film can act to maintain electric insulation of the metal wires, and the existence of the metal wires extending in the cured film serves to provide electric connection between the pair of electrode terminals on the light emitting element and the drive element, thereby serving for control of the light emission mechanism. In addition, because the depressed surface of the cured film has high flatness, it serves to prevent a significant depression from occurring when forming a layered structure involving the cured film, metal wires, and light emitting elements, which helps to reduce wiring defects such as short circuits in wires and defective connections of light emitting elements, thus serving to produce a display with a decreased light emission failure rate.

Each metal wire 4 may be in the form of an electrically conductive film 34. FIG. 49 shows steps in which electrically conductive films 34 are adopted instead of the metal wires 4.

A step for irradiating the entire region of the resin film with light may be performed after the photolithographic step for forming through-hole patterns 12 having shapes that correspond to the metal wires 4 and before the step for curing the resin film 21.

Light irradiation performed after development serves to suppress coloring during heat treatment, thereby allowing a higher transmittance for light with a wavelength of 450 nm to be realized after the heat treatment. In particular, if a photo acid generator is used as the component (B), it will work particularly preferably.

In the production method of a display according to the first embodiment of the present invention, it is preferable that a step for forming partition walls with a thickness equal to or larger than the thickness of the light emitting elements be provided before the step in which light emitting elements 2, each having a pair of electrode terminals 6, are arranged on a support substrate 20.

Figure 15:
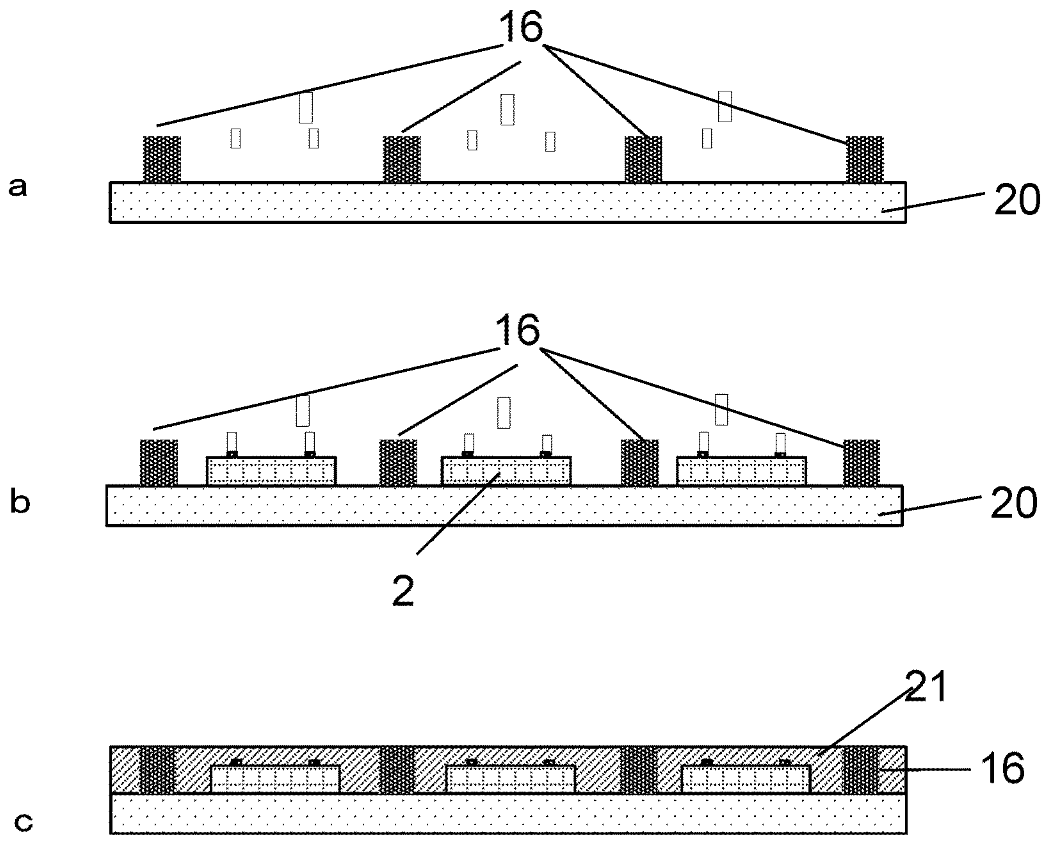
FIG. 15 This gives a cross-sectional view of a production process for an embodiment of the display according to the present invention that has partition walls.

FIG. 15*a* shows a step in which partition walls 16 with a thickness equal to or larger than the thickness of the light emitting elements 2 are formed on a support substrate, and the next diagram in FIG. 15*b* shows a step in which a plurality of light emitting elements 2 is formed between the partition walls with a thickness equal to or larger than the thickness of the light emitting elements 2. FIG. 15*c* shows a step similar to the step in FIG. 14*b* and is intended to form a resin film 21 after forming the partition walls 16. The subsequent steps are carried out as shown in FIG. 14. The partition walls may be made of the resin (A) or generally known materials such as epoxy resin, (meth)acrylic polymers, polyurethane, polyester, polyolefin, and polysiloxane. In addition, a shading component, reflecting component, etc. may also be provided.

For the production method of a display according to first embodiment of the present invention, it is preferable that a step for forming reflecting films on part of the cured film be provided after the step for curing the resin film 21.

Figure 16:
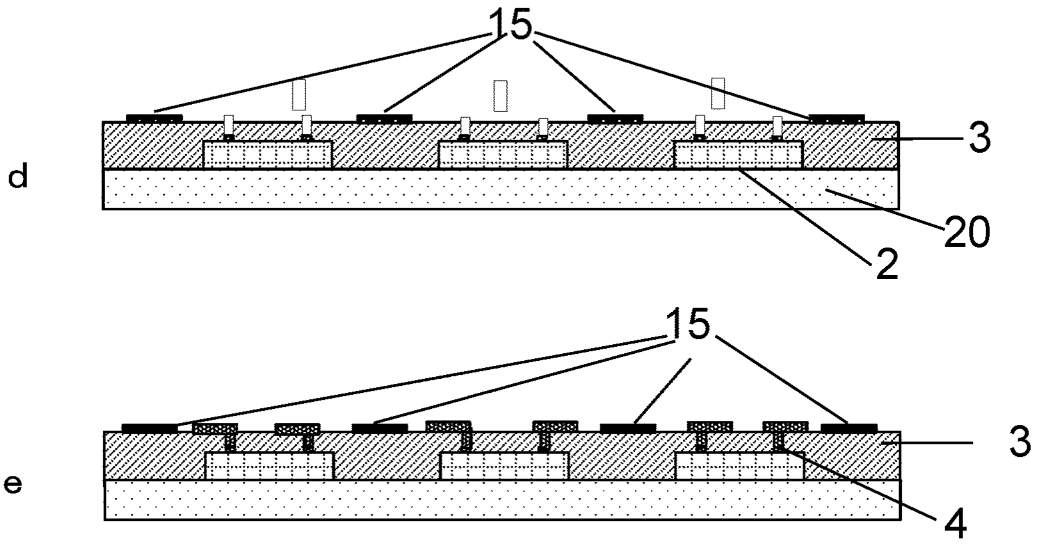
FIG. 16 This gives a cross-sectional view of a production process for an embodiment of the display according to the present invention that has reflecting films.

FIG. 16 shows a typical step for forming reflecting films on part of the cured film. FIG. 16*d* shows a step for forming reflecting films 15 on a partial region of the cured film 3.

The steps shown in and before FIG. 16*d* are the same as those shown in and before FIG. 14*c*, and the next step shown in FIG. 16*e* is the same as the step in FIG. 14*d* in which the metal wires (K1)4*a* and the metal wires (K2)4*b* are formed. The subsequent steps are carried out, with the reflecting films 15 maintained as formed, in the same order as shown in FIG. 14. The reflecting films are formed using such a material as aluminum, silver, copper, titanium, and an alloy containing them by an appropriate technique such as sputtering. Furthermore, in order to prevent them from overlapping the metal wires that will be formed later, it is preferable to protect the appropriate portions in advance using a photoresist etc. or apply an appropriate mask when forming them by sputtering.

For the production method for a display according to the first embodiment of the present invention, it is preferable that the step in which metal wires (K1)4*a* of copper or the like for electric connection to the pair of electrode terminals 6 on each light emitting element 2 are formed by the plating technique or the like in the hole pattern 12 in the cured film 3, followed by forming metal wires (K2)4*b* on part of the surface of the cured film 3, be followed by a step in which a drive element and substrate are formed in such a manner that the drive element is connected to the light emitting elements by metal wires and that at least part of the metal wires extends along a side face of the substrate.

FIG. 14*h* shows a step in which a drive element and substrate are formed in such a manner that the drive element is connected to the light emitting elements by metal wires. As illustrated in FIG. 14*h*, the drive element 8 is connected to the light emitting elements 2 by metal wires 4 and 22, and part of the metal wire 22 extends along the side face of the light emitting element driving substrate 7. Here, if there are electrodes that penetrate the light emitting element driving substrate 7, the connection to the drive element 8 may be established through those penetrating electrodes.

This serves to decrease the height of the display itself and enhance the high speed response, thereby realizing the production of a smaller display with a smaller frame.

The metal wire 22 may be made of, for example, gold, silver, copper, aluminum, nickel, titanium, tungsten, aluminum, tin, chromium, or an alloy containing them. If the substrate or light emitting element driving substrate 7 has other existing wires, it may be good to use such wires.

For the production method for a display according to the first embodiment of the present invention, the metal wires may be in the form of electrically conductive films.

In FIG. 43*h*, the drive elements are connected to the light emitting elements 2 by the metal wires 4 and the electrically conductive film 34, and part of the electrically conductive film 34 extends along the side face of the light emitting element driving substrate 7.

Preferable materials for the electrically conductive film 34 include compounds containing, as primary component, an oxide of at least one substance selected from indium, gallium, zinc, tin, titanium, niobium, or the like, and photosensitive electrically conductive pastes containing organic substances and electrically conductive particles.

It is preferable for the production method for a display according to the first embodiment of the present invention to further include a step for forming shading layers between the two or more light emitting elements.

FIG. 44*a* shows a step for forming shading layers 35 between the two or more light emitting elements 2. Here, the shading layers 35 may be formed either before the formation of the light emitting elements 2 or after the formation of the light emitting elements 2.

The shading layers 35 may be constructed mainly of a cured film formed by curing a resin composition containing the resin (A) and a coloring material (E) or may be of a material other than a resin composition containing the resin (A), and good materials include generally known ones such as epoxy resin, (meth)acrylic polymers, polyurethane, polyester, polyolefin, and polysiloxane. A black pigment may be used as the coloring material (E), and good materials include, for example, black organic pigments such as carbon black, perylene black, and aniline black, and inorganic pigments including graphite and fine particles of metal such as titanium, copper, iron, manganese, cobalt, chromium, nickel, zinc, calcium, and silver, as well as metal oxides, composite oxides, metal sulfides, metal nitrides, and metal oxynitrides thereof. Furthermore, a red pigment and a blue pigment may be combined, along with a yellow pigment and other pigments as required, to provide a black mixture. Dyes may also be used. Two or more coloring materials may be contained together.

The resin composition containing a resin (A) and a coloring material (E) may be made photosensitive, and a photosensitizing agent (B) as described later may be used.

In regard to methods for forming such a shading layer, a photolithography step may be adopted when it has photosensitivity, whereas when it does not have photosensitivity, a photoresist may be formed first on a shading layer followed by carrying out a photolithography step or an etching step, wherein a mask may be used for etching. A patterned colored film can be produced by heat-treating (postbaking) the pattern formed above. The heat treatment may be performed in an air atmosphere, a nitrogen atmosphere, or a vacuum. The heating temperature is preferably 100° C. to 300° C., and the heating time is preferably 0.25 to 5 hours. The heating temperature may be changed continuously or stepwise.

Figure 17:
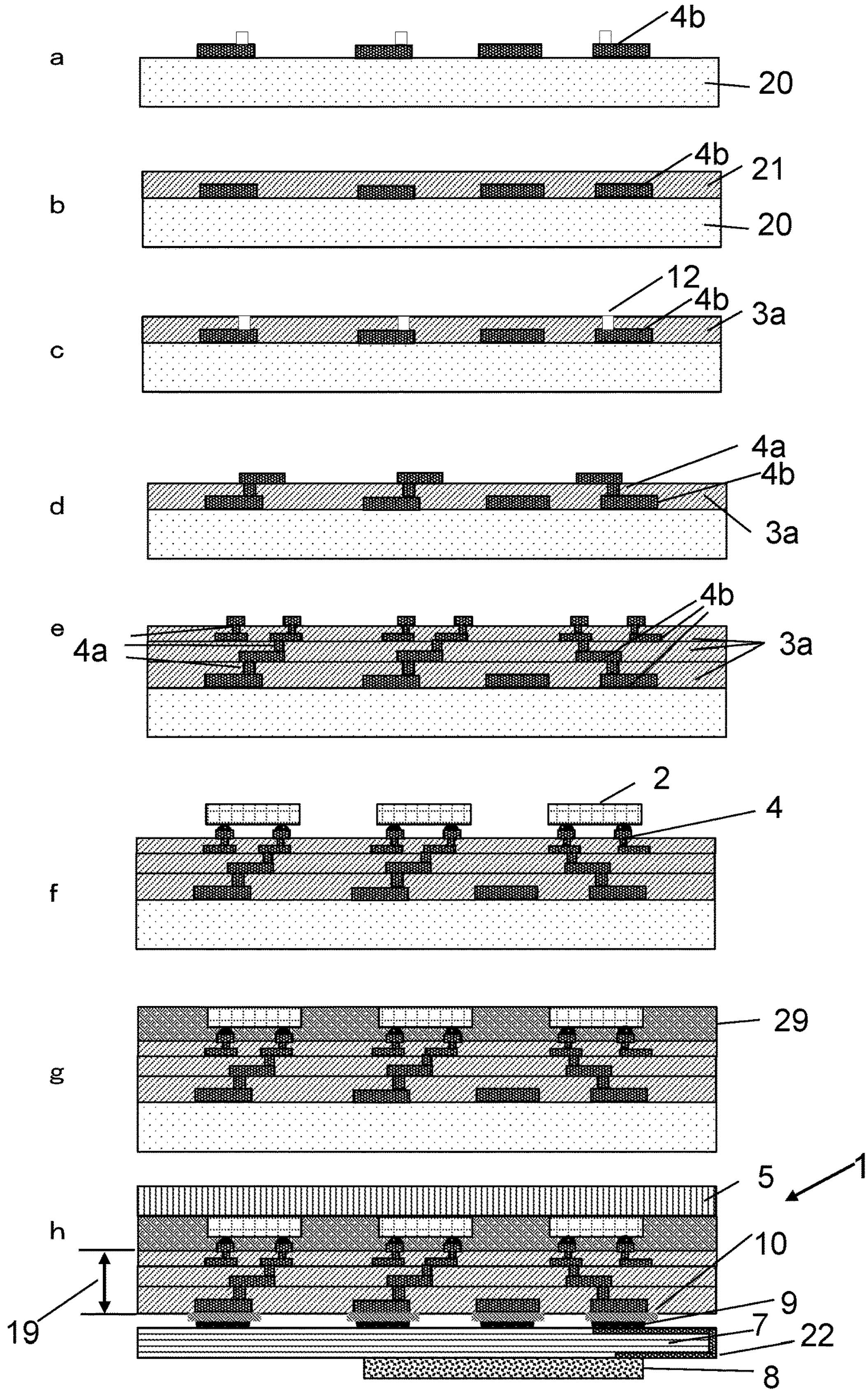
FIG. 17 This gives a cross-sectional view of a production process for another aspect of the display according to the present invention.

FIG. 17 gives a cross-sectional view of another embodiment of the production process for the display 1 according to the first embodiment of the present invention. Some steps are the same as those in FIG. 14. Specifically, FIGS. 17*b* to 17*e* overlap FIGS. 14*b* to 14*f*, and therefore, are not described here.

FIG. 17*a* illustrates a step that is designed to form a metal wire (K2)4*b* on a support substrate 20. The metal wires (K2)4*b* are made of copper, aluminum, or the like. They may be used as electrode pads.

Then, FIG. 17*b* shows a step in which a resin composition or a resin sheet containing the resin (A) is laid by coating or laminating on the support substrate 20 and on the metal wires (K2)4*b* to produce a resin film 21.

Here, the expression "on the support substrate 20 and on the wires (K2)4*b*" means that the composition or sheet is required only to be present at least either on the surface of the support substrate and on the surface of the wires (K2)4*b* or above the support substrate and above the wires (K2)4*b*, and the resin film may be formed by coating or laminating a cured film, metal wires, reflecting film, partition walls, etc., with a resin composition containing the resin (A) or a resin sheet prepared from a resin composition containing the resin (A).

Next, FIG. 17*c* shows a step in which the resin film 21 is processed by photolithography to form a plurality of through-hole patterns 12 in the resin film 21.

Next, FIG. 17*c* shows a step in which the resin film 21 is cured to form a cured film (F1)3*a*.

Following this, in order to improve the adhesion between the cured film (F1)3*a* and the metal wires (K1)4*a* or metal wires (K2)4*b* in FIG. 17*c*, barrier metal such as titanium is sputtered on the cured film (F1)3*a* and in addition, a copper seed (seed layer) is formed on top of it by sputtering.

Next, FIG. 17*d* shows a step in which a photoresist layer (not shown in the figures) is formed, and then metal wires (K1)4*a* of copper or the like are formed by the plating technique or the like in the hole patterns 12 in the cured film (F1)3*a*, followed by forming metal wires (K2)4*b* on part of the surface of the cured film (F1)3*a*. Subsequently, no longer necessary components such as photoresist, seed layer, and barrier metal are removed.

As a result of this, the cured film can act to maintain electric insulation of the metal wires, and the existence of the metal wires extending in the cured film serves to provide electric connection between the pair of electrode terminals on the light emitting element and the drive element, thereby serving for control of the light emission mechanism. In addition, because the cured film that is in contact with part of the surface of the metal wires has a depressed surface with high flatness, the cured film can work also as an insulation film or protective film for appropriate metal wires to prevent a significant depression from occurring when forming a layered structure involving the cured film, metal wires, and light emitting elements in a display, which helps to reduce wiring defects such as short circuits in wires and defective connections of light emitting elements, thus serving to produce a display with a decreased light emission failure rate.

The production method for a display according to the first embodiment of the present invention may also have a step for forming a plurality of cured film layers in which each cured film layer contains metal wires as described above.

A cured film (F1)3*a* that has two or more layers can be produced by repeatedly carrying out the same procedure on the cured film (F1)3*a* and metal wires (K2)4*b* as illustrated in FIG. 17*e*.

This prevents a significant depression from occurring when forming a layered structure involving the cured film, metal wires, and light emitting elements, which helps to reduce wiring defects such as short circuits in wires and defective connections of light emitting elements, thus serving to produce a display with a decreased light emission failure rate. Furthermore, the existence of a plurality of cured film layers in which each cured film layer contains metal wires serves to arrange a plurality of light emitting elements and also serves to lower the height of the package and shorten the wire length, thereby realizing the prevention of wiring defects such as short circuits in wires, reduction of loss, and improvement in high speed response.

Next, FIG. 17*f* shows a step in which light emitting elements 2 are arranged on the cured film 3 while maintaining electric connection to the metal wires 4. The electrode terminals 6 on each light emitting element 2 and the metal wires 4 may be connected either directly or via a solder ball etc.

As illustrated in FIG. 17*g*, a step for forming a cured film 29 on the cured film 3*a* and on the light emitting elements 2 may also be included. In regard to the formation of a cured film 29, it is preferable to form a cured film 29 by coating with a resin composition containing the resin (A) or lamination with a resin sheet prepared from a resin composition containing the resin (A) to form a resin film from a resin composition, followed by curing it. It may be made of a material other than a resin composition containing the resin (A), and examples of such a material include generally known ones such as epoxy resin, silicone resin, and fluorine resin.

Suitable curing conditions depend on the type of resin used, but for example, curing may be performed at 80° C. to 230° C. for 15 minutes to 5 hours.

The formation of a cured film on the light emitting elements is intended to protect the light emitting elements or planarize the surface.

Next, FIG. 17*h* shows a step in which an opposite substrate 5 is attached to the light emitting elements 2 and the cured film 29 using an adhesive etc. Then, the support substrate 20 is removed and barrier metal 9 and bumps 10 are formed to establish electrical connection via the solder bumps 10 to a light emitting element driving substrate 7 that carries a drive element 8 such as driver IC.

The drive element 8 is electrically connected to the light emitting elements 2 by the metal wires 22 along with the metal wires (K1)4*a* and metal wires (K2)4*b* that extend in the cured film (F1)3*a*, thus producing a display 1 that has a plurality of light emitting elements 2. Here, the metal wires 4 may include the electrodes therein.

As a result of this, the cured film can act to maintain electric insulation of the metal wires, and the existence of the metal wires extending in the cured film serves to provide electric connection between the pair of electrode terminals on the light emitting element and the drive element, thereby serving for control of the light emission mechanism. In addition, the cured film has a high depressed surface planarization rate and it serves to prevent a significant depression from occurring when forming a layered structure involving the cured film, metal wires, and light emitting elements, which helps to reduce wiring defects such as short circuits in wires and defective connections of light emitting elements, thus serving to produce a display with a decreased light emission failure rate.

Each metal wire 4 may be in the form of an electrically conductive film 34. FIG. 50 shows steps in which electrically conductive films 34 are adopted instead of the metal wires 4.

A step for irradiating the entire region of the resin layer with light may be performed after the photolithographic step for forming through-hole patterns 12 having shapes that correspond to the metal wires 4 and before the step for curing the resin film 21.

Light irradiation of the resin layer performed after development serves to suppress coloring during heat treatment, thereby allowing a higher transmittance for light with a wavelength of 450 nm to be realized after the heat treatment. In particular, if a photo acid generator is used as the component (B), it will work particularly preferably.

For the production method for a display according to the first embodiment of the present invention, it is preferable that a step for forming partition walls with a thickness equal to or larger than the thickness of the light emitting elements be performed before the step in which light emitting elements 2 are arranged on the cured film 3 while maintaining electric connection with the metal wires 4.

Figure 18:
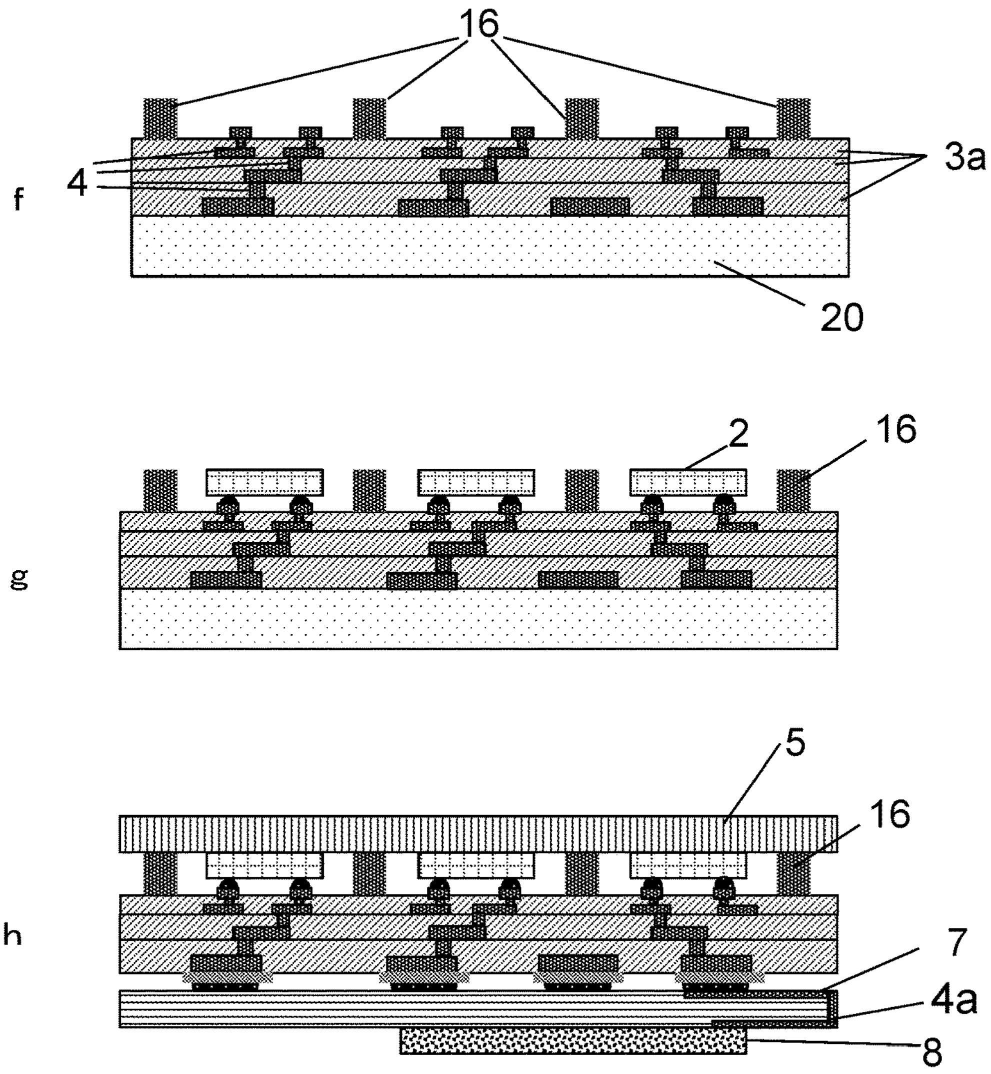
FIG. 18 This gives a cross-sectional view of a production process for another aspect of the display according to the present invention that has partition walls.

FIG. 18*f* shows the step in which partition walls 16 are formed after forming a plurality of cured film layers 3*a* as in FIG. 17*e*. Subsequently, light emitting elements 2 are formed between the partition walls 16 as shown in FIG. 18*g* and an opposite substrate 5 is attached on top of the partition walls 16 and the light emitting elements 2 as shown in FIG. 18*h*. Then, the support substrate 20 is removed, and barrier metal 9 and bumps 10 are formed to establish electrical connection via the solder bumps 10 to a light emitting element driving substrate 7 that carries a drive element 8 such as driver IC.

For the production method for a display according to the first embodiment of the present invention, it is preferable that a step for forming reflection films on part of the cured film be performed before the step in which light emitting elements 2 are arranged on the cured film 3 while maintaining electric connection with the metal wires 4.

Figure 19:
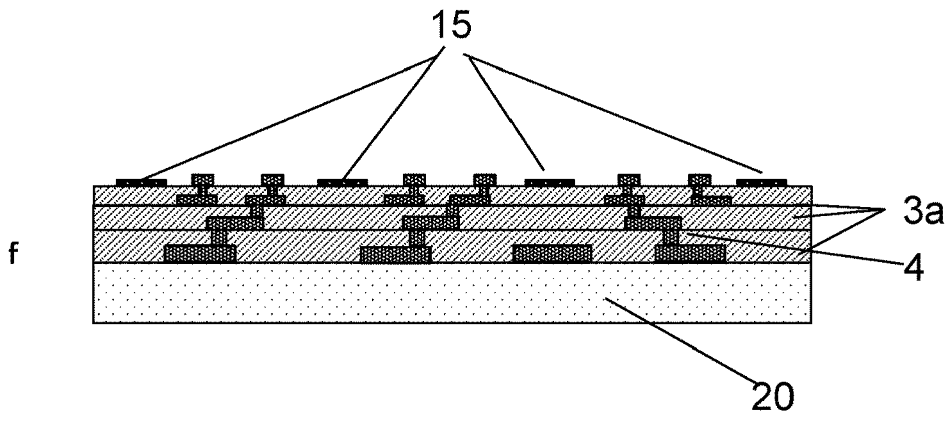
FIG. 19 This gives a cross-sectional view of a production process for another aspect of the display according to the present invention that has reflecting films.

FIG. 19*f* shows the step in which reflecting films 15 are formed after forming a plurality of cured film layers 3*a* as in FIG. 17*e*. The subsequent steps are carried out, with the reflecting films 15 maintained as formed, in the same order as shown in FIG. 17*f*, FIG. 17*g*, and FIG. 17*h*.

For the production method for a display according to the first embodiment of the present invention, it is preferable that the step for forming a cured film 29 on the cured film 3 and on the light emitting elements 2 be followed by a step for forming a drive element and substrate in such a manner that the drive element is connected to the light emitting elements by metal wires and that at least part of the metal wires extends along a side face of the substrate.

FIG. 17*h* shows a step in which a drive element and substrate are formed in such a manner that the drive element is connected to the light emitting elements by metal wires. As illustrated in FIG. 17*h*, the drive element 8 is connected to the light emitting elements 2 by metal wires 4 and 22, and part of the metal wire 22 extends along the side face of the light emitting element driving substrate 7. Here, if there are electrodes that penetrate the light emitting element driving substrate 7, the connection to the drive element 8 may be established through those penetrating electrodes.

This serves to decrease the height of the display itself and enhance the high speed response, thereby realizing the production of a smaller display with a smaller frame.

The metal wire 22 may be made of, for example, gold, silver, copper, aluminum, nickel, titanium, tungsten, aluminum, tin, chromium, or an alloy containing them. If the substrate or light emitting element driving substrate 7 has other existing wires, it may be good to use such wires.

For the production method for a display according to the first embodiment of the present invention, the metal wires may be in the form of electrically conductive films.

In FIG. 45*h*, the drive elements are connected to the light emitting elements 2 by the metal wires 4 and the electrically conductive film 34, and part of the electrically conductive film 34 extends along the side face of the light emitting element driving substrate 7.

Preferable materials for the electrically conductive film 34 include compounds containing, as primary component, an oxide of at least one substance selected from indium, gallium, zinc, tin, titanium, niobium, or the like, and photosensitive electrically conductive pastes containing organic substances and electrically conductive particles.

FIG. 46 gives a cross-sectional view of another embodiment of the production process for the display 1 according to the first embodiment of the present invention.

FIG. 46*a* shows a step in which a resin film is formed from a resin composition containing the resin (A) on a substrate etc. Such a resin film may be produced by coating or laminating the substrate with a resin composition containing the resin (A) or a resin sheet prepared from a resin composition containing the resin (A).

A light emitting element driving substrate 7 can be used as the substrate. As an example, FIG. 46*a* shows a TFT array substrate that includes TFTs 30, insulation films 31, and metal wires 4 arranged on a glass substrate.

For the metal wires 4, good materials include gold, silver, copper, aluminum, nickel, titanium, molybdenum, and alloys containing them. There are no specific limitations on the insulation film 31, but examples thereof include silicon oxide film, silicon nitride film, and insulation films made of organic substances.

In the next step, a plurality of through-hole patterns is formed in the resin film by photolithography.

In the next step, the resin film is cured to form a cured film 3.

In the next step, as illustrated in FIG. 46*b*, the wires are formed on at least part of the surface of the cured film and in at least part of the hole patterns in the cured film. A photoresist layer (not shown in the figures) is formed, and then, for example, wires 32 are formed by sputtering or the like on part of the surface of the cured film 3 in the step. Subsequently, the photoresist, which is no longer necessary, is removed.

Useful materials for the wires 32 include metals, compounds containing, as primary component, an oxide of at least one substance selected from indium, gallium, zinc, tin, titanium, niobium, or the like, photosensitive electrically conductive pastes containing organic substances and electrically conductive particles, and other generally known materials.

For the first embodiment of the present invention, it may be good to provide a step for forming a plurality of cured film layers as described above in which each cured film layer contains metal wires.

A cured film 3 having two or more layers can be produced by repeatedly carrying out the same procedure as for forming a cured film 3 as shown in FIG. 46*c*.

The next step is shown in FIG. 46*d*, in which light emitting elements 2 are arranged on the cured film 3 while maintaining electric connection to the wires 32. The electrode terminals 6 on each light emitting element 2 and the wires 32 may be connected either directly or via a solder ball etc.

Furthermore, partition walls 16 may be formed either before or after the formation of the light emitting elements 2.

Subsequently, as illustrated in FIG. 46*e*, an opposite substrate 5 is attached using an adhesive etc. Then, an electrically conductive film 34 is formed so that the electrically conductive film 34 allows the drive element 8 such as driver IC to be electrically connected to the light emitting elements 2 via the metal wires 4 or wires 32 that extend in the cured film 3, thereby producing a display 1 having a plurality of light emitting elements 2. Here, the wires 32 includes the electrodes as well.

As a result of this, the cured film can act to maintain electric insulation of the metal wires, and the existence of the metal wires extending in the cured film serves to provide electric connection between the pair of electrode terminals on the light emitting element and the drive element, thereby serving for control of the light emission mechanism. In addition, the cured film has a high depressed surface planarization rate and it serves to prevent a significant depression from occurring when forming a layered structure involving the cured film, metal wires, and light emitting elements, which helps to reduce wiring defects such as short circuits in wires and defective connections of light emitting elements, thus serving to produce a display with a decreased light emission failure rate.

Next, the production method for a display according to the second embodiment of the present invention is described.

The production method for a display according to the second embodiment of the present invention is a method for producing a display having at least metal wires, a cured film, and a plurality of light emitting elements and it includes a step (D1) for arranging the light emitting elements on a support substrate, a step (D2) for forming a resin film from a resin composition containing a resin (A) on the support substrate and on the light emitting elements, a step (D3) for irradiating and developing the resin film to form a plurality of through-hole patterns in the resin film, a step (D4) for curing the resin film to form a cured film having a dielectric breakdown voltage of 360 kV/mm or more and 600 kV/mm or less, and a step (D5) for forming the metal wires on at least part of the surface of the cured film and in the hole patterns in the cured film. FIG. 30 gives a sectional view of a production process for an example of the display having a plurality of light emitting elements according to the second embodiment of the present invention.

Hereinafter, a resin film refers to a film prepared by coating a substrate with a resin composition containing the resin (A) or by laminating it with a resin sheet, followed by drying it. In addition, a cured film refers to a film prepared by curing such a resin film or a resin sheet.

FIG. 30*a* illustrates the step (D1) in which light emitting elements 2 each having a pair of electrode terminals 6 are arranged on a support substrate 20. Useful examples of the support substrate include, but not limited to, glass substrate, silicon substrate, various ceramic substrates, gallium arsenide substrate, organic circuit board, and inorganic circuit board. These substrates may be provided with circuit components disposed thereon. Such a glass substrate and silicon substrate may have materials temporarily attached thereon. It may also be good to use a TFT array substrate. The support substrate may be removed in an appropriate step in the process, and another substrate may be added as opposite substrate after its removal.

Then, in the step (D2), as illustrated in FIG. 30*b*, a resin composition containing the resin (A) or a resin sheet prepared from a resin composition containing the resin (A) is laid by coating or laminating on the support substrate 20 and on the light emitting elements 2 to produce a resin film 21.

Here, the expression "on the support substrate 20 and on the light emitting elements" means that the composition or sheet is required only to be present at least either on the surface of the support substrate and on the surfaces of the light emitting elements or above the support substrate and above the light emitting elements, and the resin film may be formed by coating or laminating a cured film, metal wires, reflecting film, partition walls, etc., with a resin composition containing the resin (A) or a resin sheet prepared from a resin composition containing the resin (A).

Available coating methods include the spin coating method, slit coating method, dip coating method, spray coating method, and printing method. The required coating thickness depends on the coating method used, solid content in the composition, its viscosity, and the like, but commonly, coating is performed in such a manner that the film thickness will be 0.1 to 150 μm after drying.

Before the coating step, the support substrate to be coated with a resin composition containing the resin (A) may be pre-treated in advance with an adhesion promoter as described above. For example, an adhesion promoter is dissolved in a solvent such as isopropanol, ethanol, methanol, water, tetrahydrofuran, propylene glycol monomethyl ether acetate, propylene glycol monomethyl ether, ethyl lactate, and diethyl adipate to prepare a 0.5 to 20 mass % solution, which is then used to treat the surface of a substrate by an appropriate technique such as spin coating, slit die coating, bar coating, dip coating, spray coating, and steam treatment. After treating the substrate surface, reduced pressure drying may be performed as required. In addition, heat treatment at 50° C. to 280° C. may be performed to accelerate the reaction between the substrate and the adhesion promoter.

Then, the coating film of a resin composition containing the resin (A) is dried to form a resin film 21. Drying is preferably performed in the temperature range of 50° C. to 140° C. for one minute to several hours, using an oven, a hot plate, infrared rays, and the like.

On the other hand, in the case of using the aforementioned resin sheet, the protective film, if any, is removed from the resin sheet, and the resin sheet and the support substrate are held so that they are opposed to each other, followed by combining them by thermocompression bonding (such an operation of holding a resin sheet and a support substrate so that they are opposed to each other and combining them by thermocompression bonding will be occasionally expressed as laminating a support substrate with a resin sheet). Then, the resin sheet on the laminated support substrate is dried as in the case of the aforementioned resin film preparation to form a resin film 21. Such a resin sheet can be produced by spreading the resin composition containing the resin (A) on a support film of a strippable substrate material such as polyethylene terephthalate, followed by drying.

Thermocompression bonding can be carried out by hot pressing treatment, thermal lamination treatment, thermal vacuum lamination treatment, or the like. The combining temperature is preferably 40° C. or more from the viewpoint of the adhesion to the substrate and embedding property. When the resin sheet is photosensitive, furthermore, the combining temperature is preferably 140° C. or less in order to prevent the resin sheet from being cured during the combining step to cause a decrease in resolution when forming a pattern in the light irradiation and development steps.

Next, in the step (D3), as illustrated in FIG. 30*c*, the resin film 21 is processed by photolithography to form through-hole patterns 12 having shapes that correspond to the metal wires 4.

High density arrangement of light emitting elements can be realized because fine processing techniques can be applied to the resin composition containing the resin (A) or to the resin sheet.

An actinic ray is applied to the surface of the photosensitive resin film through a mask having a desired pattern. Examples of actinic ray to be used for light irradiation include ultraviolet ray, visible light, electron beam, and X-ray. For the present invention, it is preferable to use the g-line (436 nm), h-line (405 nm), or i-line (365 nm). Beams of these wavelengths are generally used for light irradiation. In the case of a resin film that is not photosensitive, a photoresist is formed after preparing a resin film, and then an actinic ray such as described above is applied.

The irradiated photosensitive resin film 21 is then developed. Preferable developers include aqueous solutions of alkaline compounds such as tetramethyl ammonium, diethanolamine, diethyl aminoethanol, sodium hydroxide, potassium hydroxide, sodium carbonate, potassium carbonate, triethyl amine, diethyl amine, methyl amine, dimethyl amine, dimethylaminoethyl acetate, dimethylaminoethanol, dimethylaminoethyl methacrylate, cyclohexyl amine, ethylene diamine, and hexamethylene diamine. In some cases, these aqueous alkali solutions may also contain polar solvents such as N-methyl-2-pyrolidone, N,N-dimethyl formamide, N,N-dimethyl acetamide, dimethyl sulfoxide, γ-butyrolactone, and dimethyl acrylamide; alcohols such as methanol, ethanol, and isopropanol; esters such as ethyl lactate and propylene glycol monomethyl ether acetate; and ketones such as cyclopentanone, cyclohexanone, isobutyl ketone, and methyl isobutyl ketone; which may be added singly or as a combination of two or more thereof. Commonly, rinsing with water is performed after the development step. Here again, rinsing may be performed with a solution prepared by adding to water an alcohol such as ethanol and isopropyl alcohol or an ester such as ethyl lactate and propylene glycol monomethyl ether acetate.

Next, in the step (D4), as illustrated in FIG. 30*c*, the resin film 21 is cured to form a cured film 3 having a dielectric breakdown voltage of 360 kV/mm or more and 600 kV/mm or less.

The resin film 21 is heated to undergo a cyclization reaction or a thermal crosslinking reaction, thereby forming the cured film 3. The cured film 3 has an increased dielectric breakdown voltage, heat resistance, and chemical resistance as a result of crosslinking of molecules of the component (A) with other molecules of the component (A) or with molecules of the component (B) or those of the component (C). This heat treatment may be carried out by raising the temperature stepwise or by raising it continuously. It is preferable for the heat treatment to be performed for 5 minutes to 5 hours. For example, heat treatment is performed first at 110° C. for 30 minutes and additional heat treatment is performed at 230° C. for 60 minutes. Preferable heat treatment conditions include a temperature range of 140° C. or more and 400° C. or less. The heat treatment temperature is preferably 140° C. or more, more preferably 160° C. or more, in order to accelerate the thermal crosslinking reaction. On the other hand, the heat treatment temperature is preferably 300° C. or less, more preferably 250° C. or less, in order to form a good cured film and produce a display with improved reliability.

It is preferable for the heat treatment to be performed in an atmosphere with a low oxygen concentration in order to form a cured film with a high light transmittance. The oxygen concentration is preferably 1,000 ppm or less, more preferably 300 ppm or less, and still more preferably 50 ppm or less.

The cured film thus formed preferably has a hole pattern, and the hole pattern preferably has a cross section with an inclined side with an angle of 40° or more and 85° or less. If the cross section of the hole portion has an angle of 40° or more, it allows a plurality of light emitting elements to be arranged efficiently to ensure a high definition. It is more preferable for the hole portion to have a cross section with an angle of 50° C. or more. On the other hand, if the angle of the cross section of the hole portion is 85° or less, it serves to suppress the occurring of wiring defects such as short circuits in wires. The angle of the cross section of the hole portion is more preferably 80° or less.

FIG. 42 gives a frontal sectional view of a hole pattern in a cured film. In FIG. 42, the hole pattern formed in the cured film 3 has an inclined side 36 with an angle 37. Here, the inclined side is defined as the straight line connecting between the hole pattern at the position 39 that is located at ½ of the thickness of the cured film 3 and the hole pattern at the bottom.

Following this, in order to improve the adhesion between the cured film 3 and the metal wires 4 in FIG. 30*c*, barrier metal such as titanium is sputtered on the cured film 3 and in addition, a copper seed (seed layer) is formed on top of it by sputtering.

Next, in the step (D5), as illustrated in FIG. 30*d*, a photoresist layer (not shown in the figures) is formed, and then metal wires 4 of copper or the like for electric connection to the pair of electrode terminals 6 on each light emitting element 2 are formed by the plating technique or the like in the hole pattern 12 in the cured film 3 and on part of the surface of the cured film 3. Subsequently, no longer necessary components such as photoresist, seed layer, and barrier metal are removed.

As a result of this, the cured film can act to maintain electric insulation of the metal wires, and the existence of the metal wires extending in the cured film serves to provide electric connection between the pair of electrode terminals on the light emitting element and the drive element, thereby serving for control of the light emission mechanism. In addition, the cured film is so high in light transmittance that the absorption of light emitted from the light emitting elements can be suppressed to achieve higher light extraction performance.

The production method for a display according to the second embodiment of the present invention preferably has a process in which the step (D2), step (D3), step (D4), and step (D5) are carried out a plurality of times repeatedly to form a plurality of cured film layers in which each cured film layer contains metal wires.

As illustrated in FIG. 30*e* to 30*f*, a cured film 3 having two or more layers can be produced by repeatedly carrying out the same procedure as for forming a cured film 3 and metal wires 4.

As a result of this, the existence of a plurality of cured film layers in which each cured film layer contains metal wires serves to arrange a plurality of light emitting elements, and also serves to lower the height of the package and shorten the wire length, thereby realizing the prevention of wiring defects such as short circuits in wires, reduction of loss, and improvement in high speed response.

Subsequently, as illustrated in FIG. 30*g*, barrier metal 9 is formed by sputtering in the hole pattern 12 in the cured film 3, followed by forming solder bumps 10. Here, the barrier metal 9 may or may not be formed. Each solder bump 10 is electrically connected to, for example, a light emitting element driving substrate 7 that has a drive element such as driver IC.

It may be good to apply a plurality of drive elements 8 with different functions to a single light emitting element 2 or to one group of red, blue, and green light emitting elements 2. For example, a plurality of drive elements may be laid in the neighborhood of light emitting elements in carrying out the steps in FIG. 30. In that case, the drive elements are electrically connected to the light emitting elements 2 by the metal wires 4 extending in the cured film 3.

Subsequently, as illustrated in FIG. 30*h*, they are electrically connected through the solder bump 10 to the light emitting element driving substrate 7 that has a drive element 8 such as driver IC. Then, the support substrate 20 is removed and an opposite substrate 5 is attached using an adhesive or the like, thus producing a display 1 that has a plurality of light emitting elements 2. Here, the metal wires 4 may include the electrodes therein.

As a result of this, the cured film can act to maintain electric insulation of the metal wires, and the existence of the metal wires extending in the cured film serves to provide electric connection between the pair of electrode terminals on the light emitting element and the drive element, thereby serving for control of the light emission mechanism.

Each metal wire 4 may be in the form of an electrically conductive film 34. FIG. 51 shows steps in which electrically conductive films 34 are adopted instead of the metal wires 4.

In the production method for a display according to the second embodiment of the present invention, a step (D6) for irradiating the entire region of the resin film may be provided after the step (D3) and before the step (D4).

Light irradiation performed after development serves to reduce the amount of residual organic acids remaining after heat treatment, leading to an increased dielectric breakdown voltage. In particular, if a photo acid generator is used as the component (B), it will work particularly preferably.

In the production method for a display according to the second embodiment of the present invention, it is preferable that a step (D7) in which partition walls with a thickness equal to or larger than the thickness of the light emitting elements are formed between the two or more light emitting elements be performed after the step (D1).

An example of the step (D7) is given in FIG. 31. FIG. 31*a* shows a step (D7) in which partition walls 16 with a thickness equal to or larger than the thickness of the light emitting elements 2 are formed on a support substrate, and the next diagram in FIG. 31*b* shows a step (D1) in which a plurality of light emitting elements 2 are formed between the partition walls with a thickness equal to or larger than the thickness of the light emitting elements. FIG. 31*c* shows a step similar to the step (D2) in FIG. 30*b* and is intended to form a resin film 21 after forming the partition walls 16. The subsequent steps are carried out as shown in FIG. 30. The partition walls may be made of the resin (A) or generally known materials such as epoxy resin, (meth)acrylic polymers, polyurethane, polyester, polyolefin, and polysiloxane. In addition, a shading component, reflecting component, etc. may also be provided.

In the production method for a display according to the second embodiment of the present invention, it is preferable that a step (D8) for forming reflecting films on part of the cured film be provided after the step (D4).

An example of the step (D8) is given in FIG. 32. FIG. 13*d* shows a step (D8) in which reflecting films 15 are formed on part of the cured film 3.

The steps shown in and before FIG. 32*d* are the same as those up to the step (D4) in and before FIG. 30*c*, and the next step shown in FIG. 32*e* is the same as the step (D5) in FIG. 30*d* in which metal wires 4 are formed. The subsequent steps are carried out, with the reflecting films 15 maintained as formed, in the same order as shown in FIG. 30. The reflecting films are formed using such a material as aluminum, silver, copper, titanium, and an alloy containing them by an appropriate technique such as sputtering. Furthermore, in order to prevent them from overlapping the metal wires that will be formed later, it is preferable to protect the appropriate portions in advance using a photoresist etc. or apply an appropriate mask when forming them by sputtering.

For the production method for a display according to the second embodiment of the present invention, it is preferable that the aforementioned step (D5) be followed by a step (D9) for forming a drive element and substrate in such a manner that the drive element is connected to the light emitting elements by metal wires and that at least part of the metal wires extends along a side face of the substrate.

An example of the step (D9) is given in FIG. 30. FIG. 30*h* shows a step (D9) in which a drive element and substrate are formed with the drive element being connected to the light emitting elements by metal wires. As illustrated in FIG. 30*h*, the drive element 8 is connected to the light emitting elements 2 by metal wires 4 and 4*c*, and part of the metal wire 4*c* extends along the side face of the light emitting element driving substrate 7. Here, if there are electrodes that penetrate the light emitting element driving substrate 7, the connection to the drive element 8 may be established through those penetrating electrodes.

This serves to decrease the height of the display itself and enhance the high speed response, thereby realizing the production of a smaller display with a smaller frame.

The metal wire 4*c* may be made of, for example, gold, silver, copper, aluminum, nickel, titanium, tungsten, aluminum, tin, chromium, or an alloy containing them. If the substrate or light emitting element driving substrate 7 has other existing wires, it may be good to use such wires.

For the production method for a display according to the second embodiment of the present invention, the metal wires may be in the form of electrically conductive films (D10).

An example of the step (D10) is given in FIG. 43. In FIG. 43*h*, the drive elements are connected to the light emitting elements 2 by the metal wires 4 and the electrically conductive film 34, and part of the electrically conductive film 34 extends along the side face of the light emitting element driving substrate 7.

This serves to decrease the height of the display itself and enhance the high speed response, thereby realizing the production of a smaller display with a smaller frame.

Preferable materials for the electrically conductive film 34 include compounds containing, as primary component, an oxide of at least one substance selected from indium, gallium, zinc, tin, titanium, niobium, or the like, and photosensitive electrically conductive pastes containing organic substances and electrically conductive particles.

It is preferable for the production method for a display according to the second embodiment of the present invention to further include a step (D11) for forming shading layers between the two or more light emitting elements.

An example of the step (D11) is given in FIG. 44. FIG. 44*a* shows a step (D11) for forming shading layers 35 between the two or more light emitting elements 2. Here, the shading layers 35 may be formed either before the formation of the light emitting elements 2 or after the formation of the light emitting elements 2.

The shading layers 35 may be constructed mainly of a cured film formed by curing a resin composition containing the resin (A) and a coloring material (E) or may be of a material other than a resin composition containing the resin (A), and good materials include generally known ones such as epoxy resin, (meth)acrylic polymers, polyurethane, polyester, polyolefin, and polysiloxane. A black pigment may be used as the coloring material (E), and good materials include, for example, black organic pigments such as carbon black, perylene black, and aniline black, and inorganic pigments including graphite and fine particles of metal such as titanium, copper, iron, manganese, cobalt, chromium, nickel, zinc, calcium, and silver, as well as metal oxides, composite oxides, metal sulfides, metal nitrides, and metal oxynitrides thereof. Furthermore, a red pigment and a blue pigment may be combined, along with a yellow pigment and other pigments as required, to provide a black mixture. Dyes may also be used. Two or more coloring materials may be contained together.

The resin composition containing a resin (A) and a coloring material (E) may be made photosensitive, and a photosensitizing agent (B) as described later may be used.

In regard to methods for forming such a shading layer, a photolithography step may be adopted when it has photosensitivity, whereas when it does not have photosensitivity, a photoresist may be formed first on a shading layer followed by carrying out a photolithography step or an etching step, wherein a mask may be used for etching. A patterned colored film can be produced by heat-treating (postbaking) the pattern formed above. The heat treatment may be performed in an air atmosphere, a nitrogen atmosphere, or a vacuum. The heating temperature is preferably 100° C. to 300° C., and the heating time is preferably 0.25 to 5 hours. The heating temperature may be changed continuously or stepwise.

In addition, the production method for a display according to the second embodiment of the present invention is a process for producing a display having at least metal wires, a cured film, and a plurality of light emitting elements and it includes a step (E1) for disposing a metal pad on a support substrate, a step (E2) for forming a resin film from a resin composition containing a resin (A) on the support substrate and on the metal pad, a step (E3) for irradiating and developing the resin film to form a plurality of through-hole patterns in the resin film, a step (E4) for curing the resin film to form the cured film having a dielectric breakdown voltage of 360 kV/mm or more and 600 kV/mm or less, a step (E5) for forming the metal wires on at least part of the surface of the cured film and in the hole patterns in the cured film, and a step (E6) for arranging the light emitting elements on the cured film while maintaining electric connection with the metal wires.

FIG. 33 gives a cross-sectional view of another embodiment of the production process for the display 1 according to the present invention. Some steps are the same as those in FIG. 30. Specifically, FIGS. 33*b* to 33*e* overlap FIGS. 30*b* to 30*f*, and therefore, are not described here.

FIG. 33*a* illustrates the step (E1) that is designed to form a metal pad 18 on a support substrate 20.

The metal pad is made of copper, aluminum, or the like.

Then, in the step (E2), as illustrated in FIG. 33*b*, a resin composition or a resin sheet containing the resin (A) is laid by coating or laminating on the support substrate 20 and on the metal pad 18 to produce a resin film 21.

Here, the expression "on the support substrate 20 and on the metal pad" means that the composition or sheet is required only to be present at least either on the surface of the support substrate and on the surface of the metal pad or above the support substrate and above the metal pad, and the resin film may be formed by coating or laminating a cured film, metal wires, reflecting film, partition walls, etc., with a resin composition containing the resin (A) or a resin sheet prepared from a resin composition containing the resin (A).

Next, in the step (E3), as illustrated in FIG. 33*c*, the resin film 21 is processed by photolithography to form a plurality of through-hole patterns 12 in the resin film 21.

Next, in the step (E4), as illustrated in FIG. 33*c*, the resin film 21 is cured to form a cured film 3 having a dielectric breakdown voltage of 360 kV/mm or more and 600 kV/mm or less.

Following this, in order to improve the adhesion between the cured film 3 and the metal wires 4 in FIG. 33*c*, barrier metal such as titanium is sputtered on the cured film 3 and in addition, a copper seed (seed layer) is formed on top of it by sputtering.

Next, in the step (E5), as illustrated in FIG. 33*d*, a photoresist layer (not shown in the figures) is formed, and then metal wires 4 of copper or the like are formed by the plating technique or the like in the hole pattern 12 in the cured film 3 and on part of the surface of the cured film 3. Subsequently, no longer necessary components such as photoresist, seed layer, and barrier metal are removed.

The production method for a display according to the second embodiment of the present invention preferably has a process in which the step (E2), step (E3), step (E4), and step (E5) are carried out a plurality of times repeatedly to form a plurality of cured film layers in which each cured film layer contains metal wires.

As illustrated in FIGS. 33*b* to 33*d*, a cured film 3 having two or more layers as shown in FIG. 33*e* can be produced by repeatedly carrying out the same procedure as for forming a cured film 3 and metal wires 4.

Next, in the step (E6), as illustrated in FIG. 33*f*, light emitting elements 2 are arranged on the cured film 3 while maintaining electric connection to the metal wires 4. The electrode terminals 6 on each light emitting element 2 and the metal wires 4 may be connected either directly or via a solder ball etc.

As illustrated in FIG. 33*g*, it is preferable to adopt a step (E7) that is designed to form a cured film 29 on the cured film 3 and on the light emitting elements 2. In regard to the formation of a cured film 29, it is preferable to form a cured film 29 by coating with a resin composition containing the resin (A) or lamination with a resin sheet prepared from a resin composition containing the resin (A) to form a resin film, followed by curing it. Instead, it may be made of a material other than a resin composition containing the resin (A) and photosensitizing agent (B), and examples of such a material include generally known ones such as epoxy resin, silicone resin, and fluorine resin.

Suitable curing conditions depend on the type of resin used, but for example, curing may be performed at 80° C. to 230° C. for 15 minutes to 5 hours.

Here, the cured film produced by curing a resin film formed from a resin composition containing a resin (A) on the support substrate and on the light emitting elements is intended to protect the light emitting elements or planarize the surface.

Subsequently, as illustrated in FIG. 33*h*, an opposite substrate 5 is attached to the cured film 29 using an adhesive etc. Then, the support substrate 20 is removed and barrier metal 9 and bumps 10 are formed to establish electrical connection via the solder bumps 10 to a light emitting element driving substrate 7 that carries a drive element 8 such as driver IC.

The drive element 8 is electrically connected to the light emitting elements 2 by the metal wires 4 extending in the cured film 3, thus producing a display 1 that has a plurality of light emitting elements 2. Here, the metal wires 4 may include the electrodes therein.

As a result of this, the cured film can act to maintain electric insulation of the metal wires, and the existence of the metal wires extending in the cured film serves to provide electric connection between the pair of electrode terminals on the light emitting element and the drive element, thereby serving for control of the light emission mechanism. In addition, the cured film is so high in light transmittance that the absorption of light emitted from the light emitting elements can be suppressed to achieve higher light extraction performance.

Each metal wire 4 may be in the form of an electrically conductive film 34. FIG. 52 shows steps in which electrically conductive films 34 are adopted instead of the metal wires 4.

For the production method for a display according to the second embodiment of the present invention, it is preferable that a step (E8) for irradiating the entire region of the resin layer be provided after the step (E3) and before the step (E4).

By developing the resin layer and subsequently irradiating it with light, the amount of organic acids remaining after heat treatment can be reduced to improve the dielectric breakdown voltage, and therefore, the light irradiation step is preferably performed before curing the resin composition containing a component (B). In the case of using a photo acid generator as component (B), it is particularly preferable to perform the light irradiation step after the development step.

For the production method for a display according to the second embodiment of the present invention, it is preferable that a step (E9) for forming partition walls with a thickness equal to or larger than the thickness of the light emitting elements be provided after the step (E5).

An example of the step (E9) is given in FIG. 34. FIG. 34*f* shows the step (E9) in which partition walls 16 are formed after forming a plurality of cured film layers 3 as in FIG. 33*e*. Subsequently, light emitting elements 2 are formed between the partition walls 16 as shown in FIG. 34*g* and an opposite substrate 5 is attached on top of the partition walls 16 and the light emitting elements 2 as shown in FIG. 34*h*. Then, the support substrate 20 is removed, and barrier metal 34 and bumps 10 are formed to establish electrical connection via the solder bumps 10 to a light emitting element driving substrate 7 that carries a drive element 8 such as driver IC.

For the production method for a display according to the second embodiment of the present invention, it is preferable that a step (E10) for forming reflecting films on part of the cured film be provided before the step (E6) and after the step (E5).

An example of the step (E10) is given in FIG. 35. FIG. 35*f* shows the step (E10) in which reflecting films 15 are formed after forming a plurality of cured film layers 3 as in FIG. 33*e*. The subsequent steps are carried out, with the reflecting films 15 maintained as formed, in the same order as shown in FIG. 33*f*, FIG. 33*g*, and FIG. 33*h*.

For the production method for a display according to the second embodiment of the present invention, it is preferable that the aforementioned step (E7) be followed by a step (E11) for forming a drive element and substrate in such a manner that the drive element is connected to the light emitting elements by metal wires and that at least part of the metal wires extends along a side face of the substrate.

An example of the step (E11) is given in FIG. 33. FIG. 33*h* shows a step (E11) in which a drive element and substrate are formed with the drive element being connected to the light emitting elements by metal wires. As illustrated in FIG. 33*h*, the drive element is connected to the light emitting elements 2 by metal wires 4 or 4*c*, and part of the metal wire 4*c* extends along the side face of the light emitting element driving substrate 7. Here, if there are electrodes that penetrate the light emitting element driving substrate 7, the connection to the drive element 8 may be established through those penetrating electrodes.

This serves to decrease the height of the display itself and enhance the high speed response, thereby realizing the production of a smaller display with a smaller frame.

The metal wire 4*c* may be made of, for example, gold, silver, copper, aluminum, nickel, titanium, tungsten, aluminum, tin, chromium, or an alloy containing them. If the substrate or light emitting element driving substrate 7 has other existing wires, it may be good to use such wires.

For the production method for a display according to the second embodiment of the present invention, the metal wires may be in the form of electrically conductive films (E12).

An example of the step (E12) is given in FIG. 45. In FIG. 45*h*, the drive elements are connected to the light emitting elements 2 by the metal wires 4 and the electrically conductive film 34, and part of the electrically conductive film 34 extends along the side face of the light emitting element driving substrate 7.

This serves to decrease the height of the display itself and enhance the high speed response, thereby realizing the production of a smaller display with a smaller frame.

Preferable materials for the electrically conductive film 34 include compounds containing, as primary component, an oxide of at least one substance selected from indium, gallium, zinc, tin, titanium, niobium, or the like, and photosensitive electrically conductive pastes containing organic substances and electrically conductive particles.

The production method for a display according to the second embodiment of the present invention is a process for producing a display having at least wires, a cured film, and a plurality of light emitting elements and it includes a step (F1) for forming a resin film from a resin composition containing a resin (A) on a support substrate or the like, a step (F2) for irradiating and developing the resin film to form a plurality of through-hole patterns in the resin film, a step (F3) for curing the resin film to form the cured film having a dielectric breakdown voltage of 360 kV/mm or more and 600 kV/mm or less, a step (F4) for forming the wires on at least part of the surface of the cured film and in part of the hole patterns in the cured film, and a step (F5) for arranging the light emitting elements on the cured film while maintaining electric connection with the wires.

FIG. 46 gives a cross-sectional view of another embodiment of the production process for a display according to the present invention.

In the step (F1), as illustrated in FIG. 46*a*, a resin film is formed from a resin composition containing the resin (A) on a substrate etc. Such a resin film may be produced by coating or laminating the substrate with a resin composition containing the resin (A) or a resin sheet prepared from a resin composition containing the resin (A).

A light emitting element driving substrate 7 can be used as the substrate. As an example, FIG. 46*a* shows a TFT array substrate that includes TFTs 30, insulation films 31, and metal wires 4 arranged on a glass substrate.

For the metal wires 4, good materials include gold, silver, copper, aluminum, nickel, titanium, molybdenum, and alloys containing them. There are no specific limitations on the insulation film 24, but examples thereof include silicon oxide film, silicon nitride film, and insulation films made of organic substances.

Next, in the step (F2), as illustrated in FIG. 46*a*, the resin film is processed by photolithography to form a plurality of through-hole patterns in the resin film.

Next, in the step (F3), as illustrated in FIG. 46*a*, the resin film is cured to form a cured film 3 having a dielectric breakdown voltage of 360 kV/mm or more and 600 kV/mm or less.

Next, in the step (F4), as illustrated in FIG. 46*b*, the wires are formed on at least part of the surface of the cured film and in part of the hole patterns in the cured film. A photoresist layer (not shown in the figures) is formed, and then, for example, wires 32 are formed by sputtering or the like on part of the surface of the cured film 3 in the step. Subsequently, the photoresist, which is no longer necessary, is removed.

Useful materials for the wires include metals, compounds containing, as primary component, an oxide of at least one substance selected from indium, gallium, zinc, tin, titanium, niobium, or the like, photosensitive electrically conductive pastes containing organic substances and electrically conductive particles, and other generally known materials.

The production method for a display according to the present invention preferably has a process in which the step (F1), step (F2), step (F3), and step (F4) are carried out a plurality of times repeatedly to form a plurality of cured film layers in which each cured film layer has wires.

A cured film 3 having two or more layers can be produced by repeatedly carrying out the same procedure as for forming a cured film 3 as shown in FIG. 46*c*.

Next, in the step (F5), as illustrated in FIG. 46*d* light emitting elements 2 are arranged on the cured film 3 while maintaining electric connection to the wires 32. The electrode terminals 6 on each light emitting element 2 and the wires 32 may be connected either directly or via a solder ball etc.

Partition walls 16 may be formed either before or after the formation of the light emitting elements 2.

Subsequently, as illustrated in FIG. 46*e*, an opposite substrate 5 is attached using an adhesive etc. Then, an electrically conductive film 34 is formed so that the electrically conductive film 34 allows the drive element 8 such as driver IC to be electrically connected to the light emitting elements 2 via the metal wires 4 or wires 32 that extend in the cured film 3, thereby producing a display 1 having a plurality of light emitting elements 2. Here, the wires 32 includes the electrodes as well.

As a result of this, the cured film can act to maintain electric insulation of the wires, and the existence of the wires extending in the cured film serves to provide electric connection between the pair of electrode terminals on the light emitting element and the drive element, thereby serving for control of the light emission mechanism. Furthermore, the cured film 3 that has a dielectric breakdown voltage of 360 kV/mm or more and 600 kV/mm or less serves to prevent the degradation of metal wires and leakage current, leading to low defective rates in reliability test performed under accelerated test conditions that simulate practical uses.

For the first embodiment and the second embodiment of the present invention, the display can be suitably used in various display devices such as LED displays and in various lamps etc. for automobiles.

EXAMPLES

The present invention will be illustrated below in greater detail with reference to examples etc., but the invention should not be construed as being limited thereto.

Here, the following methods were used in the examples to make evaluations of displays and cured films prepared from resin compositions and applied to the displays.

<Evaluation Method for Depressed Surface Planarization Rate P (%) of Cured Film in Displays Formed According to the First Embodiment of the Present Invention>

Evaluations were made for the flatness of the depressed surface of the cured films in the displays described in Examples and Comparative examples given in Table 2-1, Table 2-2, and Table 2-3. Sectional specimens were prepared by processing the displays using a sectional specimen preparation apparatus (IB-09010CP, manufactured by JEOL Ltd.). Subsequently, the sectional specimen is observed under a scanning electron microscope (S-4800, manufactured by Hitachi High-Tech Corporation) to measure the conductor spacing H1 between mutually adjacent metal wires (K2) in the region (G), thickness H2 of the metal wires (K2), thickness H3 of the cured film (F1), and the depth H4 of the depression formed in the cured film (F1) in the region (G), and the depressed surface planarization rate P (%) was calculated therefrom.

<Evaluation Method for Dielectric Breakdown Voltage of Cured Film for the Second Embodiment Of the Present Invention>

An 8 inch silicon wafer was spin-coated with a varnish prepared from a resin composition and then it was prebaked using a coater-developer apparatus (ACT-8) so as to produce a prebaked film having a thickness of 5 μm after prebaking at 120° C. for 3 minutes. Subsequently, it was heated in an inert oven (CLH-21CD-S, manufactured by Koyo Thermo Systems Ltd.) at a rate of 3.5° C./min while maintaining the oxygen concentration at 20 ppm or less, followed by heat treatment performed for 1 hour at a curing temperature as specified in Table 4-1 or Table 4-2. The wafer was taken out after the temperature lowered to 50° C. or less, and it was cooled slowly and immersed in a 45 mass % solution of hydrofluoric acid for 5 minutes, thereby removing the film of the resin composition from the wafer. This film was subjected to dielectric strength measurement using TOS9201 (manufactured by Kikusui Electronics Corp.). For each test piece, 10 measurements were taken, and the average dielectric strength was calculated and divided by the film thickness (in mm) of the cured film to give a value to represent its dielectric breakdown voltage (in kV/mm). Here, the thickness of the film was measured after the prebaking and curing steps using an optical interference type film thickness measuring apparatus (Lambda Ace STM-602, manufactured by Dainippon Screen Mfg. Co., Ltd.) assuming a refractive index of 1.629. A refractive index of 1.629 was also assumed when measuring the thickness of the cured film.

<Evaluation Method for Defective Rate in Reliability Test for the Second Embodiment of the Present Invention>

For each display with three light emitting elements as specified in Table 4-1 or Table 4-2, 10 samples were prepared in Examples and Comparative examples, and these display samples were subjected to reliability test in which a voltage of 5 V was applied at temperature of 85° C. and a humidity of 85% for 2,000 hours using a HAST instrument (HAST CHAMBER EHS-211 MD, manufactured by Tabai Espec Corp.), followed by lighting test by visual observation. For the 10 display samples, the number of light emitting elements that failed to work was counted and its ratio was used for defective rate evaluation.

<Evaluation for Hole Pattern Shape of Cured Film Prepared from Resin Composition for the First Embodiment and the Second Embodiment of the Present Invention>

A varnish was prepared, and then, using a coater-developer apparatus (ACT-8, manufactured by Tokyo Electron Ltd.), spin coating was performed to coat an 8 inch silicon wafer in such a manner that the film thickness after heat treatment would be 5 μm, followed by prebaking it to provide a prebaked film. Prebaking was performed at 120° C. for 3 minutes. Then, the film was irradiated with light with an exposure energy of 50 to 1,000 mJ/cm$^2$ using an i-line stepper (NSR-2205i14, manufactured by Nikon Corporation). A circular pattern with a size of 5 to 30 μm was used for the light irradiation step. After the light irradiation step, the film was developed with a 2.38 mass % aqueous solution of tetramethyl ammonium (TMAH) (manufactured by Tama Chemicals Co., Ltd.) under conditions that allowed the unirradiated portion of the film to undergo a thickness change of 1.0 to 1.5 μm between before and after the development step, followed by rinsing it with pure water and drying it by shaking off water to provide a patterned film. For another sample, cyclopentanone was used for development, followed by drying it by shaking off water to provide a patterned film. In the case where a non-photosensitive material was used, a photoresist was formed before the light irradiation step, and then the film was irradiated and developed, followed by removing the photoresist after the development step. Here, the thickness of the prebaked film and that of the developed film were measured with a Lambda Ace STM-602 optical interference type film thickness measuring apparatus manufactured by Dainippon Screen Mfg. Co., Ltd. assuming a refractive index of 1.629.

After the development step, it was heated up from 50° C. to 100° C. at 3.5° C./min in a nitrogen flow with an oxygen concentration of 20 ppm or less using an inert oven (CLH-21CD-S, manufactured by Koyo Thermo Systems Ltd.), followed by heat treatment at 100° C. for 30 minutes. Then, the temperature was raised to 230° C. at 3.5° C./min, immediately followed by heat-treating the film for 1 hour and curing the patterned film to provide a cured film.

The wafer was taken out when the temperature lowered to below 50° C., and then the wafer was cut, followed by observing and measuring the cross-sectional shape of the resulting 5 to 30 μm circular pattern under a scanning electron microscope (S-4800, manufactured by Hitachi High-Tech Corporation). Here, the angle of the inclined side was also measured. The inclined side is defined as the straight line connecting between the hole pattern at the position that is located at ½ of the thickness of the cured film and the hole pattern at the bottom.

Synthesis Example 1 Synthesis of hydroxyl-Containing diamine Compound

First, 18.3 g (0.05 mole) of 2,2-bis(3-amino-4-hydroxyphenyl)hexafluoropropane (manufactured by Central Glass Co. Ltd., hereinafter referred to as BAHF) was dissolved in 100 mL of acetone and 17.4 g (0.3 mole) of propylene oxide (manufactured by Tokyo Kasei), and the liquid was cooled to −15° C. To this liquid, a solution of 20.4 g (0.11 mole) of 3-nitrobenzoyl chloride (manufactured by Tokyo Kasei) dissolved in 100 mL of acetone was added dropwise. After the end of dropwise addition, the liquid was stirred at −15° C. for 4 hours, followed by leaving it to return to room temperature. The resulting white solid precipitate was separated out by filtration and vacuum-dried at 50° C.

A 30 g portion of the resulting white solid was put in a 300 mL stainless steel autoclave and dispersed in 250 mL of methyl cellosolve, followed by adding 2 g of 5% palladium-carbon (manufactured by Wako Pure Chemical Industries, Ltd.). Hydrogen was introduced into this liquid using a balloon to cause a reduction reaction at room temperature. About 2 hours later, the reaction was terminated after confirming that the balloon would deflate no more. After the end of the reaction, the liquid was filtrated to remove the palladium compound used as catalyst and concentrated in a rotary evaporator to provide a hydroxyl-containing diamine compound as represented by the formula given below.

[Chemical compound 14]

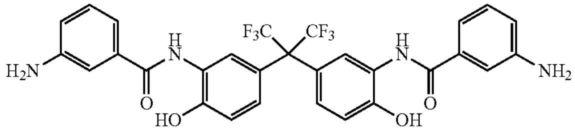

Synthesis Example 2 Synthesis of Polybenzoxazole Precursor (A-1)

In a dry nitrogen flow, 1.5 g (0.0075 mole) of 4,4'-diaminodiphenyl ether (hereinafter referred to as 4,4'-DAE), 12.8 g (0.035 mole) of BAHF, and 5.0 g (0.0050 mole) of RT-1000 (manufactured by HUNTSMAN) were dissolved in 100 g of NMP. To this liquid, diimidazole dodecanoate (7.4 g, 0.023 mole) and 1,1'-(4,4'-oxybenzoyl) diimidazole (hereinafter referred to as PBOM) (8.1 g, 0.023 mole) were added along with 25 g of NMP and allowed to react at 85° C. for 3 hours. Then, 0.6 g (0.0025 mole) of 1,3-bis(3-aminopropyl)tetramethyl disiloxane (hereinafter referred to as SiDA), 0.8 g (0.0025 mole) of 4,4'-oxydiphthalic anhydride (hereinafter referred to as ODPA), and 0.8 g (0.0050 mole) of 5-norbornene-2,3-dicarboxylic anhydride (hereinafter referred to as NA) were added along with 25 g of NMP and allowed to react at 85° C. for 1 hour. After the end of the reaction, the liquid was allowed to cool to room temperature and 13.2 g (0.25 mole) of acetic acid was added along with 25 g of NMP and stirred at room temperature for 1 hour. After the end of stirring, the solution was poured in 1.5 L of water to provide a white precipitate. This precipitate was collected by filtration, rinsed with water three times, and dried in a forced-air drier at 50° C. for 3 days to produce powder of a polybenzoxazole precursor (A-1).

Synthesis Example 3 Synthesis of Polybenzoxazole Precursor (A-2)

In a dry nitrogen flow, 27.5 g, (0.075 mole) of BAHF was dissolved in 257 g of NMP. To this liquid, 17.2 g (0.048 mole) of PBOM was added along with 20 g of NMP and allowed to react at 85° C. for 3 hours. Subsequently, 20.0 g (0.02 mole) of RT-1000 (manufactured by HUNTSMAN), 1.2 g (0.005 mole) of SiDA, and 14.3 g (0.04 mole) of PBOM were added along with 50 g of NMP and allowed to react at 85° C. for 1 hour. In addition, 3.9 g (0.024 mole) of 5-norbornene-2,3-dicarboxylic anhydride was added along with 10 g of NMP and allowed to react at 85° C. for 30 minutes. After the end of the reaction, the liquid was allowed to cool to room temperature and 52.8 g (0.50 mole) of acetic acid was added along with 87 g of NMP, followed by stirring at room temperature for 1 hour. After the end of stirring, the solution was poured in 3 L of water to provide a white precipitate. This precipitate was collected by filtration, rinsed with water three times, and dried in a forced-air drier at 50° C. for 3 days to produce powder of a polybenzoxazole precursor (A-2).

Synthesis Example 4 Synthesis of Polyimide Precursor (A-3)

In a dry nitrogen flow, 51.9 g (0.086 mole) of the hydroxyl-containing diamine prepared in Synthesis example 1 and 1.0 g (0.004 mole) of SiDA were dissolved in 200 g of NMP. To this liquid, 31.0 g (0.10 mole) of ODPA was added and stirred at 40° C. for 2 hours. Then, 1.1 g (0.01 mole) of 3-aminophenol (manufactured by Tokyo Chemical Industry Co. Ltd.), which was adopted as end-capping agent, was added along with 10 g of NMP and allowed to react at 40° C. for 1 hour. Subsequently, a solution prepared by diluting 7.1 g (0.06 mole) of dimethylformamide dimethylacetal (manufactured by Mitsubishi Rayon, Ltd.) with 5 g of NMP was added dropwise. After the end of dropping, stirring was continued at 40° C. for 2 hours. After the end of stirring, the solution was poured in 2 L of water, and the resulting solid polymer precipitate was collected by filtration. In addition, it was rinsed three times with 2 L of water, and the collected solid polymer was dried at 50° C. in a vacuum dryer for 72 hours to prepare a polyimide precursor (A-3).

Synthesis Example 5 Synthesis of Polyimide Precursor (A-4)

In a dry nitrogen flow, 41.1 g (0.068 mole) of the hydroxyl-containing diamine prepared in Synthesis example 1, 18.00 g (0.018 mole) of a diamine compound containing propylene oxide and tetramethylene ether glycol structures (RT-1000, manufactured by HUNTSMAN), and 1.0 g (0.004 mole) of SiDA were dissolved in 200 g of NMP. To this liquid, 31.0 g (0.10 mole) of ODPA was added and stirred at 40° C. for 2 hours. Then, 1.1 g (0.01 mole) of 3-aminophenol, which was adopted as end-capping agent, was added along with 10 g of NMP and allowed to react at 40° C. for 1 hour. Subsequently, a solution prepared by diluting 6.0 g (0.05 mole) of DFA (manufactured by Mitsubishi Rayon Co., Ltd.) with 5 g of NMP was added dropwise. After the end of dropping, stirring was continued at 40° C. for 2 hours. After the end of stirring, the solution was poured in 2 L of water, and the resulting solid polymer precipitate was collected by filtration. In addition, it was rinsed three times with 2 L of water, and the collected solid polymer was dried at 50° C. in a vacuum dryer for 72 hours to prepare a polyimide precursor (A-4).

Synthesis Example 6 Synthesis of Polyimide (A-5)

In a dry nitrogen flow, 29.3 g (0.08 mole) of BAHF, 1.2 g (0.005 mole) of SiDA, and 3.3 g (0.03 mole) of 3-aminophenol, which was adopted as end-capping agent, were dissolved in 80 g of NMP. To this solution, 31.2 g (0.1 mole) of ODPA was added along with 20 g of NMP and allowed to react at 60° C. for 1 hour, followed by stirring at 180° C. for 4 hours. After the end of stirring, the solution was poured in 3 L of water to provide a white precipitate. This precipitate was collected by filtration, rinsed with water three times, and dried in a vacuum dryer at 80° C. for 20 hours to provide powder of polyimide (A-5).

Synthesis Example 7 Synthesis of Cardo Resin (A-6)

In a dry nitrogen flow, 198.53 g of a 50% PGMEA solution of the product of a reaction of bisphenol fluorene type epoxy resin with an equivalent quantity of acrylic acid (a solution of ASF-400 (product name), manufactured by Nippon Steel Chemical Co., Ltd.), 39.54 g (0.12 mole) of benzophenone tetracarboxylic dianhydride, 8.13 g (0.08 mole) of succinic anhydride, 48.12 g of PGMEA, and 0.45 g of triphenyl phosphine were fed to a four-necked flask with a reflux condenser, heated while stirring at 120° C. to 125° C. for 1 hour, and additionally heated while stirring at 75° C. to 80° C. for 6 hours, followed by adding 8.6 g of glycidylmethacrylate and further stirring at 80° C. for 8 hours to provide a resin (A-6) that had two cyclic structures bonded to a quaternary carbon atom in another cyclic structure.

Synthesis Example 8 Synthesis of Polyimide Precursor (A-7)

To a separable flask with a capacity of 2 liters, 155.1 g (0.50 mole) of ODPA was fed and 134.0 g (1.00 mole) of 2-hydroxyethyl methacrylate (HEMA) and 400 g of γ-butyrolactone were added. At room temperature, 79.1 g of pyridine was added while stirring to provide a reaction mixture. After the end of heat generation from the reaction, the liquid was left to stand to cool to room temperature and left to stand for additional 16 hours.

Then, while cooling with ice, a solution prepared by dissolving 206.3 g (1.00 mole) of dicyclohexyl carbodiimide (DCC) in 180 g of γ-butyrolactone was added to the reaction mixture over 40 minutes while stirring. Then, a suspension liquid prepared by suspending 90.2 g (0.45 mole) of 4,4'-DAE in 350 g of γ-butyrolactone was added over 60 minutes while stirring. After additional stirring for 2 hours at room temperature, 30 ml of ethyl alcohol was added and stirred for 1 hour. Then, 400 g of γ-butyrolactone was added. The deposit formed in the reaction mixture was removed by filtration to provide a reaction liquid.

The reaction liquid was poured in 3 L of water to provide a white precipitate. This precipitate was collected by filtration, rinsed twice with water, washed once with isopropanol, and dried in a vacuum dryer at 50° C. for 72 hours to provide a polyimide precursor (A-7).

Synthesis Example 9 Synthesis of Polyimide Precursor (A-8)

To a separable flask with a capacity of 2 liters, 155.1 g (0.50 mole) of ODPA was fed and 134.0 g (1.00 mole) of 2-hydroxyethyl methacrylate (HEMA) and 400 g of γ-butyrolactone were added. At room temperature, 79.1 g of pyridine was added while stirring to provide a reaction mixture. After the end of heat generation from the reaction, the liquid was left to stand to cool to room temperature and left to stand for additional 16 hours.

Then, while cooling with ice, a solution prepared by dissolving 206.3 g (1.00 mole) of dicyclohexyl carbodiimide (DCC) in 180 g of γ-butyrolactone was added to the reaction mixture over 40 minutes while stirring. Then, a suspension liquid prepared by suspending 16.2 g (0.15 mole) of 1,4-paraphenylene diamine and 60.1 g (0.30 mole) of 4,4'-DAE in 350 g of γ-butyrolactone was added over 60 minutes while stirring. After additional stirring for 2 hours at room temperature, 30 ml of ethyl alcohol was added and stirred for 1 hour. Then, 400 g of γ-butyrolactone was added. The deposit formed in the reaction mixture was removed by filtration to provide a reaction liquid.

The reaction liquid was poured in 3 L of water to provide a white precipitate. This precipitate was collected by filtration, rinsed twice with water, washed once with isopropanol, and dried in a vacuum dryer at 50° C. for 72 hours to provide a polyimide precursor (A-8).

Synthesis Example 10 Synthesis of Photosensitizing Agent (Quinonediazide Compound) (B-1)

In a dry nitrogen flow, 21.2 g (0.05 mole) of 4,4'-[1-[4-[1-(4-hydroxyphenyl-1)-1-methylethyl]phenyl] ethylidene] bisphenol (manufactured by Honshu Chemical Industry Co. Ltd.), hereinafter referred to as TrisP-PA, and 26.8 g (0.10 mole) of 5-naphthoquinone diazide sulfonic acid chloride (NAC-5, manufactured by Toyo Gosei Co., Ltd.) were dissolved in 450 g of γ-butyrolactone at room temperature. To this liquid, a mixture of 12.7 g of triethyl amine with 50 g of γ-butyrolactone was added dropwise while maintaining the system below 35° C. After the end of dropping, stirring was performed at 40° C. for 2 hours. The resulting triethylamine salt was filtered and the filtrate was poured in water. Subsequently, the resulting precipitate was collected by filtration, and then washed with 1 L of a 1% hydrochloric acid solution. In addition, further rinsing with 2 L of water was performed twice. The resulting precipitate was dried in a vacuum dryer to provide a quinonediazide compound (B-1) as represented by the following formula.

[Chemical compound 15]

(B-1)

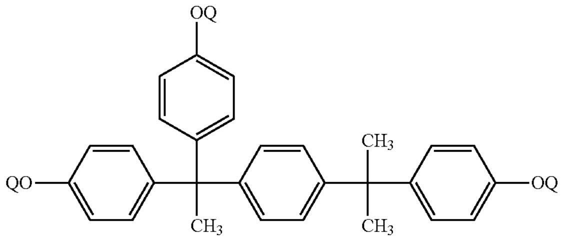

-continued

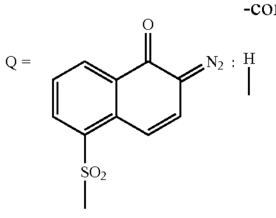

2.0:1.0

Synthesis Example 11 Synthesis of Photosensitizing Agent (quinonediazide Compound) (B-2)

In a dry nitrogen flow, 21.2 g (0.05 mole) of TrisP-PA (manufactured by Honshu Chemical Industry Co. Ltd.) and 26.8 g (0.10 mole) of 4-naphthoquinonediazide sulfonic acid chloride (NAC-5, manufactured by Toyo Gosei Co., Ltd.) were dissolved in 450 g of γ-butyrolactone at room temperature. To this liquid, a mixture of 12.7 g of triethyl amine with 50 g of γ-butyrolactone was added dropwise while maintaining the system below 35° C. After the end of dropping, stirring was performed at 40° C. for 2 hours. The resulting triethylamine salt was filtered and the filtrate was poured in water. Subsequently, the resulting precipitate was collected by filtration, and then washed with 1 L of a 1% hydrochloric acid solution. In addition, further rinsing with 2 L of water was performed twice. The resulting precipitate was dried in a vacuum dryer to provide a quinonediazide compound (B-2) as represented by the following formula.

[Chemical compound 16]

(B-2)

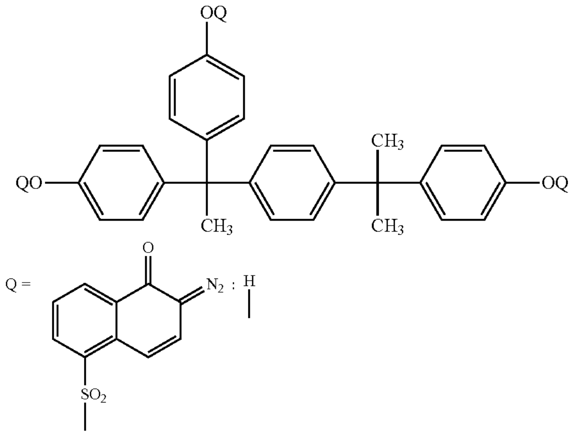

2.0:1.0

Synthesis Example 12 Synthesis of Polystyrene Resin (A-10)

A mixed solution was prepared by adding 0.01 mole of sec-butyl lithium as initiator to 500 ml of tetrahydrofuran, and 20 g of styrene was added thereto, followed by stirring for 3 hours to allow them to polymerize. The polymerization was terminated by adding 0.1 mole of methanol to the reaction solution. To refine the polymer, the reaction mixture was then poured in methanol and the resulting polymer precipitate was dried to provide a white polymer. Furthermore, it was dissolved in 400 ml of acetone and, after adding a small amount of concentrated hydrochloric acid at 60° C., the resulting solution was stirred for 7 hours and poured in water to precipitate a polymer material. It was washed and dried to provide a refined polystyrene resin (A-10).

Synthesis Example 13 Synthesis of Polyimide Precursor (A-11)

In a dry nitrogen flow, 3.2 g (0.03 mole) of 1,4-paraphenylene diamine and 12.0 g (0.06 mole) of 4,4'-DAE were dissolved in 200 g of NMP. To this liquid, 31.0 g (0.10 mole) of ODPA was added and stirred at 40° C. for 2 hours. Then, 1.1 g (0.01 mole) of 3-aminophenol (manufactured by Tokyo Chemical Industry Co. Ltd.), which was adopted as end-capping agent, was added along with 10 g of NMP and allowed to react at 40° C. for 1 hour. Subsequently, a solution prepared by diluting 7.1 g (0.06 mole) of DFA (manufactured by Mitsubishi Rayon Co., Ltd.) with 5 g of NMP was added dropwise. After the end of dropping, stirring was continued at 40° C. for 2 hours. After the end of stirring, the solution was poured in 2 L of water, and the resulting solid polymer precipitate was collected by filtration. In addition, it was rinsed three times with 2 L of water, and the collected solid polymer was dried at 50° C. in a vacuum dryer for 72 hours to prepare a polyimide precursor (A-11).

Synthesis Example 14 Synthesis of Acrylic Resin (A-12)

In a reaction vessel placed in a nitrogen atmosphere, 150 g of dimethyl aminomethanol (hereinafter referred to as DMEA, manufactured by Tokyo Chemical Industry Co., Ltd.) was fed and heated to 80° C. using an oil bath. To this liquid, a mixture of 20 g of ethyl acrylate (hereinafter referred to as EA), 40 g of 2-ethylhexyl methacrylate (hereinafter referred to as 2-EHMA), 20 g of styrene (hereinafter referred to as St), 15 g of acrylic acid (hereinafter referred to as AA), 0.8 g of 2,2'-azobisisobutyronitrile, and 10 g of DMEA was added dropwise over 1 hour. After the end of dropping, the polymerization reaction was continued in a nitrogen atmosphere at 80° C. for additional 6 hours. Then, 1 g of hydroquinone monomethyl ether was added to stop the polymerization reaction. Following this, a mixture of 5 g of glycidyl methacrylate (hereinafter referred to as GMA), 1 g of triethylbenzyl ammonium chloride, and 10 g of DMEA was added dropwise over 0.5 hour. After the end of dropping, the addition reaction was continued in a nitrogen atmosphere at 80° C. for additional 2 hours. The resulting reaction solution was purified with methanol to remove unreacted impurities and vacuum-dried for 24 hours to provide an acrylic resin (A-12) with a copolymerization ratio (by mass) EA/2-EHMA/St/GMA/AA of 20/40/20/5/15. The resulting resin (A-12) had an acid number of 103 mgKOH/g.

Synthesis Example 15 Synthesis of Acrylic Resin (A-13)

A methyl methacrylate/methacrylic acid/styrene copolymer (30/40/30 by weight) was synthesized by the method described in Example 1 of Japanese Patent No. 3120476. After adding 40 parts by weight of glycidyl methacrylate to 100 parts by weight of the resulting copolymer, the addition product was reprecipitated with purified water, filtered, and dried to provide a resin (A-13) having a weight average molecular weight of 15,000 and an acid number of 110 mgKOH/g.

Preparation Example 1 Preparation of Photosensitive Electrically Conductive Paste 1

In a 100 mL clean bottle, 10.0 g of the acrylic resin (A-12), adopted as the resin component, 0.50 g of IRGACURE (registered trademark) OXE-01 (manufactured by Ciba Japan K.K.) as photo initiator, 5.0 g of DMEA as solvent, and 2.0 g of Light Acrylate (registered trademark) BP-4EA (manufactured by Kyoeisha Chemical Co., Ltd.) as a compound with an unsaturated double bond were fed and they were mixed in a rotation-revolution type vacuum mixer (Awatori Rentaro (registered trademark) ARE-310, manufactured by Thinky Corporation) to provide 17.5 g of a resin solution (solid content 71.4 mass %).

Then, 17.50 g of the resulting resin solution, 44.02 g of silver particles with an average particle diameter of 1.0 μm, and 0.28 g of carbon black with an average particle diameter of 0.05 μm were mixed and kneaded in a triple roll mill (EXAKT M-50, manufactured by EXAKT) to provide 61.8 g of a photosensitive electrically conductive paste 1. Here, to determine the average particle diameters of the silver particles and carbon black, their particles were observed by electron microscopy (SEM) under the conditions of a magnification of 10,000× and a visual field width of 12 μm. For the silver particles and carbon black, the maximum sizes of randomly selected 40 primary particles were measured and their number average was calculated.

Preparation Example 2 Preparation of Coloring Agent Dispersion Liquid (DC-1)

Particles of a zirconia compound (Zr-1, manufactured by Nisshin Engineering Inc.), which were produced by the thermal plasma technique, were used as coloring agent. In a tank, 200 g of Zr-1, 114 g of a 35 wt % solution of an acrylic polymer (P-1) in propylene glycol monomethyl ether acetate (PGMEA), 25 g of DISPERBYK (registered trademark) LPN-21116, which has a tertiary amino group and a quaternary ammonium salt and which was adopted as polymer dispersant, and 661 g of PGMEA were fed and stirred by a homo mixer for 20 minutes to provide a preliminary dispersion liquid. The resulting preliminary dispersion liquid was fed to a disperser equipped with a centrifugal separator (Ultra Apex Mill, manufactured by Kotobuki Industry Co., Ltd.) that was 75 vol % filled with zirconia beads with a diameter of 0.05 mm, and dispersion was carried out at a rotation speed of 8 m/s for 3 hours to provide a coloring agent dispersion liquid (DC-1) having a solid content of 25 mass % and a coloring agent/resin ratio (by mas) of 80/20.

Preparation Example 3 Preparation of Photosensitive Coloring Resin Composition 1

To 283.1 g of the coloring agent dispersion liquid (DC-1), 184.4 g of a 35 mass % solution of the resin (A-13) in PGMEA, 50.1 g of dipentaerythritol hexaacrylate (manufactured by Nippon Kayaku Co., Ltd.), which was adopted as polyfunctional monomer, 7.5 g of Irgacure (registered trademark) 907 (manufactured by BASF), 3.8 g of KAYACURE (registered trademark) DETX-S (manufactured by Nippon Kayaku Co., Ltd.), both as photo initiator, 12.0 g of KBM5103 (manufactured by Shin-Etsu Chemical Co., Ltd.) as adhesion promoter, and a solution prepared by dissolving 3 g of a 10 mass % PGMEA solution of a silicone based surfactant (BYK (registered trademark) 333, manufactured by BYK-Chemie) in 456.1 g of PGMEA, which was adopted as surfactant, were added to provide a photosensitive coloring resin composition 1 having a total solid content of 20 mass % and a coloring agent/resin ratio (by weight) of 30/70.

Preparation Example 4 Preparation of Coloring Agent Dispersion Liquid (DC-2)

According to the method described in Published Japanese Translation of PCT International Publication JP 2008-517330, the carbon black (CB-Bk1), which had a surface modified with the sulfo group, had a surface element constitution of [C: 88%, O: 7%, Na: 3%, S: 2%] and the state of the S element was such that those S2p peak components attributed to C-S and S-S accounted for 90% while those attributed to SO and SOx accounted for 10%. The BET value was 54 $m^2/g$.

In a tank, this carbon black CB-Bk1 (200 g), a 40 mass % solution of the acrylic resin (A-13) in propylene glycol monomethyl ether acetate (94 g), a 40 mass % solution of LPN21116 (manufactured by BYK-Chemie Japan) (31 g), which was adopted as polymer dispersant, and propylene glycol monomethyl ether acetate (675 g) were fed and stirred for 1 hour using a homo mixer (manufactured by Tokushu Kika Kogyo Co., Ltd.) to provide a preliminary dispersion liquid. After that, the preliminary dispersion liquid was fed to a disperser equipped with a centrifugal separator (Ultra Apex Mill, manufactured by Kotobuki Industry Co., Ltd.) that was 70% filled with zirconia beads (YTZ Ball, manufactured by Nikkato Corporation) with a diameter of 0.05 mm, and dispersion was carried out at a rotation speed of 8 m/s for 2 hours to provide a coloring agent dispersion liquid (DC-2) having a solid content of 25 mass % and a coloring agent/resin ratio (by mass) of 80/20.

Preparation Example 5 Preparation of Photosensitive Coloring Resin Composition 2

To 534.8 g of the coloring agent dispersion liquid (DC-2), 122.1 g of a 40 mass % solution of the resin (A-13) in PGMEA, 47.3 g of dipentaerythritol hexaacrylate (manufactured by Nippon Kayaku Co., Ltd.), which was adopted as polyfunctional monomer, 11.8 g of ADEKA KLUSE NCI-831 (manufactured by Adeka Corporation) as photo initiator, 12.0 g of KBM5103 (manufactured by Shin-Etsu Chemical Co., Ltd.) as adhesion promoter, and a solution prepared by dissolving 4 g of a 10 mass % PGMEA solution of a silicone based surfactant (BYK (registered trademark) 333, manufactured by BYK-Chemie) in 194.0 g of PGMEA, which was adopted as surfactant, were added to provide a photosensitive coloring resin composition 2 having a total solid content of 25 mass % and a coloring agent/resin ratio (by weight) of 45/55.

The component (A-9), component (B-3), component (C-1), component (C-2), other components, and solvents that were used in Examples and Comparative examples are listed below.

- (A-9) phenol resin MEHC-7851 (manufactured by Meiwa Plastic Industries, Ltd.)
- (C-1) HMOM-TPHAP (manufactured by Honshu Chemical Industry Co., Ltd.)
- (C-2) YX4000H (manufactured by Mitsubishi Chemical Corporation)

[Chemical compound 17]

(A-9)

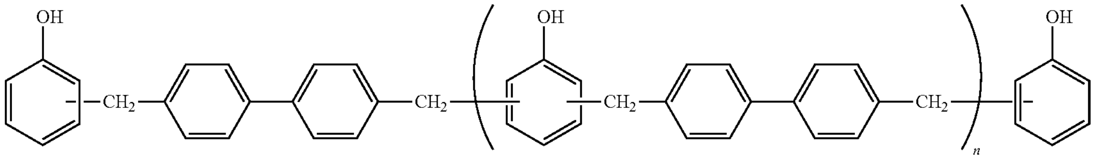

(C-1)

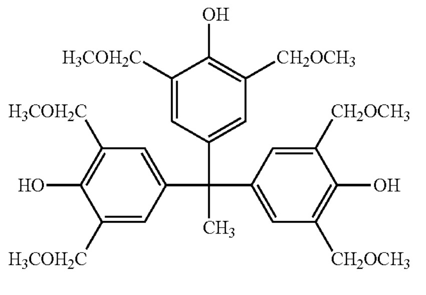

(C-2)

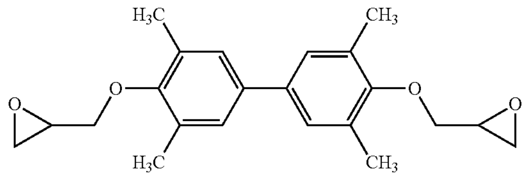

Component (B-3): photo initiator NCI-831 (manufactured by Adeka Corporation)

Other Components:

(F-1): dipentaerythritol hexaacrylate (DPHA, manufactured by Kyoeisha Chemical Co., Ltd.) Solvents:

GBL: γ-butyrolactone

EL: ethyl lactate

PGME: propylene glycol monomethyl ether

For the first embodiment of the present invention, Table 1 lists the constitutions of the resin compositions used, each consisting of a resin (A), photosensitizing agent (B), thermal crosslinking agent (C), etc. According to Table 1, the resin compositions 1 to 11, 13, and 14 were prepared using the solvents specified in Table 1 so as to have a solid content of 40 mass %. The resin composition 12 was prepared using the solvent specified in Table 1 so as to have a solid content of 20 mass %. Table 2-1, Tables 2-2, and Table 2-3 also show the resin composition used in each Example, the conductor spacing H1 (μm) between mutually adjacent metal wires (K2) in the region (G), thickness H2 (μm) of the metal wires (K2), thickness H3 (μm) of the cured film (F1), depth H4 (μm) of the depression formed in the cured film (F1) in the region (G), the depressed surface planarization rate P (%), total thickness (μm) of the cured film, number of layers in the cured film, shape and size of the hole pattern produced in the cured film, and angle of the inclined side of the hole pattern.

TABLE 1

| | resin component (A) (content) | | photosensitive agent (B) (content) | | |
|---|---|---|---|---|---|
| resin composition 1 | (A-1) (100 parts by mass) | — | (B-1) (10 parts by mass) | (B-2) (10 parts by mass) | — |
| resin composition 2 | (A-1) (100 parts by mass) | — | (B-1) (20 parts by mass) | — | — |
| resin composition 3 | (A-1) (100 parts by mass) | (A-9) (15 parts by mass) | (B-1) (20 parts by mass) | — | — |
| resin composition 4 | (A-1) (100 parts by mass) | (A-9) (15 parts by mass) | (B-1) (20 parts by mass) | — | — |
| resin composition 5 | (A-2) (100 parts by mass) | — | (B-1) (20 parts by mass) | — | — |
| resin composition 6 | (A-2) (100 parts by mass) | — | (B-1) (20 parts by mass) | — | — |
| resin composition 7 | (A-3) (100 parts by mass) | — | (B-1) (20 parts by mass) | — | — |
| resin composition 8 | (A-4) (100 parts by mass) | — | (B-1) (20 parts by mass) | — | — |
| resin composition 9 | (A-5) (100 parts by mass) | — | (B-1) (20 parts by mass) | — | — |
| resin composition 10 | (A-5) (100 parts by mass) | — | — | — | (B-3) (5 parts by mass) |
| resin composition 11 | (A-6) (100 parts by mass) | — | (B-1) (20 parts by mass) | — | — |
| resin composition 12 | (A-1) (100 parts by mass) | — | (B-1) (10 parts by mass) | (B-2) (10 parts by mass) | — |
| resin composition 13 | (A-7) (100 parts by mass) | — | — | — | (B-3) (5 parts by mass) |
| resin composition 14 | (A-8) (100 parts by mass) | — | — | — | (B-3) (5 parts by mass) |

| | thermal crosslinking agent (C) (content) | | other component | solvent |
|---|---|---|---|---|
| resin composition 1 | (C-1) (20 parts by mass) | — | — | GBL |
| resin composition 2 | (C-1) (20 parts by mass) | — | — | GBL |
| resin composition 3 | (C-1) (20 parts by mass) | — | — | GBL |
| resin composition 4 | (C-1) (10 parts by mass) | (C-2) (10 parts by mass) | — | GBL |
| resin composition 5 | (C-1) (20 parts by mass) | — | — | GBL |
| resin composition 6 | (C-1) (10 parts by mass) | (C-2) (10 parts by mass) | — | GBL |

TABLE 1-continued

| | | | | |
|---|---|---|---|---|
| resin composition 7 | (C-1) (10 parts by mass) | (C-2) (10 parts by mass) | — | GBL |
| resin composition 8 | (C-1) (10 parts by mass) | (C-2) (10 parts by mass) | — | GBL |
| resin composition 9 | (C-1) (10 parts by mass) | (C-2) (10 parts by mass) | — | GBL |
| resin composition 10 | — | — | (F-1) (20 parts by mass) | GBL |
| resin composition 11 | (C-1) (10 parts by mass) | (C-2) (10 parts by mass) | — | GBL |
| resin composition 12 | (C-1) (20 parts by mass) | — | — | EL/GBL/PGME 20 mass %/ 20 mass %/ 60 mass % |
| resin composition 13 | — | — | (F-1) (20 parts by mass) | GBL |
| resin composition 14 | — | — | (F-1) (20 parts by mass) | GBL |

TABLE 2-1

| | display | resin composition | conductor spacing H1 between metal wires (K2) (μm) | thickness H2 of metal wires (K2) (μm) | thickness H3 of cured film (F1) (μm) | depth H4 of depression formed in cured film (F1) in region (G) (μm) | depresses surface planarization rate P (%) |
|---|---|---|---|---|---|---|---|
| Example 1 | display 1 | resin composition 1 | 20 | 5 | 10 | 1.3 | 74 |
| Example 2 | display 2 | resin composition 2 | 20 | 5 | 10 | 1.2 | 77 |
| Example 3 | display 3 | resin composition 3 | 20 | 5 | 10 | 1.0 | 80 |
| Example 4 | display 4 | resin composition 4 | 20 | 5 | 10 | 0.9 | 82 |
| Example 5 | display 5 | resin composition 5 | 20 | 5 | 10 | 1.3 | 74 |
| Example 6 | display 6 | resin composition 6 | 20 | 5 | 10 | 0.9 | 82 |
| Example 7 | display 7 | resin composition 7 | 20 | 5 | 10 | 1.3 | 75 |
| Example 8 | display 8 | resin composition 8 | 20 | 5 | 10 | 1.0 | 80 |
| Example 9 | display 9 | resin composition 9 | 20 | 5 | 10 | 1.3 | 75 |
| Example 10 | display 10 | resin composition 10 | 20 | 5 | 10 | 1.3 | 75 |
| Example 11 | display 11 | resin composition 11 | 20 | 5 | 10 | 1.3 | 75 |
| Example 12 | display 12 | resin composition 12 | 20 | 5 | 10 | 1.4 | 72 |
| Example 13 | display 13 | resin composition 2 | 20 | 5 | 10 | 0.4 | 92 |
| Example 14 | display 14 | resin composition 2 | 2 | 1.5 | 3 | 0.1 | 94 |
| Example 15 | display 15 | resin composition 2 | 5 | 5 | 10 | 0.5 | 90 |
| Example 16 | display 16 | resin composition 2 | 20 | 5 | 7 | 1.5 | 71 |
| Example 17 | display 17 | resin composition 2 | 20 | 5 | 20 | 1.0 | 81 |
| Example 18 | display 18 | resin composition 4 | 2 | 2 | 4 | 0.1 | 97 |
| Example 19 | display 19 | resin composition 4 | 5 | 5 | 10 | 0.3 | 95 |
| Example 20 | display 20 | resin composition 4 | 20 | 5 | 7 | 1.2 | 76 |

TABLE 2-1-continued

| | total thickness of cured film (μm) | number of layers in cured film | shape and maximum size of hole pattern formed in cured film | evaluation item (1) | angle of inclined side of hole pattern (°) | evaluation item (2) |
|---|---|---|---|---|---|---|
| Example 1 | 30 | 3 | circular, diameter 2 μm | C | 75 | A |
| Example 2 | 30 | 3 | circular, diameter 3 μm | C | 70 | A |
| Example 3 | 30 | 3 | circular, diameter 3 μm | B | 65 | A |
| Example 4 | 30 | 3 | circular, diameter 3 μm | B | 60 | A |
| Example 5 | 30 | 3 | circular, diameter 3 μm | C | 75 | A |
| Example 6 | 30 | 3 | circular, diameter 3 μm | B | 70 | A |
| Example 7 | 30 | 3 | circular, diameter 3 μm | C | 70 | A |
| Example 8 | 30 | 3 | circular, diameter 3 μm | B | 70 | A |
| Example 9 | 30 | 3 | circular, diameter 3 μm | C | 65 | A |
| Example 10 | 30 | 3 | circular, diameter 15 μm | E | 85 | B |
| Example 11 | 30 | 3 | circular, diameter 3 μm | C | 65 | A |
| Example 12 | 30 | 3 | circular, diameter 3 μm | C | 75 | A |
| Example 13 | 30 | 3 | circular, diameter 3 μm | A | 70 | A |
| Example 14 | 9 | 3 | circular, diameter 3 μm | A | 70 | A |
| Example 15 | 30 | 3 | circular, diameter 3 μm | A | 70 | A |
| Example 16 | 27 | 3 | circular, diameter 1 μm | C | 70 | A |
| Example 17 | 40 | 3 | circular, diameter 6 μm | D | 70 | A |
| Example 18 | 12 | 3 | circular, diameter 2 μm | A | 60 | A |
| Example 19 | 30 | 3 | circular, diameter 3 μm | A | 60 | A |
| Example 20 | 27 | 3 | circular, diameter 2 μm | C | 60 | A |

TABLE 2-2

| | display | resin composition | conductor spacing H1 between metal wires (K2) (μm) | thickness H2 of metal wires (K2) (μm) | thickness H3 of cured film (F1) (μm) | depth H4 of depression formed in cured film (F1) in region (G) (μm) |
|---|---|---|---|---|---|---|
| Example 21 | display 21 | resin composition 4 | 20 | 5 | 15 | 0.7 |
| Example 22 | display 22 | resin composition 4 | 20 | 10 | 15 | 2.2 |
| Example 23 | display 23 | resin composition 4 | 20 | 5 | 10 | 0.9 |
| Example 24 | display 24 | resin composition 4 | 20 | 5 | 10 | 0.9 |
| Example 25 | display 25 | resin composition 1 | 20 | 5 | 10 | 1.3 |
| Example 26 | display 26 | resin composition 2 | 20 | 5 | 10 | 1.2 |
| Example 27 | display 27 | resin composition 4 | 20 | 5 | 10 | 0.9 |
| Example 28 | display 28 | resin composition 12 | 20 | 5 | 10 | 1.4 |
| Example 29 | display 29 | resin composition 2 | 20 | 5 | 10 | 1.2 |
| Example 30 | display 30 | resin composition 4 | 20 | 5 | 10 | 0.9 |
| Example 31 | display 31 | resin composition 4 | 20 | 5 | 10 | 0.9 |

TABLE 2-2-continued

| | | | | | | |
|---|---|---|---|---|---|---|
| Comparative example 1 | display 32 | resin composition 13 | 20 | 5 | 10 | 2.1 |
| Comparative example 2 | display 33 | resin composition 14 | 20 | 5 | 10 | 2.3 |
| Comparative example 3 | display 34 | resin composition 13 | 2 | 2 | 4 | 0.7 |
| Comparative example 4 | display 35 | resin composition 13 | 5 | 5 | 10 | 2.0 |
| Comparative example 5 | display 36 | resin composition 13 | 20 | 5 | 7 | 2.2 |
| Comparative example 6 | display 37 | resin composition 13 | 20 | 5 | 20 | 2.0 |

| | depresses surface planarization rate P (%) | total thickness of cured film (μm) | number of layers in cured film | shape and maximum size of hole pattern formed in cured film | evaluation item (1) | angle of inclined side of hole pattern (°) | evaluation item (2) |
|---|---|---|---|---|---|---|---|
| Example 21 | 86 | 35 | 3 | circular, diameter 10 μm | D | 60 | A |
| Example 22 | 78 | 35 | 3 | circular, diameter 3 μm | C | 60 | A |
| Example 23 | 82 | 30 | 3 | circular, diameter 3 μm | B | 60 | A |
| Example 24 | 82 | 30 | 3 | circular, diameter 3 μm | B | 60 | A |
| Example 25 | 74 | 30 | 3 | circular, diameter 2 μm | C | 75 | A |
| Example 26 | 77 | 30 | 3 | circular, diameter 3 μm | C | 70 | A |
| Example 27 | 82 | 30 | 3 | circular, diameter 3 μm | B | 60 | A |
| Example 28 | 72 | 30 | 3 | circular, diameter 3 μm | C | 75 | A |
| Example 29 | 77 | 30 | 3 | circular, diameter 3 μm | C | 70 | A |
| Example 30 | 82 | 30 | 3 | circular, diameter 3 μm | B | 60 | A |
| Example 31 | 82 | 30 | 3 | circular, diameter 3 μm | B | 60 | A |
| Comparative example 1 | 58 | 30 | 3 | circular, diameter 8 μm | F | 85 | B |
| Comparative example 2 | 54 | 30 | 3 | circular, diameter 10 μm | F | 85 | B |
| Comparative example 3 | 64 | 12 | 3 | circular, diameter 5 μm | F | 85 | B |
| Comparative example 4 | 60 | 30 | 3 | circular, diameter 8 μm | F | 85 | B |
| Comparative example 5 | 56 | 27 | 3 | circular, diameter 5 μm | F | 85 | B |
| Comparative example 6 | 60 | 40 | 3 | circular, diameter 20 μm | F | 85 | B |

TABLE 2-3

| | display | resin composition | conductor spacing H1 between metal wires (K2) (μm) | thickness H2 of metal wires (K2) (μm) | thickness H3 of cured film (F1) (μm) | depth H4 of depression formed in cured film (F1) in region (G) (μm) |
|---|---|---|---|---|---|---|
| Example 32 | display 38 | resin composition 4 | 20 | 5 | 10 | 0.9 |
| Example 33 | display 39 | resin composition 4 | 20 | 5 | 10 | 0.9 |
| Example 34 | display 40 | resin composition 4 | 20 | 5 | 10 | 0.9 |
| Example 35 | display 41 | resin composition 4 | 20 | 5 | 10 | 0.9 |
| Example 36 | display 42 | resin composition 4 | 20 | 5 | 10 | 0.9 |
| Example 37 | display 43 | resin composition 4 | 20 | 5 | 10 | 0.9 |
| Example 38 | display 44 | resin composition 4 | 20 | 5 | 10 | 0.9 |

TABLE 2-3-continued

| | | | | | | |
|---|---|---|---|---|---|---|
| Example 39 | display 45 | resin composition 4 | 20 | 5 | 10 | 0.9 |
| Example 40 | display 46 | resin composition 4 | 20 | 5 | 10 | 0.9 |
| Example 41 | display 47 | resin composition 4 | 20 | 5 | 10 | 0.9 |
| Example 42 | display 48 | resin composition 4 | 5 | 1 | 3 | 0.2 |

| | depresses surface planarization rate P (%) | total thickness of cured film (μm) | number of layers in cured film | shape and maximum size of hole pattern formed in cured film | evaluation item (1) | angle of inclined side of hole pattern (°) | evaluation item (2) |
|---|---|---|---|---|---|---|---|
| Example 32 | 82 | 30 | 3 | circular, diameter 3 μm | B | 60 | A |
| Example 33 | 82 | 30 | 3 | circular, diameter 3 μm | B | 60 | A |
| Example 34 | 82 | 30 | 3 | circular, diameter 3 μm | B | 60 | A |
| Example 35 | 82 | 30 | 3 | circular, diameter 3 μm | B | 60 | A |
| Example 36 | 82 | 30 | 3 | circular, diameter 3 μm | B | 60 | A |
| Example 37 | 82 | 30 | 3 | circular, diameter 3 μm | B | 60 | A |
| Example 38 | 82 | 30 | 3 | circular, diameter 3 μm | B | 60 | A |
| Example 39 | 82 | 30 | 3 | circular, diameter 3 μm | B | 60 | A |
| Example 40 | 82 | 35 | 3 | circular, diameter 3 μm | B | 60 | A |
| Example 41 | 82 | 35 | 3 | circular, diameter 3 μm | B | 60 | A |
| Example 42 | 82 | 5 | 2 | circular, diameter 3 μm | B | 60 | A |

For the evaluation item (1), a display was rated as level A if it had a depressed surface planarization rate P of 90% or more and a maximum hole pattern size of 5 μm or less, rated as level B if it had a depressed surface planarization rate P of 80% or more and 89% or less and a maximum hole pattern size of 5 μm or less, rated as level C if it had a depressed surface planarization rate P of 70% or more and 79% or less and a maximum hole pattern size of 5 μm or less, rated as level D if it had a depressed surface planarization rate P of 70% or more and a maximum hole pattern size of more than 5 μm and 10 μm or less, rated as level E if it had a depressed surface planarization rate P of 70% or more and a maximum hole pattern size of more than 10 μm, or rated as level F if it had a depressed surface planarization rate P of less than 70%.

For the evaluation item (2), a display was rated as level A if the angle of its inclined side was 55° or more and 80° or less, rated as level B if it was 40° or more and less than 55° or more than 80° and 85° or less, or rated as level C if it was less than 40° or more than 85°.

Example 1 (Steps in FIG. 14)

An example of the display according to the present invention is described below with reference to the cross-sectional views of the production steps given in FIG. 14.

As illustrated in FIG. 14*a*, a glass substrate was used as the support substrate 20. Some temporarily attached materials made of polyimide were disposed on the glass substrate, and LEDs 2, which work as light emitting elements, were disposed on the support substrate 20. Each LED 2 had a thickness of 7 μm and had a pair of sides with a length of 30 μm and the other pair of sides with a length of 50 μm.

Next, as illustrated in FIG. 14*b*, the resin composition 1 described in Table 1 was applied by spin-coating on the support substrate 20 and on the light emitting element 2 in such a manner that its thickness would be 10 μm after heat treatment, thereby forming a resin film 21.

Next, as illustrated in FIG. 14*c*, the resin film 21 was irradiated with i-line light (365 nm) through a mask having a desired pattern. The irradiated resin film 21 was developed with a 2.38 mass % aqueous solution of tetramethyl ammonium (TMAH) to form a plurality of hole patterns 12 that penetrated the resin film 21 in the thickness direction. Each hole pattern had a circular shape, and the hole pattern had a diameter of 2 μm as the maximum size in the bottom face portion in the smallest region.

Next, the resin film 21 was cured by performing heat treatment at 110° C. for 30 minutes in an atmosphere having an oxygen concentration of 100 ppm or less and additional heat treatment at 230° C. for 60 minutes to form a cured film 3 with a thickness of 10 μm. Thus, the resin film 21 was cured directly into a cured film 3.

Next, as illustrated in FIG. 14*d*, barrier metal of titanium was sputtered on the cured film 3 and in addition, a copper seed layer was formed on top of it by sputtering. Following this, a photoresist layer was formed, and then metal wires (K1)4*a* of copper connected electrically to the LEDs 2 were formed by the plating technique in the hole pattern 12 in the cured film 3 and metal wires (K2)4*b* were on part of the surface of the cured film 3. Subsequently, the photoresist, seed layer, and barrier metal were removed. The metal wires (K2)4*b* had a thickness H2 of 5 μm.

Then, as illustrated in FIG. 14*e* to 14*f*, two cured film layers 3*a* were formed, wherein each cured film layer 3*a* had metal wires (K1)4*a* and metal wires (K2)4*b*. Each of the metal wires (K2)4*b* had a thickness H2 of 5 μm, and each of the cured film layers (F1)3*a* had a thickness H3 of 10 μm. Here, a region (G) 28 in which the conductor spacing H1 between mutually adjacent metal wires (K2)4*b* was 1 to 20 μm was formed in a portion of the cured film 3 located near an LED 2. The resulting three layered cured film 3 had a total thickness of 30 μm.

Subsequently, as illustrated in FIG. 14*g*, barrier metal 9 was formed by sputtering in each hole pattern 12 in the cured film 3*a*, followed by forming solder bumps 10. Subsequently, as illustrated in FIG. 14*h*, the solder was reflowed at 250° C. for 1 minute to allow it to be electrically connected through the solder bump 10 to a light emitting element driving substrate 7 that had a driver IC as drive element 8. Then, the support substrate 20 was removed and an opposite substrate 5 was attached using an adhesive etc., thus producing a display 1 that had a plurality of LEDs 2.

Examples 2 and 11

Except for replacing the resin composition 1 used in Example 1 with the resin compositions 2 to 11, the same procedure as in Example 1 was carried out to produce displays 2 to 11.

Example 12

Except for replacing the resin composition 1 used in Example 1 with the resin composition 12 and using the slit coating technique to form the resin film 21, the same procedure as in Example 1 was carried out to produce a display 12.

Example 13

Except for replacing the resin composition 1 used in Example 1 with a resin sheet prepared from the resin composition 2 and using the lamination technique to form the resin film 21, the same procedure as in Example 1 was carried out to produce a display 13.

Example 14

In Example 14, except for, unlike Example 2, forming a region (G) in which the conductor spacing H1 was 2 μm and also forming metal wires (K2) with a thickness H2 of 1.5 μm, a cured film (F1)3*a* with a thickness H3 of 3 μm, and a three layered cured film 3 with a total thickness of 9 μm, the same procedure as in Example 2 was carried out to produce a display 14.

Example 15

In Example 15, except for, unlike Example 2, forming a region (G) in which the conductor spacing H1 was 5 μm, the same procedure as in Example 2 was carried out to produce a display 15.

Examples 16 and 17

In Examples 16 and 17, except that, unlike Example 2, the cured film layer (F1)3*a*, which is one of the plurality of layers formed in the cured film 3*a* that was closest to the LED 2, had a thickness H3 of 7 μm or 20 μm and that the three layered cured film 3 had a total thickness of 27 μm or 40 μm, the same procedure as in Example 2 was carried out to produce displays 16 and 17.

Example 18

In Example 18, except for, unlike Example 4, forming a region (G) in which the conductor spacing H1 was 2 μm and also forming metal wires (K2) with a thickness H2 of 2 μm, a cured film (F1)3*a* with a thickness H3 of 4 μm, and a three layered cured film 3 with a total thickness of 12 μm, the same procedure as in Example 4 was carried out to produce a display 18.

Example 19

In Example 19, except for, unlike Example 4, forming a region (G) in which the conductor spacing H1 was 5 μm, the same procedure as in Example 4 was carried out to produce a display 19.

Example 20

In Example 20, except that, unlike Example 4, the cured film layer (F1)3*a*, which is one of the plurality of layers formed in the cured film 3*a* that was closest to the LED 2, had a thickness H3 of 7 μm and that the three layered cured film 3 had a total thickness of 27 μm, the same procedure as in Example 4 was carried out to produce displays 20.

Examples 21 and 22

In Examples 21 and 22, except that, unlike Example 4, a region in which the metal wires (K2) had a thickness H2 of 5 μm or 10 μm was formed, that the cured film layer (F1)3*a*, which is one of the plurality of layers formed in the cured film 3*a* that was closest to the LED 2, had a total thickness H3 of 15 μm, and that the three layered cured film 3 had a total thickness of 35 μm, the same procedure as in Example 4 was carried out to produce displays 21 and 22.

Example 23

As illustrated in FIG. 15*a*, partition walls 16 were formed on the support substrate 20. Next, as illustrated in FIG. 15*b*, LEDs 2 were formed between the partition walls 16. Then, a resin film 21 was formed as illustrated in FIG. 15*c*. Except for this, the same steps as in Example 4 were carried out to produce a display 23. Here, the LEDs 2 had a thickness of 7 μm and the partition walls 16 had a thickness of 10 μm. To form the partition walls 16, an acrylic resin containing a generally known white pigment was used.

Example 24

As illustrated in FIG. 16*d*, the step shown in FIG. 14*c* which was designed to form a cured film by the same procedure as in Example 4 was followed by sputtering aluminum to a thickness of 0.2 μm at predetermined positions so as to avoid the metal wires (K2)4*b* that were to be formed later, thereby producing reflecting films 15. Except for this, the same steps as in Example 4 were carried out to produce a display 24.

Example 25

An example of the display according to the present invention is described below with reference to the cross-sectional views of the production steps given in FIG. 17.

First, as illustrated in FIG. 17*a*, metal wires (K2)4*b* made of copper were formed on the support substrate 20. The metal wires (K2)4*b* had a thickness H2 of 5 μm.

Next, as illustrated in FIG. 17*b*, the resin composition 1 described in Table 1 was applied by spin-coating on the support substrate 20 and on metal wires (K2)4*b* in such a manner that its thickness would be 10 μm after heat treatment, thereby forming a resin film 21.

Next, as illustrated in FIG. 17*c*, a plurality of hole patterns 12 was formed in the resin film 21 under the same conditions as adopted in the photolithography steps described in Example 1.

Next, the resin film 21 was cured under the same conditions as in Example 1 to form a cured film 3*a* with a thickness of 10 μm.

Following this, in FIG. 17*c*, barrier metal such as titanium was sputtered on the cured film 3*a* and in addition, a copper seed (seed layer) was formed on top of it by sputtering.

Following this, as shown in FIG. 17*d*, after the formation of a photoresist layer, then metal wires (K1)4*a* of copper were formed by the plating technique in the hole patterns 12 in the cured film 3*a* and metal wires (K2)4*b* were formed on part of the surface of the cured film 3*a*. Subsequently, the photoresist, seed layer, and barrier metal were removed. The metal wires (K2)4*b* had a thickness H2 of 5 μm. Subsequently, the photoresist, seed layer, and barrier metal were removed.

Then, as illustrated in FIG. 17*e*, a three layered cured film 3*a* was formed, wherein the cured film 3*a* had metal wires (K1)4*a* and metal wires (K2)4*b*. Each of the metal wires (K2)4*b* had a thickness H2 of 5 μm, and each of the cured film layers (F1)3*a* had a thickness H3 of 10 μm. Here, a region (G) 28 in which the conductor spacing H1 between mutually adjacent metal wires (K2)4*b* was 20 μm was formed in a portion of the cured film 3*a* located near an LED 2. The resulting three layered cured film 3 had a total thickness of 30 μm.

Next, as illustrated in FIG. 17*f*, LEDs 2 were formed on the cured film 3*a* while maintaining electric connection to the metal wires (K1)4*a* and the metal wires (K2)4*b*. The LEDs 2 had a thickness of 7 μm.

Next, as illustrated in FIG. 17*g*, a resin film 21 was formed from the resin composition 1 on the cured film 3*a* and on the light emitting elements 2 and cured by heat treatment to form a cured film 29. Here, the cured film 29 was formed by performing heat treatment at 110° C. for 30 minutes in an atmosphere having an oxygen concentration of 100 ppm or less and additional heat treatment at 230° C. for 60 minutes.

Subsequently, as illustrated in FIG. 17*h*, the support substrate 20 was removed, followed by attaching a light emitting element driving substrate 7 that had a driver IC as drive element 8 and was electrically connected via the solder bump 10. Then, an opposite substrate 5 was attached to the LEDs 2 using an adhesive etc., thus producing a display 25 having a plurality of LEDs 2.

Examples 26 and 27

Except for replacing the resin composition 1 used in Example 26 with the resin composition 2 or 4, the same procedure as in Example 25 was carried out to produce displays 26 and 27.

Example 28

Except for replacing the resin composition 1 used in Example 25 with the resin composition 12 and using the slit coating technique to form the resin film 21, the same procedure as in Example 25 was carried out to produce a display 28.

Example 29

As illustrated in FIG. 18*f*, the formation of a plurality of cured film layers 3*a* as described in FIG. 17*e*, which was performed by the same procedure as in Example 26, was followed by forming partition walls 16 from the resin composition 2 between and around the LEDs 2 that were to be formed later. Then, a plurality of LEDs 2 was formed as illustrated in FIG. 34*g* and, as illustrated in FIG. 18*h*, the support substrate 20 was removed, followed by attaching a light emitting element driving substrate 7 that had a driver IC as drive element 8 and was electrically connected via the solder bumps 10. Then, an opposite substrate 5 was attached to the LEDs 2 using an adhesive etc. to produce a display 29 having a plurality of LEDs 2. Here, the LEDs 2 had a thickness of 7 μm and the partition walls had a thickness of 10 μm.

Example 30

As illustrated in FIG. 19*f*, the steps carried out by the same procedure as in Example 27 for forming a cured film 3*a* and for forming metal wires (K1)4*a* and metal wires (K2)4*b* were followed by sputtering aluminum to a thickness of 0.5 μm at predetermined positions so as to avoid the metal wires (K2)4*b* formed above, thereby producing reflecting films 15. Subsequently, the same steps as in Example 27 were carried out to produce a display 30.

Example 31

Except that, unlike Example 27, NLD-L-672 (manufactured by Sanyu Rec. Ltd.) was used as material for the cured film 29 to be formed on the light emitting elements 2 and that it was heat-treated at 150° C. for 360 minutes to form a cured film 29, the same procedure as in Example 27 was carried out to produce a display 31.

Example 32

Unlike Example 4, a groove was formed by laser processing in a side face of the light emitting element driving substrate 7 as illustrated in FIG. 14*h*, followed by sputtering of titanium and copper in this order and plating with copper to form metal wires 22. Except for this, the same procedure as in Example 1 was carried out to produce a display 38.

Example 33

Unlike Example 27, a groove was formed by laser processing in a side face of the light emitting element driving substrate 7 as illustrated in FIG. 17*h*, followed by sputtering of titanium and copper in this order and plating with copper to form metal wires 22. Except for this, the same procedure as in Example 27 was carried out to produce a display 39.

Example 34

For the side face of a light emitting element driving substrate 7 formed as in Example 32, an electrically conductive film 34 was adopted as illustrated in FIG. 43*h*, and the photosensitive electrically conductive paste 1 prepared in Preparation example 1 was used to form the electrically conductive film 34. Except for this, the same procedure as in Example 32 was carried out to produce a display 40. The formation of the electrically conductive film 34 was performed as described below.

<Preparation of Electrically Conductive Film 34>

The photosensitive electrically conductive paste 1 was spread on a PET mold release film prepared by coating a PET film having a thickness of 16 μm with a mold releasing agent in such a manner that the film thickness would be 6.0 μm after drying, followed by drying the resulting coated film in a drying oven at 100° C. for 10 minutes. Then, it was irradiated with an exposure energy of 350 mJ/cm$^2$ using a light irradiation machine equipped with an ultrahigh pressure mercury lamp and then, using a 0.1 mass % aqueous solution of sodium carbonate as developer, spray development under a pressure of 0.1 MPa was performed for 30 seconds, thereby forming a pattern. Subsequently, the resulting pattern was cured in a drying oven at 140° C. for 30 minutes to prepare a wired sample for transfer test. The resulting pattern had a line width of 50 μm and a line length of 90 mm. Such samples for transfer test were attached to both faces of a glass plate in such a manner that part of the wires were disposed along the edge of the plate that had a beveled curved portion. Then, the side face of the glass plate was pressed against a hot plate at 130° C. for 30 seconds, followed by transferring the remaining portion using a hot roll laminator under the conditions of 130° C. and 1.0 m/min.

Example 35

For the side face of a light emitting element driving substrate 7 formed as in Example 33, an electrically conductive film 34 was adopted as illustrated in FIG. 45*h*, and the photosensitive electrically conductive paste 1 prepared in Example 34 was used to form the electrically conductive film 34. Except for this, the same procedure as in Example 33 was carried out to produce a display 41.

Example 36

Except that a printed circuit board was adopted instead of the light emitting element driving substrate 7 used in Example 32 and that the drive element 8 and the metal wires 4 were connected to each other by the wires in the printed circuit board and the bump, the same procedure as in Example 32 was carried out to produce a display 42.

Example 37

Except that a printed circuit board was adopted instead of the light emitting element driving substrate 7 used in Example 33 and that the drive element 8 and the metal wires 4 were connected to each other by the wires in the printed circuit board and the bump, the same procedure as in Example 33 was carried out to produce a display 43.

Example 38

As illustrated in FIG. 44*a*, shading layers 35 were formed from a coloring resin composition 1 on a support substrate 20. Next, as illustrated in FIG. 44*a*, LEDs 2 were formed between the shading layers 35. Except for this, the same steps as in Example 4 were carried out to produce a display 44. The formation of the shading layers 35 was performed as described below.

<Formation of Shading Layers 35>

The coloring resin composition 1 was spread on the support substrate 20 in such a manner that its thickness would be 1 μm after heat treatment, and the coated film was dried by heating on a hot plate at 100° C. for 2 minutes. The dried film was irradiated with ultraviolet ray with an exposure energy of 200 mJ/cm$^2$ using a light irradiation machine equipped with an ultrahigh pressure mercury lamp. Next, it was developed with a 0.045 wt % aqueous solution of potassium hydroxide used as alkaline developer, followed by rinsing with pure water to produce a pattern film. The resulting pattern film was post baked in a hot air oven at 230° C. for 30 minutes to produce shading layers.

Example 39

Except for adopting the coloring resin composition 2 for forming the shading layers 35, unlike the shading layers 35 formed in Example 38, the same steps as in Example 38 were carried out to produce a display 45.

Example 40

Except that in FIG. 14*f*, the metal wires 4*a* that were in contact with the bumps 10 had a thickness of 10 μm, that the cured film layer 3 formed on part of the surface of the metal wires 4*a* had a thickness of 15 μm, and that the cured film 3 had a total thickness of 35 μm, the same steps as in Example 4 were carried out to produce a display 46.

Example 41

Except that in FIG. 17*b*, the metal pad 18 had a thickness of 10 μm, that the cured film layer 3 formed on part of the surface of the metal pad had a thickness of 15 μm, and that the cured film 3 had a total thickness of 35 μm, the same steps as in Example 27 were carried out to produce a display 47.

Example 42

An example of the display according to the present invention is described below with reference to the cross-sectional views of the production steps given in FIG. 46.

As illustrated in FIG. 46*a*, a TFT array substrate was used as the light emitting element driving substrate 7, and the resin composition 3 given in Table 1 was spread on the light emitting element driving substrate 7 in such a manner that its thickness would be 3 μm after heat treatment, thereby producing a resin film 21. Here, the metal wires 4 had a thickness of 1 μm. Next, a plurality of hole patterns 12 was formed in the resin film 21 under the same conditions as adopted in the photolithography steps described in Example 4.

Next, the resin film 21 was cured under the same conditions as in Example 4 to form a cured film 3 with a thickness of 3 μm.

Next, FIG. 46*b* shows a step in which the metal wires or electrically conductive film are formed on at least part of the surface of the cured film and in part of the hole patterns in the cured film. A photoresist layer (not shown in the figures) was formed, and then wires 25 were formed by sputtering ITO on part of the surface of the cured film 3. Subsequently, the photoresist, which was no longer necessary, was removed The ITO layer had a thickness of 0.1 μm.

Next, as illustrated in FIG. 46*c*, the aforementioned steps were carried out repeatedly to cure the resin composition 3 given in Table 1 to produce a cured film 3 with a thickness of 2 μm.

Next, as illustrated in FIG. 46*d*, partition walls 16 were formed on the cured film 3. Next, LEDs 2 were formed between the partition walls 16. Here, the LEDs 2 had a thickness of 7 μm and the partition walls 16 had a thickness of 8 μm. To form the partition walls 16, an acrylic resin containing a generally known white pigment was used.

Subsequently, as illustrated in FIG. 46*e*, an opposite substrate 5 was attached using an adhesive. To produce an electrically conductive film 34, furthermore, the photosensitivity electrically conductive paste 1 prepared in Preparation example 1 was used to form an electrically conductive film 27 so that the electrically conductive film 34 allowed the drive element 8 such as driver IC to be electrically connected to the light emitting elements 2 via the metal wires 4 or wires 32 that extended in the cured film 3, thereby producing a display 48 that had a plurality of LEDs 2.

As a result, in displays 1 to 31 and 38 to 48, the cured film 3*a* had a high depressed surface planarization rate and it serves to prevent a significant depression from occurring when forming a layered structure involving the cured film, metal wires, and light emitting elements, which helped to reduce wiring defects such as short circuits in wires and defective connections of light emitting elements, thus serving to produce a display with a decreased light emission failure rate. In addition, in comparison with the conventional flexible substrates, the cured film was smaller in thickness and served to lower the height of the package and shorten the wire length, thereby realizing the prevention of wiring defects such as short circuits in wires, reduction of loss, and improvement in high speed response. Furthermore, the displays 1 to 9, 11 to 31, and 38 to 48 were suitable for fine processing, and therefore, it was possible to apply minute light emitting elements and achieve high density mounting of light emitting elements. It was also possible to allow a cured film prepared from a resin composition to be adopted as the partition wall 16, and accordingly, the formation of partition walls served to attach an opposite substrate easily. In the displays 1 to 31, 38 to 41, and 44 to 48, furthermore, at least part of the metal wires or electrically conductive films extended along a side face of the substrate, which served to lower the height of the display itself and enhance the high speed response, thereby realizing the production of a smaller display with a smaller frame. In addition, the displays 44 and 45 had a plurality of light emitting elements and shading layers formed between them, which served to suppress light leakage from the light emitting elements and mixing of colors between pixels and realize improved contrast without suffering a significant decrease in light extraction efficiency. In the displays 46 and 47, the metal wires located nearer to the bumps 10 were larger in thickness than the metal wires located nearer to the LEDs 2, which served to prevent the occurrence of wiring defects when connecting a light emitting element driving substrate 7 via bumps 10 and produce displays with high reliability.

Comparative Examples 1 and 2

Except for replacing the resin composition 1 used in Example 1 with the resin composition 13 or 14 and using cyclopentanone in the development step, the same procedure as in Example 1 was carried out to produce displays 32 and 33.

Comparative Example 3

In Comparative example 3, except for, unlike Comparative example 1, forming a region (G) in which the conductor spacing H1 between mutually adjacent metal wires (K2) was 2 μm and also forming metal wires (K2) with a thickness H2 of 2 μm, a cured film layer (F1)3*a* with a thickness H3 of 4 μm, and a three layered cured film 3 with a total thickness of 12 μm, the same procedure as in Comparative example 1 was carried out to produce a display 34.

Comparative Example 4

In Comparative example 4, except for, unlike Comparative example 1, forming a region (G) in which the conductor spacing H1 between mutually adjacent metal wires (K2) was 5 μm, the same procedure as Comparative example 1 was carried out to produce a display 35.

Comparative Examples 5 and 6

In Comparative examples 5 and 6, except that, unlike Comparative example 1, the cured film layer (F1)3*a*, which is one of the plurality of layers formed in the cured film 3*a* that was closest to the LED 2, had a thickness H3 of 7 μm or 20 μm and that the three layered cured film 3 had a total thickness of 27 μm or 40 μm, the same procedure as in Comparative example 1 was carried out to produce displays 36 and 37.

As a result, in displays 32 to 37, the cured film 3*a* was so low in depressed surface planarization rate that the occurrence of a significant depression cannot be avoided when forming a layered structure involving the cured film, metal wires, and light emitting elements, which resulted in wiring defects such as short circuits in wires and defective connections of light emitting elements, thus resulting in displays that suffered light emission failures.

For the second embodiment of the present invention, Table 3 lists the constitutions of the resin compositions used, each consisting of a resin (A), photosensitizing agent (B), thermal crosslinking agent (C), etc. According to Table 3, the resin compositions 101 to 115 were prepared using the solvents specified in Table 3 so as to have a solid content of 40 mass %. Furthermore, Table 4-1 and Table 4-2 show the resin composition used in each Example, dielectric breakdown voltage (kV/mm) of the cured film prepared from each resin composition, the total thickness of the cured film (μm), the number of layers in the cured film, the shape and maximum size of the hole pattern created in the cured film, presence or absence of the step (D6) and step (D8), the defective rate in display production, and the angle of the inclined side of the hole pattern.

TABLE 3

| | resin component (A) (content) | | photosensitive agent (B) (content) | | |
|---|---|---|---|---|---|
| resin composition 101 | (A-1) (100 parts by mass) | — | (B-1) (11 parts by mass) | (B-2) (9 parts by mass) | — |
| resin composition 102 | (A-1) (100 parts by mass) | — | (B-1) (14 parts by mass) | (B-2) (6 parts by mass) | — |

TABLE 3-continued

| | | | | | |
|---|---|---|---|---|---|
| resin composition 103 | (A-1) (100 parts by mass) | — | (B-1) (20 parts by mass) | — | — |
| resin composition 104 | (A-1) (100 parts by mass) | — | (B-1) (20 parts by mass) | — | — |
| resin composition 105 | (A-2) (100 parts by mass) | — | (B-1) (20 parts by mass) | — | — |
| resin composition 106 | (A-3) (100 parts by mass) | — | (B-1) (20 parts by mass) | — | — |
| resin composition 107 | (A-4) (100 parts by mass) | — | (B-1) (20 parts by mass) | — | — |
| resin composition 108 | (A-5) (100 parts by mass) | — | (B-1) (20 parts by mass) | — | — |
| resin composition 109 | (A-6) (100 parts by mass) | — | (B-1) (20 parts by mass) | — | — |
| resin composition 110 | (A-1) (100 parts by mass) | (A-9) (19 parts by mass) | (B-1) (20 parts by mass) | — | — |
| resin composition 111 | (A-5) (100 parts by mass) | — | — | — | (B-3) (5 parts by mass) |
| resin composition 112 | (A-1) (100 parts by mass) | — | — | — | — |
| resin composition 113 | (A-11) (100 parts by mass) | — | (B-1) (20 parts by mass) | — | — |
| resin composition 114 | (A-8) (100 parts by mass) | — | — | — | (B-3) (5 parts by mass) |
| resin composition 115 | (A-10) (100 parts by mass) | — | (B-1) (20 parts by mass) | — | — |

| | thermal crosslinking agent (C) (content) | | other component | solvent |
|---|---|---|---|---|
| resin composition 101 | (C-1) (20 parts by mass) | — | — | GBL |
| resin composition 102 | (C-1) (20 parts by mass) | — | — | GBL |
| resin composition 103 | (C-1) (20 parts by mass) | — | — | GBL |
| resin composition 104 | (C-1) (10 parts by mass) | (C-2) (10 parts by mass) | — | GBL |
| resin composition 105 | (C-1) (20 parts by mass) | — | — | GBL |
| resin composition 106 | (C-1) (20 parts by mass) | — | — | GBL |
| resin composition 107 | (C-1) (20 parts by mass) | — | — | GBL |
| resin composition 108 | (C-1) (20 parts by mass) | — | — | GBL |
| resin composition 109 | (C-1) (20 parts by mass) | — | — | GBL |
| resin composition 110 | (C-1) (20 parts by mass) | — | — | GBL |
| resin composition 111 | (C-1) (20 parts by mass) | — | (F-1) (20 parts by mass) | GBL |
| resin composition 112 | (C-1) (20 parts by mass) | — | — | GBL |
| resin composition 113 | (C-1) (20 parts by mass) | — | — | GBL |
| resin composition 114 | (C-1) (20 parts by mass) | — | (F-1) (20 parts by mass) | GBL |
| resin composition 115 | (C-1) (20 parts by mass) | — | — | GBL |

TABLE 4-1

| | display | resin composition | cure temperature (° C.) | dielectric breakdown voltage (kV/mm) | total thickness of cured film (μm) | number of layers in cured film |
|---|---|---|---|---|---|---|
| Example 101 | display 101 | resin composition 101 | 230 | 500 | 30 | 3 |
| Example 102 | display 102 | resin composition 102 | 230 | 505 | 30 | 3 |
| Example 103 | display 103 | resin composition 103 | 230 | 532 | 30 | 3 |
| Example 104 | display 104 | resin composition 104 | 230 | 532 | 30 | 3 |
| Example 105 | display 105 | resin composition 105 | 230 | 530 | 30 | 3 |

TABLE 4-1-continued

| | | | | | | |
|---|---|---|---|---|---|---|
| Example 106 | display 106 | resin composition 106 | 230 | 527 | 30 | 3 |
| Example 107 | display 107 | resin composition 107 | 230 | 527 | 30 | 3 |
| Example 108 | display 108 | resin composition 108 | 230 | 460 | 30 | 3 |
| Example 109 | display 109 | resin composition 109 | 230 | 450 | 30 | 3 |
| Example 110 | display 110 | resin composition 110 | 230 | 524 | 30 | 3 |
| Example 111 | display 111 | resin composition 111 | 230 | 532 | 30 | 3 |
| Example 112 | display 112 | resin composition 112 | 230 | 546 | 30 | 3 |
| Example 113 | display 113 | resin composition 102 | 230 | 527 | 30 | 3 |
| Example 114 | display 114 | resin composition 103 | 230 | 532 | 30 | 3 |
| Example 115 | display 115 | resin composition 103 | 230 | 532 | 30 | 3 |
| Example 116 | display 116 | resin composition 101 | 230 | 500 | 30 | 3 |
| Example 117 | display 117 | resin composition 102 | 230 | 505 | 30 | 3 |
| Example 118 | display 118 | resin composition 103 | 230 | 532 | 30 | 3 |
| Example 119 | display 119 | resin composition 102 | 230 | 527 | 30 | 3 |
| Example 120 | display 120 | resin composition 103 | 230 | 532 | 30 | 3 |
| Example 121 | display 121 | resin composition 103 | 230 | 532 | 30 | 3 |
| Example 122 | display 122 | resin composition 113 | 230 | 420 | 30 | 3 |
| Example 123 | display 123 | resin composition 114 | 230 | 430 | 30 | 3 |
| Comparative example 101 | display 124 | resin composition 113 | 150 | 300 | 30 | 3 |
| Comparative example 102 | display 125 | resin composition 115 | 230 | 610 | 30 | 3 |

| | shape and maximum size of hole formed in cured film | presence or absence of step (D6) or step (E8) | defective rate | evaluation item (1) | angle of inclined side of hole pattern (°) | evaluation item (2) |
|---|---|---|---|---|---|---|
| Example 101 | circular, diameter 2 μm | absent | 0.37 | B | 75 | A |
| Example 102 | circular, diameter 2 μm | absent | 0.33 | B | 75 | A |
| Example 103 | circular, diameter 2 μm | absent | 0.17 | A | 70 | A |
| Example 104 | circular, diameter 2 μm | absent | 0.17 | A | 70 | A |
| Example 105 | circular diameter 2 μm | absent | 0.20 | A | 75 | A |
| Example 106 | circular, diameter 3 μm | absent | 0.20 | A | 75 | A |
| Example 107 | circular, diameter 3 μm | absent | 0.20 | A | 75 | A |
| Example 108 | circular, diameter 3 μm | absent | 0.20 | A | 70 | A |
| Example 109 | circular, diameter 3 μm | absent | 0.20 | A | 65 | A |
| Example 110 | circular, diameter 3 μm | absent | 0.23 | A | 60 | A |
| Example 111 | circular, diameter 15 μm | absent | 0.17 | C | 85 | B |
| Example 112 | circular, diameter 25 μm | absent | 0.03 | D | 50 | B |
| Example 113 | circular, diameter 2 μm | present | 0.20 | A | 75 | A |
| Example 114 | circular, diameter 2 μm | absent | 0.13 | A | 70 | A |
| Example 115 | circular, diameter 2 μm | absent | 0.07 | A | 70 | A |
| Example 116 | circular, diameter 2 μm | absent | 0.33 | B | 75 | A |
| Example 117 | circular, diameter 2 μm | absent | 0.30 | B | 75 | A |

TABLE 4-1-continued

| | | | | | | |
|---|---|---|---|---|---|---|
| Example 118 | circular, diameter 2 μm | absent | 0.17 | A | 70 | A |
| Example 119 | circular, diameter 2 μm | present | 0.20 | A | 75 | A |
| Example 120 | circular, diameter 2 μm | absent | 0.07 | A | 70 | A |
| Example 121 | circular, diameter 2 μm | absent | 0.03 | A | 70 | A |
| Example 122 | circular, diameter 15 μm | absent | 0.43 | E | 50 | B |
| Example 123 | circular, diameter 8 μm | absent | 0.43 | E | 85 | B |
| Comparative example 101 | circular, diameter 15 μm | absent | 0.50 | F | 50 | B |
| Comparative example 102 | circular, diameter 5 μm | absent | 0.50 | F | 50 | B |

TABLE 4-2

| | display | resin composition | cure temperature (° C.) | dielectric breakdown voltage (kV/mm) | total thickness of cured film (μm) | number of layers in cured film |
|---|---|---|---|---|---|---|
| Example 124 | display 126 | resin composition 103 | 230 | 532 | 30 | 3 |
| Example 125 | display 127 | resin composition 103 | 230 | 532 | 30 | 3 |
| Example 126 | display 128 | resin composition 103 | 230 | 532 | 30 | 3 |
| Example 127 | display 129 | resin composition 103 | 230 | 532 | 30 | 3 |
| Example 128 | display 130 | resin composition 103 | 230 | 532 | 30 | 3 |
| Example 129 | display 131 | resin composition 103 | 230 | 532 | 30 | 3 |
| Example 130 | display 132 | resin composition 103 | 230 | 532 | 30 | 3 |
| Example 131 | display 133 | resin composition 103 | 230 | 532 | 30 | 3 |
| Example 132 | display 134 | resin composition 103 | 230 | 532 | 35 | 3 |
| Example 133 | display 135 | resin composition 103 | 230 | 532 | 35 | 3 |
| Example 134 | display 136 | resin composition 103 | 230 | 532 | 5 | 2 |

| | shape and maximum size of hole formed in cured film | presence or absence of step (D6) or step (E8) | defective rate | evaluation item (1) | angle of inclined side of hole pattern (°) | evaluation item (2) |
|---|---|---|---|---|---|---|
| Example 124 | circular, diameter 2 μm | absent | 0.17 | A | 70 | A |
| Example 125 | circular, diameter 2 μm | absent | 0.17 | A | 70 | A |
| Example 126 | circular, diameter 2 μm | absent | 0.17 | A | 70 | A |
| Example 127 | circular, diameter 2 μm | absent | 0.17 | A | 70 | A |
| Example 128 | circular, diameter 2 μm | absent | 0.17 | A | 70 | A |
| Example 129 | circular, diameter 2 μm | absent | 0.17 | A | 70 | A |
| Example 130 | circular, diameter 2 μm | absent | 0.17 | A | 70 | A |
| Example 131 | circular, diameter 2 μm | absent | 0.17 | A | 70 | A |
| Example 132 | circular, diameter 2 μm | absent | 0.17 | A | 70 | A |
| Example 133 | circular, diameter 2 μm | absent | 0.17 | A | 70 | A |
| Example 134 | circular, diameter 2 μm | absent | 0.17 | A | 70 | A |

For the evaluation item (1), a display was rated as level A if its 10 samples gave a defective rate of 0.25 or less and had a maximum hole pattern size of 5 μm or less, rated as level B if display samples gave a defective rate of more than 0.25 and 0.35 or less and had a maximum hole pattern size of 5 μm or less, rated as level C if display samples gave a defective rate of 0.35 or less and had a maximum hole pattern size of more than 5 μm and 20 μm or less, rated as level D if display samples gave a defective rate of 0.35 or less and had a maximum hole pattern size of more than 20 μm and 25 μm or less, rated as level E if display samples gave a defective rate of more than 0.35 and 0.45 or less, and rated as level F if display samples gave a defective rate of more than 0.45. A display was assessed as practically acceptable if it was rated as level A to level E or practically unacceptable if it was rated as level F.

For the evaluation item (2), a display was rated as level A if the angle of its inclined side was 55° or more and 80° or less, rated as level B if it was 40° or more and less than 55° or more than 80° and 85° or less, or rated as level C if it was less than 40° or more than 85°.

Example 101 (Steps in FIG. 30)

An example of the display according to the present invention is described below with reference to the cross-sectional views of the production steps given in FIG. 30.

As illustrated in FIG. 30*a*, a glass substrate was used as the support substrate 20. Some temporarily attached materials made of polyimide were disposed on the glass substrate, and LEDs 2, which work as light emitting elements, were disposed on the support substrate 20 (corresponding to the step (D1)). Each LED 2 had a thickness of 7 μm and had a pair of sides with a length of 30 μm and the other pair of sides with a length of 50 μm.

Next, as illustrated in FIG. 30*b*, the resin composition 101 described in Table 3 was spread on the support substrate 20 and on the light emitting element 2 in such a manner that its thickness would be 10 μm after heat treatment, thereby forming a resin film 21 (corresponding to the step (D2)).

Next, as illustrated in FIG. 30*c*, the resin film 21 was irradiated with i-line light (365 nm) through a mask having a desired pattern. The irradiated resin film 21 was developed with a 2.38 mass % aqueous solution of tetramethyl ammonium (TMAH) to form a plurality of hole patterns 12 that penetrated the resin film 21 in the thickness direction (corresponding to the step (D3)). Each hole pattern had a circular shape, and the hole pattern had a diameter of 2 μm as the maximum size in the bottom face portion in the smallest region.

Next, the resin film 21 was cured by performing heat treatment at 110° C. for 30 minutes in an atmosphere having an oxygen concentration of 100 ppm or less and additional heat treatment at 230° C. for 60 minutes to form a cured film 3 with a thickness of 10 μm (corresponding to the step (D4)). Thus, the resin film 21 was cured directly into a cured film 3.

Next, as illustrated in FIG. 30*d*, barrier metal of titanium was sputtered on the cured film 3 and in addition, a copper seed layer was formed on top of it by sputtering. Following this, a photoresist layer was formed, and then metal wires 4 of copper connected electrically to the LEDs 2 were formed by the plating technique in the hole pattern 12 in the cured film 3 and on part of the surface of the cured film 3. Subsequently, the photoresist, seed layer, and barrier metal were removed (corresponding to the step (D5)). The metal wires 4*a* formed on part of the surface of the cured film 3 had a thickness of 5 μm.

Then, as illustrated in FIGS. 30*e* to 30*f*, the step (D2), step (D3), step (D4), and step (D5) were repeated twice to form a three layered cured film 3. The resulting three layered cured film 3 had a total thickness of 30 μm.

Subsequently, as illustrated in FIG. 30*g*, barrier metal 9 was formed by sputtering in each hole pattern 12 in the cured film 3, followed by forming solder bumps 10. Subsequently, as illustrated in FIG. 30*h*, the solder was reflowed at 250° C. for 1 minute to allow it to be electrically connected through the solder bump 10 to a light emitting element driving substrate 7 that had a driver IC as drive element 8. Then, the support substrate 20 was removed and an opposite substrate 5 was attached using an adhesive etc., thus producing a display 101 that had a plurality of LEDs 2.

Example 102

Except for replacing the resin composition 101 used in Example 101 with a resin sheet prepared from the resin composition 102 and using the lamination technique to form the resin film 21, the same procedure as in Example 101 was carried out to produce a display 102.

Examples 103 to 111

Except for replacing the resin composition 101 used in Example 101 with the resin compositions 103 to 111, the same procedure as in Example 1 was carried out to produce displays 103 to 111.

Example 112

Except for replacing the resin composition 101 used in Example 101 with the resin composition 112, forming a photoresist before light irradiation, and removing the photoresist after development, the same procedure as in Example 101 was carried out to produce a display 112.

Example 113

In Example 113, except that, unlike Example 102, a step (D6) for applying i-line light (365 nm) to the entire region of the resin film 21 that contained the hole pattern 12 formed in step (D3) was carried out after the step (D3) and before the step (D4), the same procedure as in Example 2 was carried out to produce a display 113.

Example 114

As illustrated in FIG. 31*a*, partition walls 16 were formed on the support substrate 20 (corresponding to the step (D7)). Next, as illustrated in FIG. 31*b*, LEDs 2 were formed between the partition walls 16 (corresponding to the step (D1)). Except for this, the same steps as in Example 103 were carried out to produce a display 114. Here, the LEDs 2 had a thickness of 7 μm and the partition walls 16 had a thickness of 10 μm. To form the partition walls 16, an acrylic resin containing a generally known white pigment was used.

Example 115

As illustrated in FIG. 32*d*, the step (D4) shown in FIG. 30*c* which was designed to form a cured film by the same procedure as in Example 103 was followed by sputtering aluminum to a thickness of 0.2 μm at predetermined positions so as to avoid the metal wires 4 to be formed later, thereby producing reflecting films 15 (step (D8)). Except for this, the same steps as in Example 103 were carried out to produce a display 115.

Example 116

An example of the display according to the present invention is described below with reference to the cross-sectional views of the production steps given in FIG. 33.

First, as illustrated in FIG. 33*a*, an electrode pad 18 made of copper was formed on the support substrate 20 (corresponding to the step (E1)). The electrode pad had a thickness of 0.2 μm. Next, as illustrated in FIG. 33*b*, the resin composition 101 described in Table 3 was spread on the support substrate 20 and on the metal pad 18 in such a manner that its thickness would be 10 μm after heat treatment, thereby forming a resin film 21 (corresponding to the step (E2)).

Next, as illustrated in FIG. 33*c*, a plurality of hole patterns 12 was formed in the resin film 21 under the same conditions as adopted in the photolithography steps described in Example 1 (corresponding to step (E3)).

Next, the resin film 21 was cured under the same conditions as in Example 101 to form a cured film 3 with a thickness of 10 μm (corresponding to the step (E4)).

Following this, in order to improve the adhesion between the cured film 3 and the metal wires 4 in FIG. 33*c*, barrier metal such as titanium was sputtered on the cured film 3 and in addition, a copper seed (seed layer) was formed on top of it by sputtering.

Next, as illustrated in FIG. 33*d*, a photoresist layer was formed and then metal wires 4 of copper were formed by the plating technique in the hole pattern 12 in the cured film 3 and on part of the surface of the cured film 3 (corresponding to the step (E5)). The metal wires 4 formed on part of the surface of the cured film 3 had a thickness of 5 μm. Subsequently, the photoresist, seed layer, and barrier metal were removed.

Then, the step (E2), step (E3), step (E4), and step (E5) were repeated twice to form a three layered cured film 3 that had metal wires 4 extending in the cured film 3 as illustrated in FIG. 33*e*. The resulting three layered cured film 3 had a total thickness of 30 μm.

Next, as illustrated in FIG. 33*f*, LEDs 2 were formed on the cured film 3 while maintaining electric connection to the metal wires 4 (corresponding to the step (E6)). The LEDs 2 had a thickness of 7 μm.

Next, as illustrated in FIG. 33 *g*, a resin film 21 was formed from the resin composition 101 on the cured film 3 and on the light emitting elements 2 and cured by heat treatment to form a cured film 29. Here, the cured film 3 was formed by performing heat treatment at 110° C. for 30 minutes in an atmosphere having an oxygen concentration of 100 ppm or less and additional heat treatment at 230° C. for 60 minutes.

Subsequently, as illustrated in FIG. 33*h*, the support substrate 20 was removed, followed by attaching a light emitting element driving substrate 7 that had a driver IC as drive element 8 and was electrically connected via the solder bumps 10. Then, an opposite substrate 5 was attached to the LEDs 2 using an adhesive etc., thus producing a display 116 having a plurality of LEDs 2.

Examples 117 and 118

Except for replacing the resin composition 101 used in Example 116 with the resin composition 102 or 103, the same procedure as in Example 116 was carried out to produce displays 117 and 118.

Example 119

Except that, unlike Example 117, a step (E8) for applying i-line light (365 nm) to the entire region of the resin film 21 that contained the hole pattern 12 formed in step (E3) was carried out after the step (E3) and before the step (E4), the same procedure as in Example 117 was carried out to produce a display 119.

Example 120

As illustrated in FIG. 34*f*, the formation of a plurality of cured film layers 3 as described in FIG. 33*e*, which was performed by the same procedure as in Example 118, was followed by forming partition walls 16 from the resin composition 103 between and around the LEDs 2 that were to be formed later (corresponding to the step (E9)). Then, a plurality of LEDs 2 was formed as illustrated in FIG. 34*g* and, as illustrated in FIG. 34*h*, the support substrate 20 was removed, followed by attaching a light emitting element driving substrate 7 that had a driver IC as drive element 8 and was electrically connected via the solder bumps 10. Then, an opposite substrate 5 was attached to the LEDs 2 using an adhesive etc. to produce a display 120 having a plurality of LEDs 2. Here, the LEDs 2 had a thickness of 7 μm and the partition walls had a thickness of 10 μm.

Example 121

As illustrated in FIG. 35*f*, the step (E5) shown in FIG. 33*e* which was designed to form a cured film by the same procedure as in Example 118 was followed by sputtering aluminum to a thickness of 0.5 μm at predetermined positions so as to avoid the metal wires 4 formed above, thereby producing reflecting films 15 (corresponding to the step (E10)). Subsequently, the same steps as in Example 118 were carried out to produce a display 121.

Example 122

Except for replacing the resin composition 101 used in Example 101 with the resin composition 113, the same procedure as in Example 101 was carried out to produce a display 122.

Example 123

Except for replacing the resin composition 101 used in Example 101 with the resin composition 114 and developing the resin film 21, which had been irradiated with light, with cyclopentanone, the same procedure as in Example 101 was carried out to produce a display 123.

Example 124

Unlike Example 103, a groove was formed by laser processing in a side face of the light emitting element driving substrate 7 as illustrated in FIG. 30*h*, followed by sputtering of titanium and copper in this order and plating with copper to form metal wires 4*c* (step (D9)). Except for this, the same procedure as in Example 101 was carried out to produce a display 126.

Example 125

Unlike Example 118, a groove was formed by laser processing in a side face of the light emitting element driving substrate 7 as illustrated in FIG. 33*h*, followed by sputtering of titanium and copper in this order and plating with copper to form metal wires 4*c* (step (E11)). Except for this, the same procedure as in Example 118 was carried out to produce a display 127.

Example 126

For the side face of a light emitting element driving substrate 7 formed as in Example 124, an electrically conductive film 34 was adopted as illustrated in FIG. 43*h*, and the photosensitive electrically conductive paste 1 prepared in Preparation example 1 was used to form the electrically conductive film 34 (step (D10)). Except for this, the same procedure as in Example 124 was carried out to produce a display 128. The formation of the electrically conductive film 34 was performed as described below.

<Preparation of Electrically Conductive Film 34>

The photosensitive electrically conductive paste 1 was spread on a PET mold release film prepared by coating a PET film having a thickness of 16 μm with a mold releasing agent in such a manner that the film thickness would be 6.0 μm after drying, followed by drying the resulting coated film in a drying oven at 100° C. for 10 minutes. Then, it was irradiated with an exposure energy of 350 mJ/cm$^2$ using a light irradiation machine equipped with an ultrahigh pressure mercury lamp and then, using a 0.1 mass % aqueous solution of sodium carbonate as developer, spray development under a pressure of 0.1 MPa was performed for 30 seconds, thereby forming a pattern. Subsequently, the resulting pattern was cured in a drying oven at 140° C. for 30 minutes to prepare a wired sample for transfer test. The resulting pattern had a line width of 50 μm and a line length of 90 mm. Such samples for transfer test were attached to both faces of a glass plate in such a manner that part of the wires were disposed along the edge of the plate that had a beveled curved portion. Then, the side face of the glass plate was pressed against a hot plate at 130° C. for 30 seconds, followed by transferring the remaining portion using a hot roll laminator under the conditions of 130° C. and 1.0 m/min.

Example 127

In the side face of a light emitting element driving substrate 7 as described in Example 125, an electrically conductive film 34 was adopted as illustrated in FIG. 45*h*, and the photosensitive electrically conductive paste 1 prepared in Example 126 was used for the electrically conductive film 34 (step (E12)). Except for this, the same procedure as in Example 125 was carried out to produce a display 129.

Example 128

Except that a printed circuit board was adopted instead of the light emitting element driving substrate 7 used in Example 124 and that the drive element 8 and the metal wires 4 were connected to each other by the wires in the printed circuit board and the bump, the same procedure as in Example 124 was carried out to produce a display 130.

Example 129

Except that a printed circuit board was adopted instead of the light emitting element driving substrate 7 used in Example 125 and that the drive element 8 and the metal wires 4 were connected to each other by the wires in the printed circuit board and the bump, the same procedure as in Example 125 was carried out to produce a display 131.

Example 130

As illustrated in FIG. 44*a*, shading layers 35 were formed from a coloring resin composition 1 on a support substrate 20 (step (D11)). Next, as illustrated in FIG. 44*a*, LEDs 2 were formed between the shading layers 35 (step (D1)). Except for this, the same steps as in Example 103 were carried out to produce a display 132. The formation of the shading layers 35 was performed as described below.

<Formation of Shading Layers 35>

The coloring resin composition 1 was spread on the support substrate 20 in such a manner that its thickness would be 1 μm after heat treatment, and the coated film was dried by heating on a hot plate at 100° C. for 2 minutes. The dried film was irradiated with ultraviolet ray with an exposure energy of 200 mJ/cm$^2$ using a light irradiation machine equipped with an ultrahigh pressure mercury lamp. Next, it was developed with a 0.045 wt % aqueous solution of potassium hydroxide used as alkaline developer, followed by rinsing with pure water to produce a pattern film. The resulting pattern film was post baked in a hot air oven at 230° C. for 30 minutes to produce shading layers.

Example 131

Except for adopting the coloring resin composition 2 for forming the shading layers 35, unlike the shading layers 35 formed in Example 130, the same steps as in Example 130 were carried out to produce a display 133.

Example 132

Except that in FIG. 30*f*, the metal wires 4*a* that were in contact with the bumps 10 had a thickness of 10 μm, that the cured film layer 3 formed on part of the surface of the metal wires 4*a* had a thickness of 15 μm, and that the cured film 3 had a total thickness of 35 μm, the same steps as in Example 103 were carried out to produce a display 134.

Example 133

Except that in FIG. 33*b*, the metal pad 18 had a thickness of 10 μm, that the cured film layer 3 formed on part of the surface of the metal pad had a thickness of 15 μm, and that the cured film 3 had a total thickness of 35 μm, the same steps as in Example 118 were carried out to produce a display 135.

Example 134

An example of the display according to the present invention is described below with reference to the cross-sectional views of the production steps given in FIG. 46.

As illustrated in FIG. 46*a*, a TFT array substrate was used as the light emitting element driving substrate 7, and the resin composition 103 given in Table 3 was spread on the light emitting element driving substrate 7 in such a manner that its thickness would be 3 μm after heat treatment, thereby producing a resin film 21 (step (F1)). Here, the metal wires 4 had a thickness of 1 μm.

Next, a plurality of hole patterns 12 was formed in the resin film 21 under the same conditions as adopted in the photolithography steps described in Example 103 (step (F2)).

Next, the resin film 21 was cured under the same conditions as in Example 103 to form a cured film 3 with a thickness of 3 μm (step (F3)).

Next, FIG. 46*b* shows a step in which the metal wires or electrically conductive film are formed on at least part of the surface of the cured film and in part of the hole patterns in the cured film. A photoresist layer (not shown in the figures) was formed, and then wires 25 were formed by sputtering ITO on part of the surface of the cured film 3. Subsequently, the photoresist, which was no longer necessary, was removed (step (F4)). The ITO layer had a thickness of 0.1 μm.

Next, as illustrated in FIG. 46*c*, the steps (F1), (F2), and (F3) were carried out repeatedly to cure the resin composition 103 given in Table 3 to produce a cured film 3 having a thickness of 2 μm.

Next, as illustrated in FIG. 46*d*, partition walls 16 were formed on the cured film 3. Next, LEDs 2 were formed between the partition walls 16 (step (F5)). Here, the LEDs 2 had a thickness of 7 μm and the partition walls 16 had a thickness of 8 μm. To form the partition walls 16, an acrylic resin containing a generally known white pigment was used.

Subsequently, as illustrated in FIG. 46*e*, an opposite substrate 5 was attached using an adhesive. To produce an electrically conductive film 34, furthermore, the photosensitivity electrically conductive paste 1 prepared in Preparation example 1 was used to form an electrically conductive film 34 so that the electrically conductive film 34 allowed the drive element 8 such as driver IC to be electrically connected to the light emitting elements 2 via the metal wires 4 or wires 32 that extended in the cured film 3, thereby producing a display 136 that had a plurality of LEDs 2.

Thus, the displays 101 to 123 and 126 to 136 each had a cured film 3 with a high dielectric breakdown voltage and accordingly showed a low defective rate in reliability test. In addition, in comparison with the conventional flexible substrates, the cured film was smaller in thickness and served to lower the height of the package and shorten the wire length, thereby realizing the prevention of wiring defects such as short circuits in wires, reduction of loss, and improvement in high speed response. Furthermore, the displays 101 to 110, 113 to 121, and 124 to 134 were suitable for fine processing, and therefore, it was possible to apply minute light emitting elements and achieve high density mounting of light emitting elements. It was also possible to allow a cured film prepared from a resin composition to be adopted as the partition wall 16, and accordingly, the formation of partition walls served to attach an opposite substrate easily. In the displays 101 to 123, 126 to 129, and 132 to 136, furthermore, at least part of the metal wires or electrically conductive films extended along a side face of the substrate, which served to lower the height of the display itself and enhance the high speed response, thereby realizing the production of a smaller display with a smaller frame. In addition, the displays 132 and 133 had a plurality of light emitting elements and shading layers formed between them, which served to suppress light leakage from the light emitting elements and mixing of colors between pixels and realize improved contrast without suffering a significant decrease in light extraction efficiency. In the displays 134 and 135, the metal wires located nearer to the bumps 10 are larger in thickness than the metal wires located nearer to the LEDs 2, which served to prevent the occurrence of wiring defects when connecting a light emitting element driving substrate 7 via bumps 10 and produce displays with high reliability.

Comparative Example 101

Except for replacing the resin composition 101 used in Example 101 with the resin composition 113 and adopting the curing temperature specified in Table 4-1, the same procedure as in Example 101 was carried out to produce a display 124.

Comparative Example 102

Except for replacing the resin composition 101 used in Example 101 with the resin composition 115, the same procedure as in Example 101 was carried out to produce a display 125.

As a result, the display 124 had a cured film 3 with a dielectric breakdown voltage of less than 360 kV/mm and the display 125 had a cured film 3 with a dielectric breakdown voltage of more than 600 kV/mm, leading to high defective rates.

EXPLANATION OF NUMERALS

1 display
2 light emitting element
3 cured film
3*a* cured film (F1) in contact with part of surface of metal wires (K2)
103*a* thickness of cured film 103*a* covering metal wire 104*a*
4, 4*c*, and 22 metal wire
4*a* metal wire (K1) extending in the thickness direction of cured film (F1)
4*b* metal wire (K2) connected to metal wire (K1) and extending in planar direction perpendicular to thickness direction of cured film (F1)
104*a* thickness of metal wire disposed on surface of cured film
104*b* thickness of metal wire extending in hole patterns penetrating cured film in thickness direction
5 opposite substrate
6 electrode terminal
7 light emitting element driving substrate
8 drive element
9 barrier metal
10 solder bump
11*a* designated region A
11*b*, 111*b* designated region B
11*c*, 111*c* designated region C
12 hole pattern
13 bottom face portion of metal wire 4
14 maximum size of bottom face portion
15 reflecting film
16 partition wall
17 external substrate
19 total thickness of cured film
20 support substrate
21 resin film
23 conductor spacing H1 between mutually adjacent metal wires (K2)
24 thickness H2 of metal wires (K2)
25 thickness H3 of cured film (F1)
26 depth H4 of depression
27 region (M1)
28 region (G)
29 cured film
30 TFT
31 TFT insulation layer
32 wire
33 contact hole
34 electrically conductive film

34*a* electrically conductive film (K101) extending in thickness direction of cured film (F1)

34*b* electrically conductive film (K102) connected to conductive film (K101) and extending in planar direction perpendicular to thickness direction of cured film (F1)

35 shading layer

36 inclined side

37 angle of inclined side

38 thickness of cured film 3

39 position at ½ of thickness of cured film 3

The invention claimed is:

1. A display comprising metal wires, a cured film, and a plurality of light emitting elements, each light emitting element having a pair of electrode terminals on one surface of a support substrate, the pair of electrode terminals being connected to the metal wires extending in the cured film, the metal wires being electrically insulated by the cured film, the metal wires having a plurality of metal wires (K1) extending in the thickness direction of the cured film and also having a plurality of metal wires (K2) connected to the metal wires (K1) and extending in the planar direction perpendicular to the thickness direction of the cured film, the cured film being a film formed by curing a resin composition containing a resin (A), having the cured film being in contact with part of the surface of the metal wires (K2), the display at least having a region (G) in which the conductor spacing H1 between mutually adjacent metal wires (K2) is 1 to 20 μm, the thickness H2 (μm) of the metal wires (K2) and the thickness H3 (μm) of the cured film in the region (G) having the following relation $$H3/H2=1.4 \text{ to } 4.0, \text{ and}$$

the depressed surface planarization rate P (%) defined by the following formula (1);

$$P\ (\%)=(1-(H4/H2))\times 100 \qquad \text{formula (1)}$$

wherein H4 (μm) is the depth of the depression formed in the cured film in the region (G) being 70% to 99%.

2. The display as set forth in claim 1, wherein the metal wires (K2) have a thickness of 1.5 to 10 μm.

3. The display as set forth in claim 1, wherein the cured film has 2 to 10 layers.

4. The display as set forth in claim 1, wherein the cured film has a total thickness of 5 to 100 μm.

5. The display as set forth in claim 1, wherein the cured film has a hole pattern that penetrates it in the thickness direction; the metal wires extend at least in the hole pattern; and the bottom face portion of each metal wire that is formed at a position where it is in contact with a light emitting element has a maximum size of 2 to 20 μm.

6. The display as set forth in claim 1, wherein the cured film covers the faces of each light emitting element other than the light extraction face.

7. The display as set forth in claim 1, wherein the cured film further comprises a reflecting film.

8. The display as set forth in claim 1, wherein partition walls having a thickness equal to or larger than the thickness of the light emitting elements are disposed between the two or more light emitting elements.

9. The display as set forth in claim 1, wherein partition walls having a thickness equal to or larger than the thickness of the light emitting elements are disposed between the two or more light emitting elements in the cured film that covers the light emitting elements.

10. The display as set forth in claim 1, wherein each light emitting element is an LED having sides of 5 μm or more and 700 μm or less.

11. The display as set forth in claim 1, further comprising a drive element and a substrate in such a manner that the drive element is connected to the light emitting elements by metal wires and that at least part of the metal wires extends along a side face of the substrate.

12. The display as set forth in claim 1, wherein shading layers are disposed between the two or more light emitting elements.

13. The display as set forth in claim 1, wherein the resin (A) contains one or more resins selected from the group consisting of polyimide, polyimide precursor, polybenzoxazole, polybenzoxazole precursor, and copolymers thereof.

14. The display as set forth in claim 1, wherein the resin (A) further includes a phenol resin having a biphenyl structure.

15. The display as set forth in claim 1, wherein the resin composition containing the resin (A) further includes a photosensitizing agent (B).

16. The display as set forth in claim 1, wherein the resin composition containing the resin (A) further includes a thermal crosslinking agent (C).

17. The display as set forth in claim 16, wherein the thermal crosslinking agent (C) contains a thermal crosslinking agent component having a biphenyl structure.

18. The display as set forth in claim 1, wherein the resin composition containing the resin (A) has positive photosensitivity.

19. A production method for a display comprising metal wires, a cured film, and light emitting elements comprising:

a step (D1) for arranging the light emitting elements on a support substrate, a step (D2) for forming a resin film from a resin composition containing a resin (A) on the support substrate and on the light emitting elements, a step (D3) for irradiating and developing the resin film to form a plurality of through-hole patterns that penetrate the resin film, a step (D4) for curing the resin film to form a cured film having a dielectric breakdown voltage of 360 kV/mm or more and 600 kV/mm or less, and a step (D5) for forming the metal wires on at least part of the surface of the cured film and in the hole patterns in the cured film.

20. The production method for a display as set forth in claim 19, wherein a step (D6) for irradiating the entire region of the resin film is provided after the step (D3) and before the step (D4).

21. The production method for a display as set forth in claim 19, wherein the step (D2), step (D3), step (D4), and step (D5) are carried out a plurality of times repeatedly to form a plurality of cured film layers in which each cured film layer contains metal wires.

22. The production method for a display as set forth in claim 19, wherein a step (D7) for forming partition walls with a thickness equal to or larger than the thickness of the light emitting elements is provided after the step (D1).

23. The production method for a display as set forth in claim 19, wherein a step (D8) for forming reflecting films on part of the cured film is provided after the step (D4).

24. A production method for a display comprising metal wires, a cured film, and a plurality of light emitting elements comprising:

a step (E1) for disposing a metal pad on a support substrate, a step (E2) for forming a resin film from a resin composition containing a resin (A) on the support substrate and on the metal pad, a step (E3) for irradiating and developing the resin film to form a plurality of through-hole patterns that penetrate the resin film, a step (E4) for curing the resin film to form a cured film having a dielectric breakdown voltage of 360 kV/mm or more and 600 kV/mm or less, a step (E5) for forming the metal wires on at least part of the surface of the cured film and in the hole patterns in the cured film, and a step (E6) for arranging the light emitting elements on the cured film while maintaining electric connection with the metal wires.

25. The production method for a display as set forth in claim 24, wherein a step (E8) for irradiating the entire region of the resin layer is provided after the step (E3) and before the step (E4).

26. The production method for a display as set forth in claim 24, wherein the cured film comprises a plurality of cured film layers; and wherein the step (E2), step (E3), step (E4), and step (E5) are carried out a plurality of times repeatedly to form the plurality of cured film layers in which each cured film layer of the plurality of cured film layers contains the metal wires.

27. The production method for a display as set forth in claim 24, wherein a step (E9) for forming partition walls with a thickness equal to or larger than the thickness of the light emitting elements is provided after the step (E5).

28. The production method for a display as set forth in claim 24, wherein a step (E10) for forming reflecting films on part of the cured film is provided before the step (E6) and after the step (E5).

29. The display comprising metal wires, a cured film, and light emitting elements, each light emitting element having a pair of electrode terminals on one surface of a support substrate, the pair of electrode terminals being connected to the metal wires extending in the cured film, the metal wires being electrically insulated by the cured film, the cured film being a film formed by curing a resin composition containing a resin (A), and the cured film having a dielectric breakdown voltage of 360 kV/mm or more and 600 kV/mm or less.

* * * * *